US012156468B2

(12) United States Patent
Jeong et al.

(10) Patent No.: US 12,156,468 B2
(45) Date of Patent: *Nov. 26, 2024

(54) ORGANIC COMPOUND AND ORGANIC ELECTROLUMINESCENT DEVICE COMPRISING THE SAME

(71) Applicant: MATERIAL SCIENCE CO., LTD., Seoul (KR)

(72) Inventors: Jae Ho Jeong, Incheon (KR); Hyun Bin Kang, Suwon-si (KR); Jin Sung Kim, Asan-si (KR); Tae Ho Kwak, Goyang-si (KR)

(73) Assignee: MATERIAL SCIENCE CO., LTD., Seoul (KR)

( * ) Notice: Subject to any disclaimer, the term of this patent is extended or adjusted under 35 U.S.C. 154(b) by 993 days.

This patent is subject to a terminal disclaimer.

(21) Appl. No.: 16/615,606

(22) PCT Filed: May 21, 2018

(86) PCT No.: PCT/KR2018/005797

§ 371 (c)(1),
(2) Date: Nov. 21, 2019

(87) PCT Pub. No.: WO2018/216990

PCT Pub. Date: Nov. 29, 2018

(65) Prior Publication Data

US 2020/0176679 A1 Jun. 4, 2020

(30) Foreign Application Priority Data

May 22, 2017 (KR) ........................ 10-2017-0062889
Oct. 17, 2017 (KR) ........................ 10-2017-0134774

(51) Int. Cl.

| | |
|---|---|
| ***H10K 85/60*** | (2023.01) |
| ***C07F 5/02*** | (2006.01) |
| ***C09K 11/06*** | (2006.01) |
| ***H10K 50/11*** | (2023.01) |
| ***H10K 50/15*** | (2023.01) |
| ***H10K 50/16*** | (2023.01) |
| ***H10K 50/17*** | (2023.01) |
| ***H10K 50/18*** | (2023.01) |
| ***H10K 101/10*** | (2023.01) |

(52) U.S. Cl.

CPC ........... *H10K 85/658* (2023.02); *C07F 5/027* (2013.01); *C09K 11/06* (2013.01); *C09K 2211/1018* (2013.01); *H10K 50/11* (2023.02); *H10K 50/15* (2023.02); *H10K 50/16* (2023.02); *H10K 50/17* (2023.02); *H10K 50/171* (2023.02); *H10K 50/18* (2023.02); *H10K 2101/10* (2023.02)

(58) Field of Classification Search

CPC .... H01L 51/008; H01L 51/5012; C07F 5/027; C09K 11/06; C09K 2211/1018; H10K 85/322; H10K 50/11; H10K 50/15; H10K 50/16; H10K 50/17; H10K 50/171; H10K 50/18; H10K 2101/10

See application file for complete search history.

(56) References Cited

U.S. PATENT DOCUMENTS

| | | | | |
|---|---|---|---|---|
| 2014/0027734 | A1* | 1/2014 | Kwong | H10K 85/615 546/13 |
| 2015/0236274 | A1* | 8/2015 | Hatakeyama | H10K 85/322 548/405 |
| 2018/0366653 | A1* | 12/2018 | He | C07F 5/027 |
| 2020/0058885 | A1* | 2/2020 | Hong | H10K 85/322 |
| 2020/0335705 | A1* | 10/2020 | Song | H10K 85/631 |

FOREIGN PATENT DOCUMENTS

| | | | | |
|---|---|---|---|---|
| CN | 105431439 | A | 3/2016 | |
| EP | 2248868 | A1 * | 11/2010 | C07C 211/61 |
| EP | 3109253 | A1 * | 12/2016 | C07F 5/02 |
| KR | 1020140013001 | A | 2/2014 | |
| KR | 1020160119683 | A | 10/2016 | |
| WO | WO2016152544 | A1 | 9/2016 | |
| WO | WO-2019088799 | A1 * | 5/2019 | C07F 5/02 |
| WO | WO2016143624 | A1 | 9/2019 | |
| WO | WO-2019198699 | A1 * | 10/2019 | C07F 5/02 |

OTHER PUBLICATIONS

Machine Translation of Hatakeyama (WO-2019198699-A1) from Espacenet (Year: 2019).*

Hirai, H., Nakajima, K., Nakatsuka, S., Shiren, K., Ni, J., Nomura, S., Ikuta, T. and Hatakeyama, T., 2015. One-step borylation of 1,3-diaryloxybenzenes towards efficient materials for organic light-emitting diodes. Angewandte Chemie, 127(46), pp. 13785-13789. (Year: 2015).*

S. H. Han, Y. H. Park, J. Y. Lee, Advanced Optical Materials 2018, 6, 1800997. (Year: 2018).*

Krajovi, Jozef, et al. "Adamantyl side groups boosting the efficiency and thermal stability of organic solid-state fluorescent dyes." Journal of Luminescence 175 (2016): 94-99. (Year: 2016).*

International Search Report of PCT/KR2018/005797, Sep. 27, 2018, English translation.

Hiroki Hirai et al, One-Step Borylation of 1,3-Diaryloxybenzenes Towards Efficient Materials for Organic Light-Emitting Diodes, Angewandte Chemie, 2015, vol. 54, pp. 13581-13585, 2015 Wiley-VCH Verlag GmbH & Co. KGaA, Weinheim, Germany.

Soichiro Nakatsuka et al, Divergent Synthesis of Heteroatom-Centered 4,8,12-Triazatriangulenes, Angewandte Chemie, 2017, vol. 56, pp. 1-5, 2017 Wiley-VCH Verlag GmbH & Co. KGaA, Weinheim, Germany.

(Continued)

*Primary Examiner* — Dawn L Garrett

(74) *Attorney, Agent, or Firm* — Carter, DeLuca & Farrell LLP; Jeffrey S. Steen

(57) ABSTRACT

The present invention relates to a compound represented by Formula 1 and an organic electroluminescent element including the same, and provides an organic compound which is excellent in service life, efficiency, electrochemical stability, and thermal stability, and an organic electroluminescent element including the same.

7 Claims, No Drawings

(56) References Cited

OTHER PUBLICATIONS

C.W. Tang et al, Organic electroluminescent diodes, Applied Physics, Sep. 1987, vol. 51, pp. 913-915, American Institute of Physics, College Park, USA.

Takuji Hatakeyama et al, Ultrapure Blue Thermally Activated Delayed Fluorescence Molecules; Efficient HOMO-LUMO Separation by the Multiple Resonance Effect, Advanced Materials, 2016, vol. 28, pp. 2777-2781, 2016 Wiley-VCH Verlag GmbH & Co. KGaA, Weinheim, Germany.

* cited by examiner

ORGANIC COMPOUND AND ORGANIC ELECTROLUMINESCENT DEVICE COMPRISING THE SAME

CROSS-REFERENCE TO RELATED APPLICATIONS

This application is the U.S. National Phase under 35 U.S.C. § 371 of International Application No. PCT/KR2018/005797 filed on May 21, 2018, which in turn claims the benefit of Korean Application Nos. 10-2017-0062889 filed on May 22, 2017 and 10-2017-0134774 filed on Oct. 17, 2017.

TECHNICAL FIELD

The present invention relates to a novel organic compound and an organic electroluminescent element including the same.

BACKGROUND ART

Since an organic electroluminescent element (OLED) has a simple structure as compared to other flat panel display devices elements such as an existing liquid crystal display (LCD), a plasma display panel (PDP), and a field emission display (FED), has various advantages in the manufacturing process, has high brightness and excellent viewing angle characteristics, and has a high response speed and a low driving voltage, the organic electroluminescent element has been actively developed and productized for use in a light source for a flat panel display such as a wall-mounted TV or a backlight of a display, a lighting, and a billboard.

For the organic electroluminescent element, the first organic EL element was reported by C. W. Tang et al. from Eastman Kodak Co. (C. W. Tang, S. A. Vanslyke, Applied Physics Letters, vol. 51, p. 913, 1987), and the light emission principle thereof is based on a principle in which in general, when a voltage is applied to the organic EL element, holes injected from a positive electrode are recombined with electrons injected from a negative electrode to form excitons as electron-hole pairs, and energy of the excitons is transmitted to a light emitting material and converted into light.

More specifically, the organic electroluminescent element has a structure including a negative electrode (electron injection electrode), a positive electrode (hole injection electrode), and one or more organic layers between the two electrodes. In this case, in the organic electroluminescent element, from a positive electrode, a hole injection layer (HIL), a hole transport layer (HTL), a light emitting layer (EML), and an electron transport layer (ETL) or an electron injection layer (EIL) are stacked in this order, and in order to increase the efficiency of the light emitting layer, an electron blocking layer (EBL) or a hole blocking layer (HBL) may be additionally included in front of and behind the light emitting layer.

The materials used in an organic layer of the electroluminescent element are mostly pure organic materials or complex compounds in which organic materials and metals form a complex, and may be classified into a hole injection material, a hole transport material, a light emitting material, an electron transport material, an electron injection material, and the like according to the use thereof.

Here, as the hole injection material or the hole transport material, organic materials readily oxidized and having an electrochemically stable state when oxidized are usually used. As the electron injection material or the electron transport material, organic materials readily reduced and having an electrochemically stable state when reduced are usually used.

Meanwhile, as the light emitting material, materials having a stable form in both oxidized and reduced states are preferred, and materials having high light emission efficiency of converting, when excitons are formed, the excitons to light are preferred. More specifically, the light emitting layer is composed of two materials, that is, a host and a dopant, the dopant needs to have high quantum efficiency, and it is preferred that the host material has a higher energy gap than the dopant material, and thus allows energy to be readily transferred to the dopant. Displays used for TVs, mobile device, and the like implement a full color with three colors of red, green, and blue, and the light emitting layer is composed of a red host/dopant, a green host/dopant, and a blue host/dopant.

For materials used as the existing blue dopant, the use of fluorescent molecules such as perylene, coumarine, anthracene, and pyrene is dominant, but there is a disadvantage in that the light emission spectrum and full width half the maximum of the dopant are so broad that pure blue light cannot be used when a device is manufactured. These characteristics are main causes which not only reduce efficiency of blue, but also make the use of a deep blue area difficult, in the resonance structure of the device.

Recently, a document relating the use of a boron-based dopant having a narrow emission spectrum of a device and high device efficiency has been published in Adv. Mater., 2016, 28, 2777-2781 and Angew. Chem. Int. Ed 2017, 56, 5087-5090, and disclosed in Korean Patent Application Laid-Open No. 10-2016-0119683. In the case of the boron-based blue dopant material introduced in the related art, boron atoms are included in the center and cyclized, and a result, the structure of the molecule maintains a planar state while boron forms only a three-coordinate bond.

The dopant having such a planar structure is similar to the energy level of the molecular vibration mode, and thus has an advantage in that the light emission spectrum and the full width half the maximum are narrowed, and thus pure light can be emitted. However, when a device is manufactured using the dopant having a planar structure, the intensity of the interaction with an adjacent dopant becomes strong due to the lack of the outermost electrons of the boron atom, resulting in an increase in the concentration quenching phenomenon of the dopant.

Therefore, there is a need for developing a new type of dopant which can solve the problems of reduction in efficiency according to the concentration of the dopant and of the concentration quenching phenomenon, which is the main cause for the long wavelength of the color coordinate, when a device is manufactured, while maintaining the advantage in which the light emission spectrum and the full width half the maximum are narrow.

DISCLOSURE

Technical Problem

The present invention has been made in an effort to provide an organic compound which is excellent in service life, efficiency, electrochemical stability, and thermal stability, and an organic electroluminescent element including the same.

The present invention provides an organic compound having a planar structure and having narrow light emission spectrum and full width half the maximum while minimizing the molecular π-π interaction in the molecule because the energy levels of the vibration mode of the molecule are almost similar, and capable of suppressing the concentration quenching phenomenon which may occur when the compound is used as a dopant.

Further, the present invention has also been made in an effort to provide an organic compound which enables an increase in efficiency and service life of a device, by including an atom, such as a boron-based element, which provides the planar structure of a compound of Formula 1, in order to hinder the production of an excimer in the molecule and increase the electron density of the core and the stability of the dopant.

The present invention has also been made in an effort to provide a blue-based blue host/dopant system suitable for an AM-OLED, and an organic electroluminescent element by using the organic compound.

TECHNICAL SOLUTION

The present invention provides a compound represented by Formula 1 as an organic compound having narrow light emission spectrum and full width half the maximum and capable of suppressing the concentration quenching phenomenon in spite of high doping concentration.

Further, the present invention uses a compound represented by Formula 1 a dopant in order to provide an organic electroluminescent element which is excellent in light emission efficiency and service life characteristics.

Advantageous Effects

The present invention provides an organic electroluminescent element which has a low driving voltage, high efficiency in a low doping area, and a relatively suppressed reduction in efficiency even in an overdoping area, and is particularly excellent in characteristics such as service life, by using an organic compound which is excellent in service life, efficiency, electrochemical stability, and thermal stability.

BEST MODE

Hereinafter, exemplary embodiments of the present invention will be described in detail. However, the exemplary embodiments are suggested as an example, the present invention is not limited thereby, and the present invention is defined only by the scope of the claims to be described below.

In the present invention, "substitution" means, unless otherwise defined, that at least one hydrogen in a substituent or compound is substituted with one or more substituents selected from the group consisting of deuterium, a cyano group, a nitro group, a halogen group, a hydroxyl group, an alkylthio group having 1 to 4 carbon atoms, an aryloxy group having 6 to 30 carbon atoms, an alkoxy group having 1 to 30 carbon atoms, an alkylamino group having 1 to 30 carbon atoms, an arylamino group having 6 to 30 carbon atoms, an aralkylamino group having 6 to 30 carbon atoms, a heteroarylamino group having 2 to 24 carbon atoms, an alkylsilyl group having 1 to 30 carbon atoms, an arylsilyl group having 6 to 30 carbon atoms, an alkyl group having 1 to 30 carbon atoms, an alkenyl group having 2 to 30 carbon atoms, an alkynyl group having 2 to 24 carbon atoms, an aralkyl group having 7 to 30 carbon atoms, an aryl group having 6 to 30 carbon atoms, a heteroaryl group having 5 to 60 nuclear atoms, and a heteroarylalkyl group having 6 to 30 carbon atoms.

Further, among the substituted cyano group, nitro group, halogen group, hydroxyl group, alkylthio group having 1 to 4 carbon atoms, aryloxy group having 6 to 30 carbon atoms, alkoxy group having 1 to 30 carbon atoms, alkylamino group having 1 to 30 carbon atoms, arylamino group having 6 to 30 carbon atoms, aralkylamino group having 6 to 30 carbon atoms, heteroarylamino group having 2 to 24 carbon atoms, alkylsilyl group having 1 to 30 carbon atoms, arylsilyl group having 6 to 30 carbon atoms, alkyl group having 1 to 30 carbon atoms, alkenyl group having 2 to 30 carbon atoms, alkynyl group having 2 to 24 carbon atoms, aralkyl group having 7 to 30 carbon atoms, aryl group having 6 to 30 carbon atoms, heteroaryl group having 5 to 60 nuclear atoms, and heteroarylalkyl group having 6 to 30 carbon atoms, two adjacent substituents may also be fused to form a ring.

In the present invention, "halogen group" is fluorine, chlorine, bromine, or iodine.

In the present invention, "alkyl" means a monovalent substituent derived from a linear or branched saturated hydrocarbon having 1 to 40 carbon atoms. Examples thereof include methyl, ethyl, propyl, isobutyl, isopropyl, tert-butyl, sec-butyl, pentyl, iso-amyl, hexyl, and the like, but are not limited thereto.

In the present invention, "alkenyl" means a monovalent substituent derived from a linear or branched unsaturated hydrocarbon having 2 to 40 carbon atoms and having one or more carbon-carbon double bonds. Examples thereof include vinyl, allyl, isopropenyl, 2-butenyl, and the like, but are not limited thereto.

In the present invention, "alkynyl" means a monovalent substituent derived from a linear or branched unsaturated hydrocarbon having 2 to 40 carbon atoms and having one or more carbon-carbon triple bonds. Examples thereof include ethynyl, 2-propynyl, and the like, but are not limited thereto.

In the present invention, "alkylthio" means the above-described alkyl group which is bonded through a sulfur linkage (—S—).

In the present invention, "aryl" means a monovalent substituent derived from an aromatic hydrocarbon having 6 to 60 carbon atoms and having a single ring or a combination of two or more rings. Further, the aryl may also include a form in which two or more rings are simply pendant to or fused with each other. Examples of the aryl include phenyl, naphthyl, phenanthryl, anthryl, dimethylfluorenyl, pyrenyl, terphenyl, and the like, but are not limited thereto.

In the present invention, "heteroaryl" means a monovalent substituent derived from a monoheterocyclic or polyheterocyclic aromatic hydrocarbon having 5 to 60 nuclear atoms. In this case, one or more carbons, preferably 1 to 3 carbons in the ring are substituted with a heteroatom such as N, O, S, or Se. Further, the heteroaryl may also include a form in which two or more rings are simply pendant to or fused with each other, and a fused form with an aryl group. Examples of the heteroaryl include: a 6-membered monocyclic ring, such as pyridyl, pyrazinyl, pyrimidinyl, pyridazinyl, and triazinyl, a polycyclic ring, such as phenoxathienyl, indolizinyl, indolyl, purinyl, quinolyl, benzothiazole, and carbazolyl, 2-furanyl, N-imidazolyl, 2-isoxazolyl, 2-pyridinyl, 2-pyrimidinyl, and the like, but are not limited thereto.

In the present invention, "aryloxy" means a monovalent substituent represented by RO—, in which R is an aryl having 6 to 60 carbon atoms. Examples of the aryloxy include phenyloxy, naphthyloxy, diphenyloxy, and the like, but are not limited thereto.

In the present invention, "alkyloxy" means a monovalent substituent represented by R'O—, in which R' is an alkyl having 1 to 40 carbon atoms, and may include a linear, branched, or cyclic structure. Examples of the alkyloxy include methoxy, ethoxy, n-propoxy, 1-propoxy, t-butoxy, n-butoxy, pentoxy, and the like, but are not limited thereto.

In the present invention, "aralkyl" means an aryl-alkyl group in which aryl and alkyl are as described above. A preferred aralkyl includes a lower alkyl group. Non-limiting examples of a suitable aralkyl group include benzyl, 2-phenethyl, and naphthalenylmethyl. Binding to the parent moiety is achieved through alkyl.

In the present invention, "arylamino group" means an amine group substituted with an aryl group.

In the present invention, "heteroarylamino group" means an amine group substituted with an aryl group and a heterocyclic group.

In the present invention, "cycloalkyl" means a monovalent substituent derived from a monocyclic or polycyclic non-aromatic hydrocarbon having 3 to 40 carbon atoms. Examples of the cycloalkyl include cyclopropyl, cyclobutyl, cyclopentyl, cyclohexyl, norbornyl, adamantine, and the like, but are not limited thereto.

In the present invention, "heterocycloalkyl" means a monovalent substituent derived from a non-aromatic hydrocarbon having 3 to 40 nuclear atoms, and one or more carbons, preferably 1 to 3 carbons in the ring are substituted with a heteroatom such as N, O, S, or Se. Examples of the heterocycloalkyl include morpholine, piperazine, and the like, but are not limited thereto.

In the present invention, "alkylsilyl" means a silyl substituted with an alkyl having 1 to 40 carbon atoms, and "arylsilyl" means a silyl substituted with an aryl having 6 to 60 carbon atoms.

In the present invention, "fused ring" means a fused aliphatic ring, a fused aromatic ring, a fused heteroaliphatic ring, a fused heteroaromatic ring, or a combined form thereof.

In the present invention, "being bonded to an adjacent group to form a ring" means being bonded to an adjacent group to form a substituted or unsubstituted aliphatic hydrocarbon ring; a substituted or unsubstituted aromatic hydrocarbon ring; a substituted or unsubstituted aliphatic hetero ring; a substituted or unsubstituted aromatic hetero ring; or a fused ring thereof.

In the present specification, "aliphatic hydocarbon ring" means a ring composed of only carbon and hydrogen atoms as a ring which is not an aromatic group.

In the present specification, examples of "aromatic hydrocarbon ring" include a phenyl group, a naphthyl group, an anthracenyl group, and the like, but are not limited thereto.

In the present specification, "aliphatic hetero ring" means an aliphatic ring including one or more heteroatoms.

In the present specification, "aromatic hetero ring" means an aromatic ring including one or more heteroatoms.

In the present specification, the aliphatic hydrocarbon ring, the aromatic hydrocarbon ring, the aliphatic hetero ring, and the aromatic hetero ring may be monocyclic or polycyclic.

In the present specification, "concentration quenching" means that the light emitting efficiency of a device is decreased as the concentration of a dopant molecule is increased.

In the present specification, "boron-based element", "boron-based compound", or "boron-based dopant" means a boron (B) element having an atomic number of 5, and a compound or dopant including boron.

MODE FOR INVENTION

An exemplary embodiment of the present invention provides a compound represented by the following Formula 1 as an organic compound of an organic electroluminescent element.

[Formula 1]

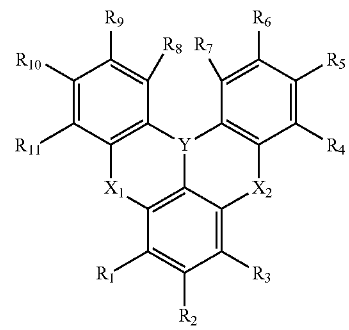

Here, Y is B, P(═O) or P(═S), $X_1$ and $X_2$ are the same as or different from each other, and are each independently selected from the group consisting of O, S, Se and $N(R_{12})$, $R_1$ to $R_{12}$ are the same as or different from each other, and are each independently selected from the group consisting of hydrogen, deuterium, a cyano group, a trifluoromethyl group, a nitro group, a halogen group, a hydroxyl group, a substituted or unsubstituted alkylthio group having 1 to 4 carbon atoms, a substituted or unsubstituted alkyl group having 1 to 30 carbon atoms, a substituted or unsubstituted cycloalkyl group having 1 to 20 carbon atoms, a substituted or unsubstituted alkenyl group having 2 to 30 carbon atoms, a substituted or unsubstituted alkynyl group having 2 to 24 carbon atoms, a substituted or unsubstituted aralkyl group having 7 to 30 carbon atoms, a substituted or unsubstituted aryl group having 6 to 30 carbon atoms, a substituted or unsubstituted heteroaryl group having 5 to 60 nuclear atoms, a substituted or unsubstituted heteroarylalkyl group having 6 to 30 carbon atoms, a substituted or unsubstituted alkoxy group having 1 to 30 carbon atoms, a substituted or unsubstituted alkylamino group having 1 to 30 carbon atoms, a substituted or unsubstituted arylamino group having 6 to 30 carbon atoms, a substituted or unsubstituted aralkylamino group having 6 to 30 carbon atoms, a substituted or unsubstituted heteroarylamino group having 2 to 24 carbon atoms, a substituted or unsubstituted alkylsilyl group having 1 to 30 carbon atoms, a substituted or unsubstituted arylsilyl group having 6 to 30 carbon atoms, and a substituted or unsubstituted aryloxy group having 6 to 30 carbon atoms, and may be bonded to an adjacent group to form a substituted or unsubstituted ring, at least one of $R_1$ to $R_{12}$ is a substituted or unsubstituted cycloalkyl group having 1 to 20 carbon atoms, and in this case, each of $R_1$ to $R_{12}$ may be substituted with one or more substituents selected from the group consisting of hydrogen, deuterium, a cyano group, a nitro group, a halogen group, a hydroxyl group, an alkylthio group having 1 to 4 carbon atoms, a substituted or unsubstituted alkyl group having 1 to 30 carbon atoms, a substituted or unsubstituted cycloalkyl group having 1 to 20 carbon atoms, an aryloxy group having 6 to 30 carbon atoms, an alkoxy group having 1 to 30 carbon atoms, an alkylamino group having 1 to 30 carbon atoms, an arylamino group having 6 to 30 carbon atoms, an aralkylamino group having 6 to 30 carbon atoms, a heteroarylamino group having 2 to 24 carbon atoms, an alkylsilyl group having 1 to 30 carbon atoms, an arylsilyl group having 6 to 30 carbon atoms, an alkyl group having 1 to 30 carbon atoms, an alkenyl group having 2 to 30 carbon atoms, an alkynyl group having 2 to 24 carbon atoms, an aralkyl group having 7 to 30 carbon atoms, an aryl group having 6 to 30 carbon atoms, a heteroaryl group having 5 to 60 nuclear atoms, and a heteroarylalkyl group having 6 to 30 carbon atoms.

The compound of Formula 1 according to the present invention includes at least one or more substituted or unsubstituted cycloalkyl groups having 1 to 20 carbon atoms. Formula 1 according to the present invention includes at least one or more substituted or unsubstituted cycloalkyl groups having 1 to 20 carbon atoms to adjust the polarity of the molecule and minimize the phi-phi interaction of the molecule.

Accordingly, even when the compound of Formula 1 according to the present invention is used in an excessive amount as a dopant, the concentration quenching phenomenon may be suppressed, and furthermore, since the compound of Formula 1 hinders production of an excimer and increases the electron density and stability of the core, the light emitting efficiency and service life of a device to which the organic compound according to the present invention is applied are increased.

Further, a substituted or unsubstituted cycloalkyl group having 1 to 20 carbon atoms substituted with the compound of Formula 1 may not affect the energy level according to the localization of electrons, and may improve the stability of a thin film by increasing the boiling point or glass transition temperature thereof.

According to a preferred exemplary embodiment of the present invention, in the following Formula 1, Y is B, and $X_1$ and $X_2$ are each independently $N(R_{12})$, and may be the same as or different from each other.

[Formula 1]

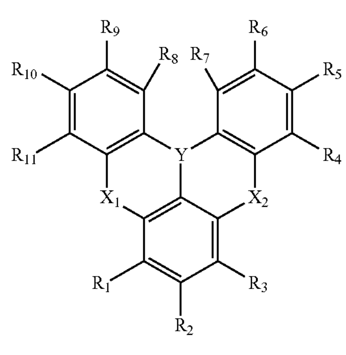

According to an exemplary embodiment of the present invention, in Formula 1, $R_1$ to $R_3$ are the same as or different from each other, and may be each independently selected from the group consisting of hydrogen, deuterium, a cyano group, a trifluoromethyl group, a nitro group, a halogen group, a hydroxyl group, a substituted or unsubstituted alkylthio group having 1 to 4 carbon atoms, a substituted or unsubstituted alkyl group having 1 to 30 carbon atoms, a cycloalkyl group having 1 to 20 carbon atoms, a substituted or unsubstituted alkenyl group having 2 to 30 carbon atoms, a substituted or unsubstituted alkynyl group having 2 to 24 carbon atoms, a substituted or unsubstituted aryl group having 6 to 30 carbon atoms, and a substituted or unsubstituted heteroaryl group having 5 to 60 nuclear atoms.

According to a preferred exemplary embodiment of the present invention, $R_1$ to $R_3$ are the same as or different from each other, and may be each independently selected from the group consisting of hydrogen, a substituted or unsubstituted cyclopropyl group, a substituted or unsubstituted cyclobutyl group, a substituted or unsubstituted cyclopentyl group, a substituted or unsubstituted cyclohexyl group, a substituted or unsubstituted cycloheptyl group, and a substituted or unsubstituted adamantyl group, and more preferably, at least one or more of $R_1$ to $R_3$ are a substituted or unsubstituted cyclohexyl group or a substituted or unsubstituted adamantyl group.

According to another exemplary embodiment of the present invention, in Formula 1, $R_4$ to $R_{11}$ are the same as or different from each other, and may be each independently selected from the group consisting of hydrogen, deuterium, a cyano group, a trifluoromethyl group, a halogen group, a trimethylsilylethynyl group (TMS), an alkylthio group having 1 to 4 carbon atoms, an alkylamino group having 1 to 10 carbon atoms, an alkyl group having 1 to 10 carbon atoms, an alkoxy group having 1 to 10 carbon atoms, a cycloalkyl group having 1 to 30 carbon atoms, a substituted or unsubstituted aryl group having 6 to 20 carbon atoms, a substituted or unsubstituted heteroaryl group having 5 to 60 nuclear atoms, a substituted or unsubstituted heteroarylalkyl group having 6 to 20 carbon atoms, a substituted or unsubstituted alkoxy group having 1 to 10 carbon atoms, a substituted or unsubstituted alkylamino group having 1 to 10 carbon atoms, a substituted or unsubstituted arylamino group having 6 to 20 carbon atoms, a substituted or unsubstituted aralkylamino group having 6 to 20 carbon atoms, a substituted or unsubstituted heteroarylamino group having 2 to 24 carbon atoms, a substituted or unsubstituted alkylsilyl group having 1 to 20 carbon atoms, a substituted or unsubstituted arylsilyl group having 6 to 20 carbon atoms, and a substituted or unsubstituted aryloxy group having 6 to 20 carbon atoms.

More specifically, $R_4$ to $R_{11}$ may be each independently selected from the group consisting of hydrogen, deuterium, a methyl group, an ethyl group, an isopropyl group, a sec-butyl group, a tert-butyl group, a cyano group, a trifluoromethyl group, a fluoro group, a trimethylsilylethynyl group (TMS), a dimethylamino group, a diethylamino group, a methylthieno group, an ethylthieno group, a methoxy group, an ethoxy group, a substituted or unsubstituted cyclopropyl group, a substituted or unsubstituted cyclobutyl group, a substituted or unsubstituted cyclopentyl group, a substituted or unsubstituted cyclohexyl group, a substituted or unsubstituted cycloheptyl group, a substituted or unsubstituted adamantyl group, a substituted or unsubstituted phenyl group, a substituted or unsubstituted naphthyl group, a substituted or unsubstituted anthracenyl group, a substituted or unsubstituted phenanthryl group, a substituted or unsubstituted naphthacenyl group, a substituted or unsubstituted pyrenyl group, a substituted or unsubstituted biphenyl group, a substituted or unsubstituted p-terphenyl group, a substituted or unsubstituted m-terphenyl group, a substituted or unsubstituted chrycenyl group, a substituted or unsubstituted phenothiazinyl group, a substituted or unsubstituted phenoxazinyl group, a substituted or unsubstituted pyridyl group, a substituted or unsubstituted pyrimidinyl group, a substituted or unsubstituted pyrazinyl group, a substituted or unsubstituted triazinyl group, a substituted or unsubstituted thiophenyl group, a substituted or unsubstituted triphenylenyl group, a substituted or unsubstituted perylenyl group, a substituted or unsubstituted indenyl group, a substituted or unsubstituted furanyl group, a substituted or unsubstituted pyrrolyl group, a substituted or unsubstituted pyrazolyl group, a substituted or unsubstituted imidazolyl group, a substituted or unsubstituted triazolyl group, a substituted or unsubstituted oxazolyl group, a substituted or unsubstituted thiazolyl group, a substituted or unsubstituted oxadiazolyl group, a substituted or unsubstituted thiadiazolyl group, a substituted or unsubstituted pyridyl group, a substituted or unsubstituted pyrimidinyl group, a substituted or unsubstituted pyrazinyl group, a substituted or unsubstituted benzofuranyl group, a substituted or unsubstituted benzimidazolyl group, a substituted or unsubstituted indolyl group, a substituted or unsubstituted quinolinyl group, a substituted or unsubstituted isoquinolinyl group, a substituted or unsubstituted quinazolinyl group, a substituted or unsubstituted qunioxalinyl group, a substituted or unsubstituted naphthyridinyl group, a substituted or unsubstituted benzoxazinyl group, a substituted or unsubstituted benzothiazinyl group, a substituted or unsubstituted acridinyl group, and the following Formulae 2 to 6.

[Formula 2]

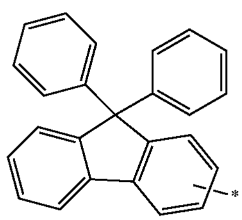

[Formula 3]

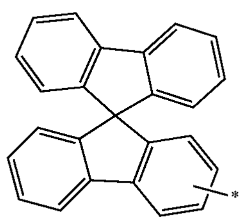

[Formula 4]

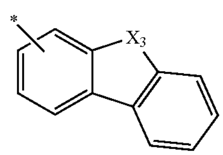

[Formula 5]

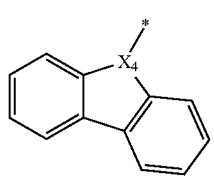

[Formula 6]

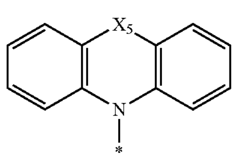

In the formulae, $X_3$ and $X_5$ are S, O, N(R'), C(R')(R"), or Si(R')(R"); and $X_4$ is N, and R' and R" are each independently hydrogen, an alkyl group having 1 to 4 carbon atoms, or an aryl group having 6 to 20 carbon atoms. As an example, $X_3$ and $X_5$ are S, O, N-Ph, $CH_2$, $C(CH_3)_2$, or $Si(CH_3)_2$; and R' and R" may be each independently hydrogen, a methyl group, an ethyl group, a propyl group, a phenyl group, and the like.

More preferably, one or more of $R_4$ to $R_{11}$ are a substituted or unsubstituted aryl group having 6 to 20 carbon atoms, and the aryl group is substituted with one or more substituents selected from the group consisting of deuterium, a methyl group, an ethyl group, an isopropyl group, a sec-butyl group, a tert-butyl group, a cyano group, a trifluoromethyl group, a fluoro group, a trimethylsilylethynyl group (TMS), a dimethylamino group, a diethylamino group, a methylthieno group, an ethylthieno group, a methoxy group, an ethoxy group, a phenoxy group, a cyclopropyl group, a cyclobutyl group, a cyclopentyl group, a cyclohexyl group, a cycloheptyl group, an adamantyl group, a phenyl group, a naphthyl group, an anthracenyl group, a phenanthryl group, a naphthacenyl group, a pyrenyl group, a biphenyl group, a p-terphenyl group, an m-terphenyl group, a chrycenyl group, a phenothiazinyl group, a phenoxazinyl group, a pyridyl group, a pyrimidinyl group, a pyrazinyl group, a triazinyl group, a thiophenyl group, a triphenylenyl group, a perylenyl group, an indenyl group, a furanyl group, a pyrrolyl group, a pyrazolyl group, an imidazolyl group, a triazolyl group, an oxazolyl group, a thiazolyl group, an oxadiazolyl group, a thiadiazolyl group, a pyridyl group, a pyrimidinyl group, a pyrazinyl group, a benzofuranyl group, a benzimidazolyl group, an indolyl group, a quinolinyl group, an isoquinolinyl group, a quinazolinyl group, a qunioxalinyl group, a naphthyridinyl group, a benzoxazinyl group, a benzothiazinyl group, an acridinyl group, and the following Formulae 2 to 13.

[Formula 2]

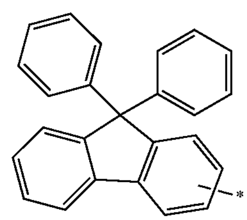

[Formula 3]

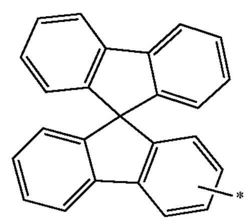

[Formula 4]

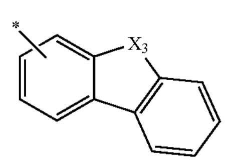

[Formula 5]

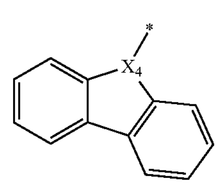

-continued

[Formula 6]

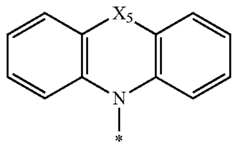

[Formula 7]

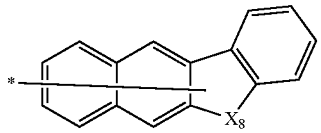

[Formula 8]

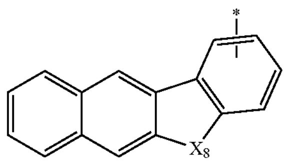

[Formula 9]

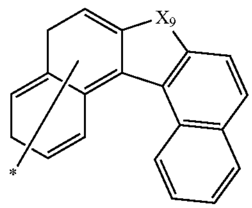

[Formula 10]

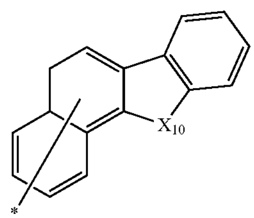

[Formula 11]

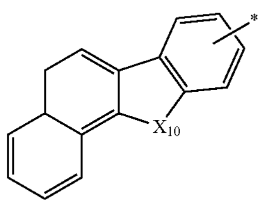

[Formula 12]

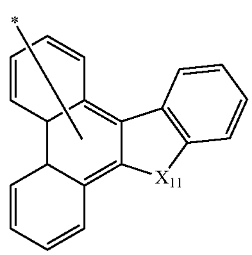

[Formula 13]

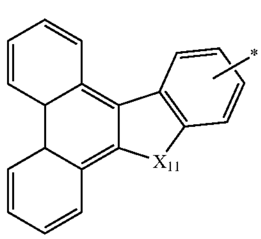

In the formulae, $X_3$, $X_5$, and $X_8$ to $X_{11}$ are S, O, N(R'), C(R')(R"), or Si(R')(R"); and $X_4$ is N, and R' and R" are each independently hydrogen, an alkyl group having 1 to 4 carbon atoms, or an aryl group having 6 to 20 carbon atoms. As an example, $X_3$, $X_5$, and $X_8$ to $X_{11}$ are S, O, N-Ph, $CH_2$, $C(CH_3)_2$, or $Si(CH_3)_2$; and R' and R" may be each independently hydrogen, a methyl group, an ethyl group, a propyl group, a phenyl group, and the like.

According to a preferred exemplary embodiment of the present invention, the compound represented by Formula 1 may be selected from the group consisting of the following compounds, but is not limited thereto.

1

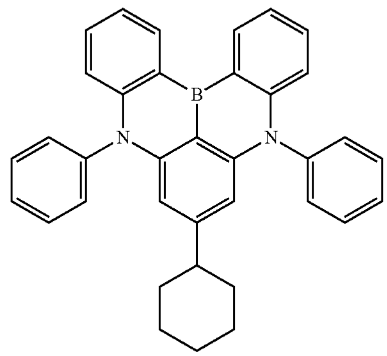

2

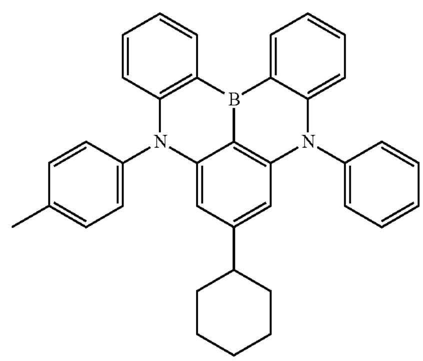

3

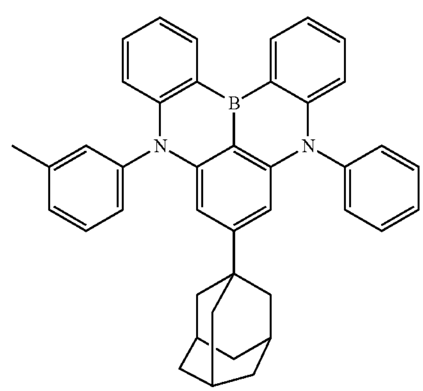

-continued
4
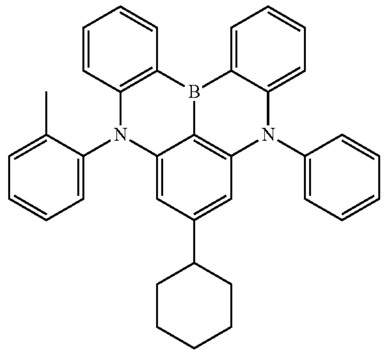
5
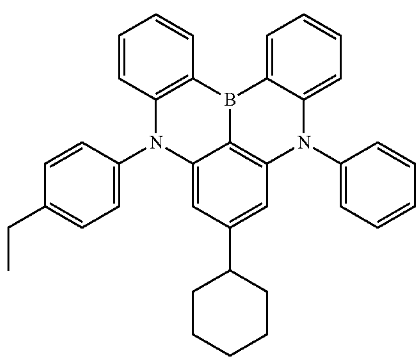
6
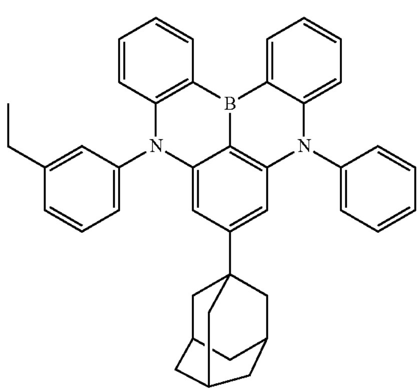
7
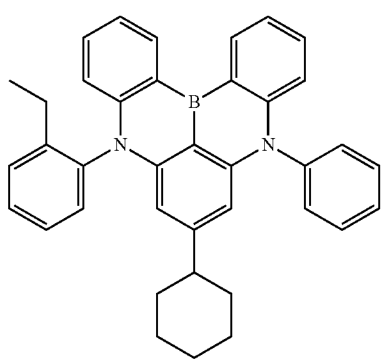
-continued
8
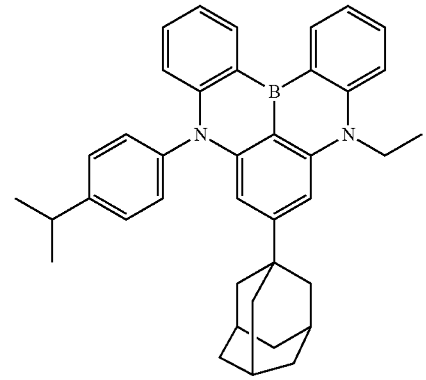
9
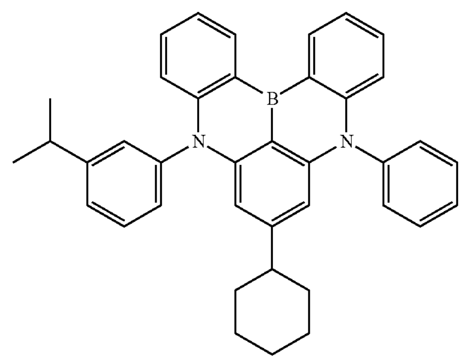
10
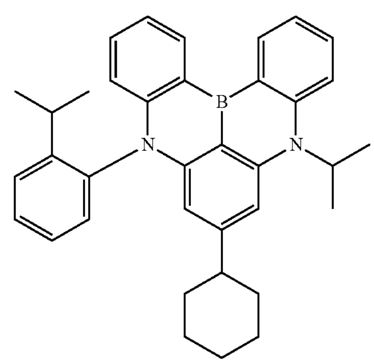
11
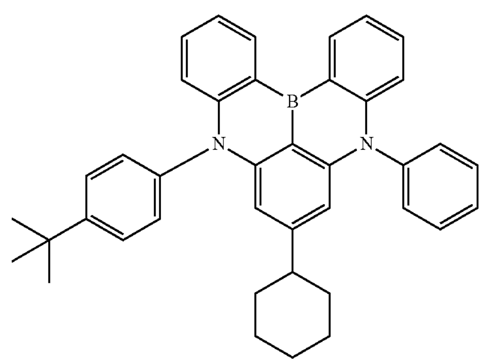

-continued
12
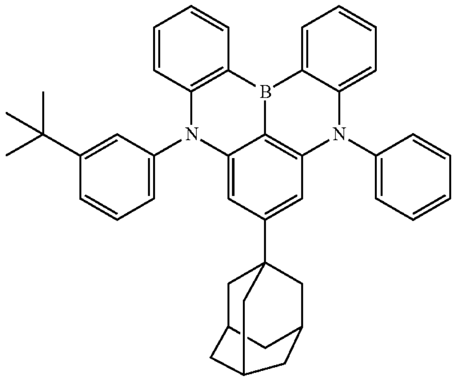
13
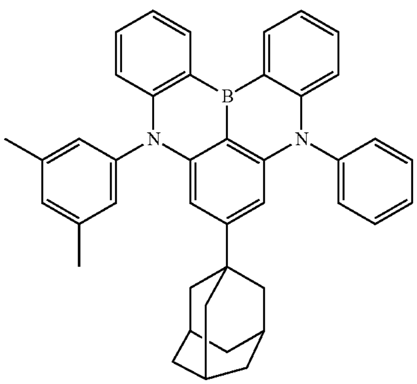
14
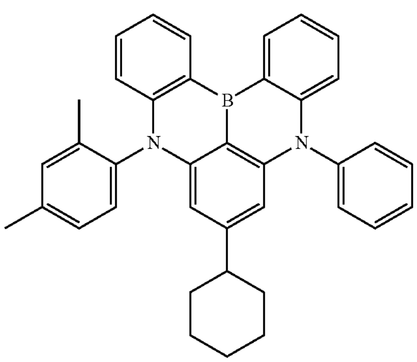
15
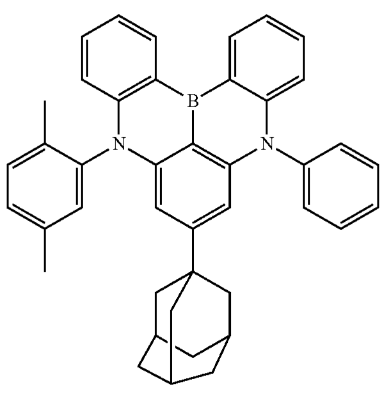
-continued
16
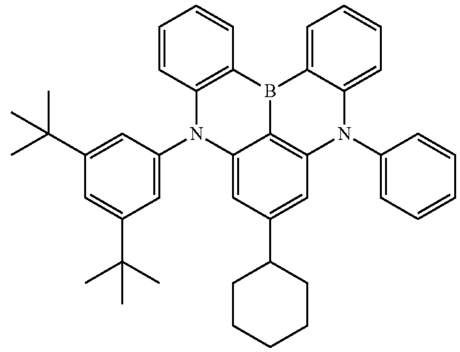
17
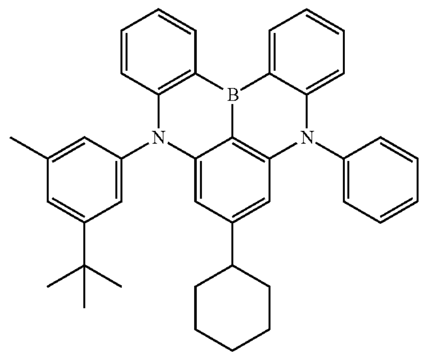
18
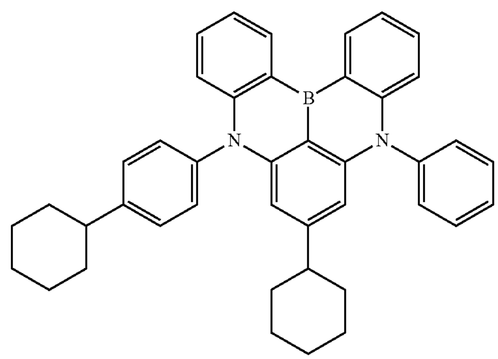
19
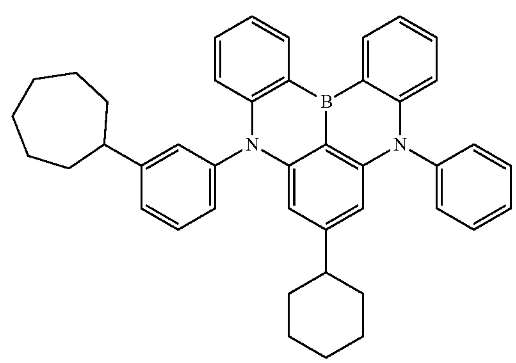

-continued
20
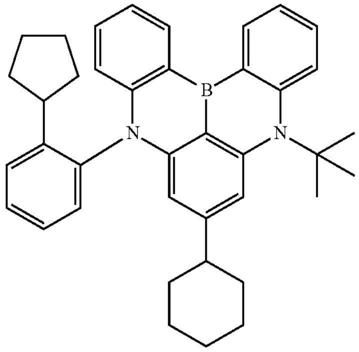
21
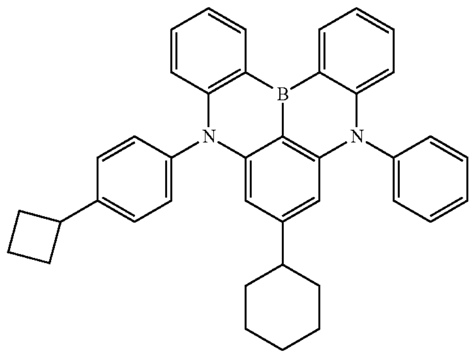
22
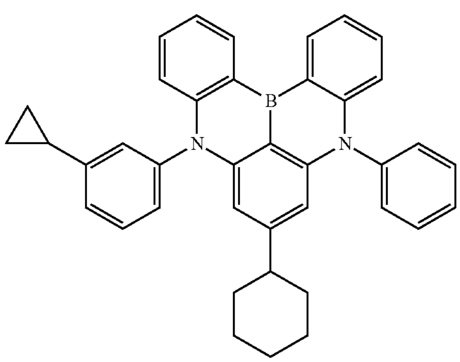
23
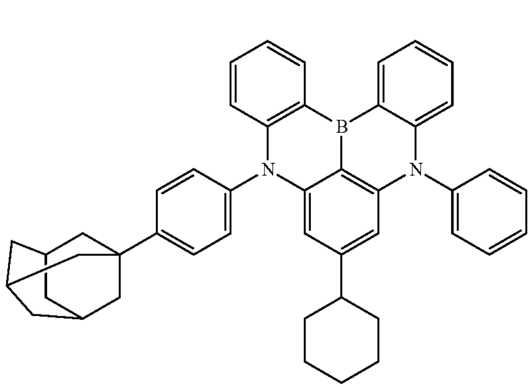
-continued
24
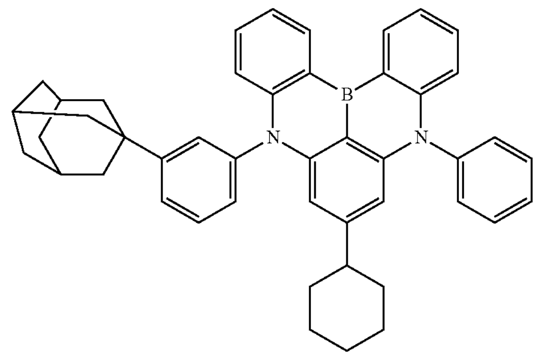
25
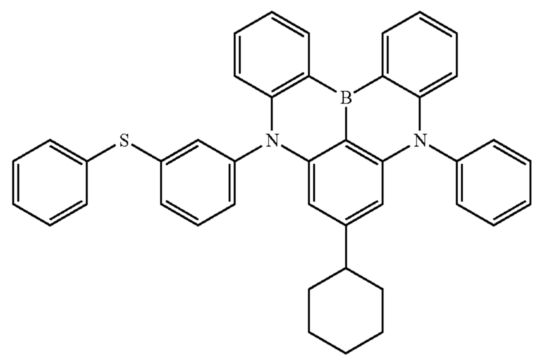
26
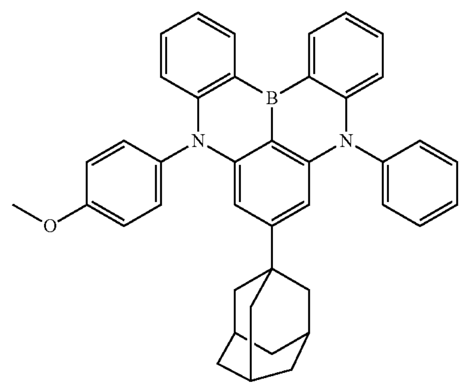
27
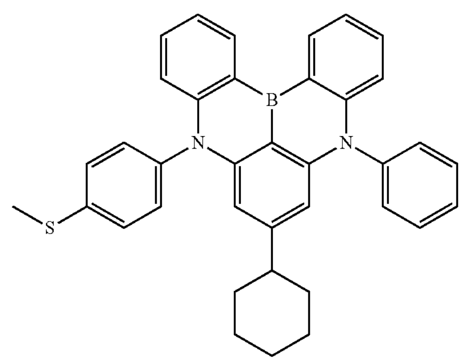

-continued
28
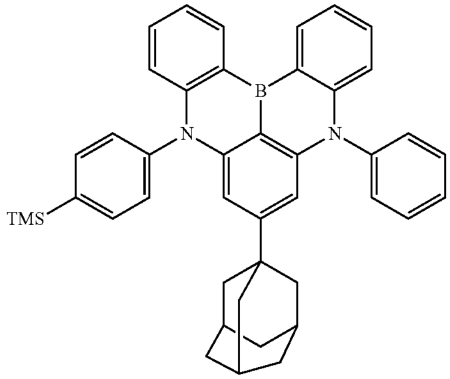
29
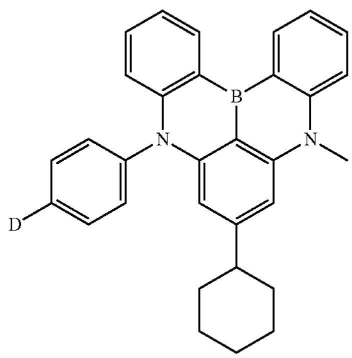
30
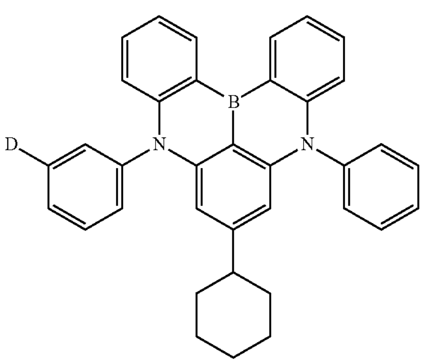
31
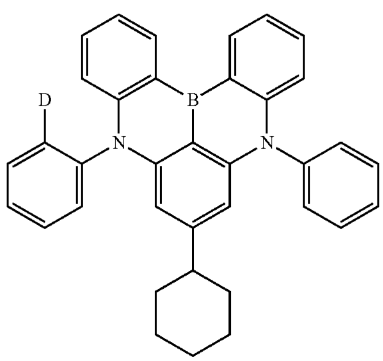
-continued
32
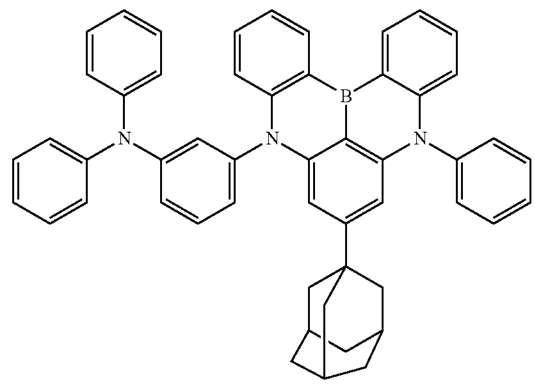
33
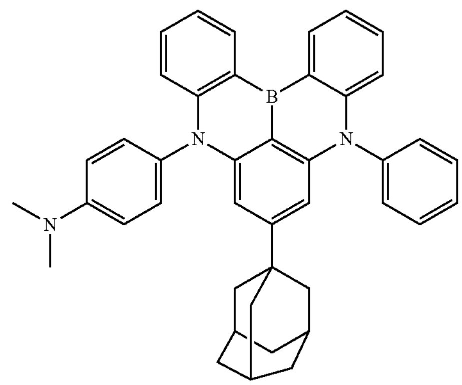
34
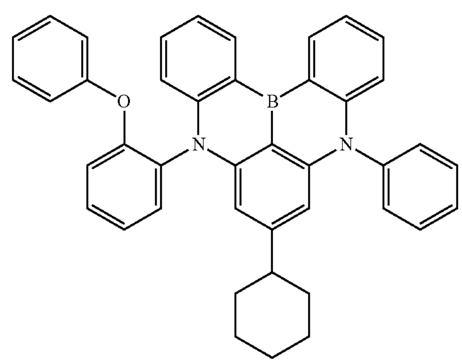
35
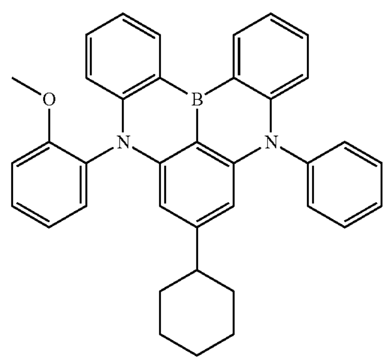

-continued
36
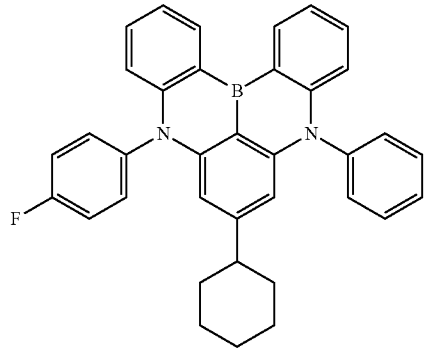
37
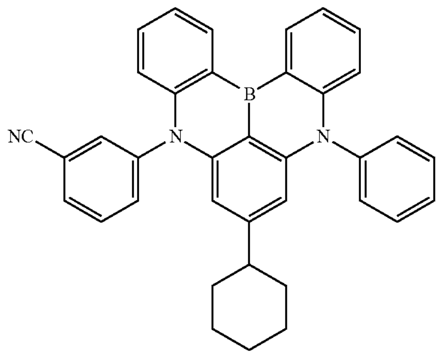
38
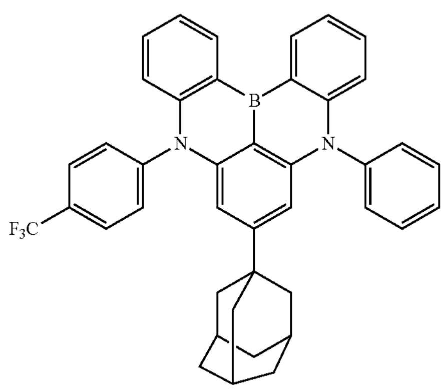
39
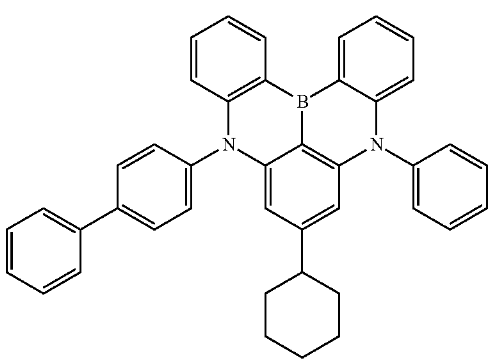
-continued
40
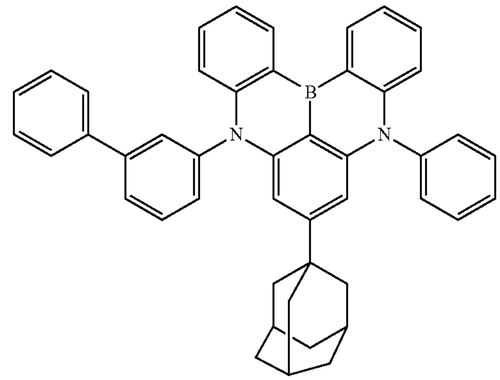
41
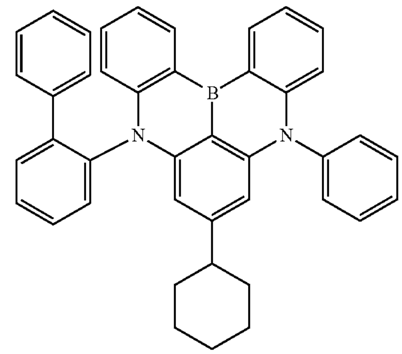
42
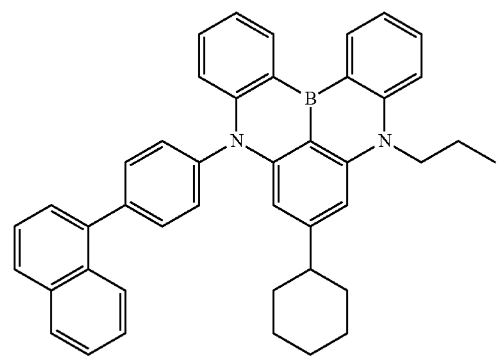
43
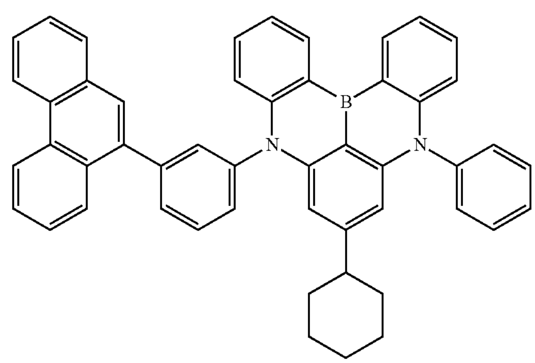

44
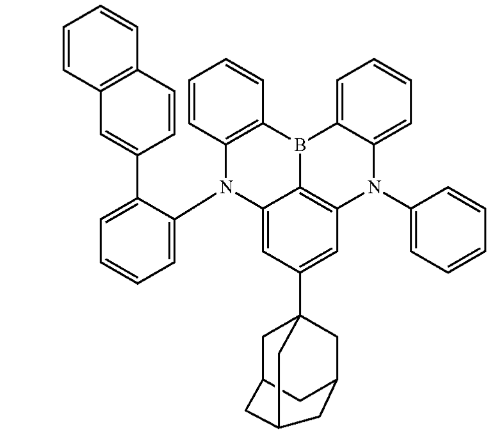
45
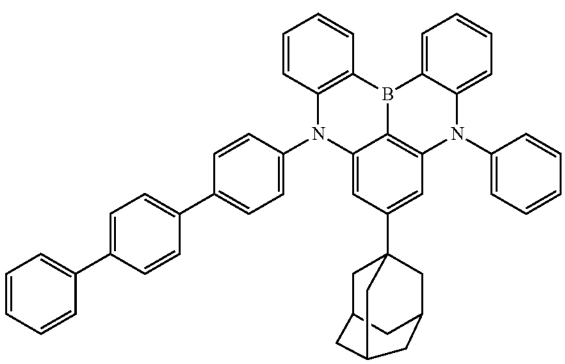
46
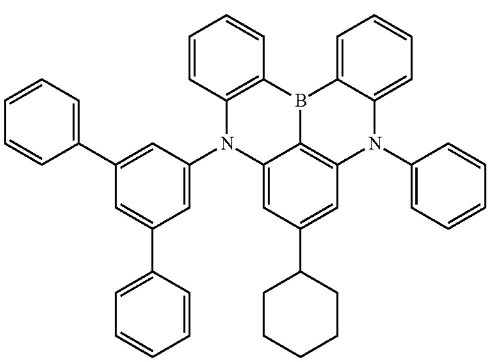
47
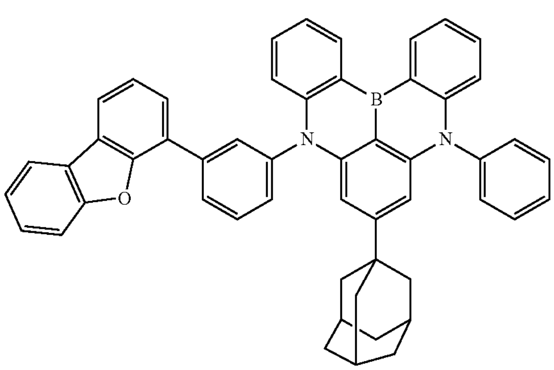
48
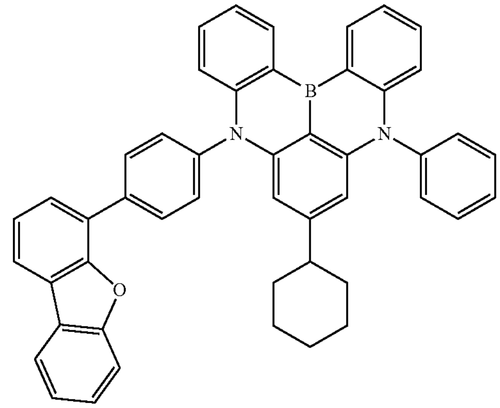
49
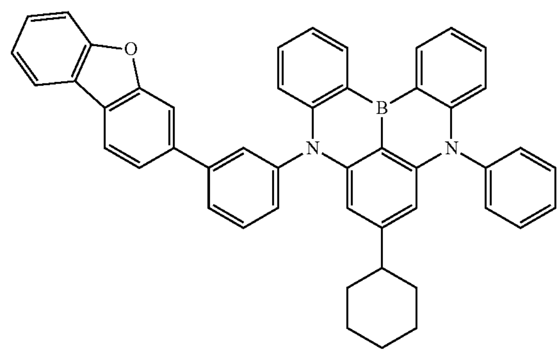
50
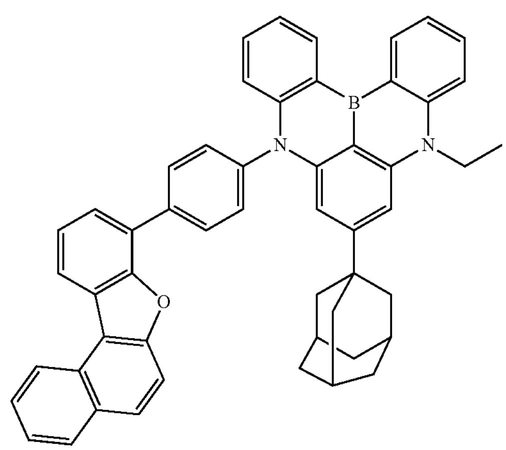

-continued
51
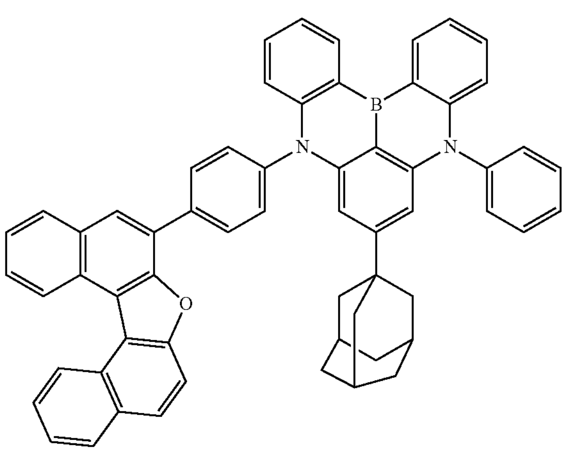
52
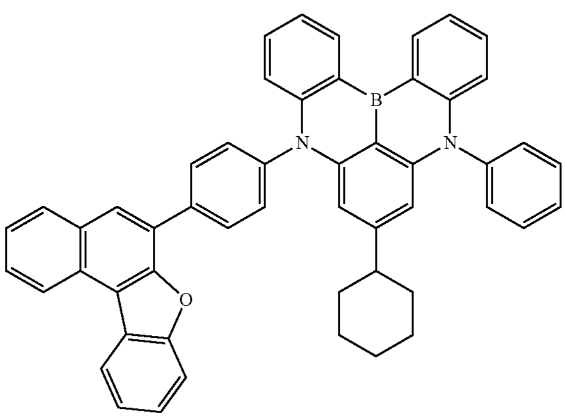
53
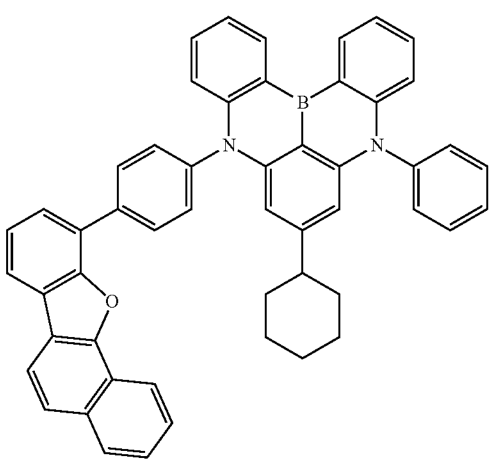
-continued
54
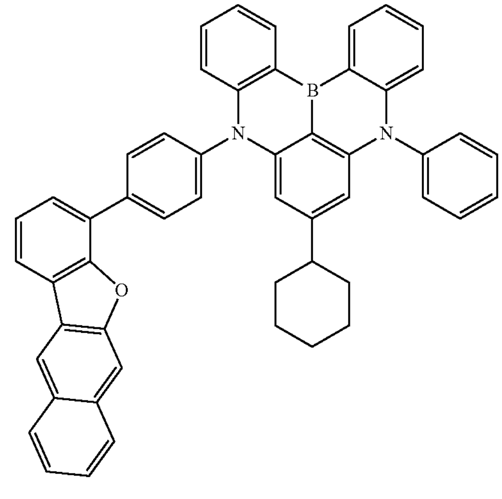
55
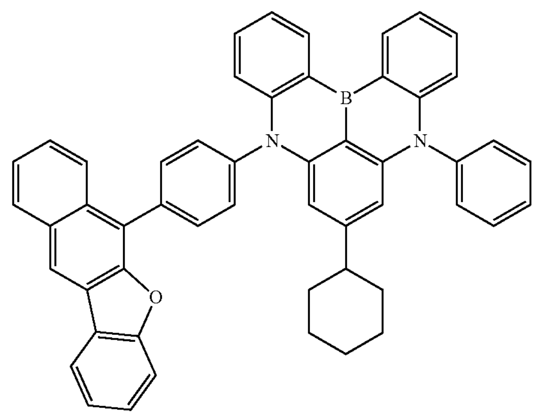
56
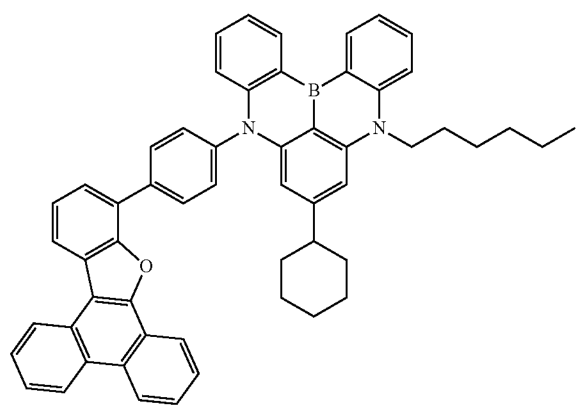

-continued
57
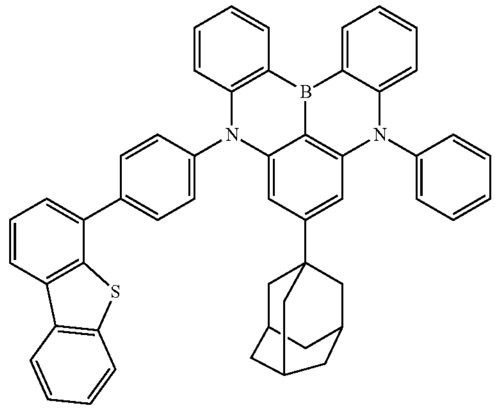
58
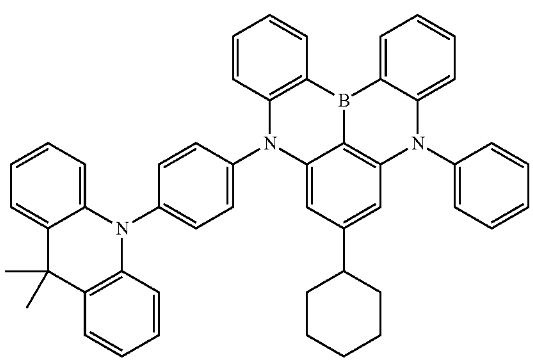
59
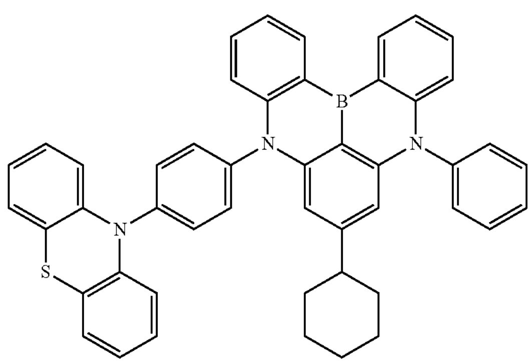
60
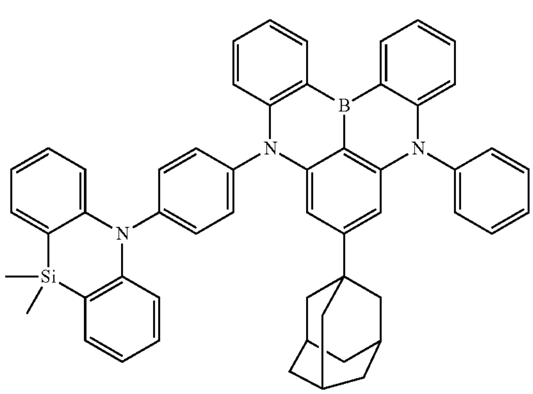
-continued
61
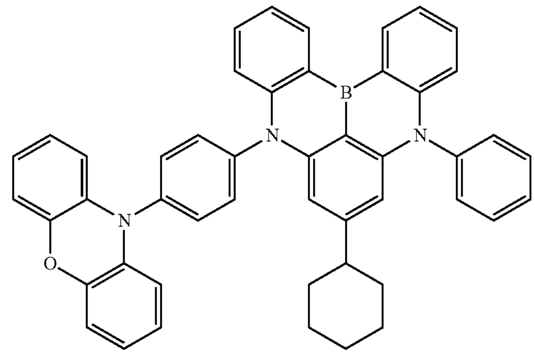
62
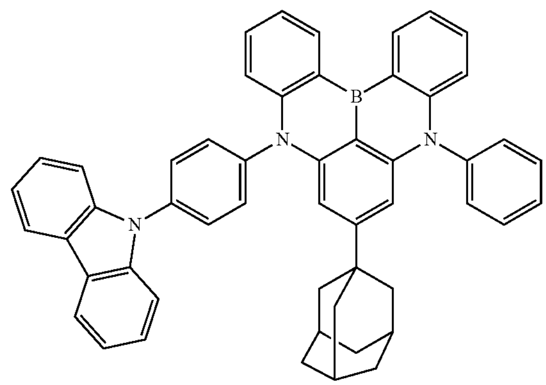
63
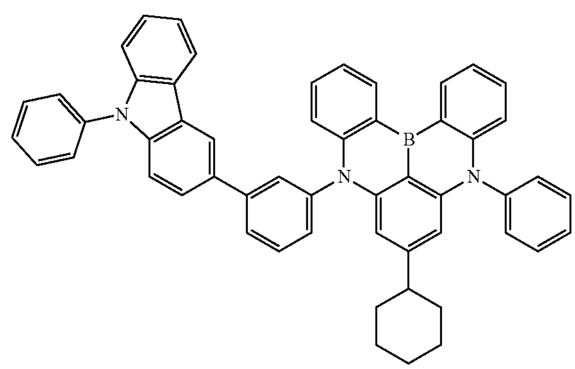
64
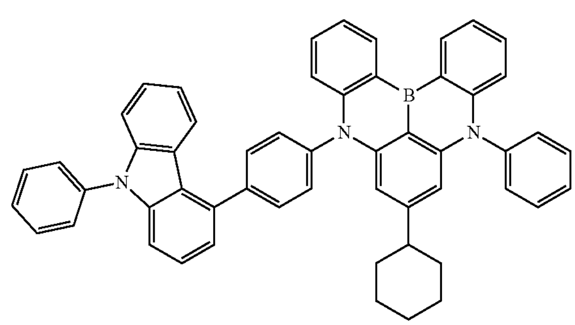

-continued
65
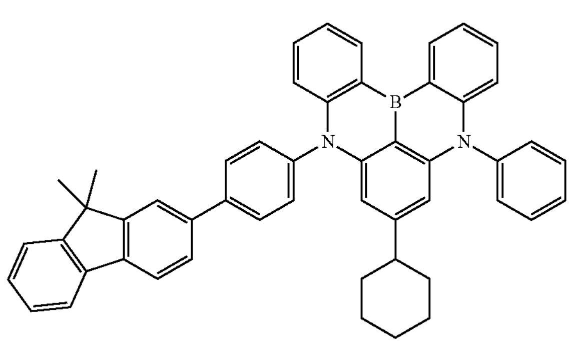
66
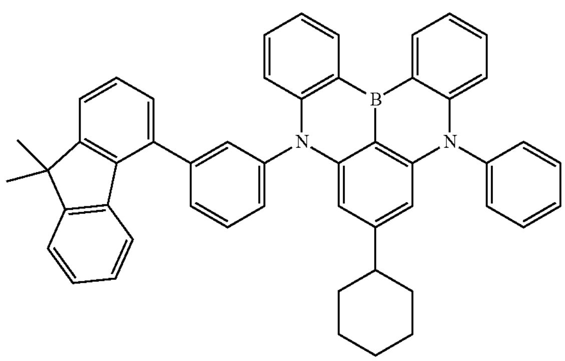
67
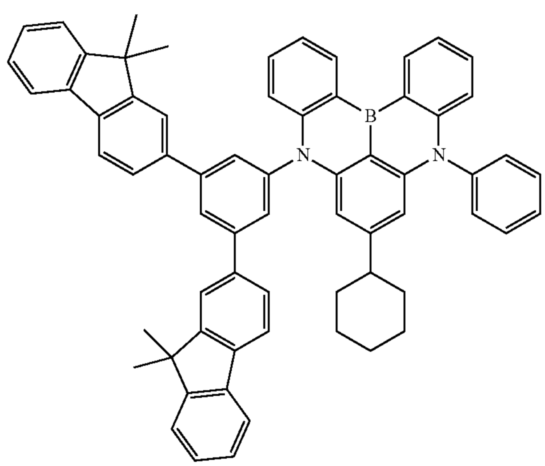
68
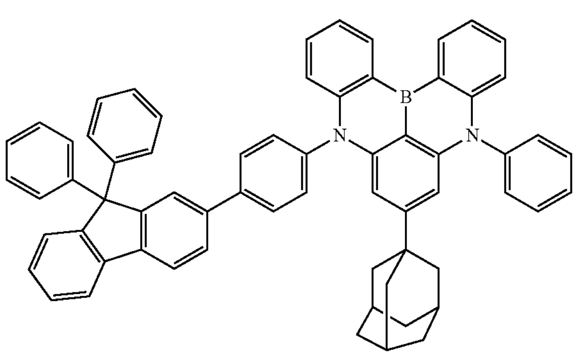
-continued
69
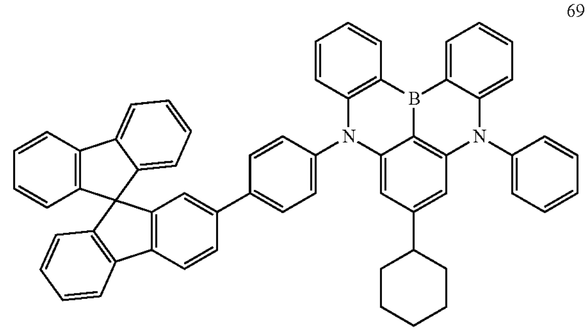
70
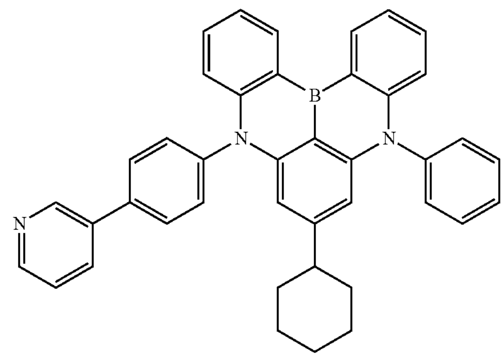
71
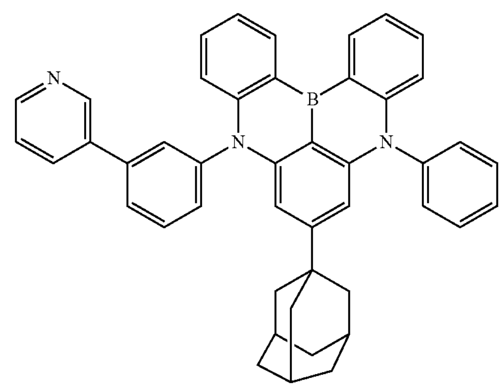
72
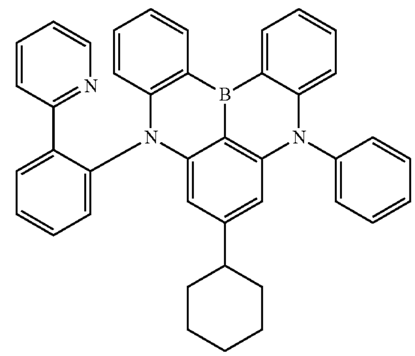

-continued
73
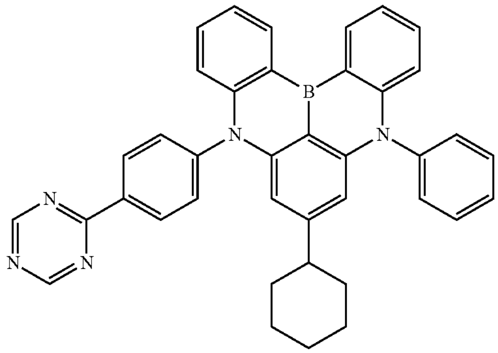
74
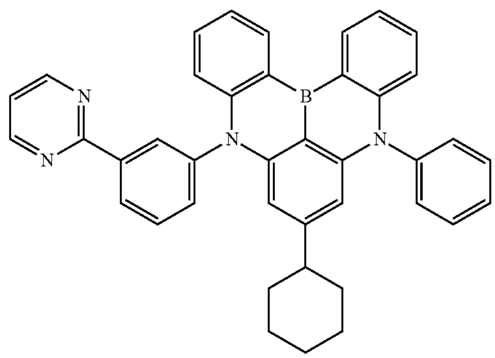
75
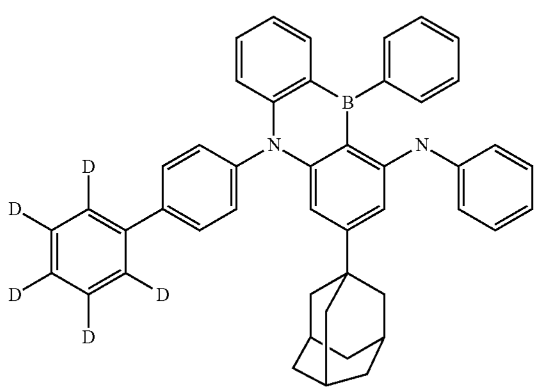
76
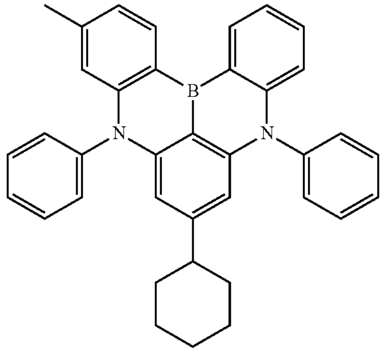
-continued
77
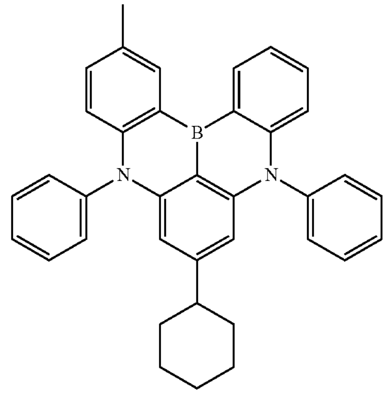
78
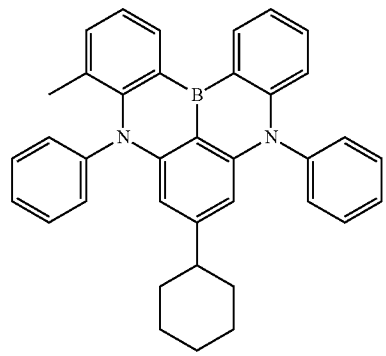
79
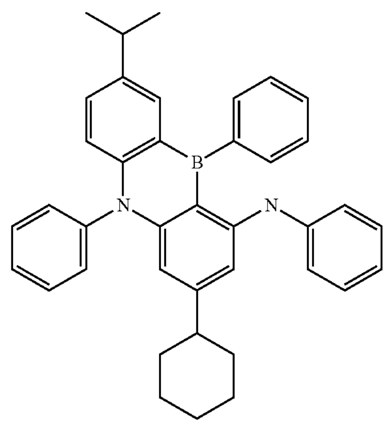
80
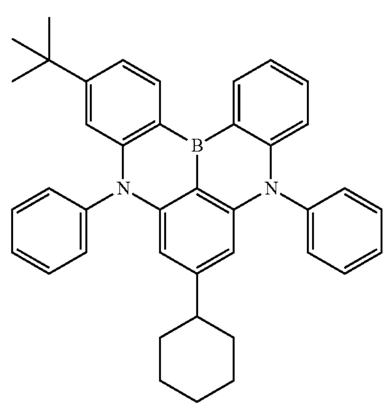

-continued
81
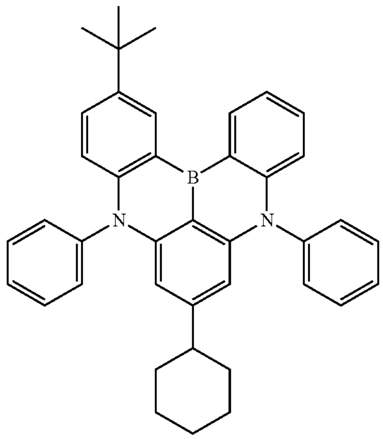
82
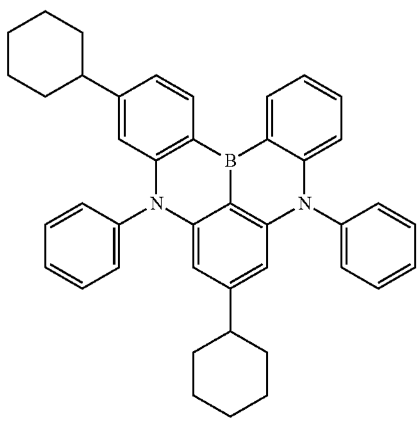
83
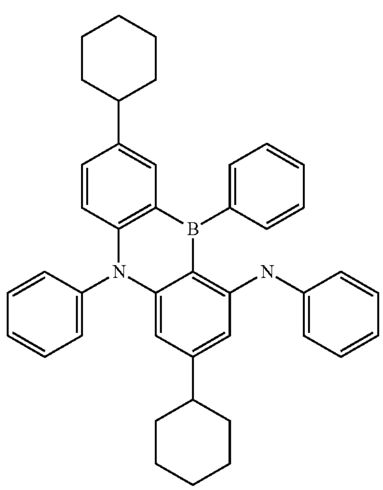
-continued
84
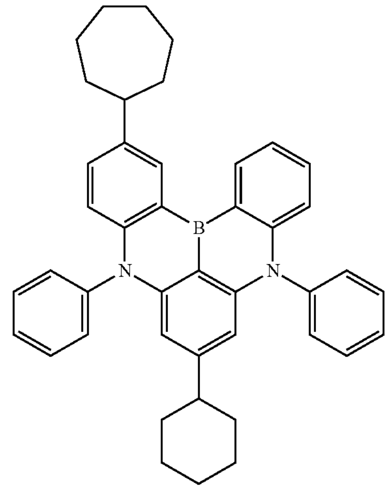
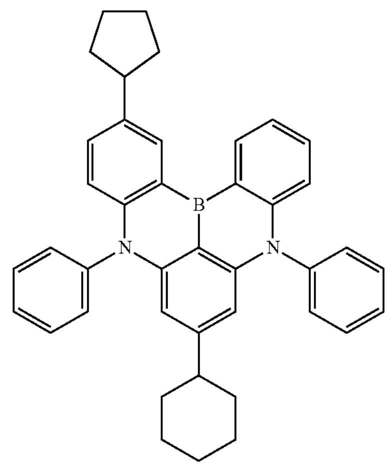
86
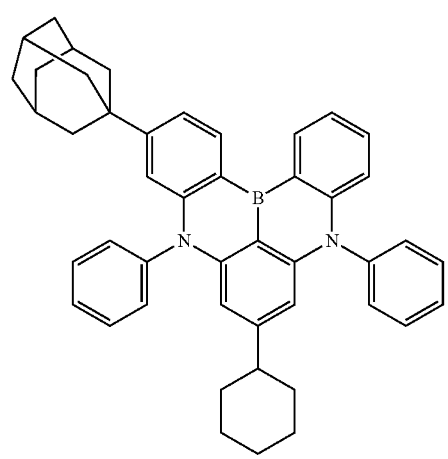

-continued
87
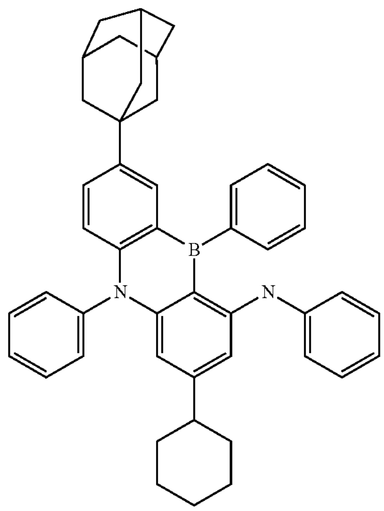
88
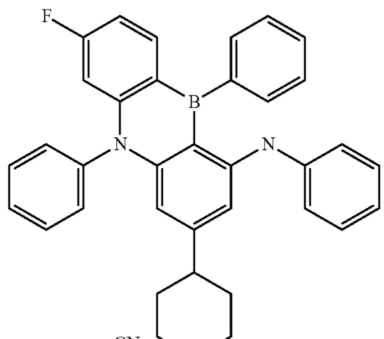
89
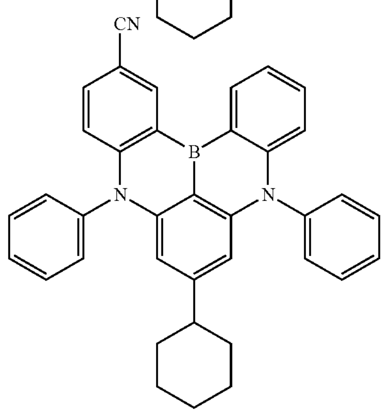
90
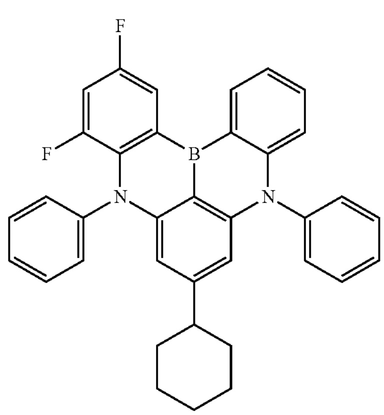
-continued
91
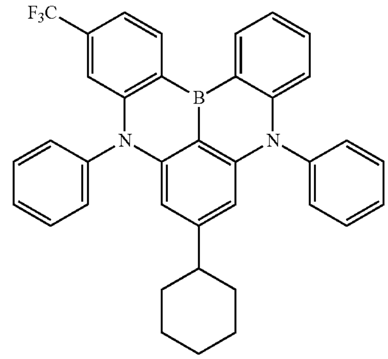
92
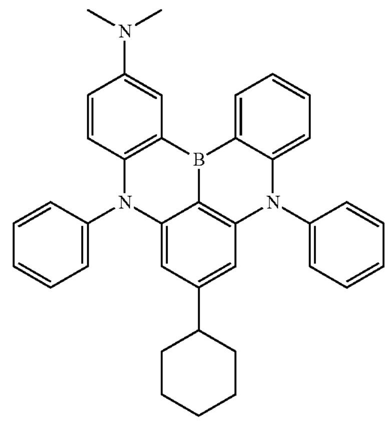
93
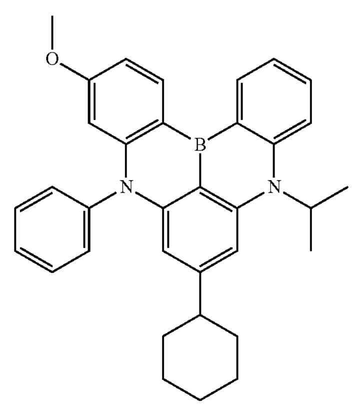
94
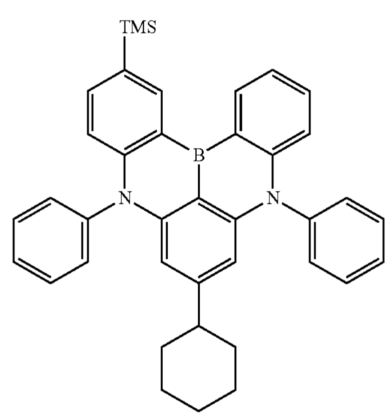

95
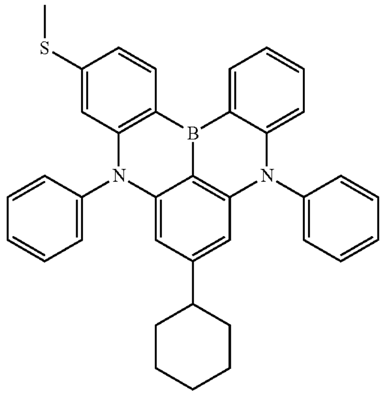
96
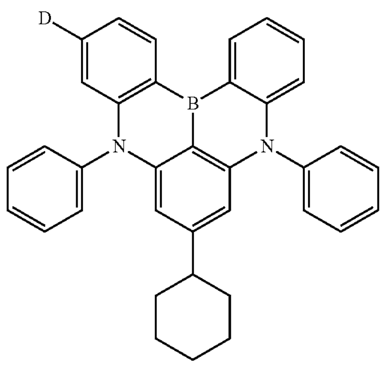
97
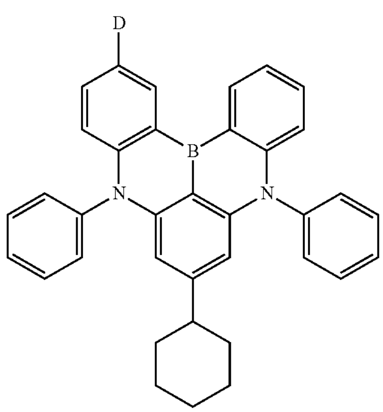
98
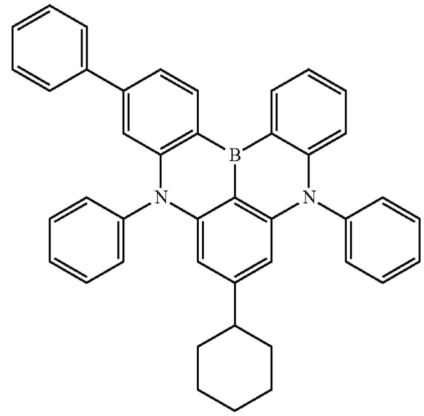
99
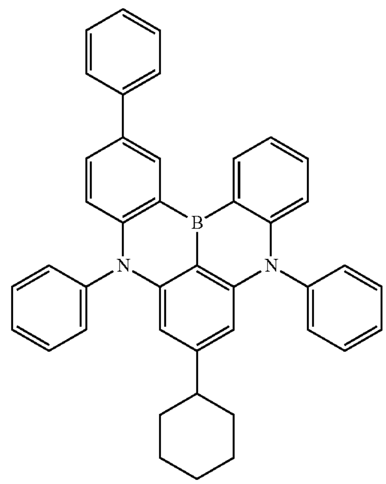
100
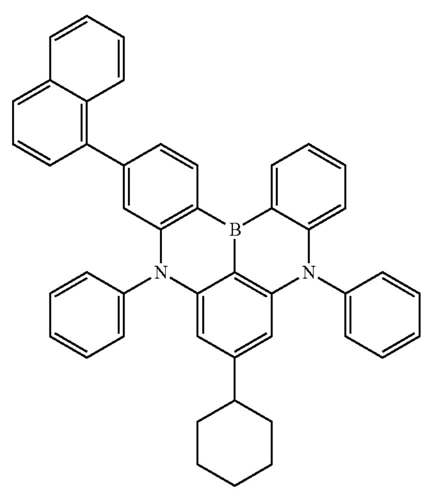

-continued
101
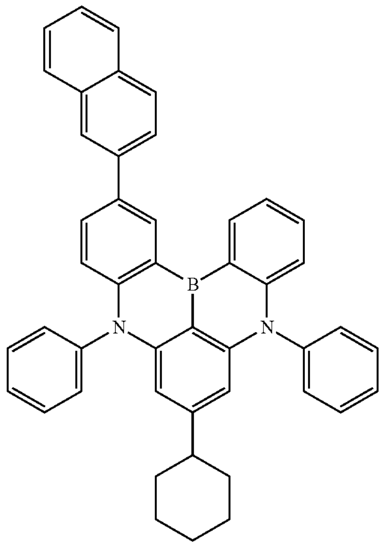
102
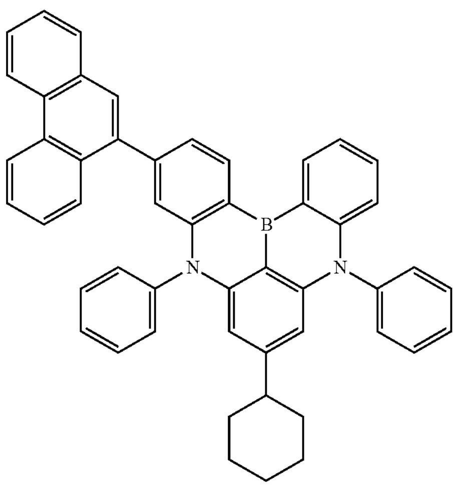
103
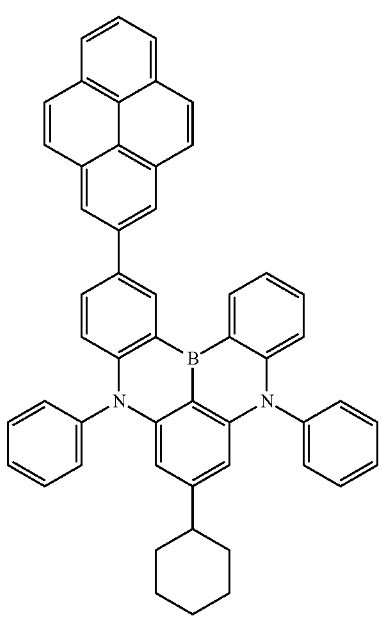
-continued
104
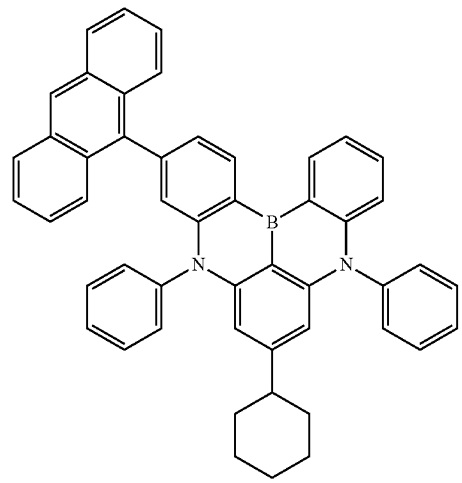
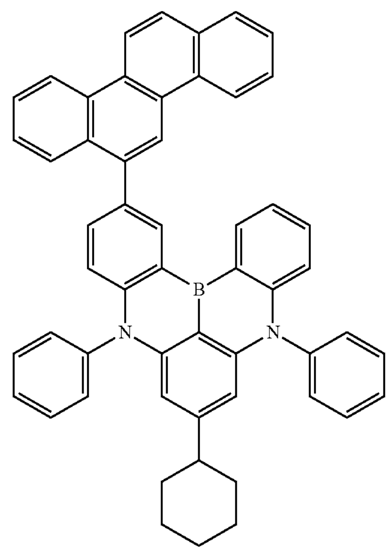
106
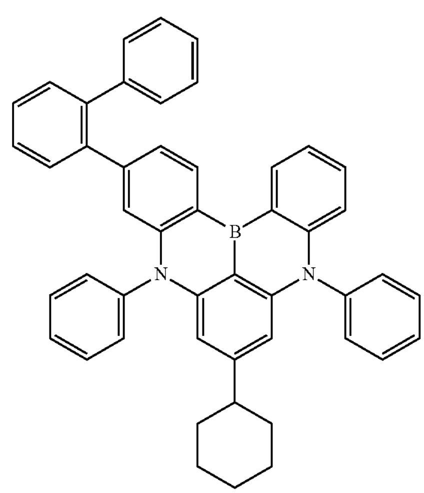

-continued
107
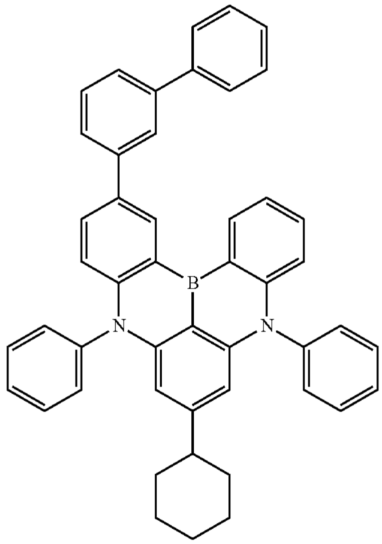
108
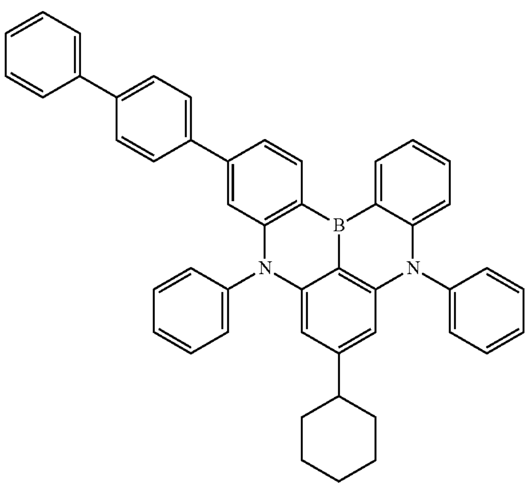
109
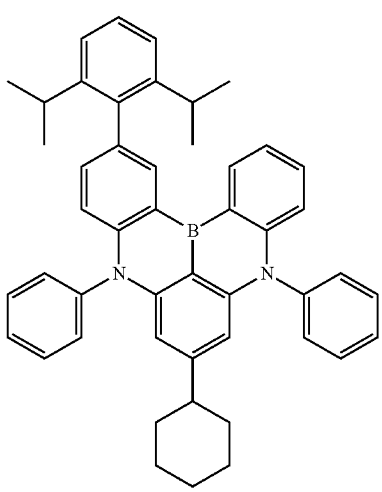
-continued
110
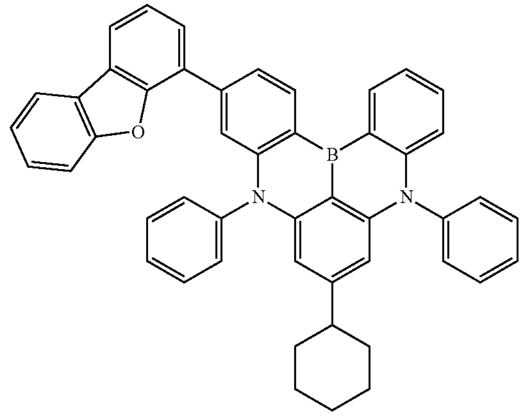
111
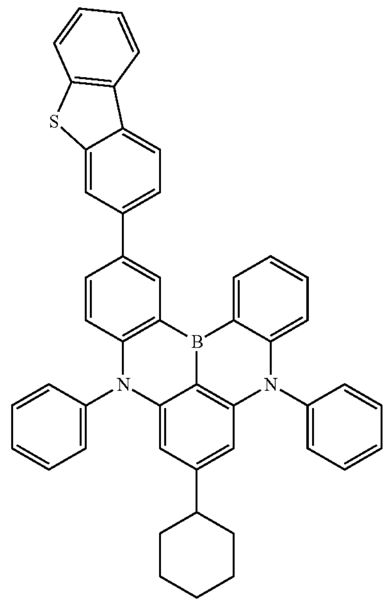
112
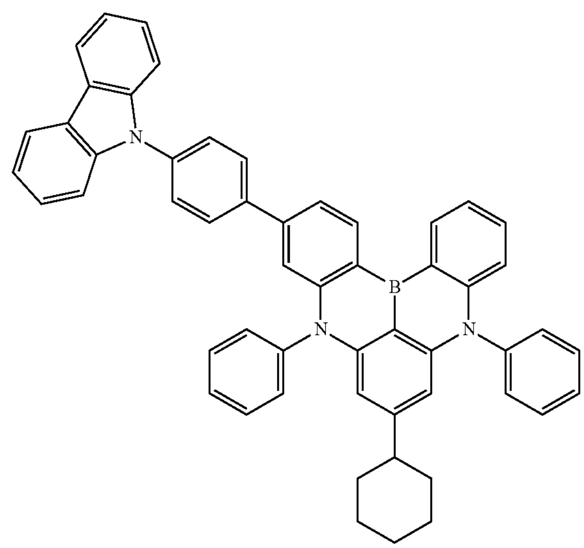

-continued
113
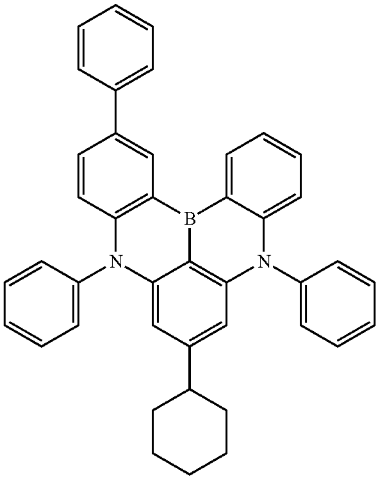
114
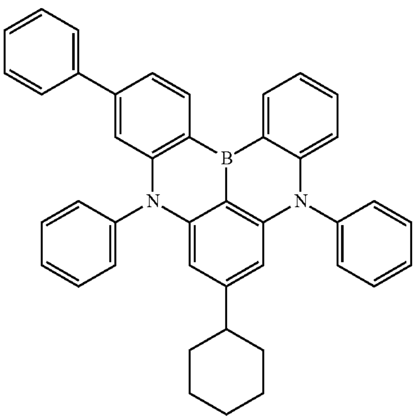
115
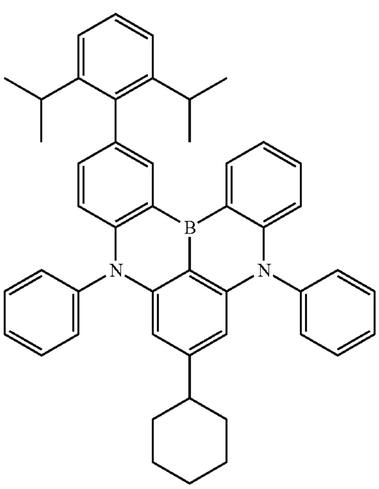
-continued
116
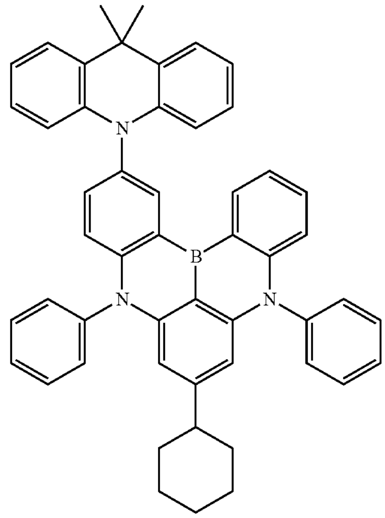
117
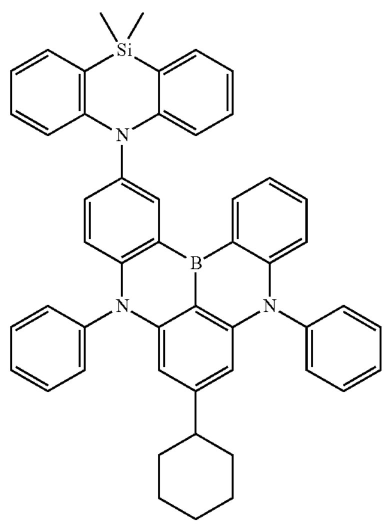
118
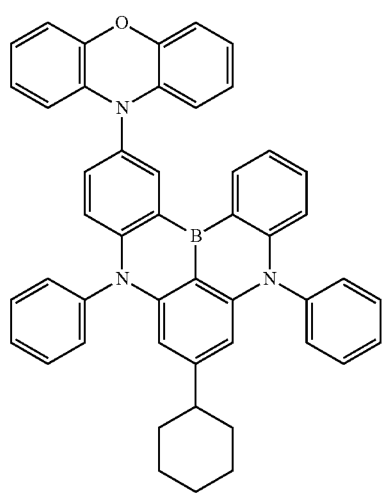

-continued
119
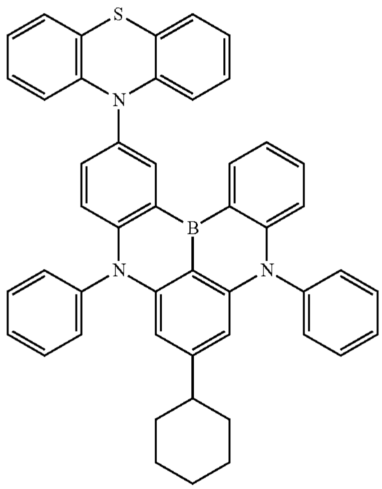
120
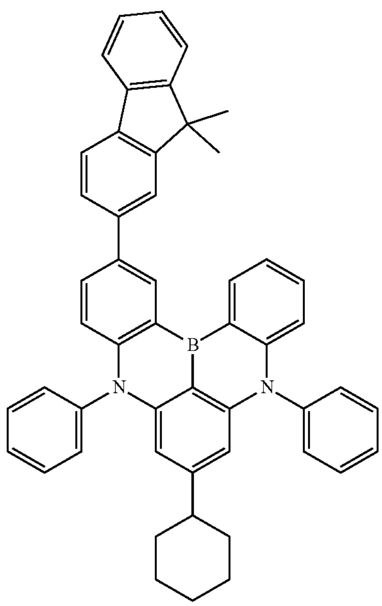
121
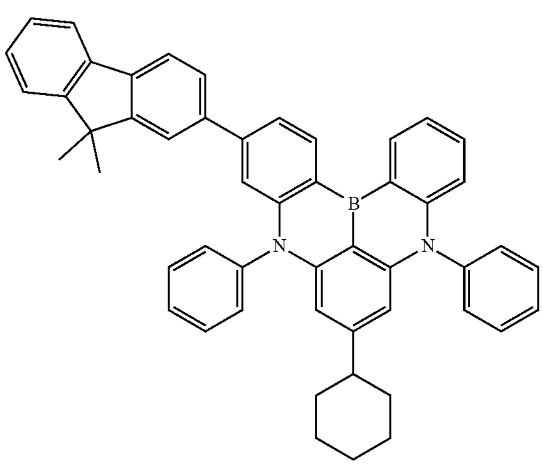
-continued
122
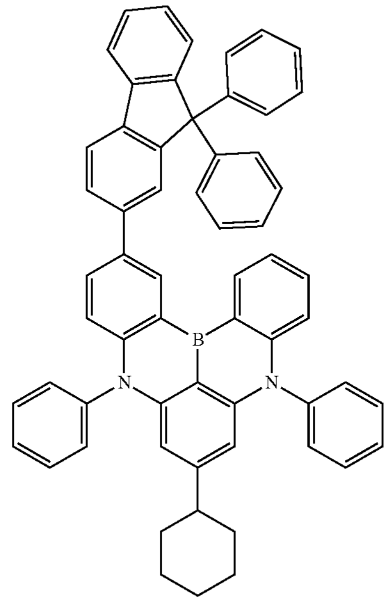
123
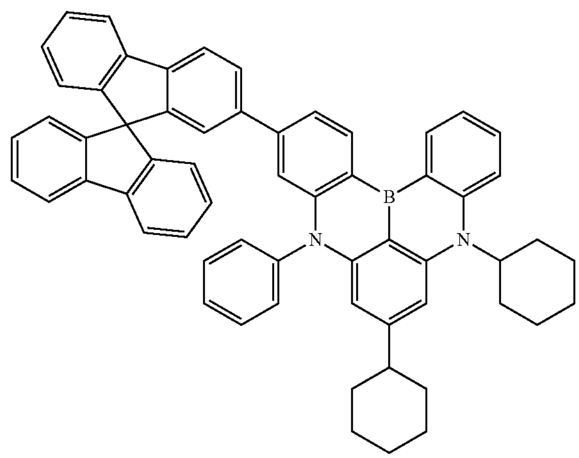
124
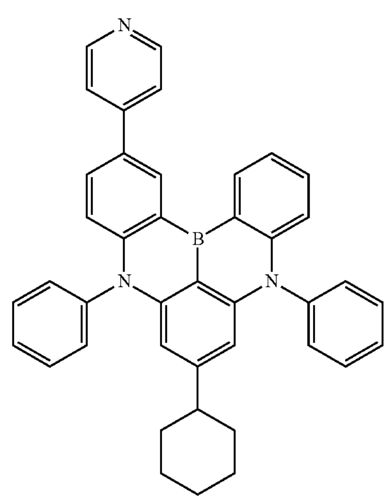

-continued
125
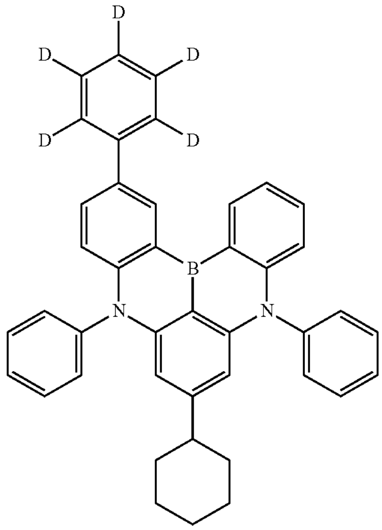
126
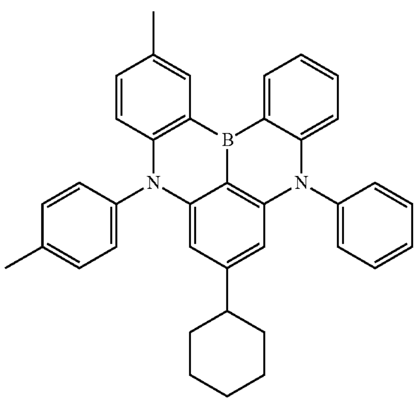
127
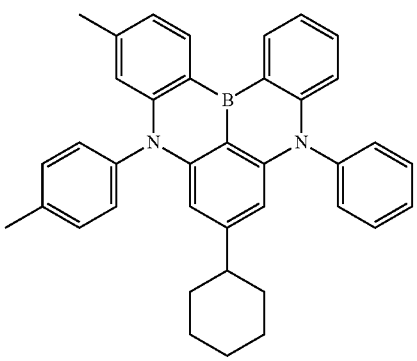
128
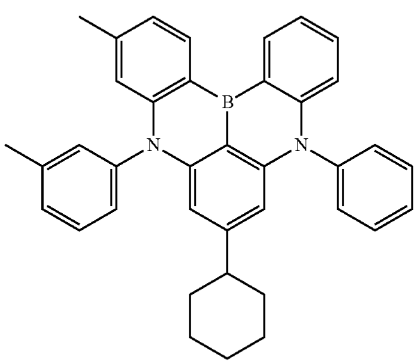
-continued
129
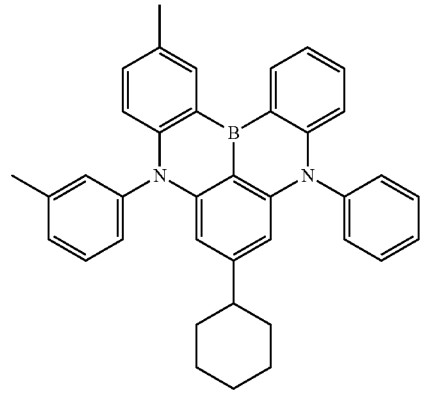
130
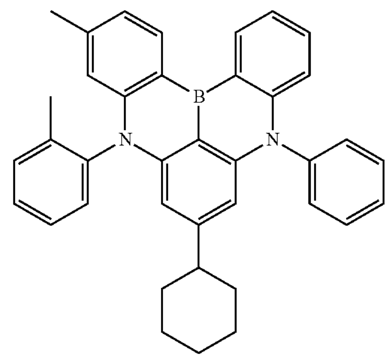
131
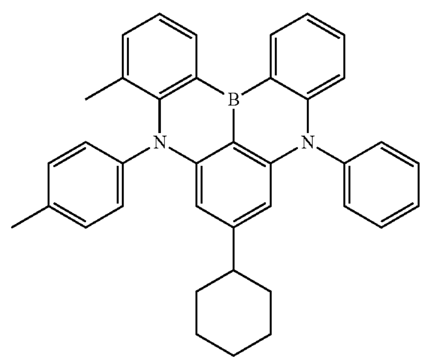
132
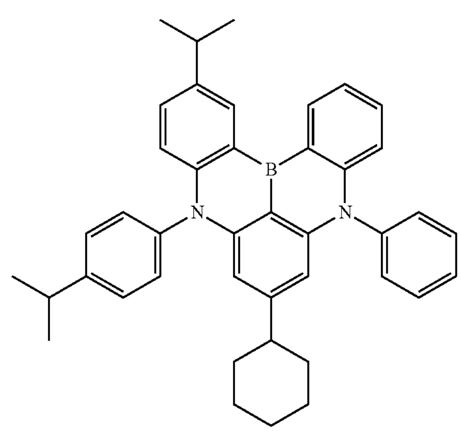

-continued
133
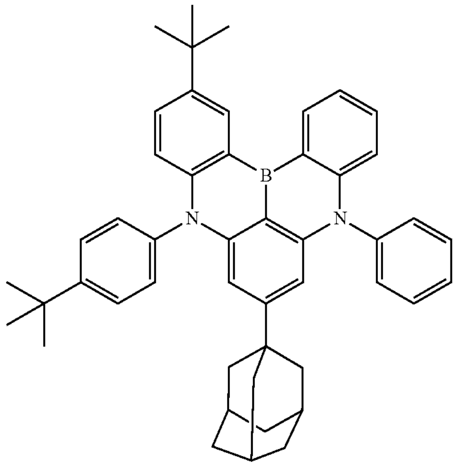
134
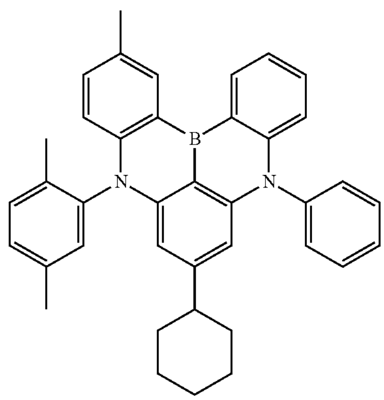
135
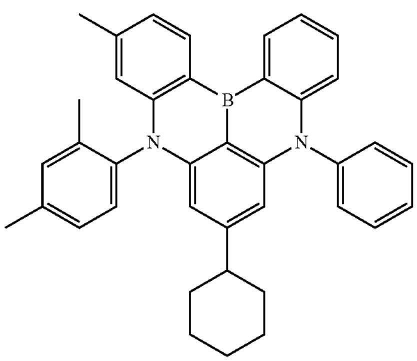
136
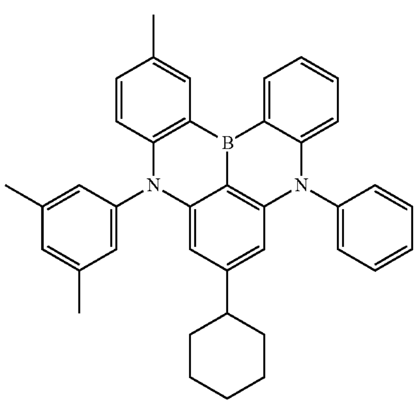
-continued
141
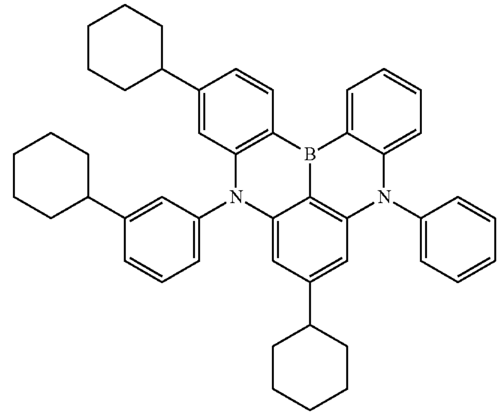
142
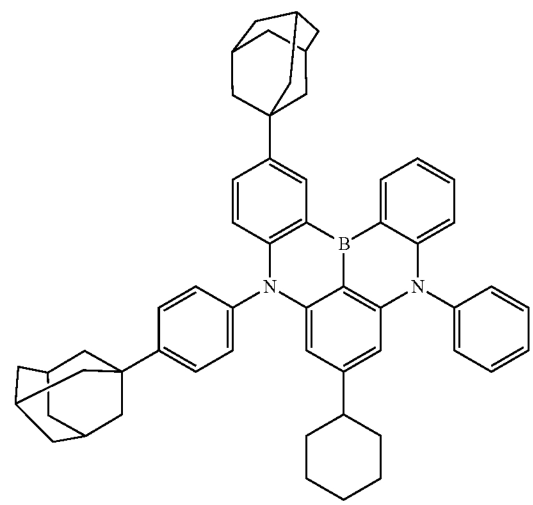
143
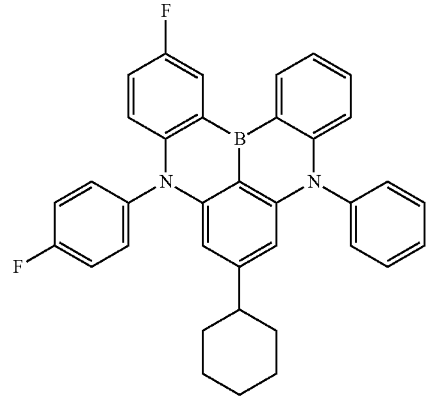

-continued
144
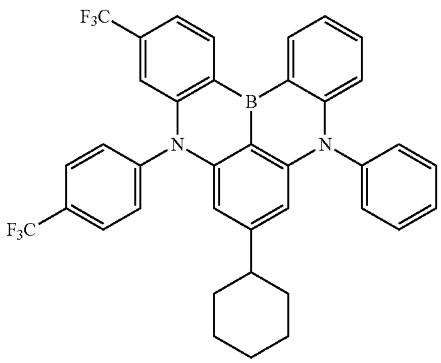
145
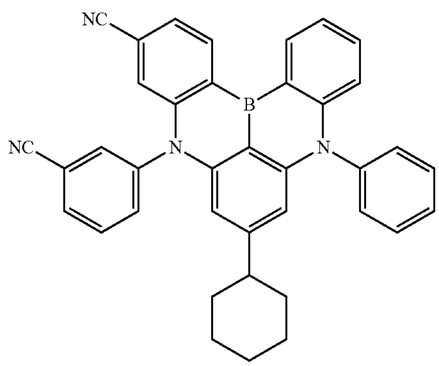
146
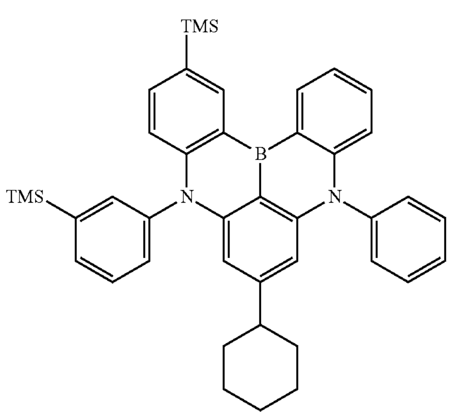
147
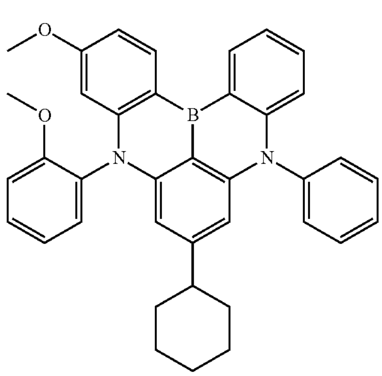
-continued
148
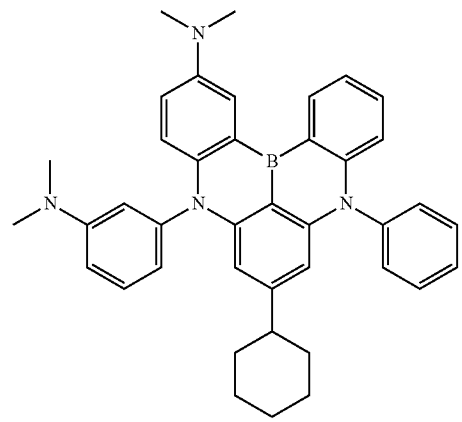
149
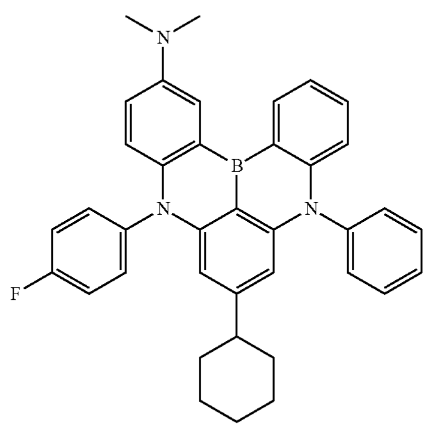
150
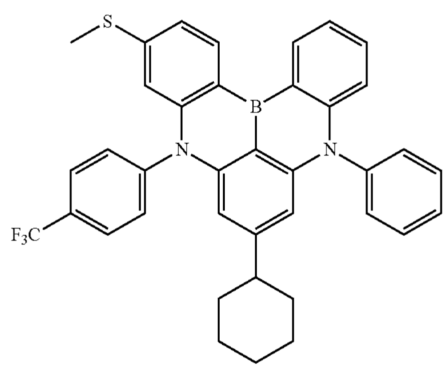
151
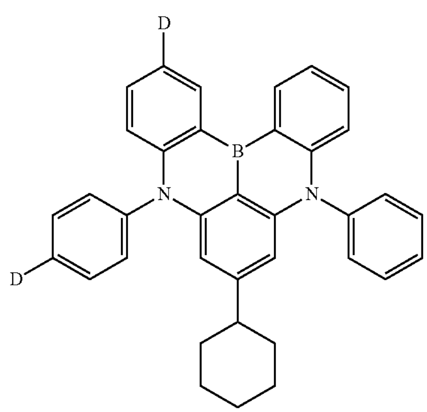

-continued
152
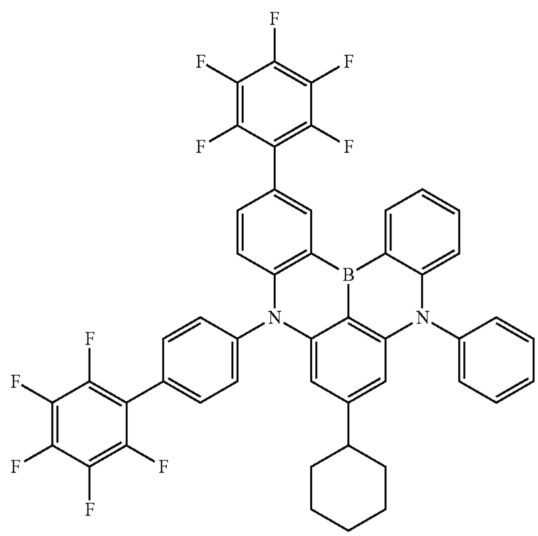
153
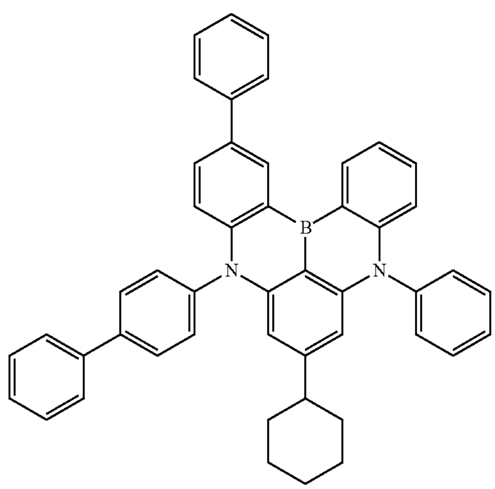
154
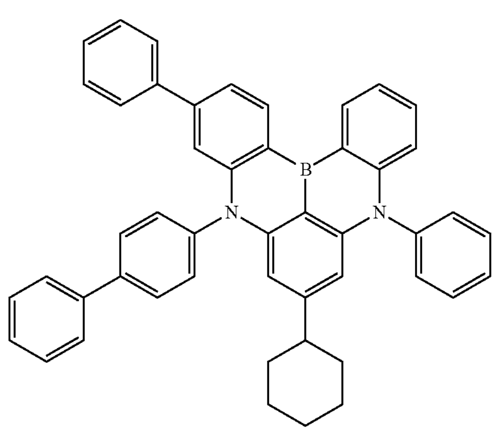
-continued
155
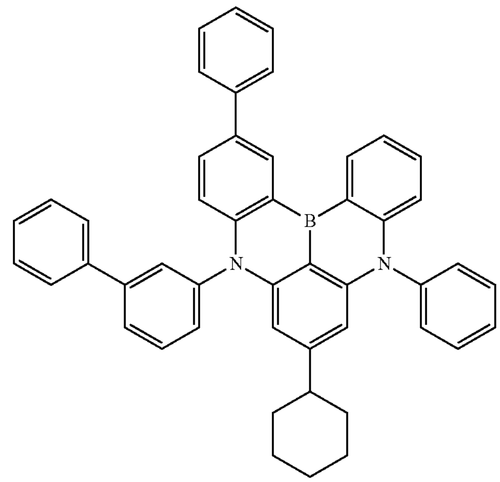
156
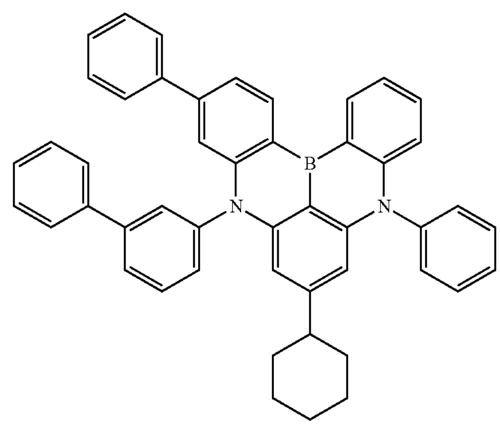
157
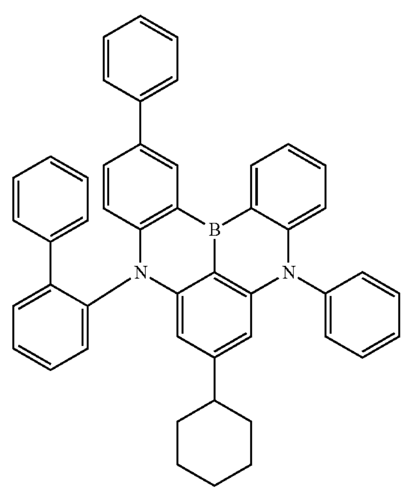

-continued
158
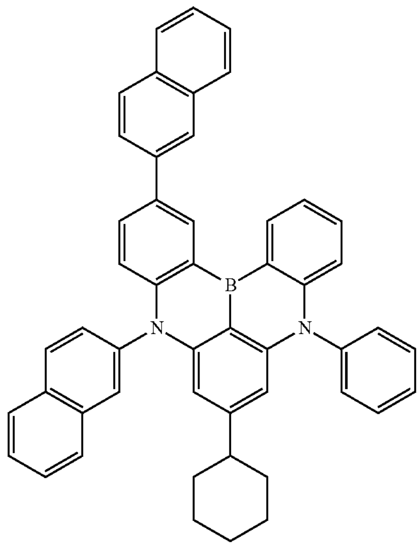
159
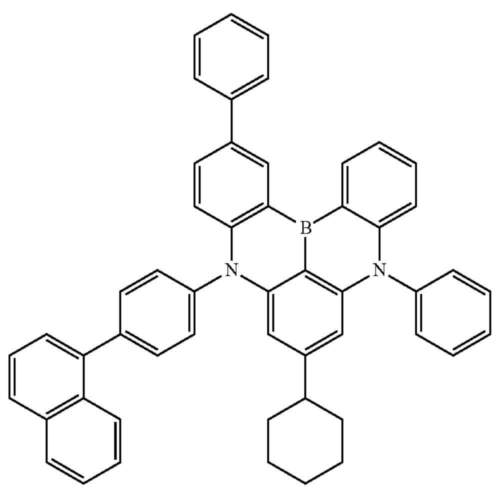
160
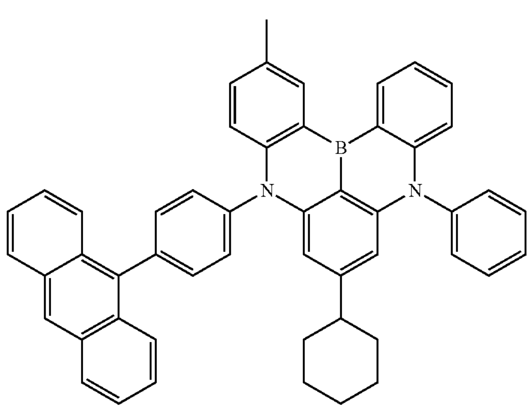
-continued
161
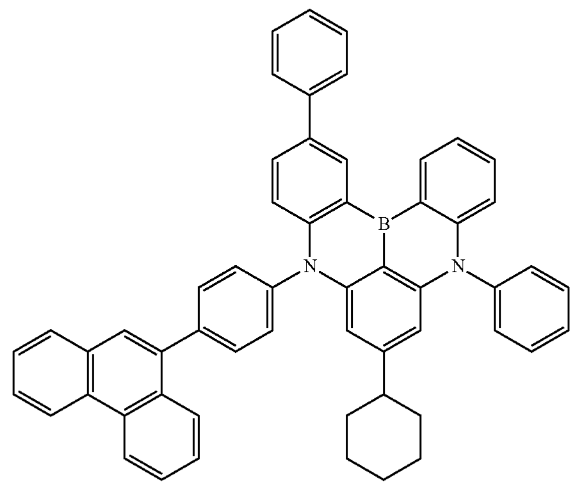
162
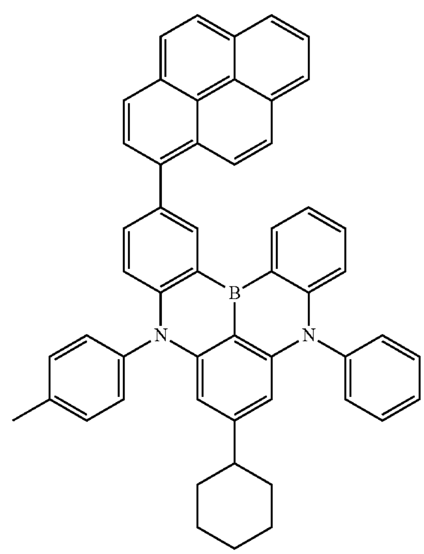
163
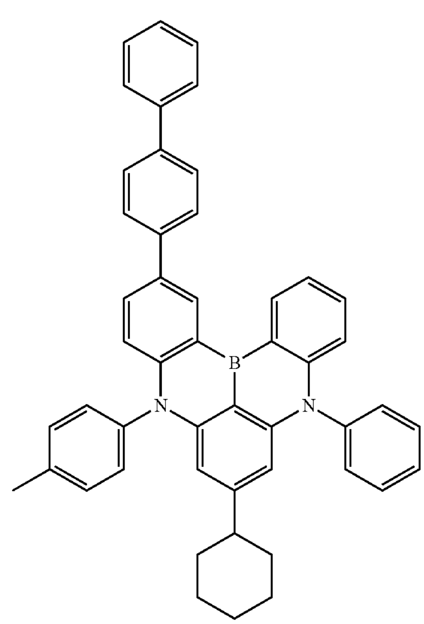

164
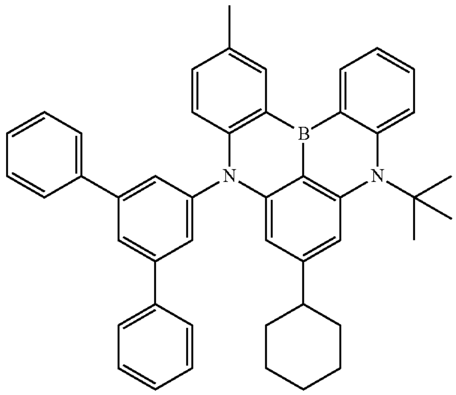
165
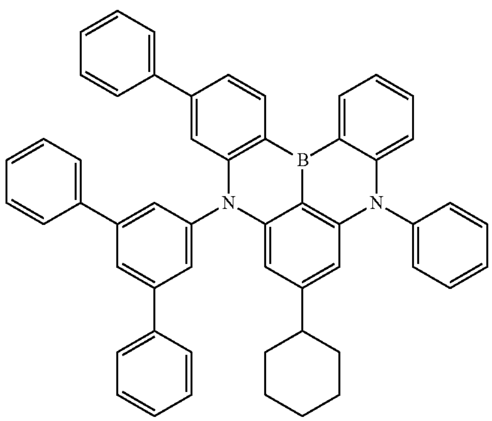
166
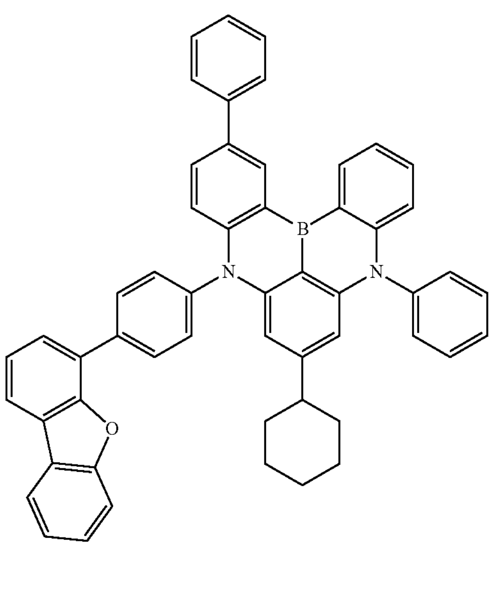
167
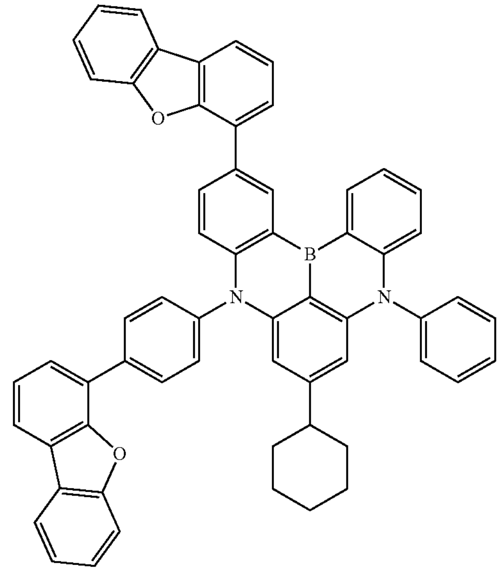
168
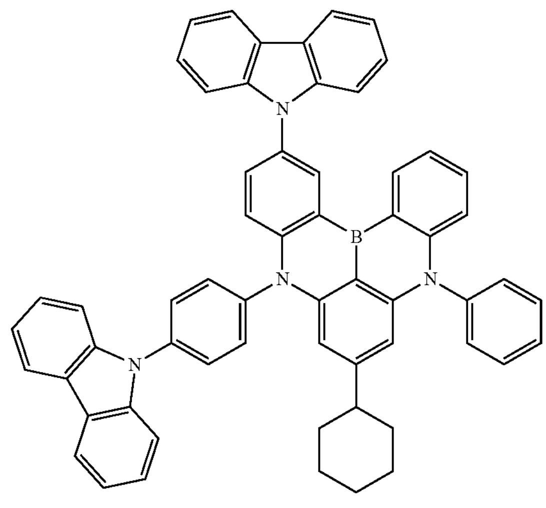
169
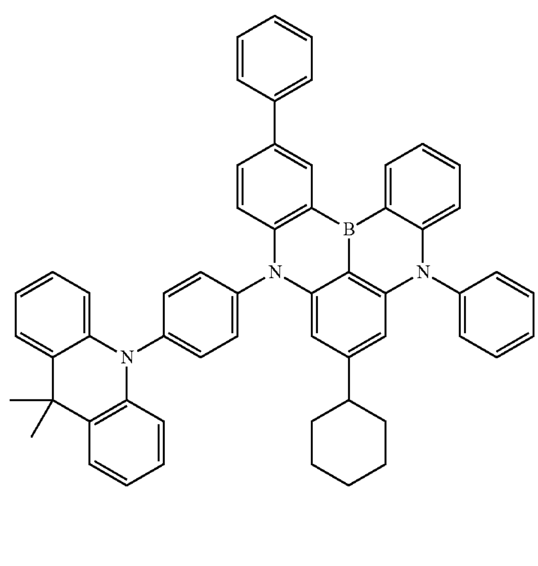

170
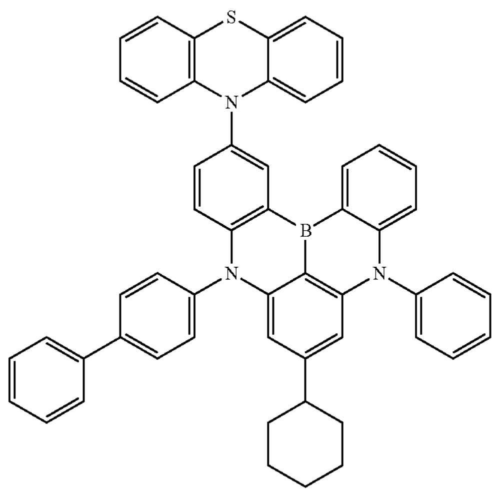
171
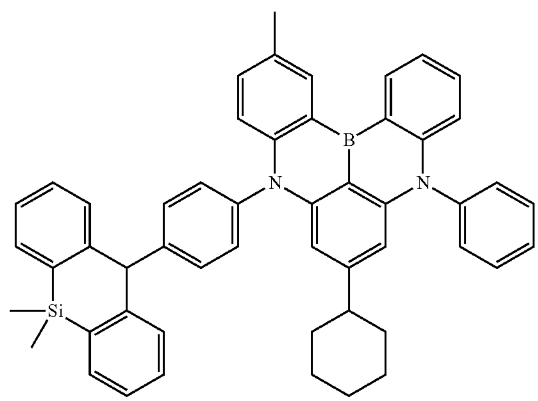
172
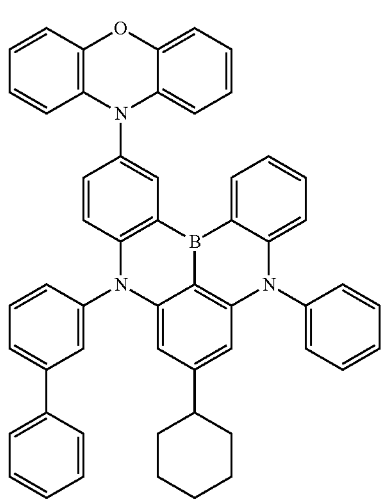
173
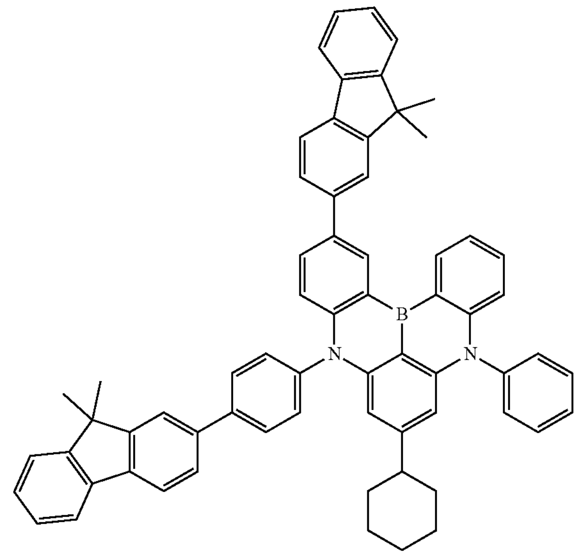
174
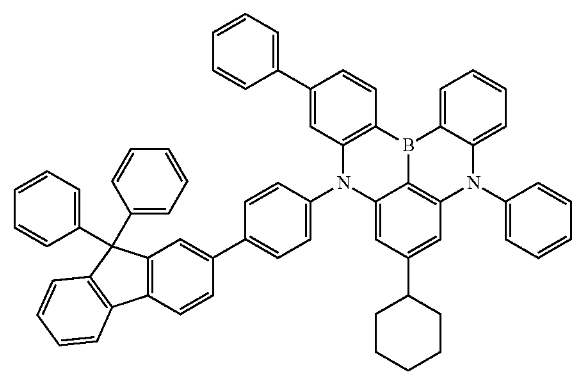
175
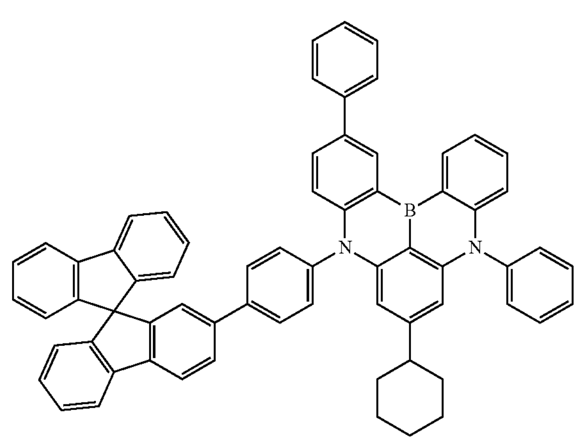

176
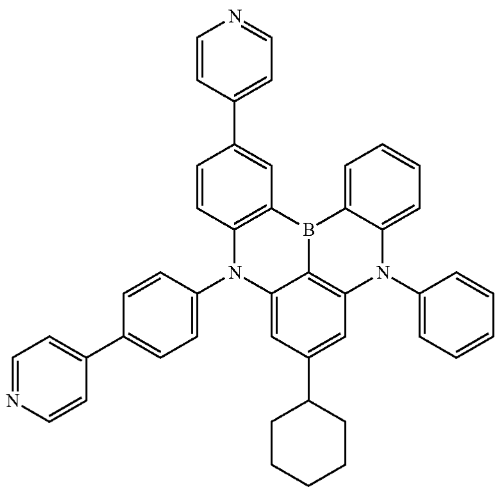
177
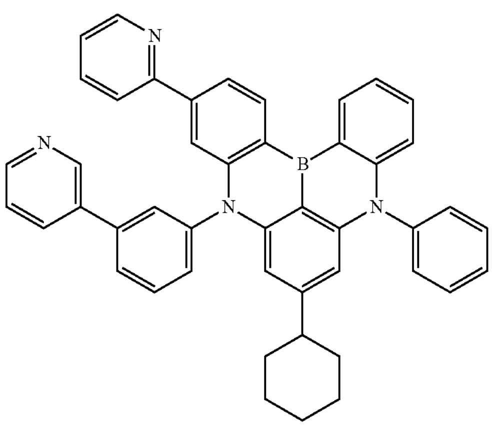
178
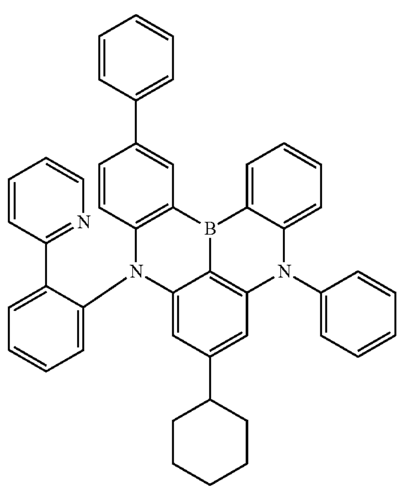
179
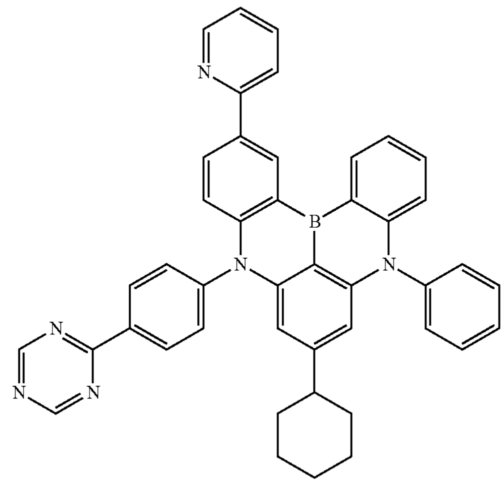
180
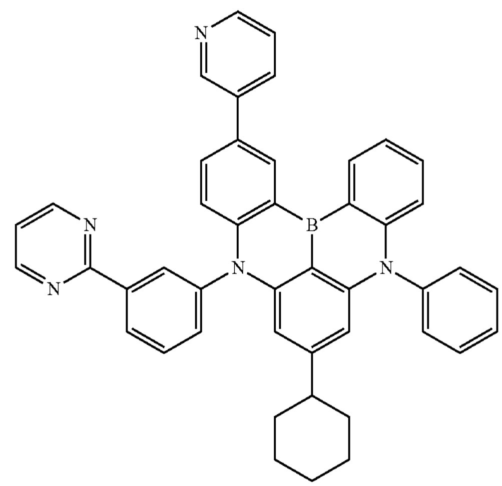
181
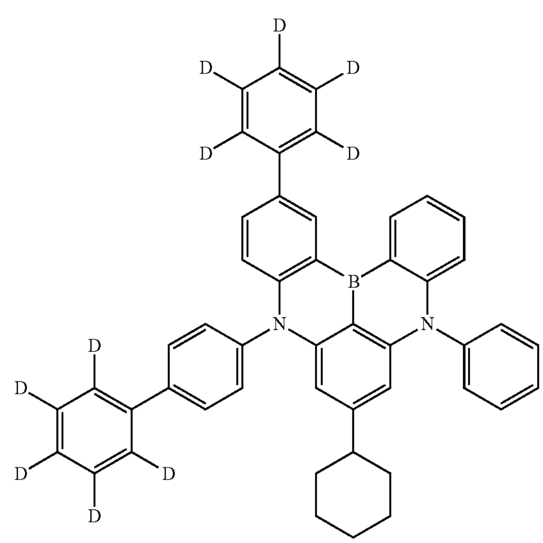

-continued
182
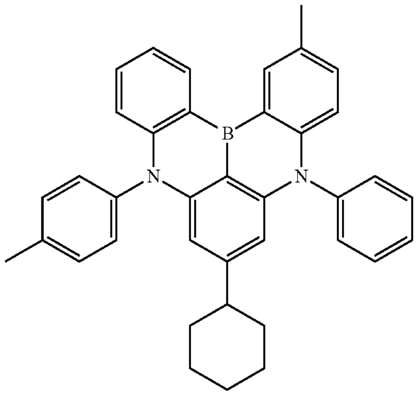
183
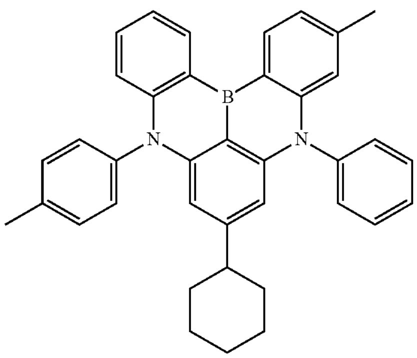
184
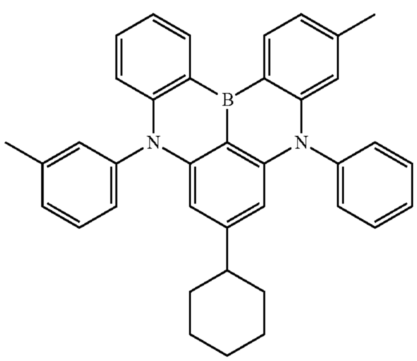
185
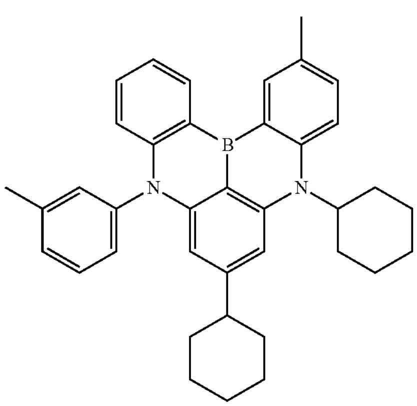
-continued
186
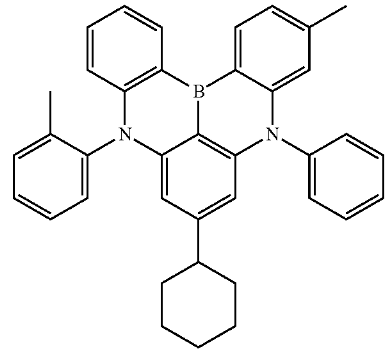
187
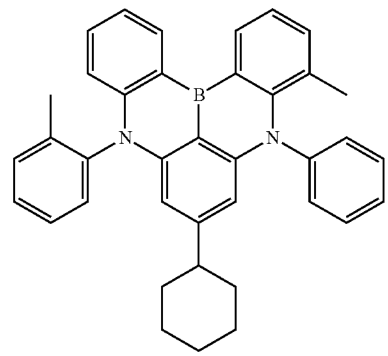
188
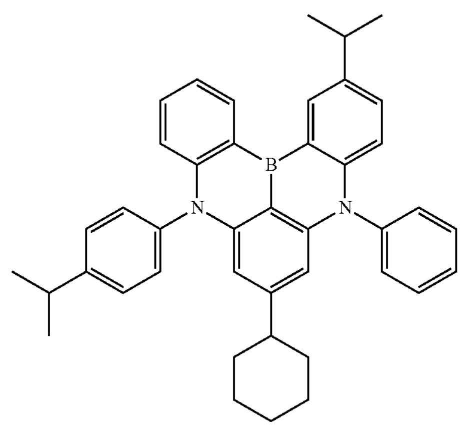
189
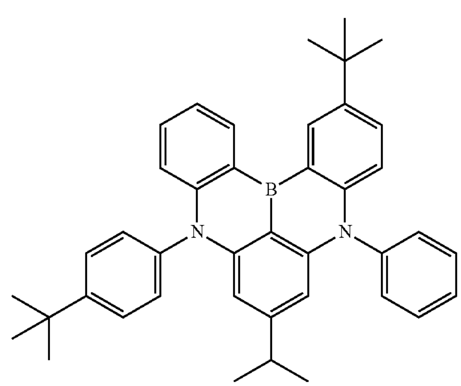

-continued
190
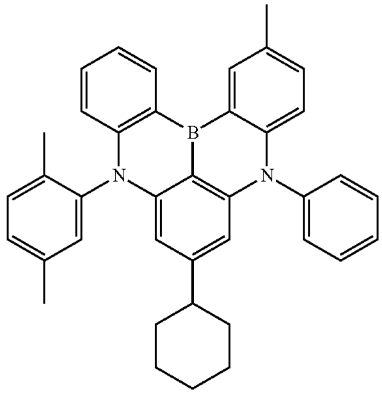
191
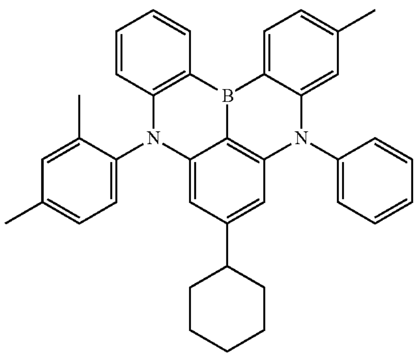
192
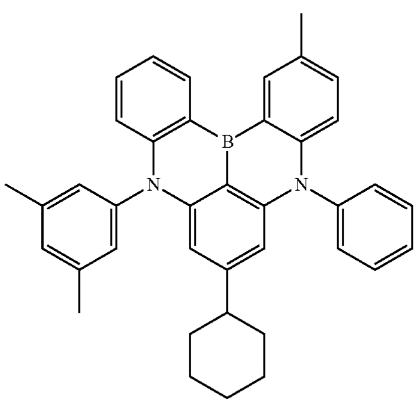
193
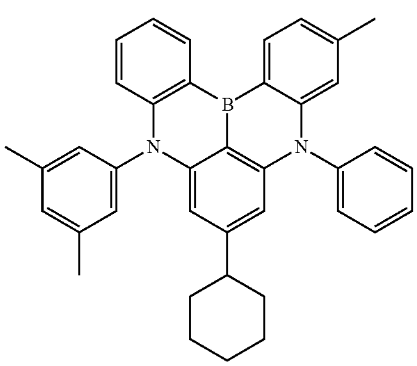
-continued
194
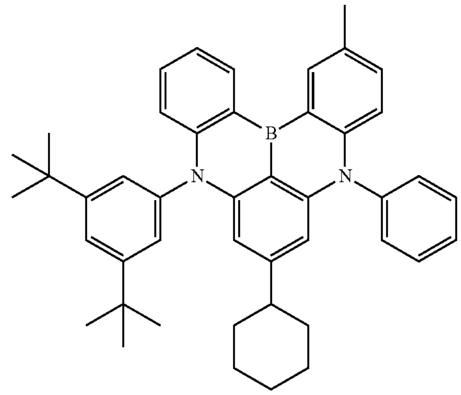
195
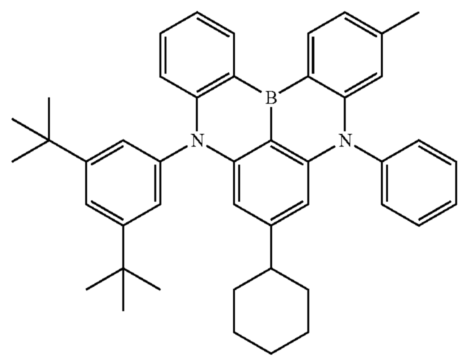
196
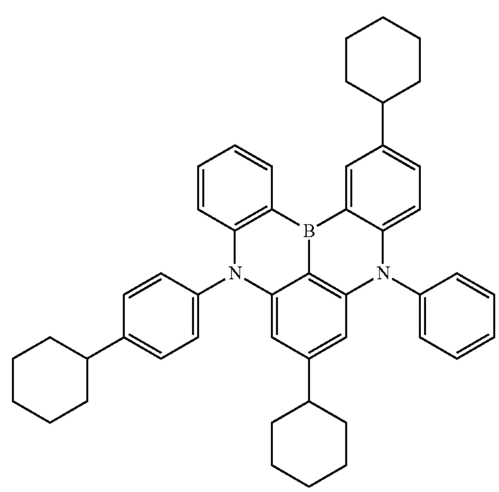

-continued
197
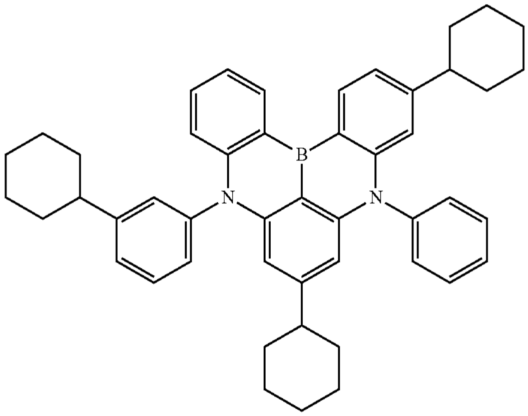
198
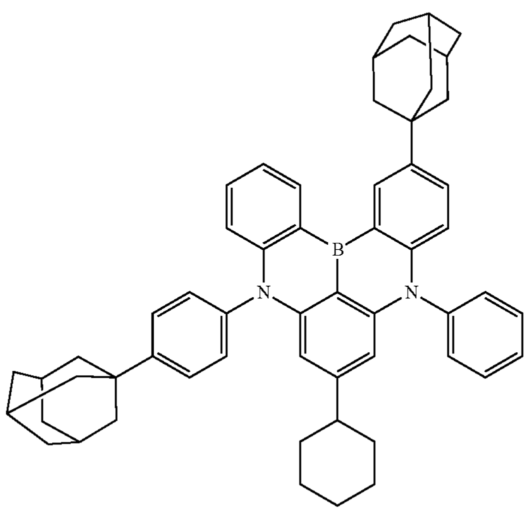
199
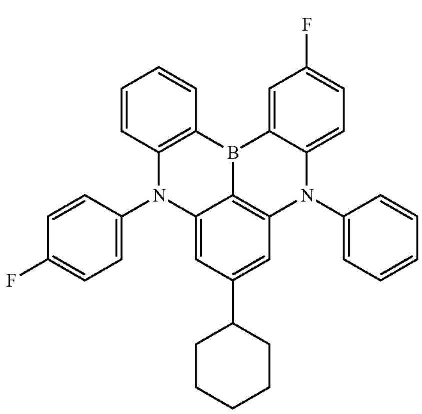
-continued
200
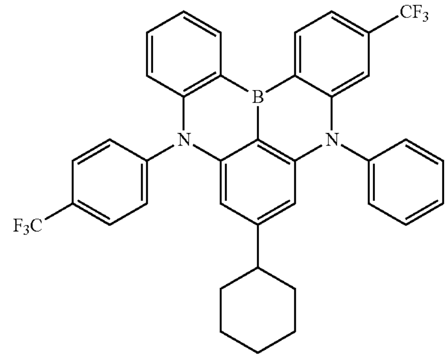
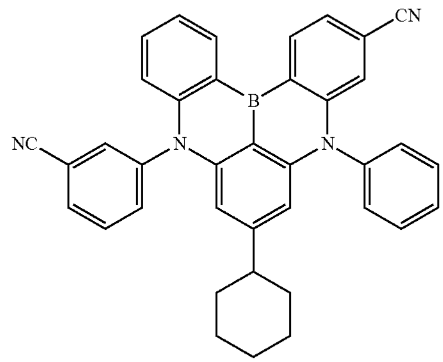
202
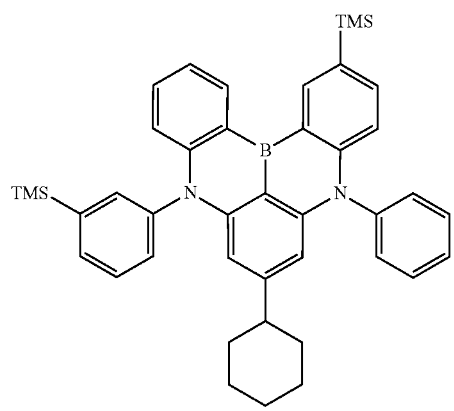
203
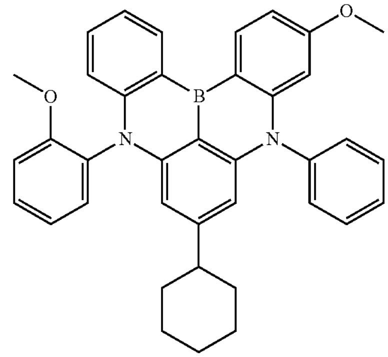

-continued
204
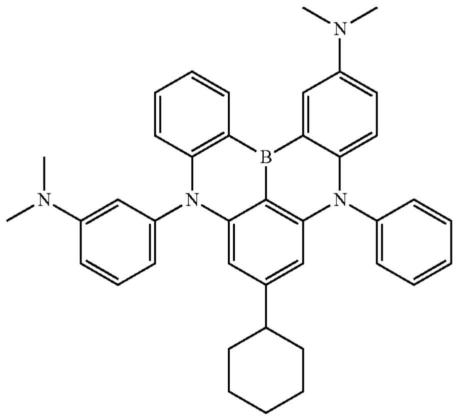
205
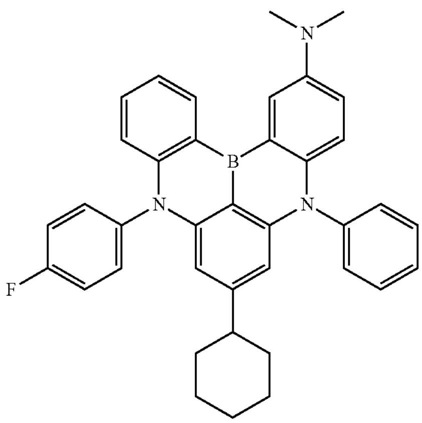
206
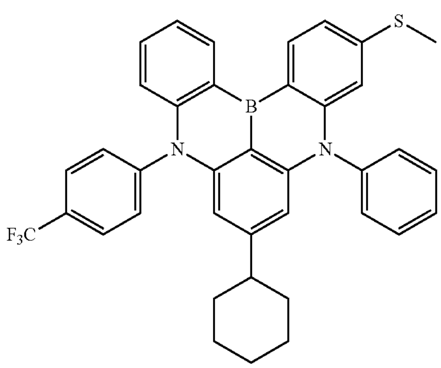
207
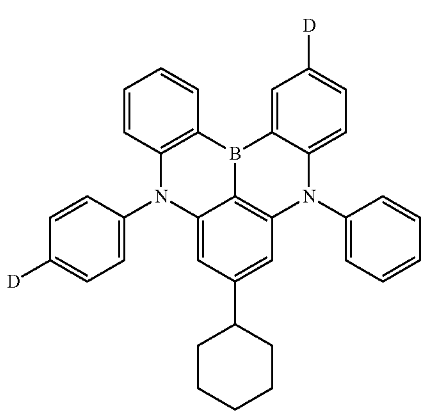
-continued
208
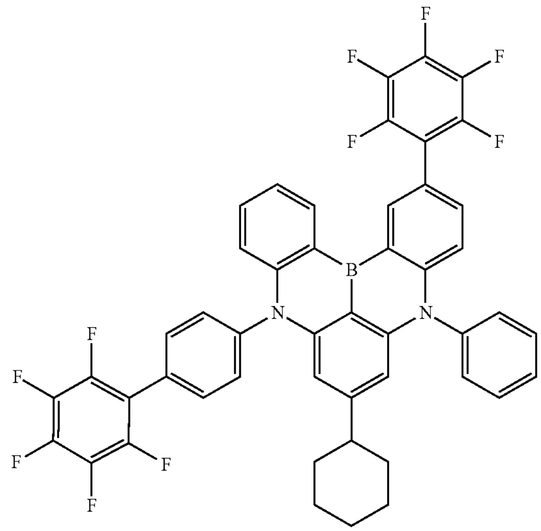
209
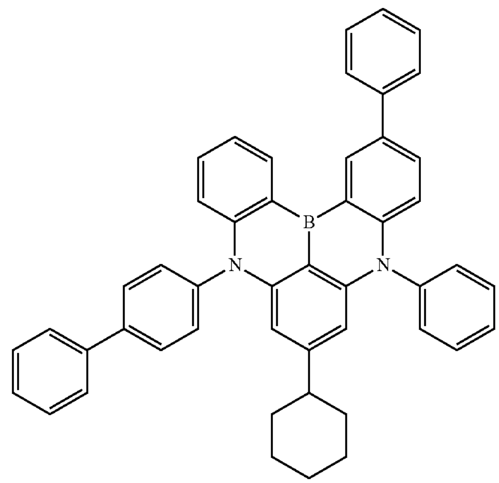
210
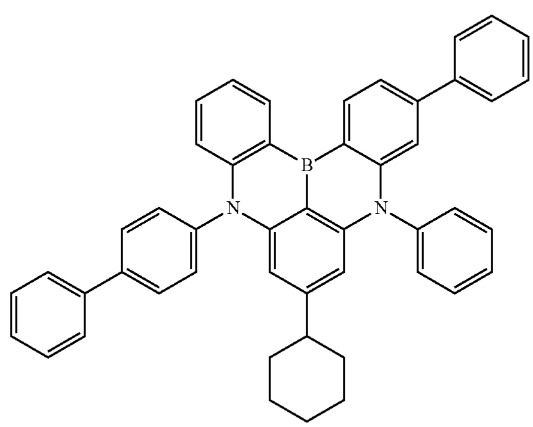

211
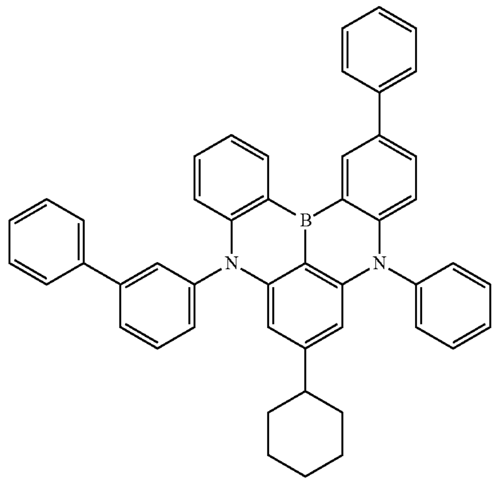
212
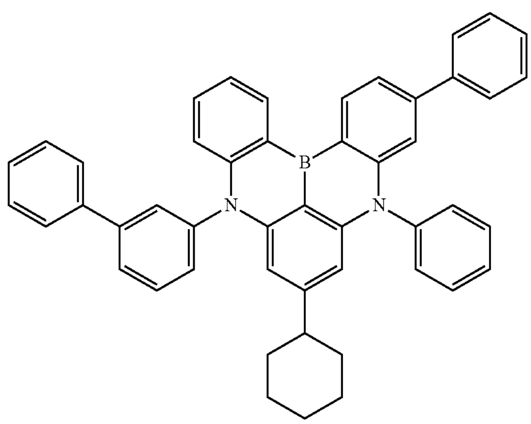
213
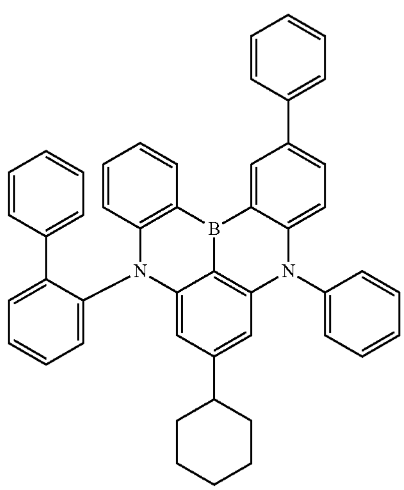
214
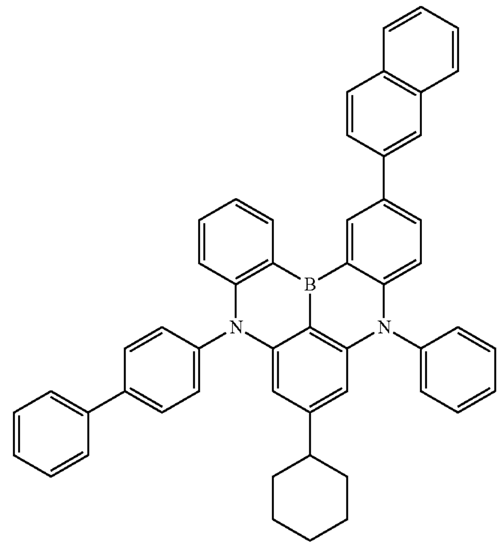
215
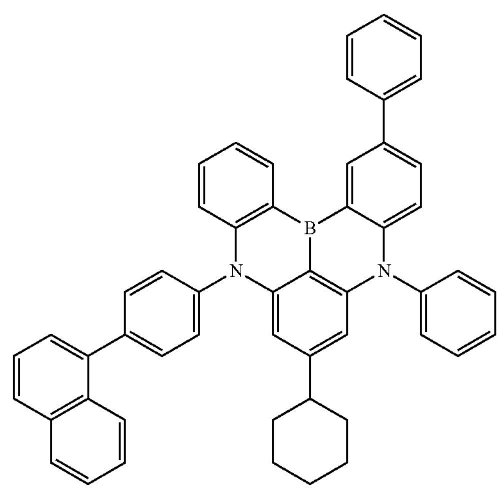
216
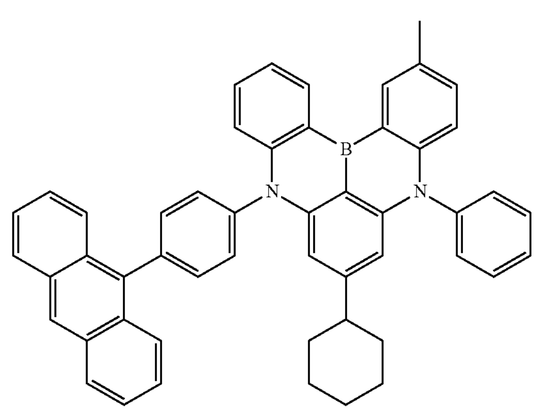

-continued
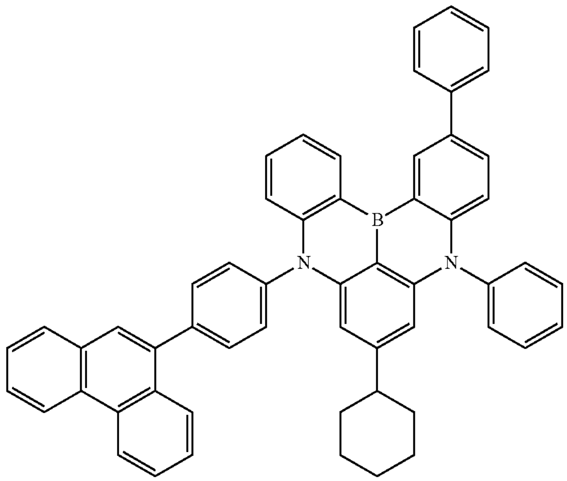
218
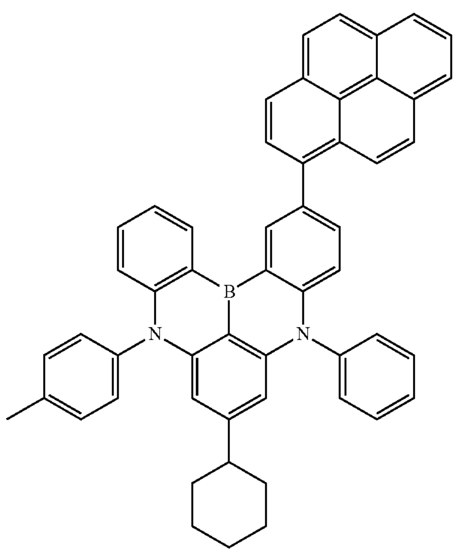
219
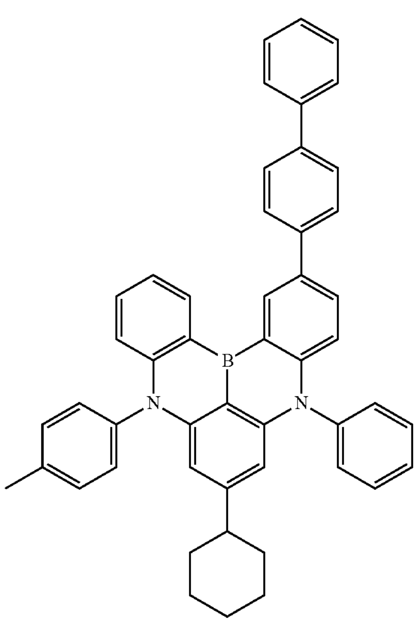
-continued
220
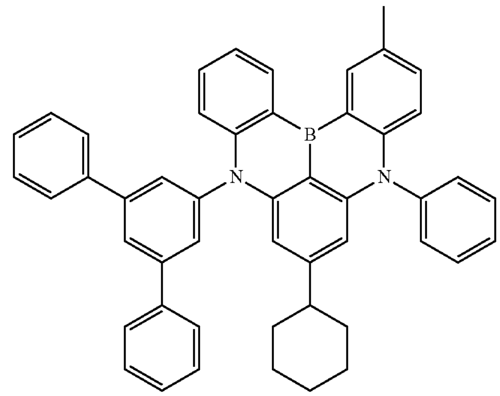
221
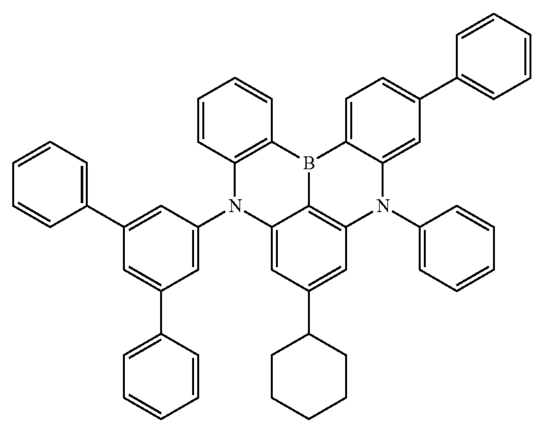
222
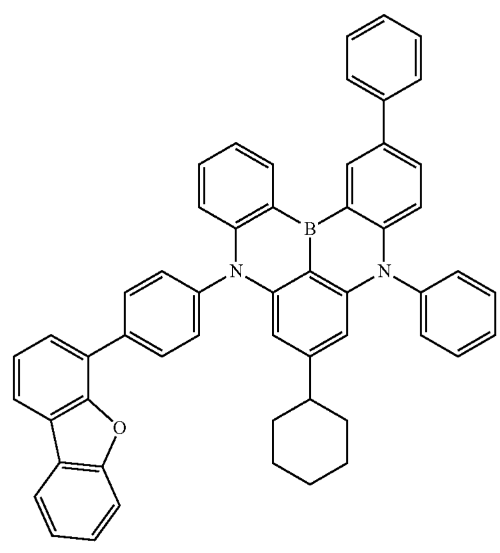

-continued
223
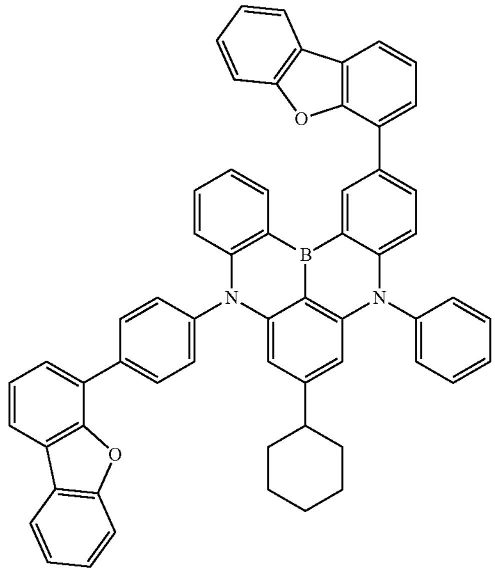
224
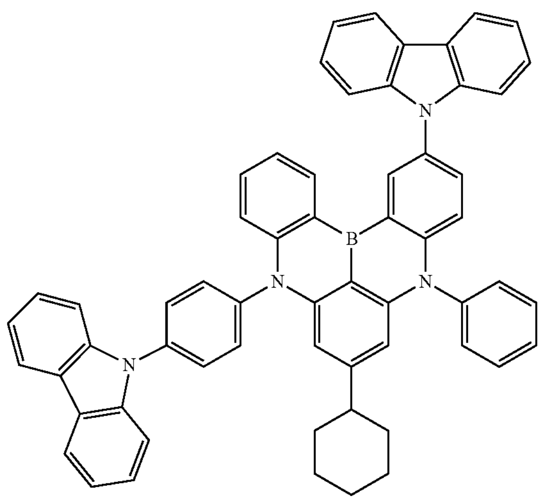
225
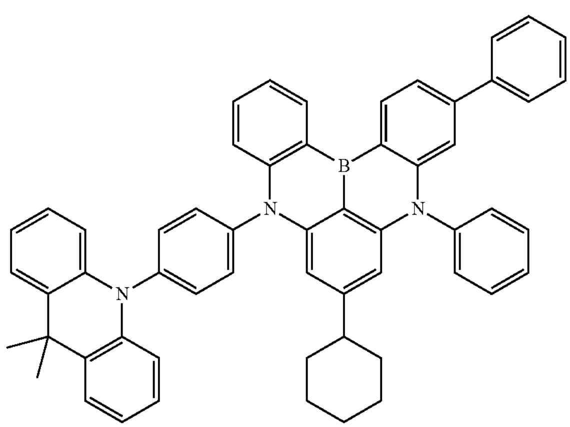
-continued
226
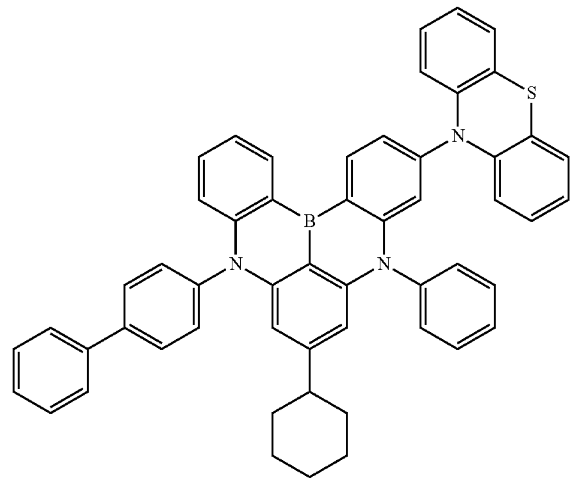
227
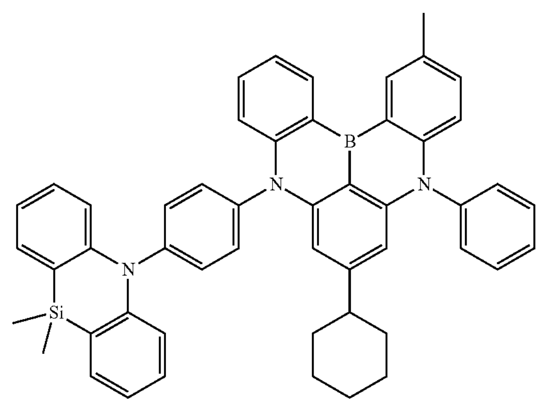
228
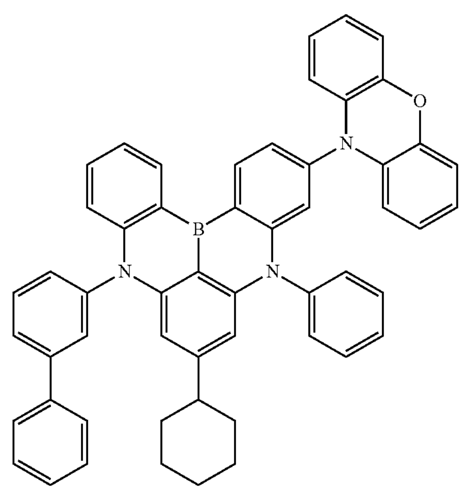

-continued
229
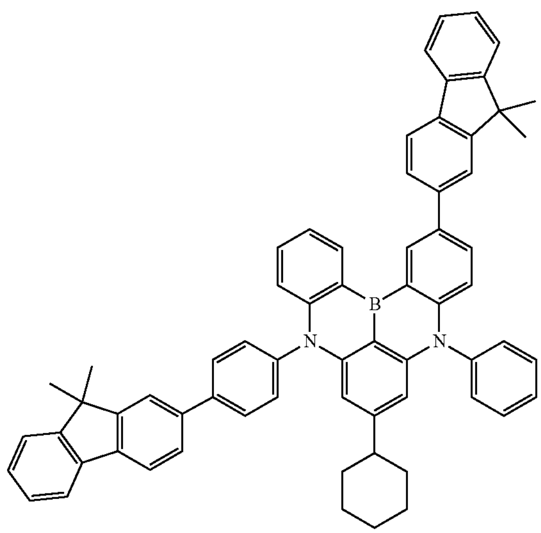
230
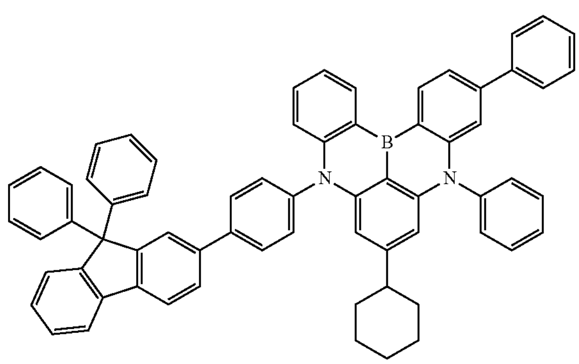
231
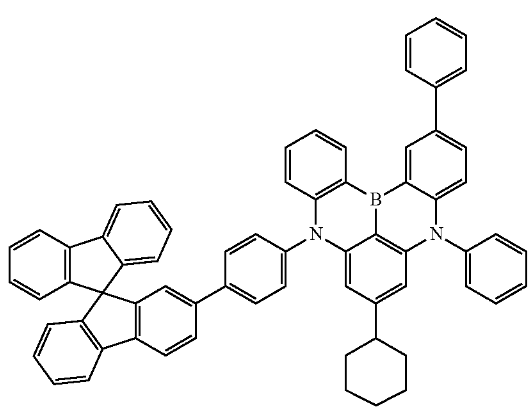
-continued
232
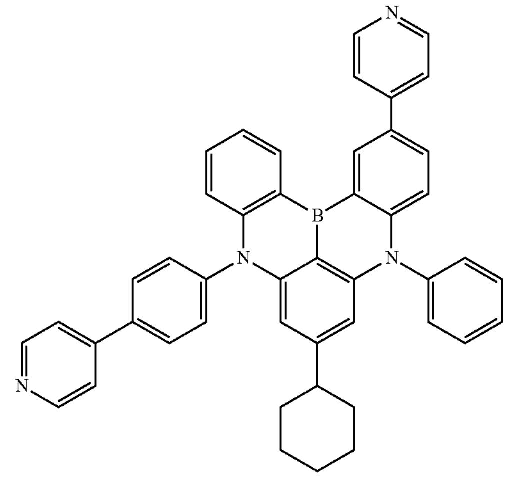
233
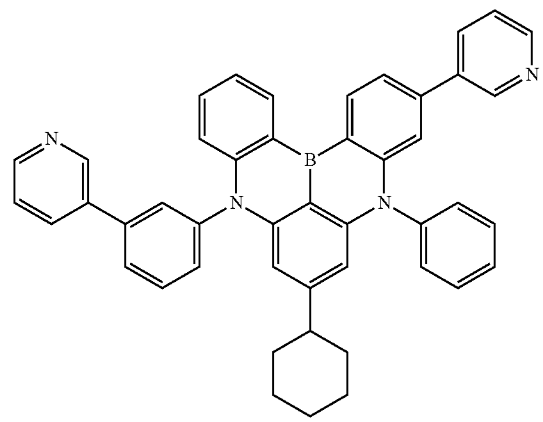
234
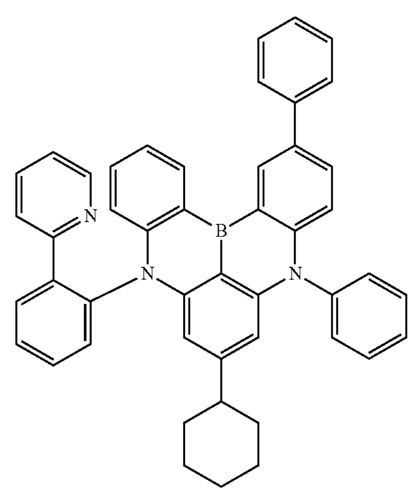

-continued
235
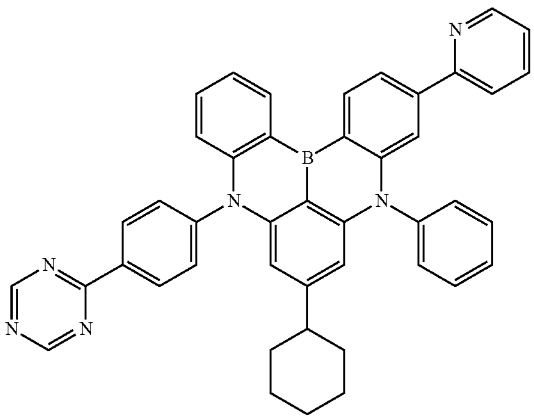
236
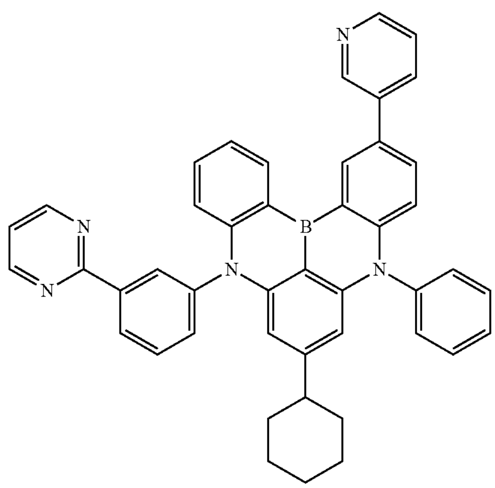
237
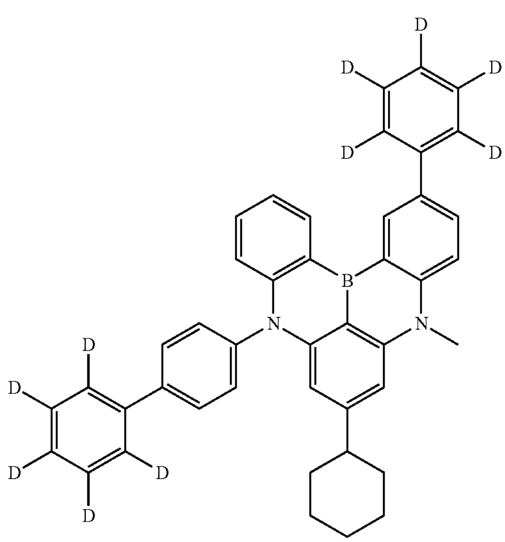
-continued
238
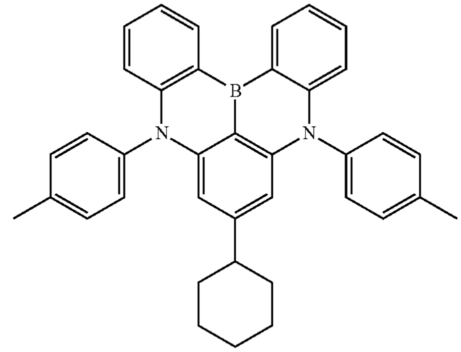
239
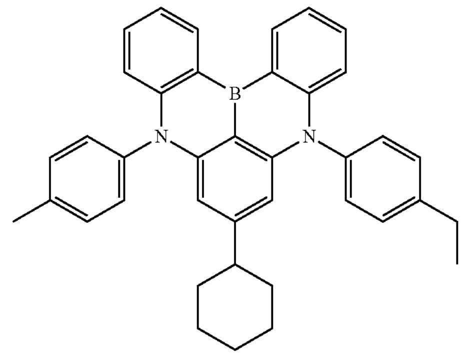
240
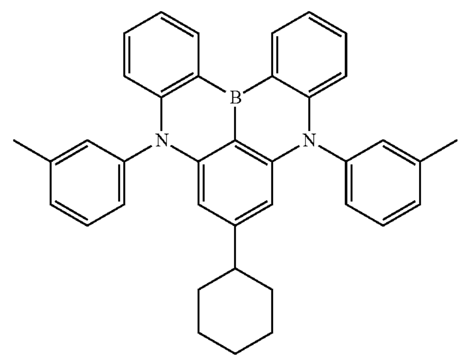
241
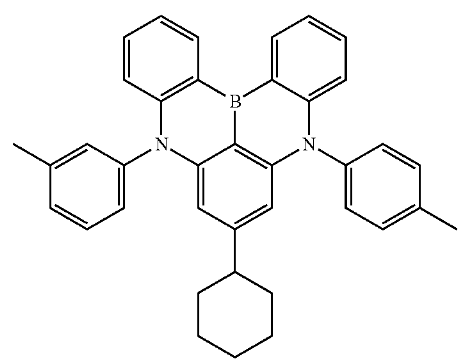

-continued
242
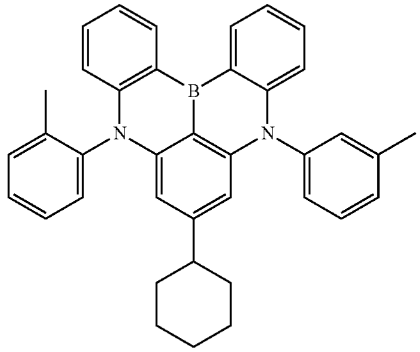
243
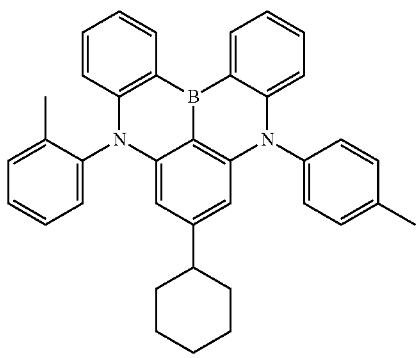
244
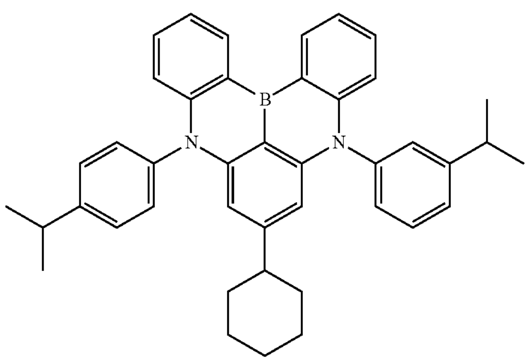
245
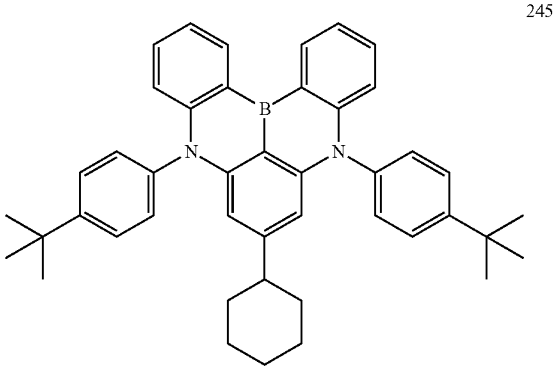
-continued
246
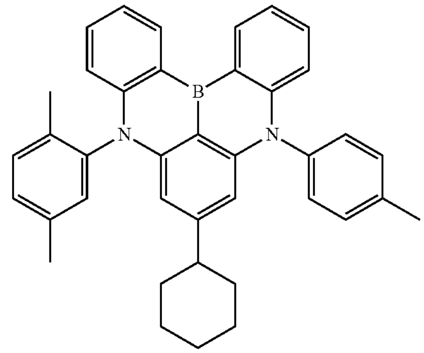
247
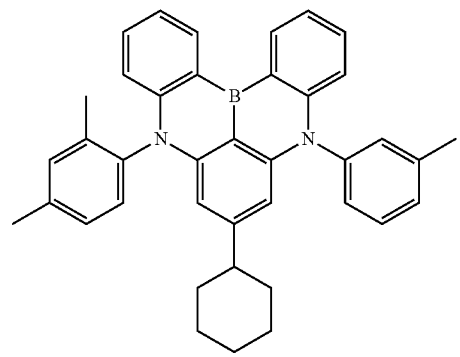
248
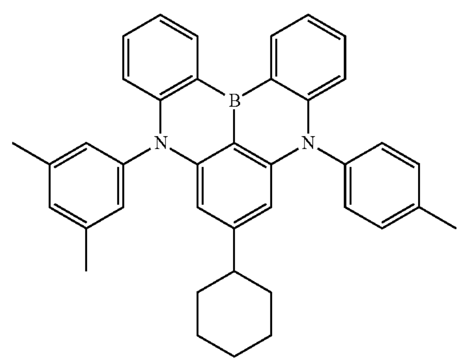
249
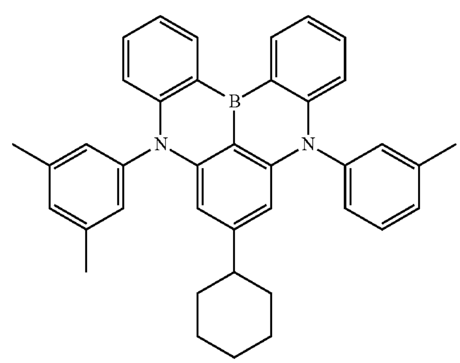

-continued
250
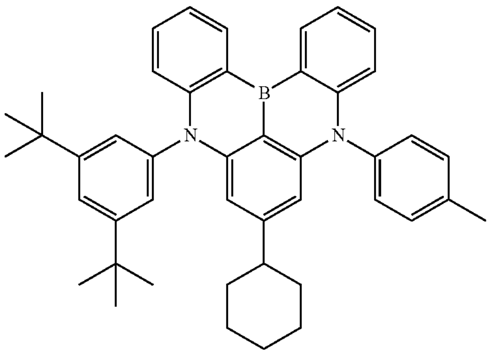
251
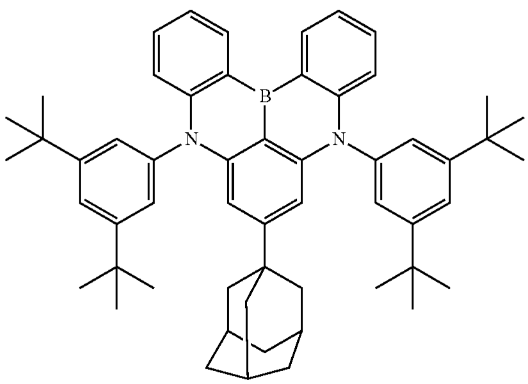
252
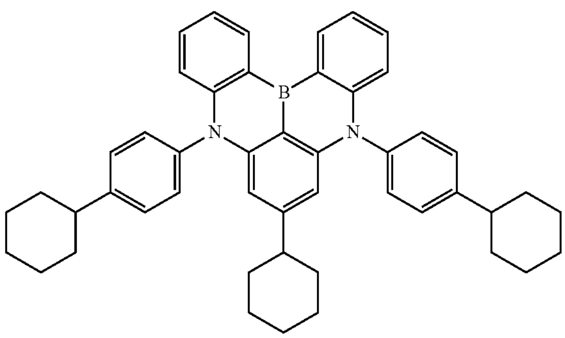
253
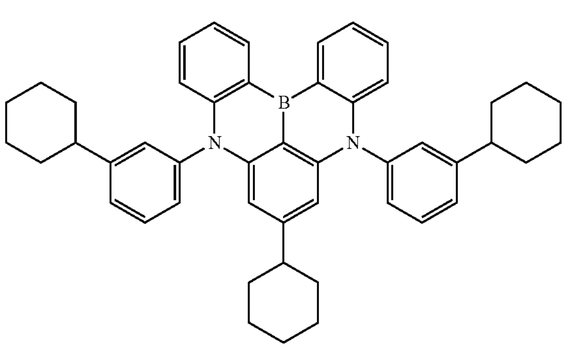
-continued
254
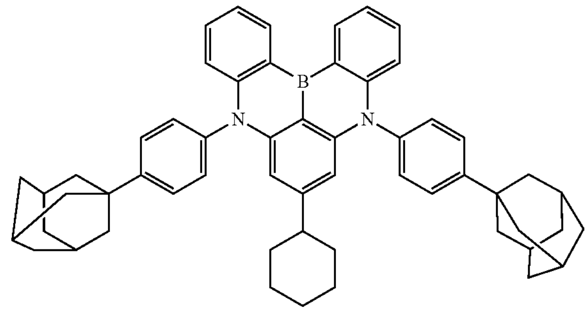
255
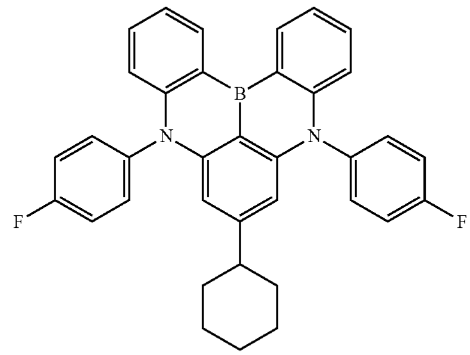
256
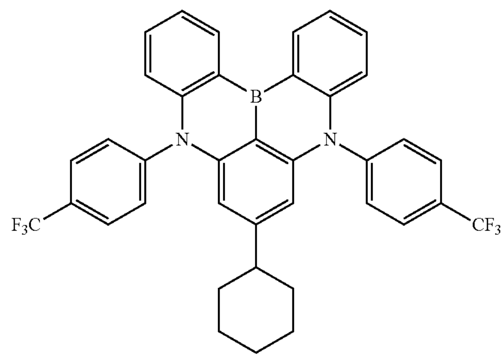
257
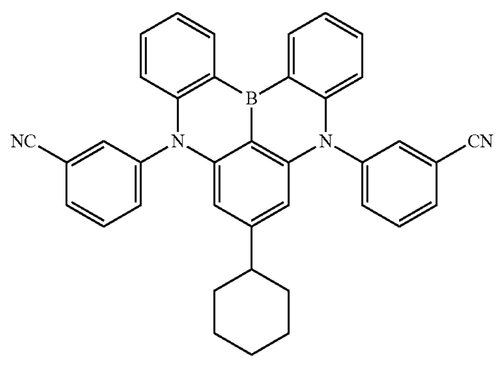

258
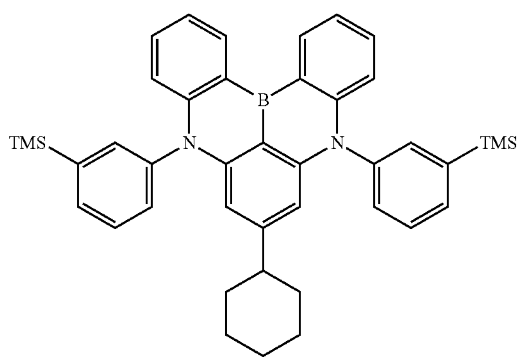
259
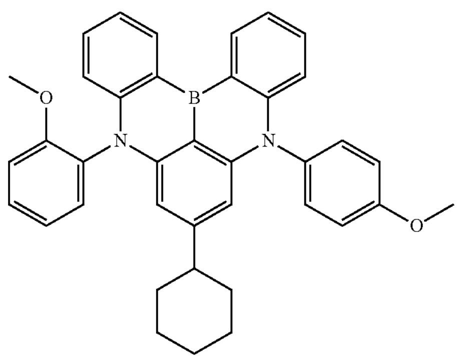
260
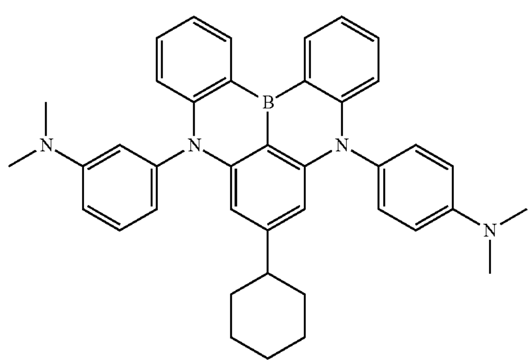
261
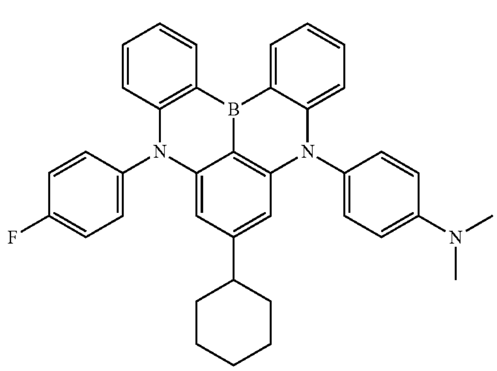
262
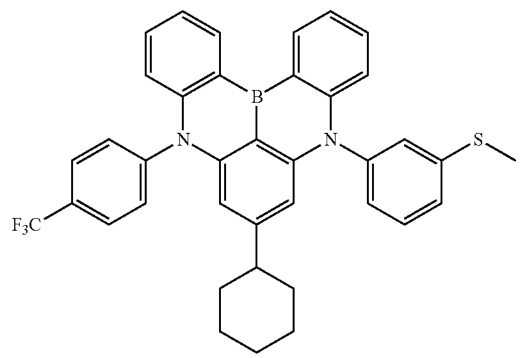
263
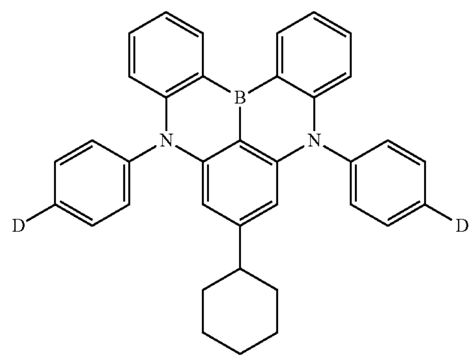
264
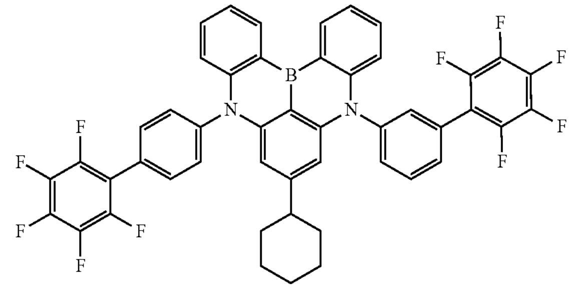
265
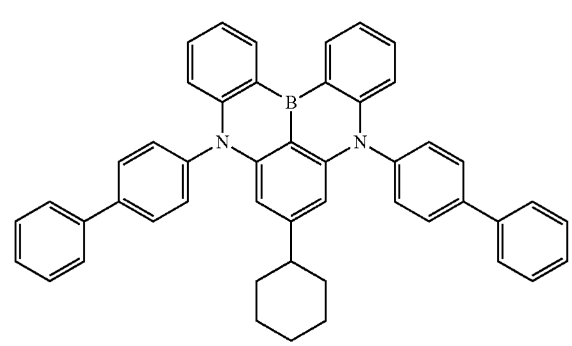

-continued
266
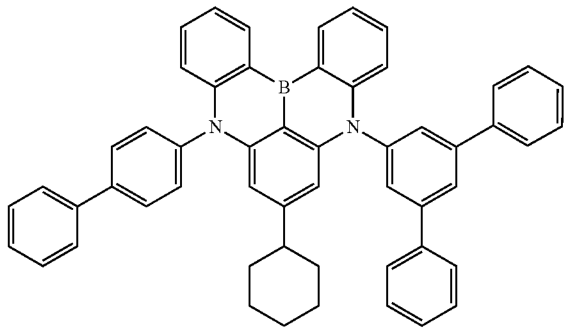
267
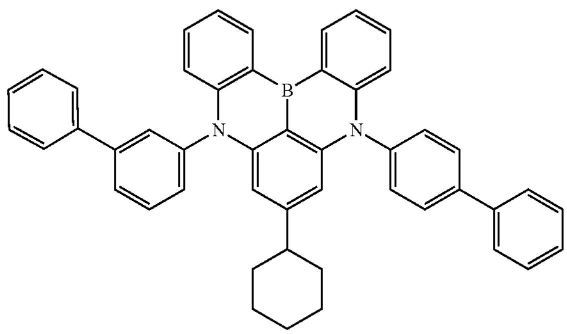
268
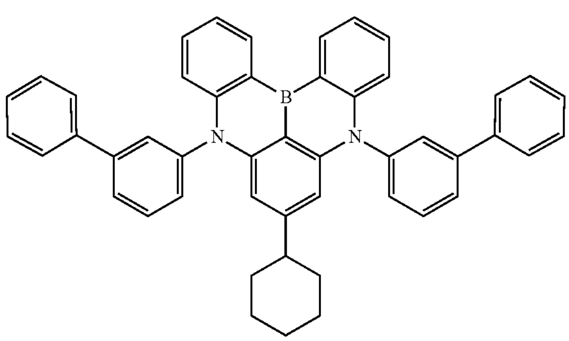
269
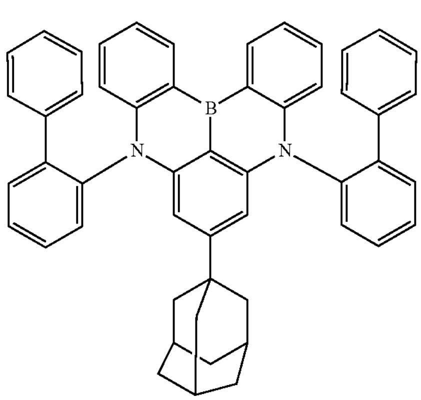
-continued
270
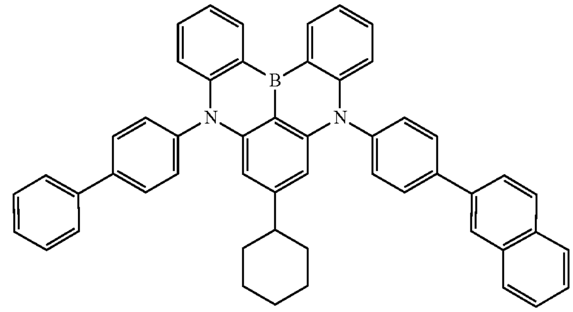
271
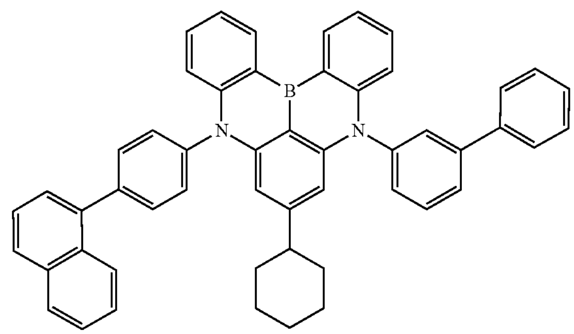
272
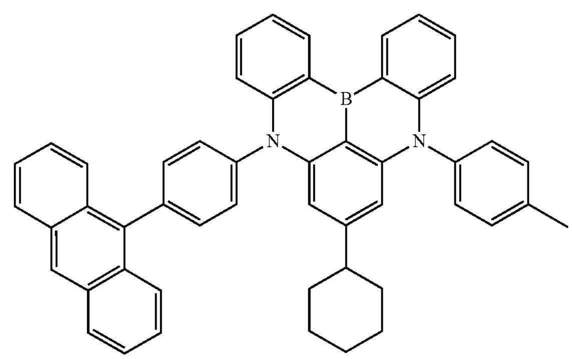
273
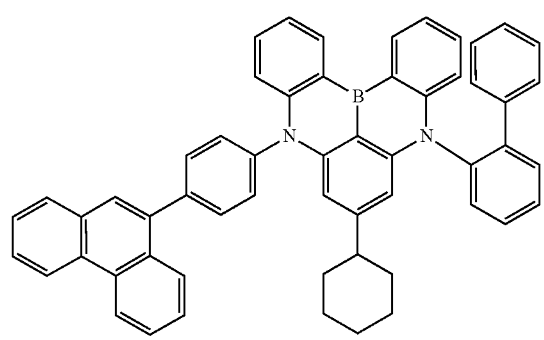

-continued
274
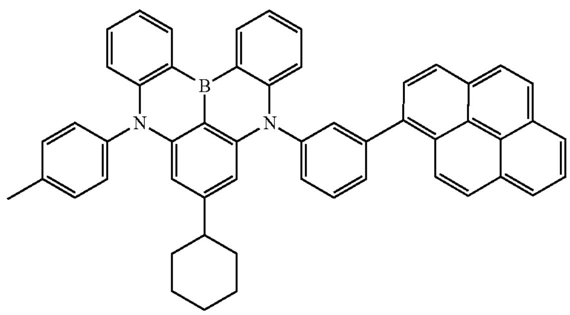
275
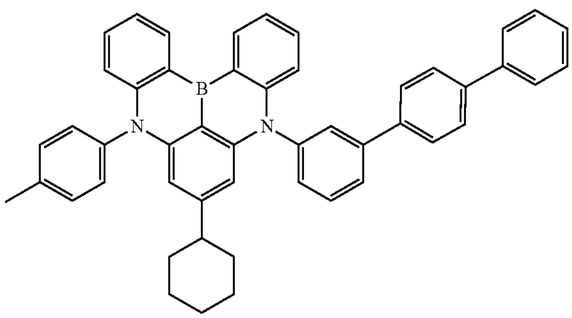
276
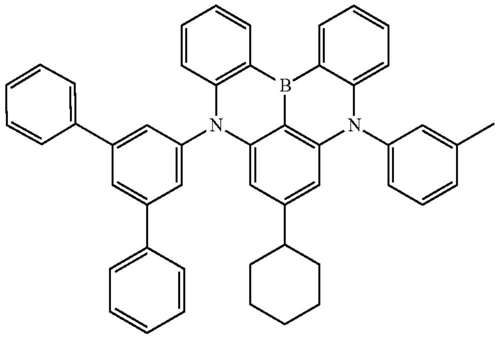
277
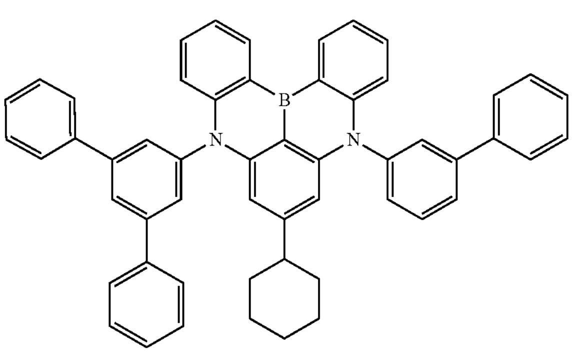
-continued
278
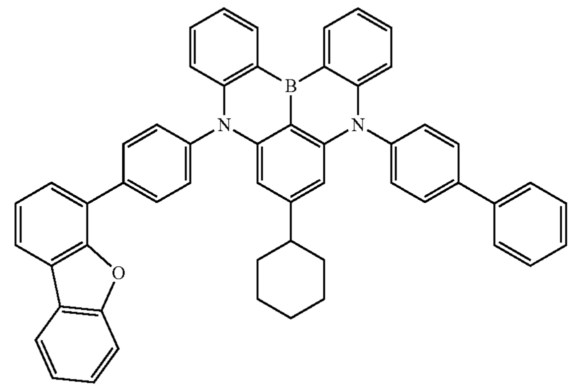
279
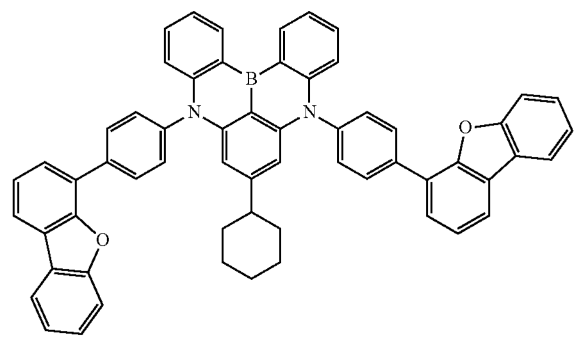
280
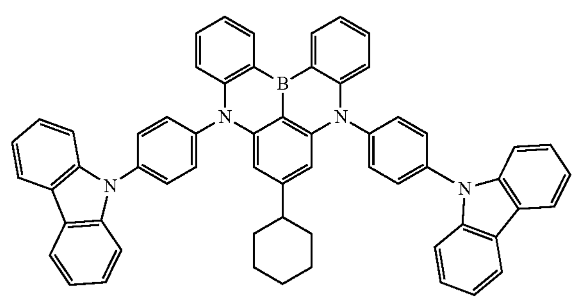
281
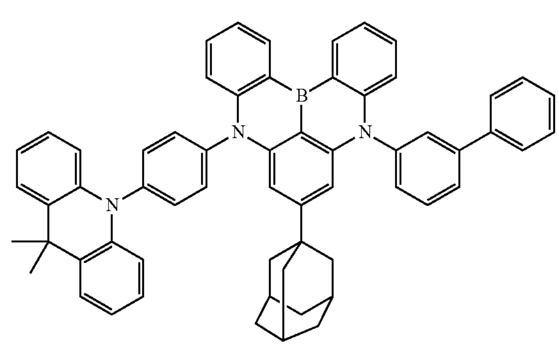

-continued
282
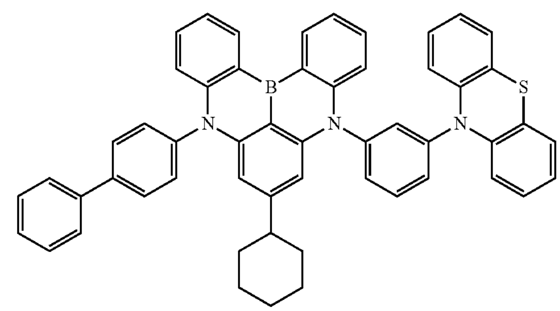
283
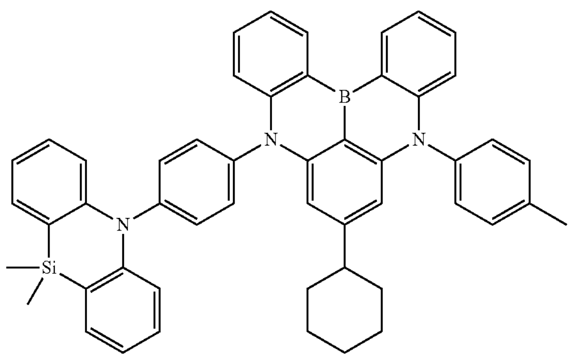
284
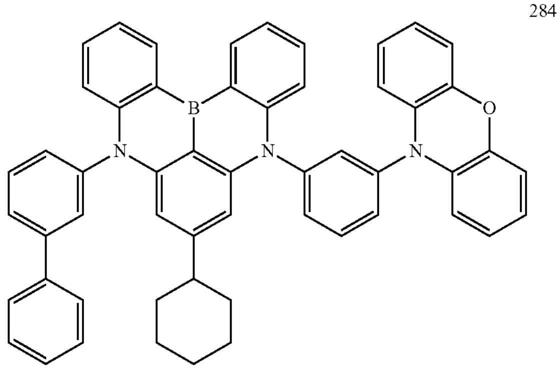
285
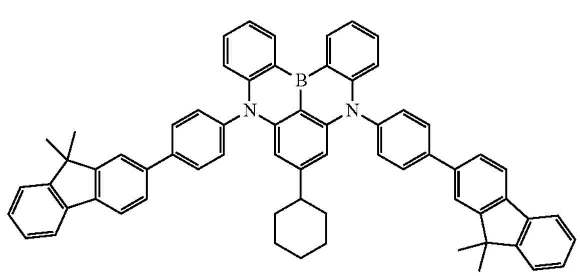
286
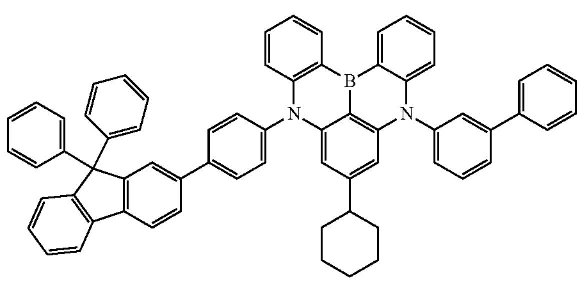
-continued
287
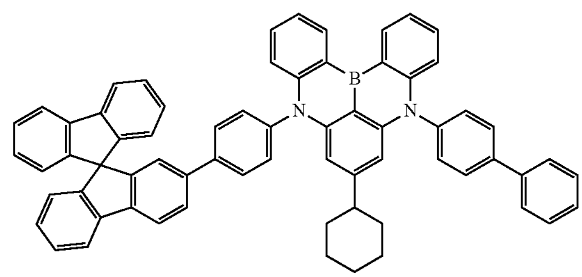
288
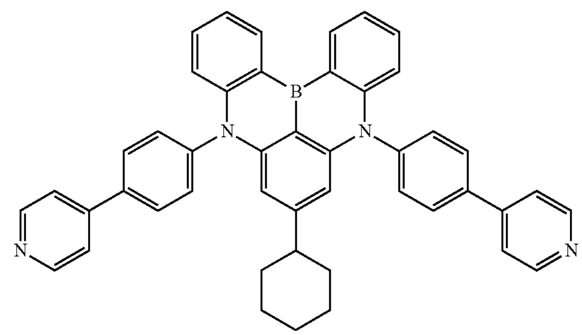
289
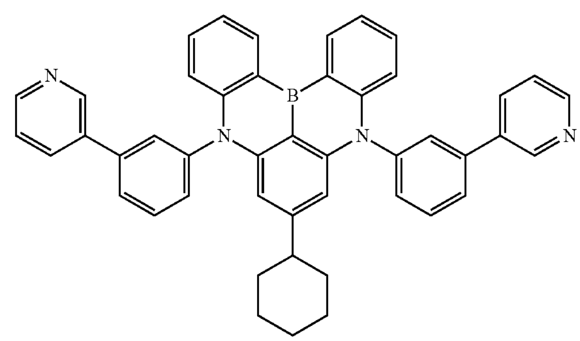
290
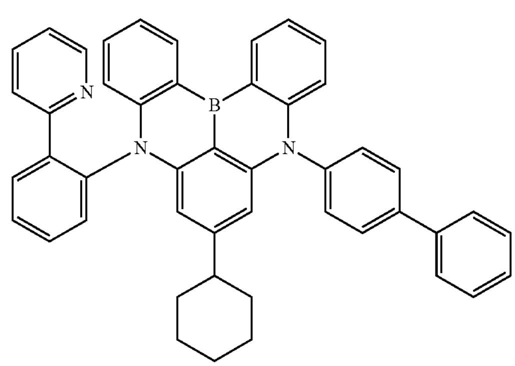

291
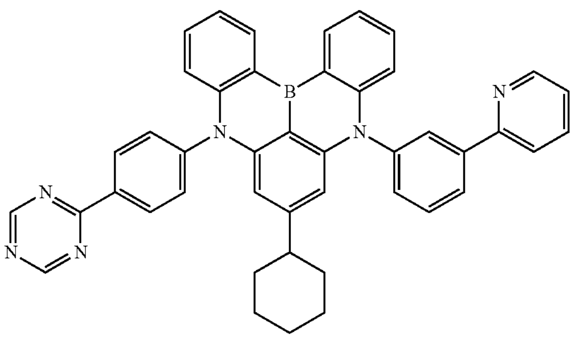
292
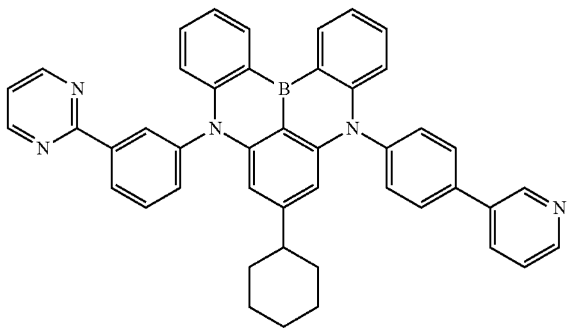
293
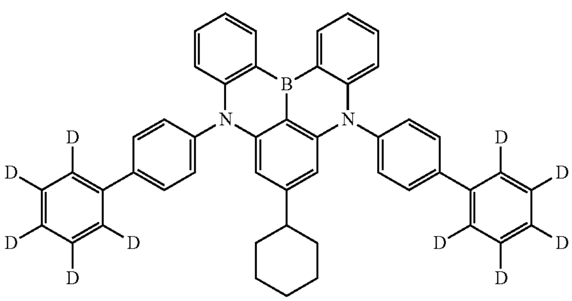
294
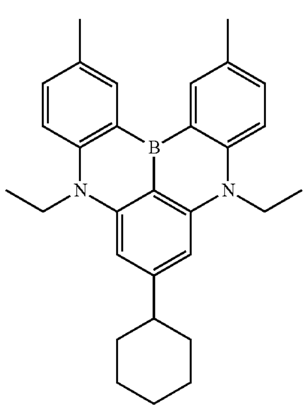
295
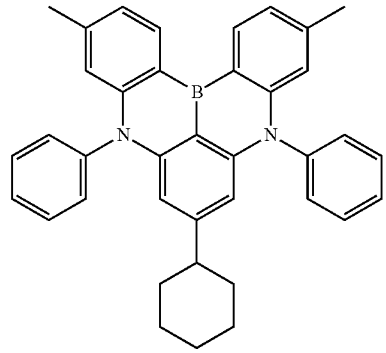
296
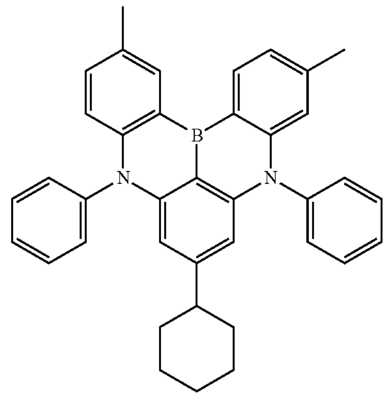
297
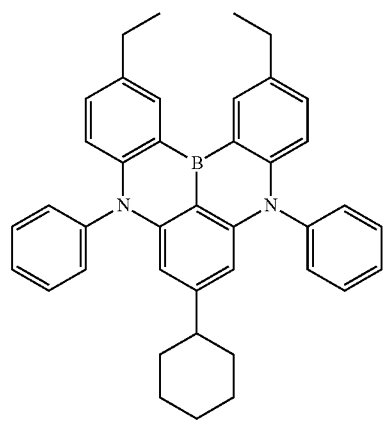
298
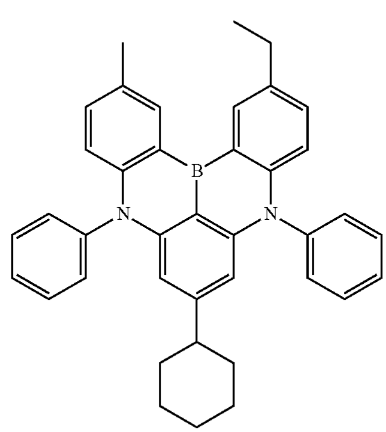

-continued
299
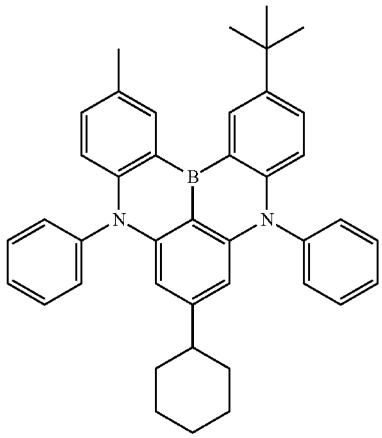
300
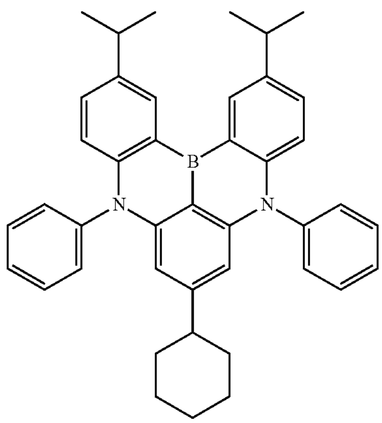
301
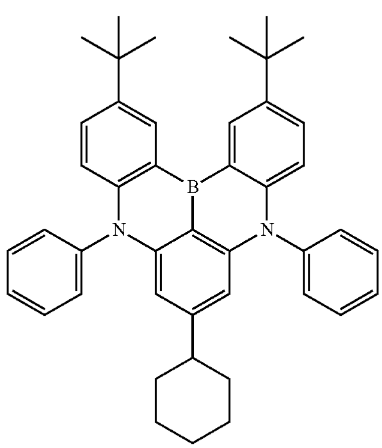
-continued
302
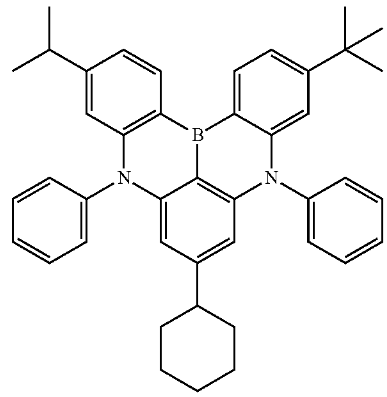
303
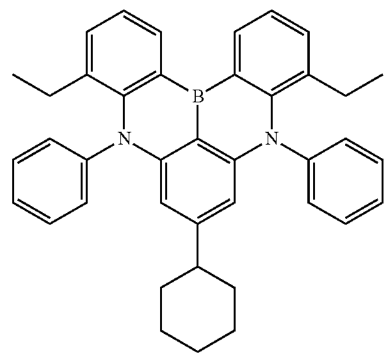
304
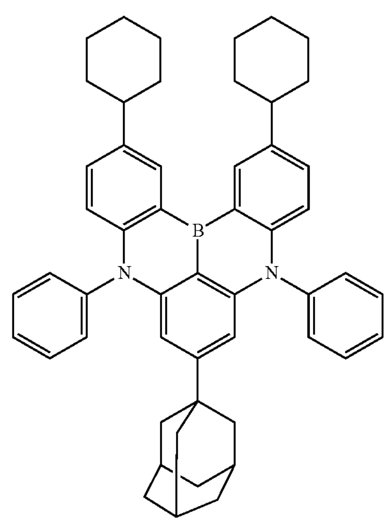

-continued
305
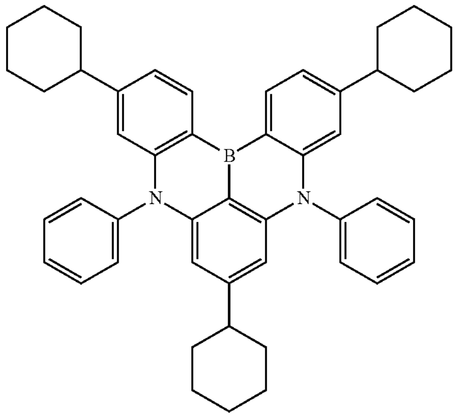
306
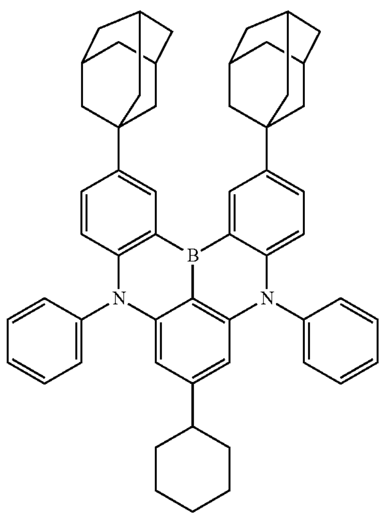
307
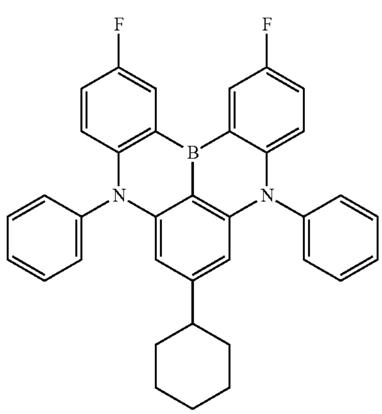
-continued
308
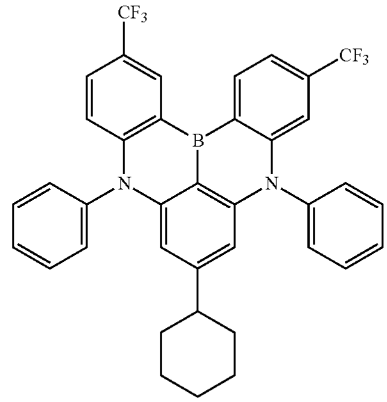
309
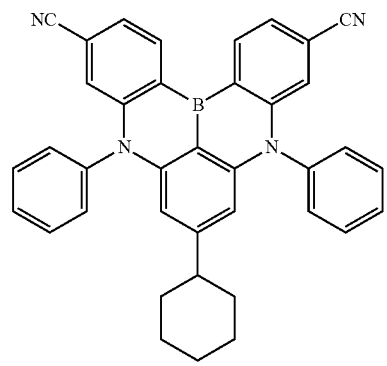
310
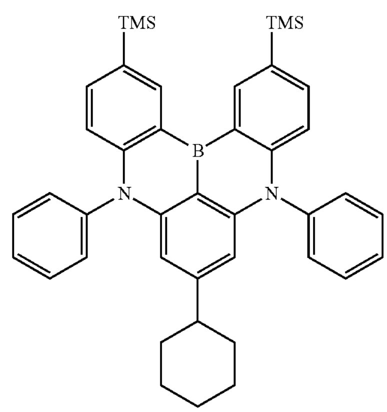
311
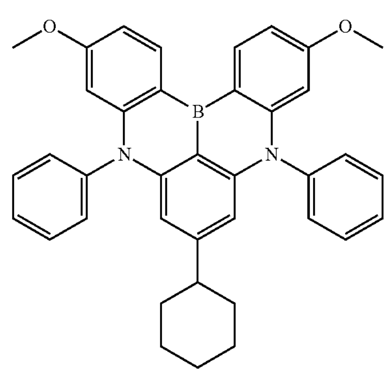

312
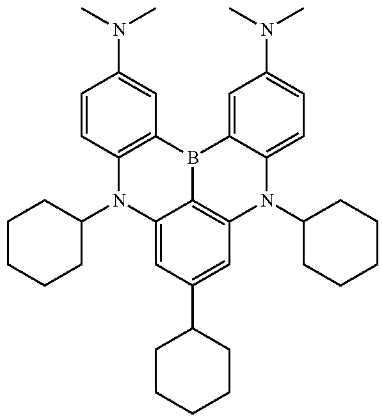
313
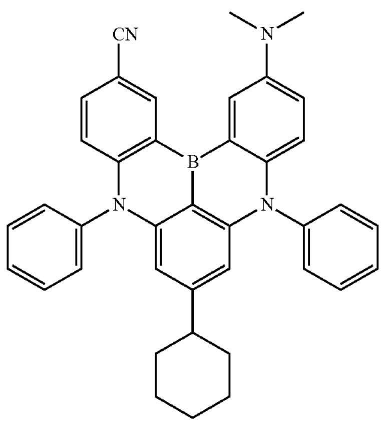
314
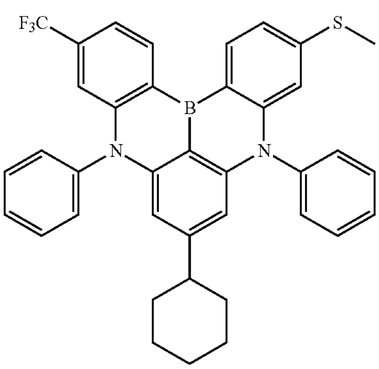
315
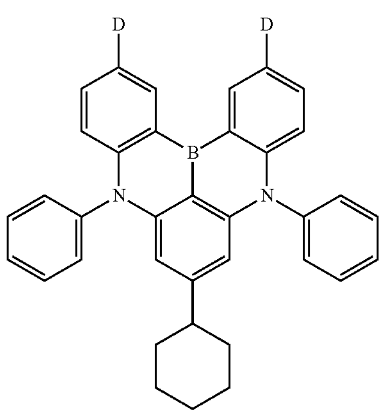
316
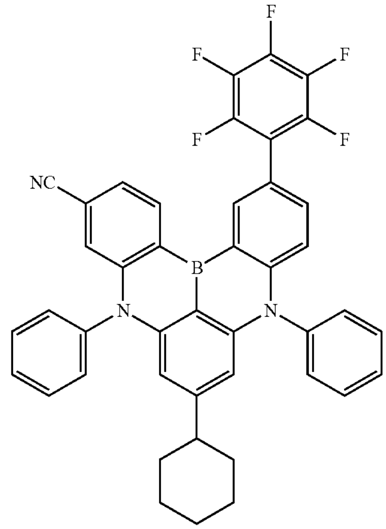
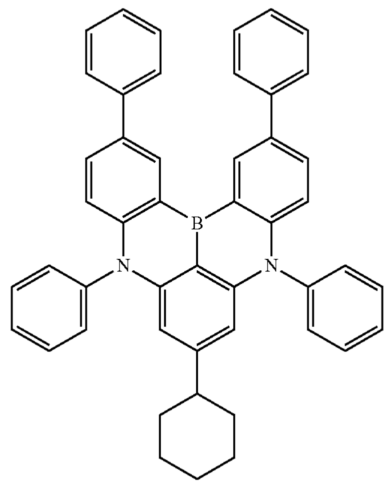
318
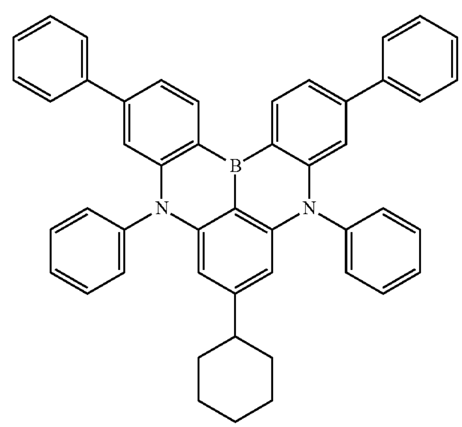

319
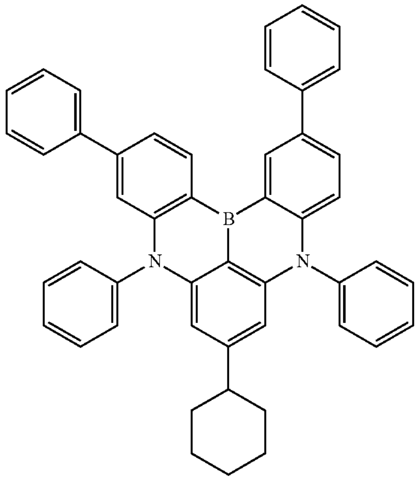
320
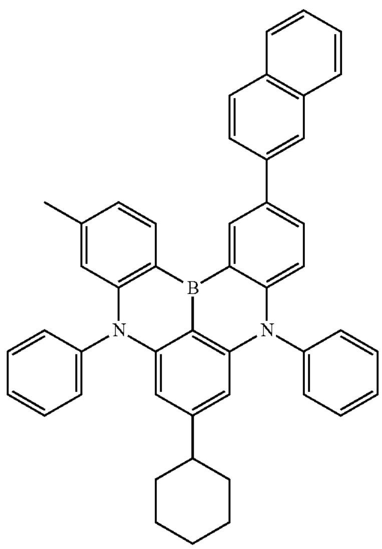
321
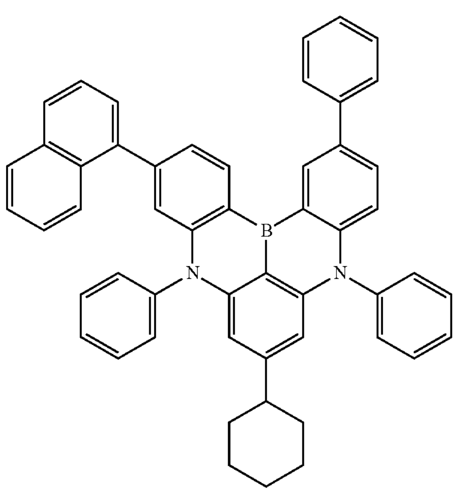
322
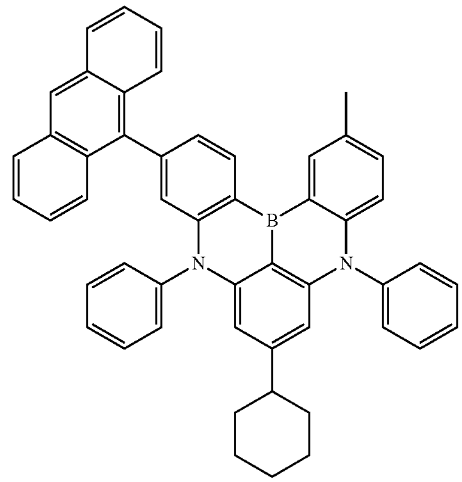
323
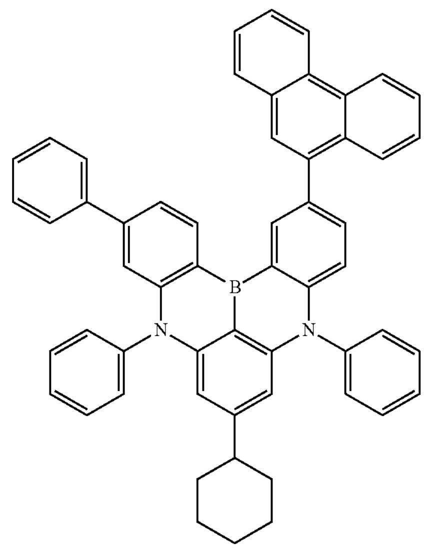
324
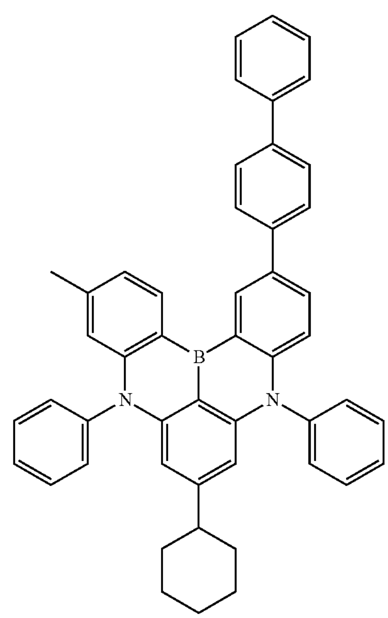

-continued
325
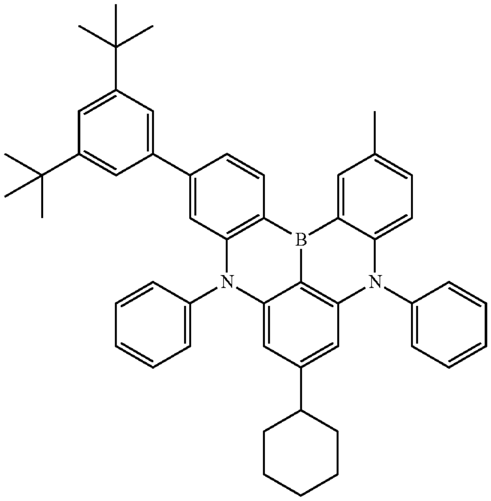
326
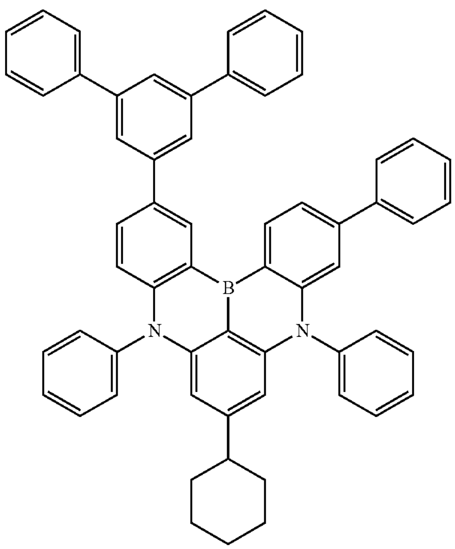
327
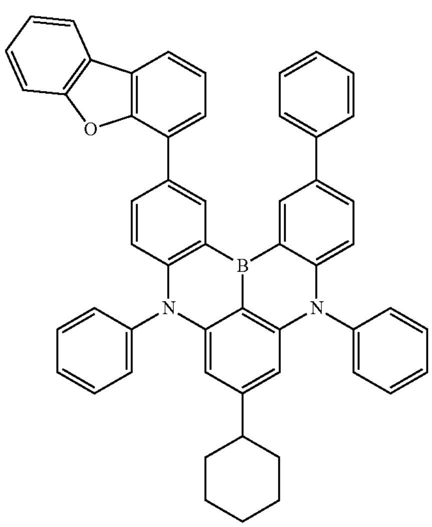
-continued
328
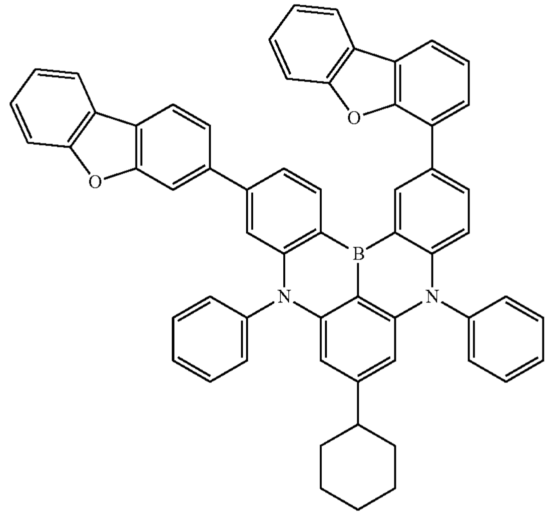
329
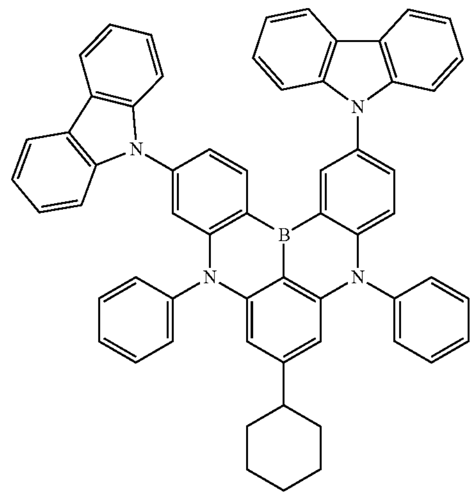
330
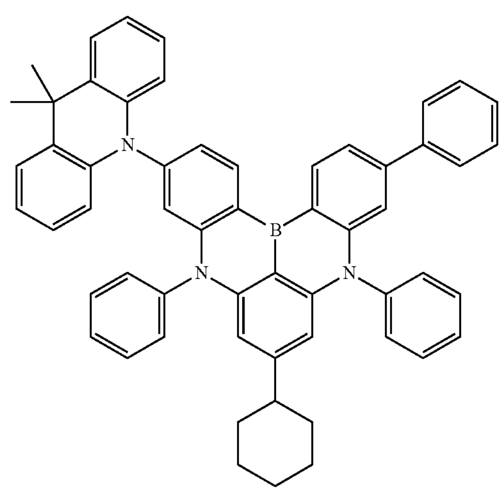

-continued
331
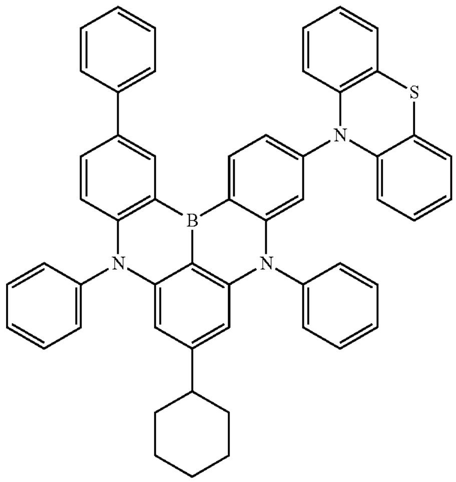
332
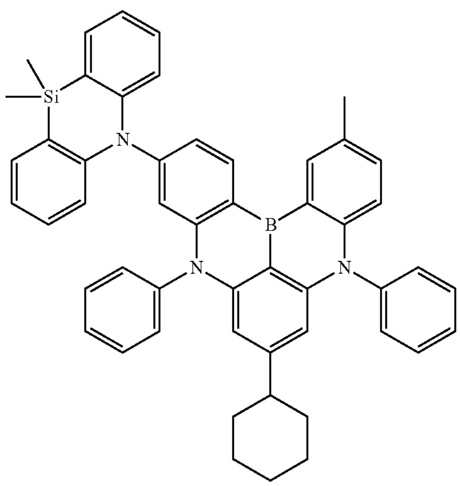
333
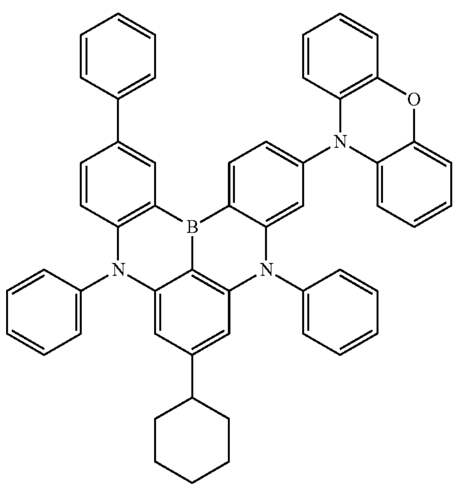
-continued
334
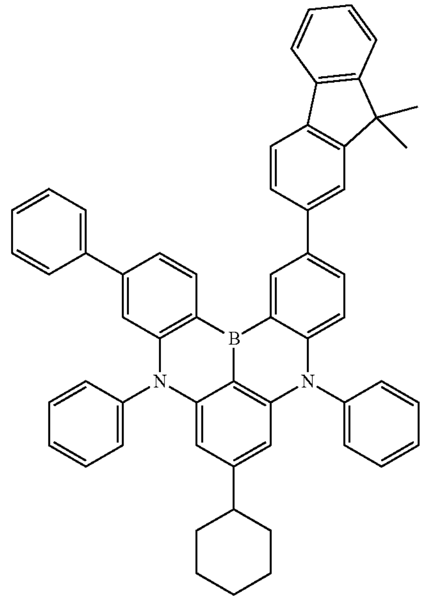
335
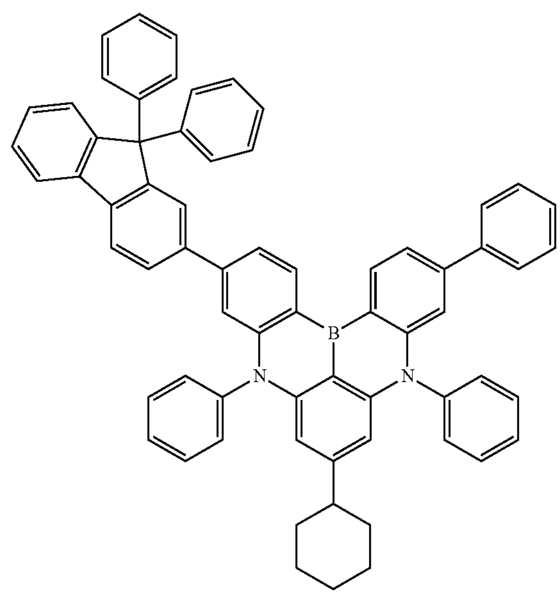

-continued
336
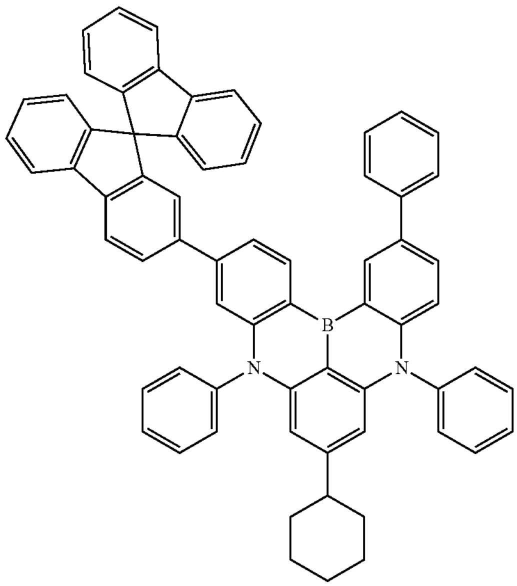
337
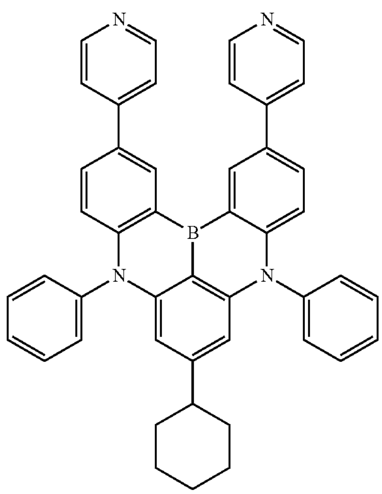
338
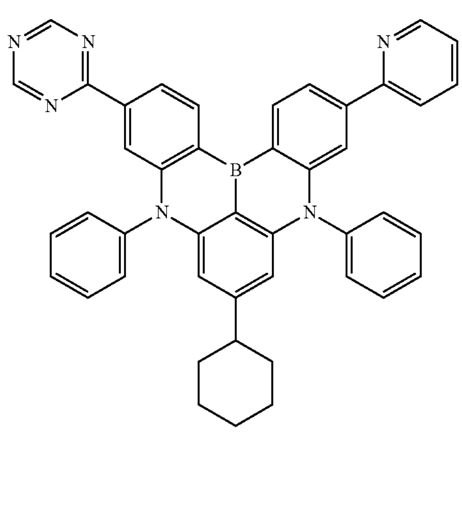
-continued
339
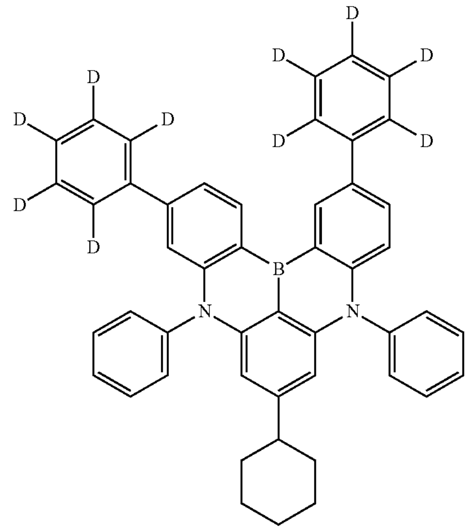
340
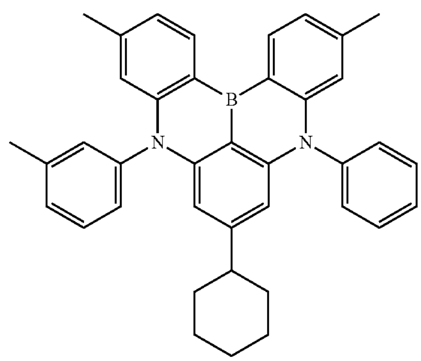
341
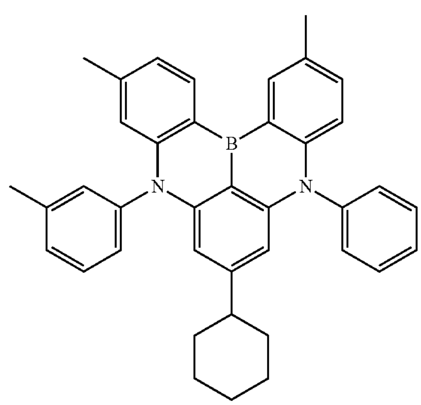

-continued
342
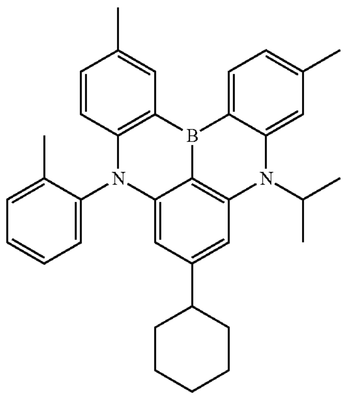
343
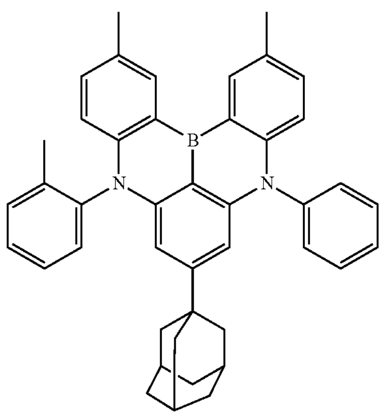
344
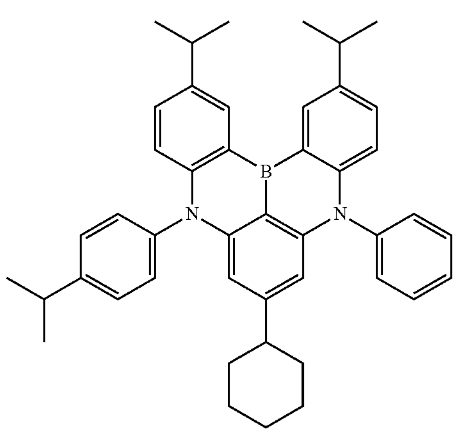
-continued
345
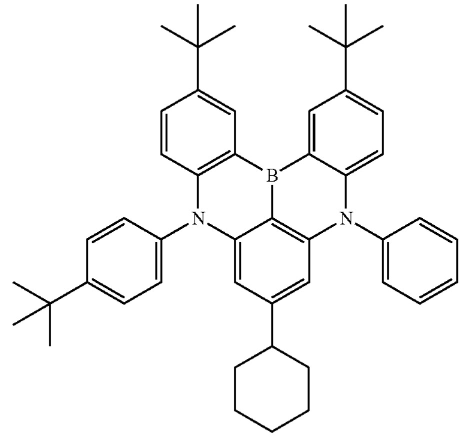
346
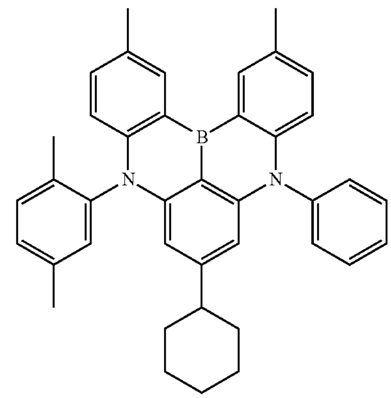
347
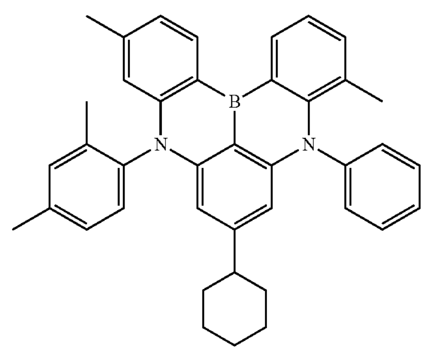
348
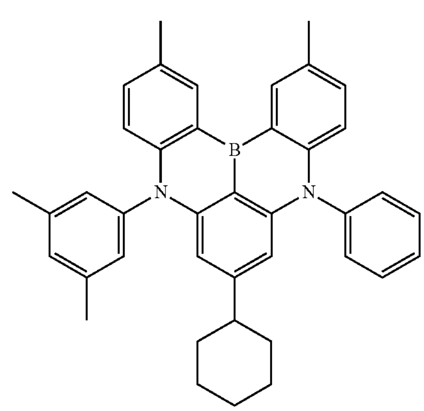

-continued
349
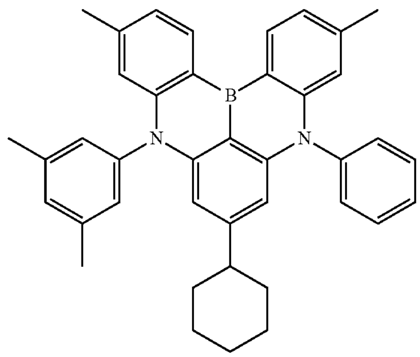
350
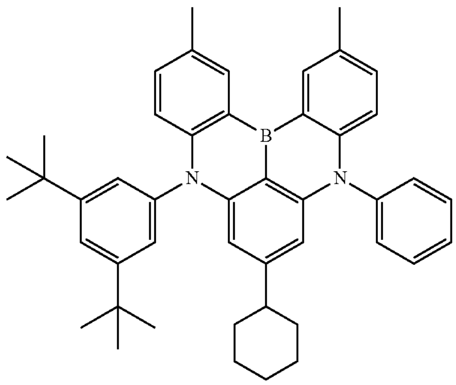
351
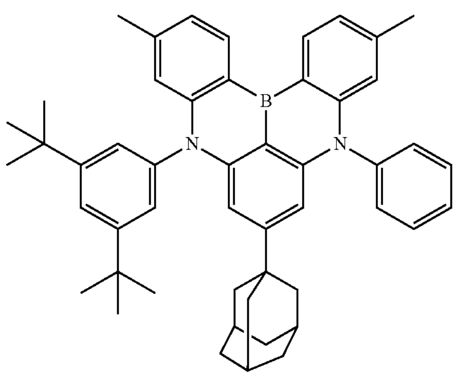
352
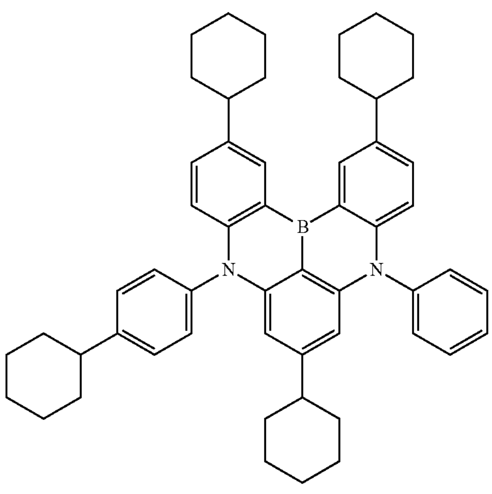
-continued
353
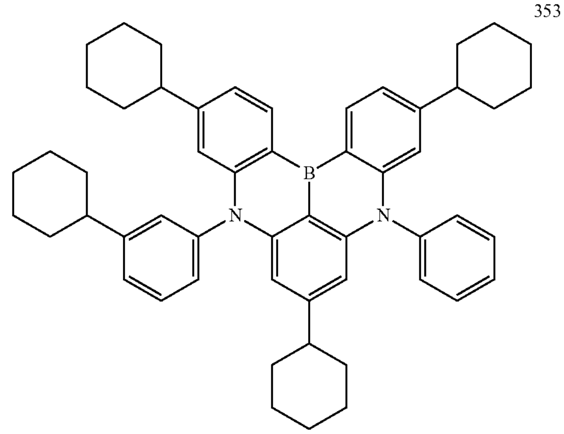
354
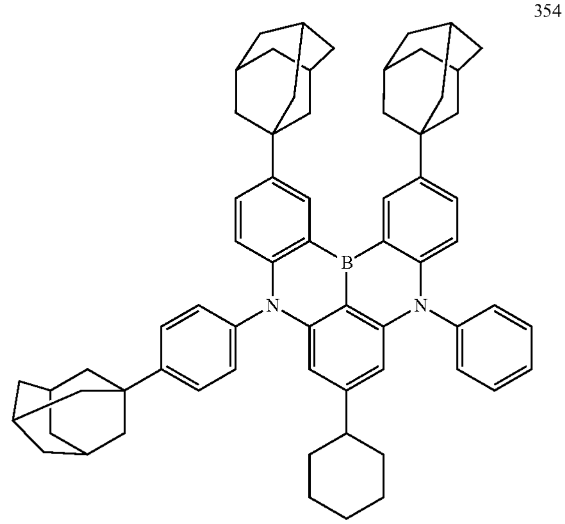
355
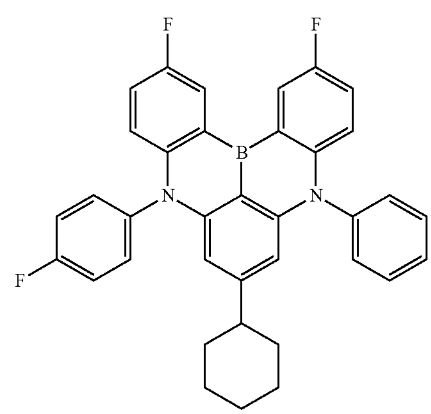

-continued
356
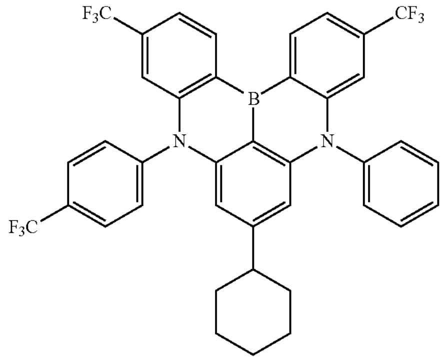
357
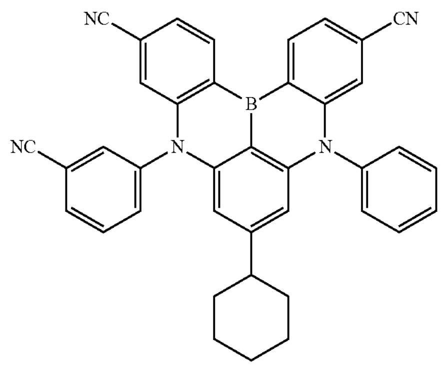
358
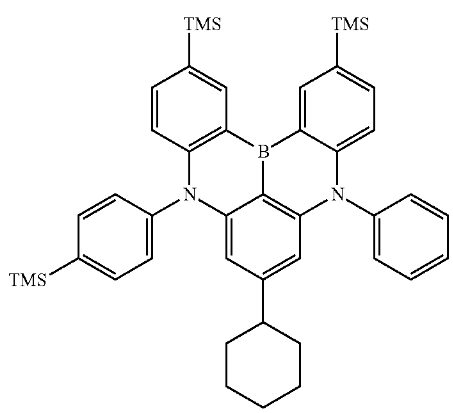
359
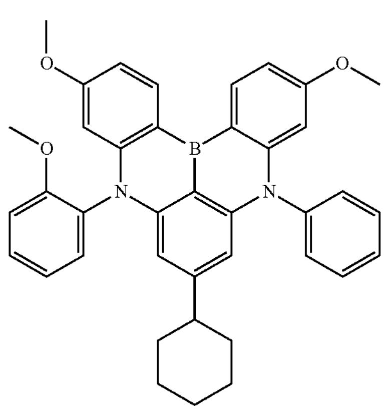
-continued
360
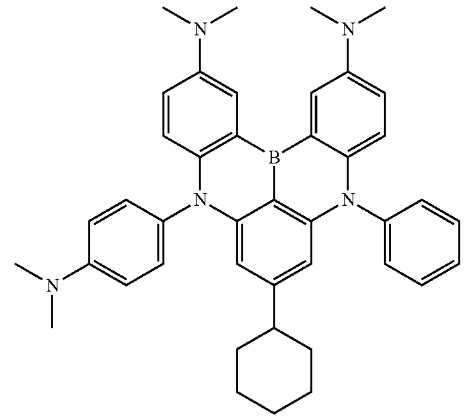
361
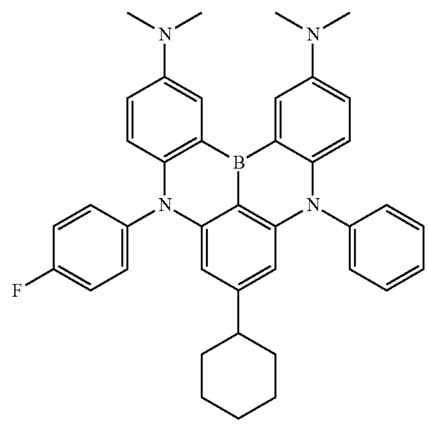
362
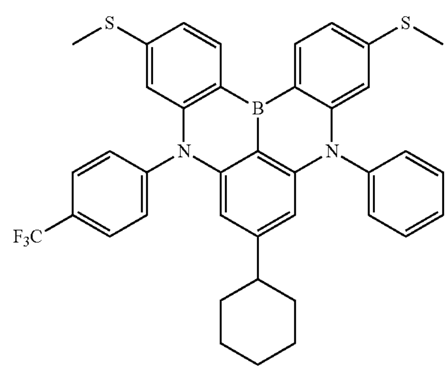
363
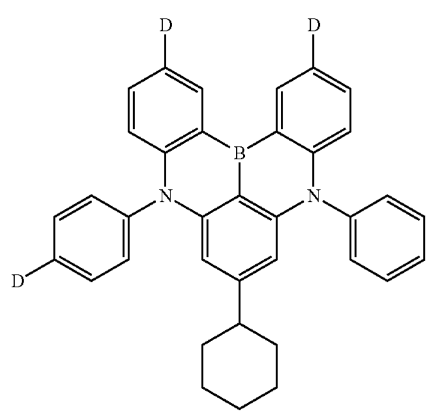

-continued
364
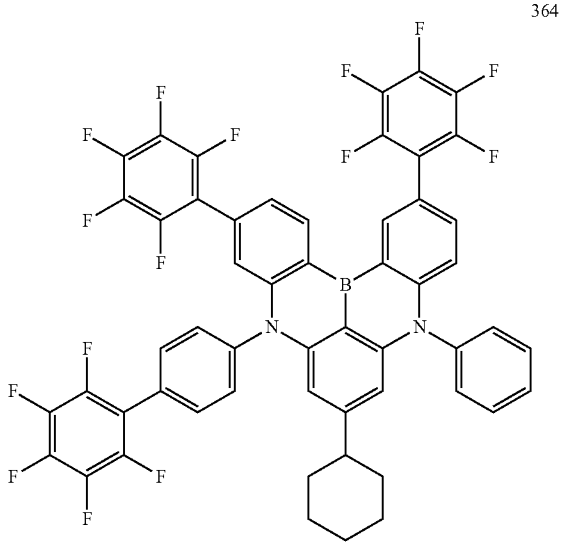
365
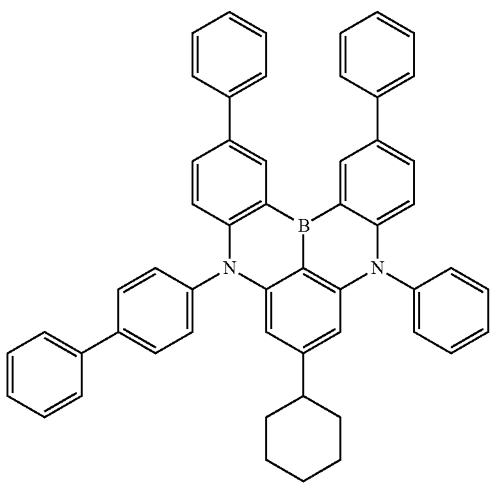
366
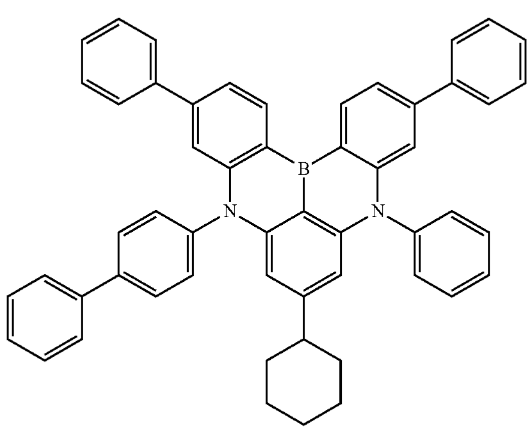
-continued
367
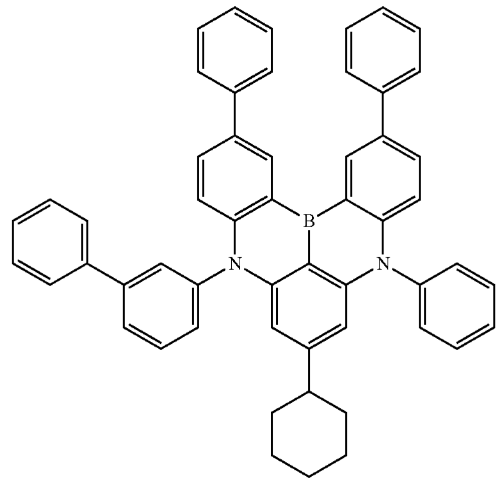
368
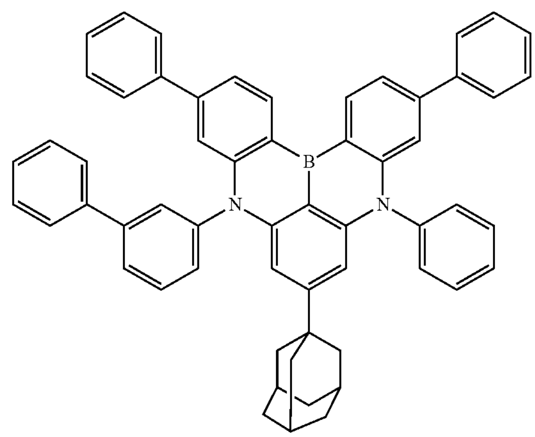
369
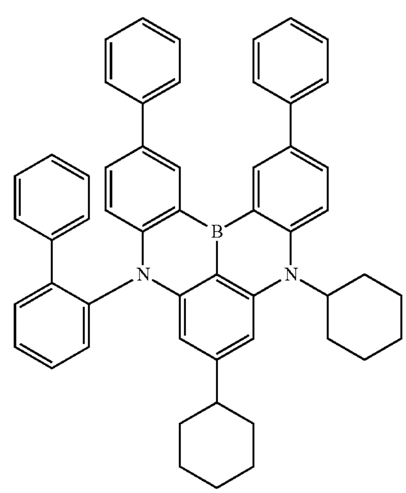

370
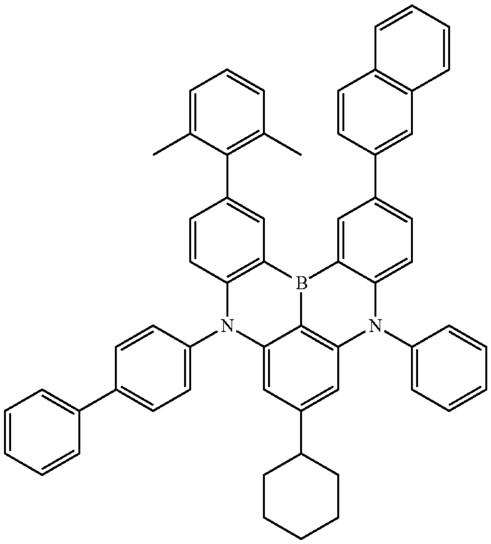
371
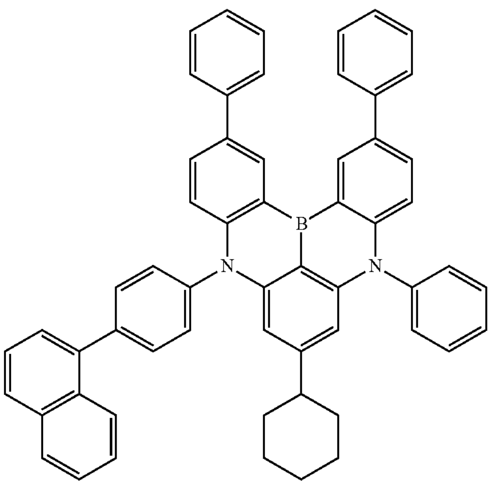
372
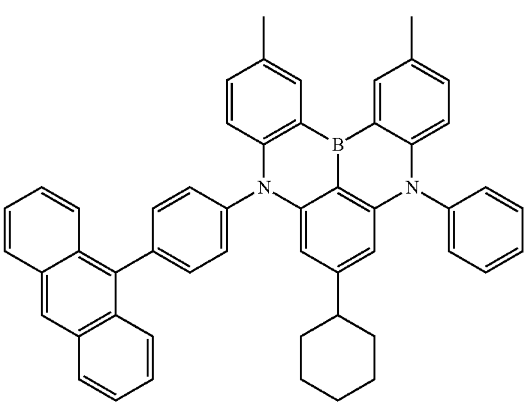
373
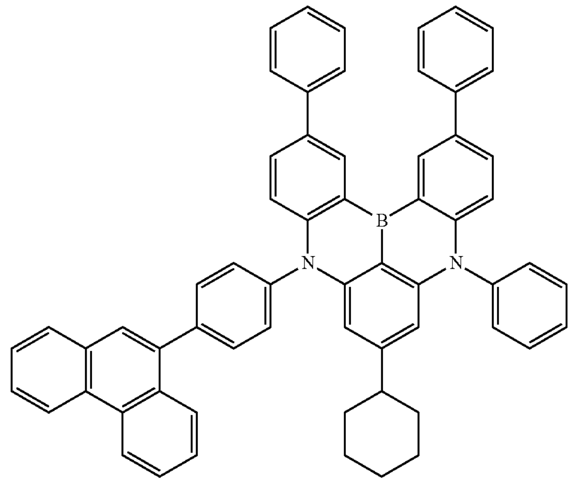
374
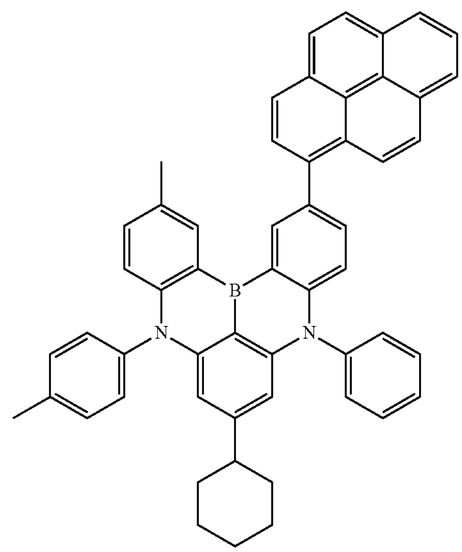
375
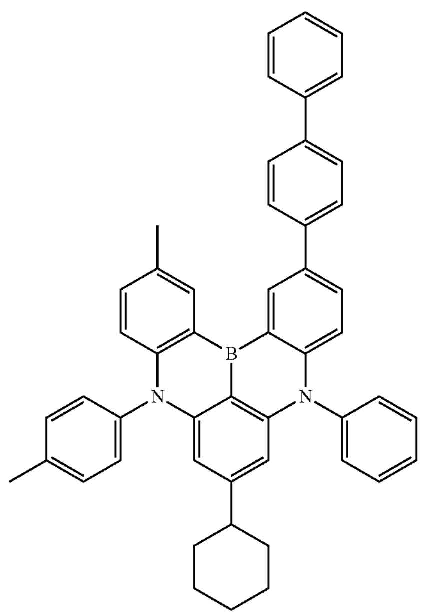

-continued
376
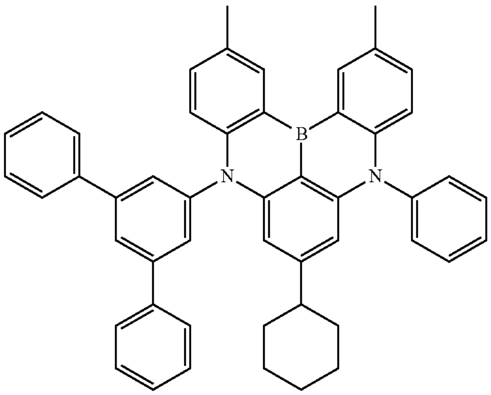
377
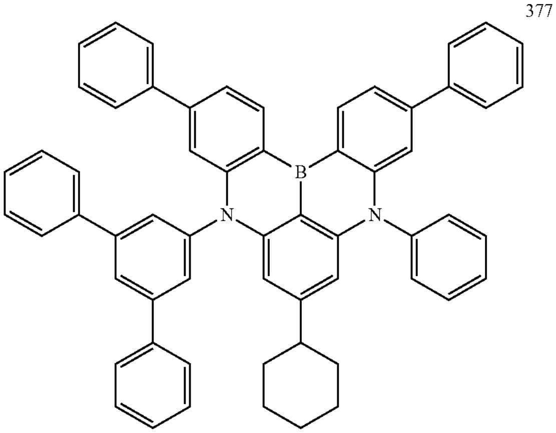
378
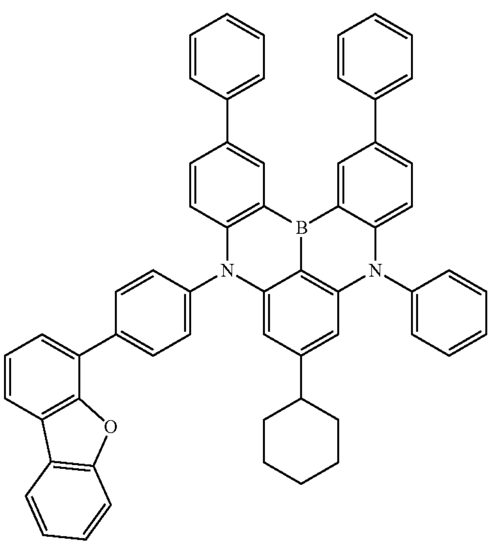
-continued
379
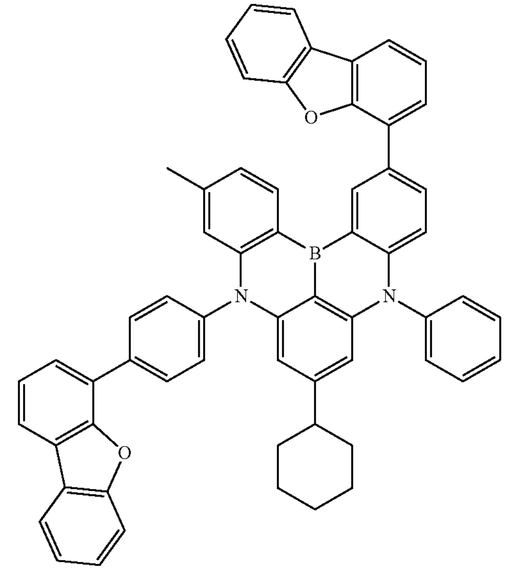
380
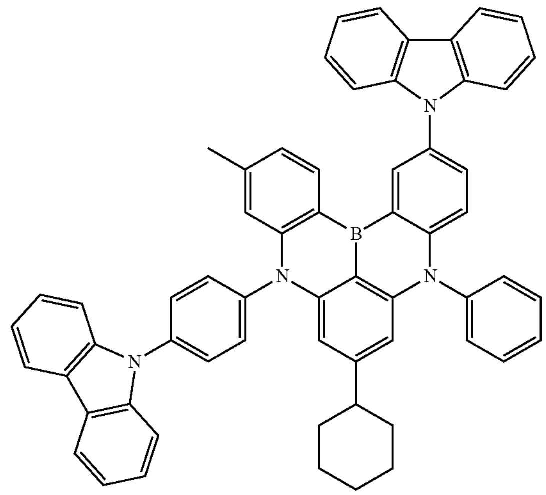
381
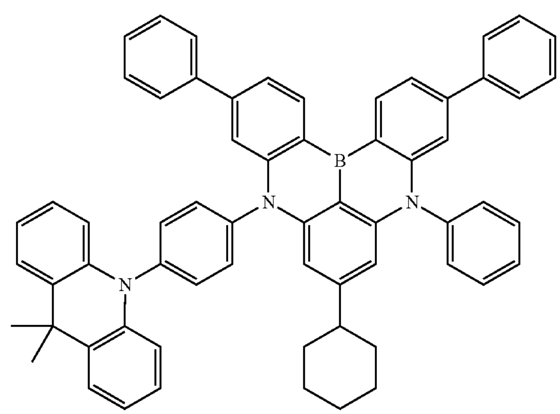

-continued
382
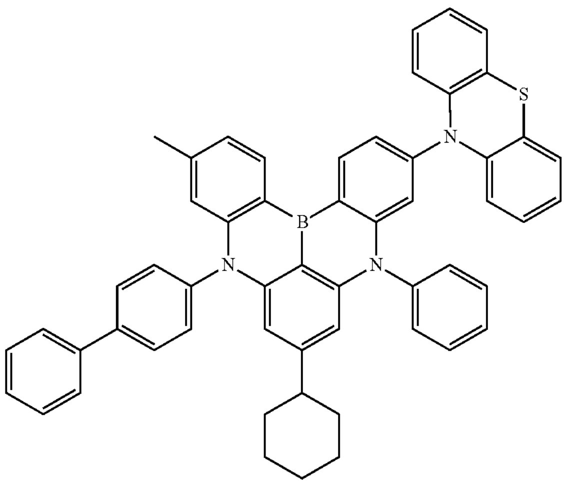
383
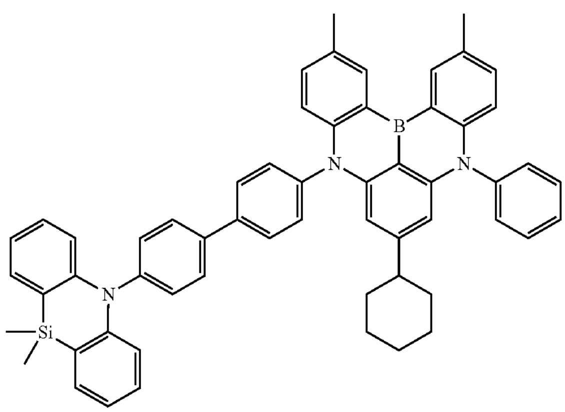
384
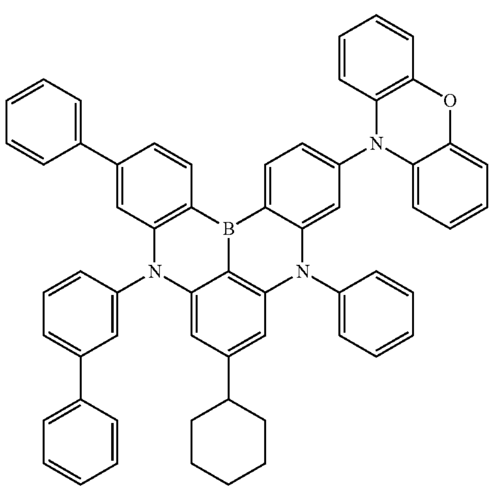
-continued
385
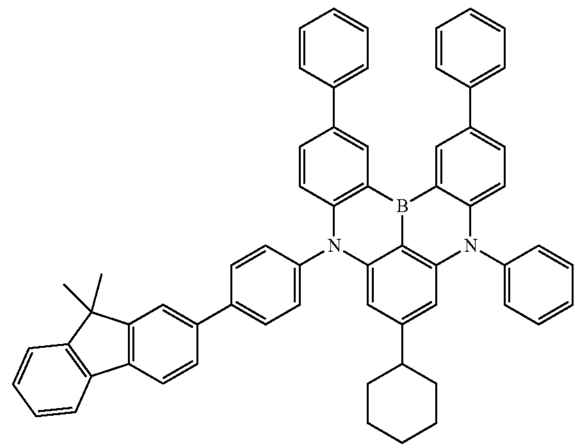
386
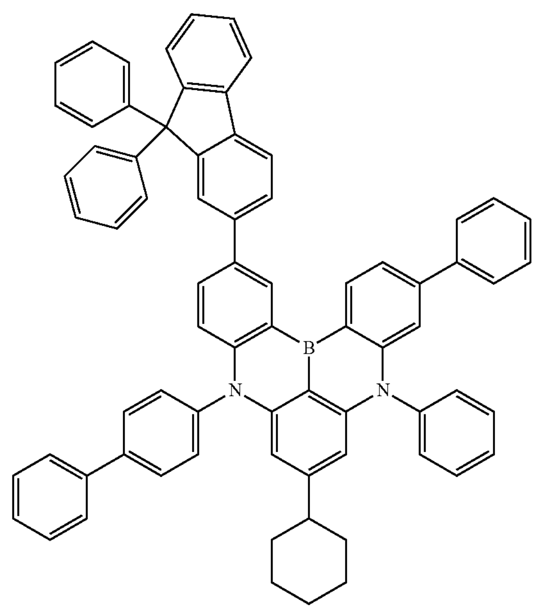

-continued
387
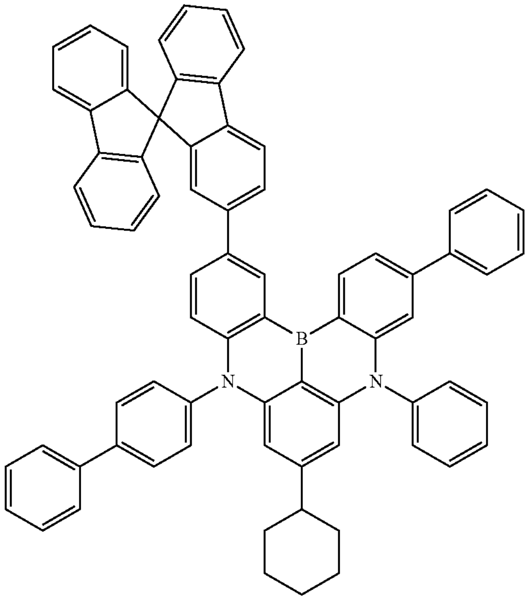
388
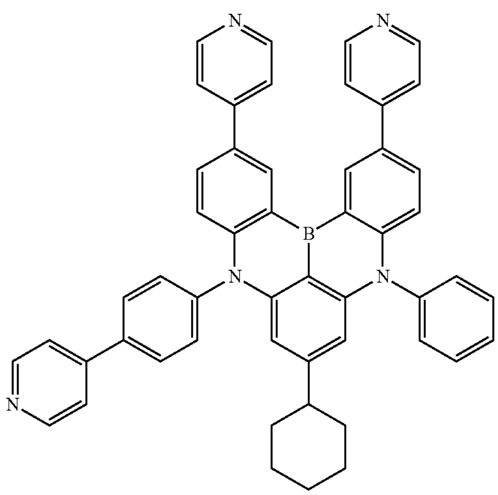
389
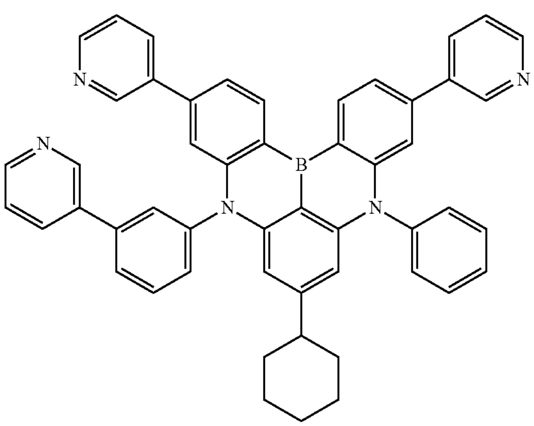
-continued
390
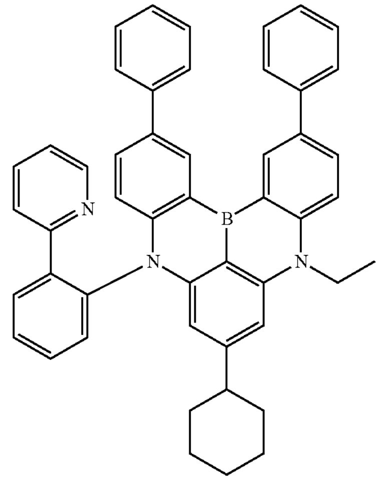
391
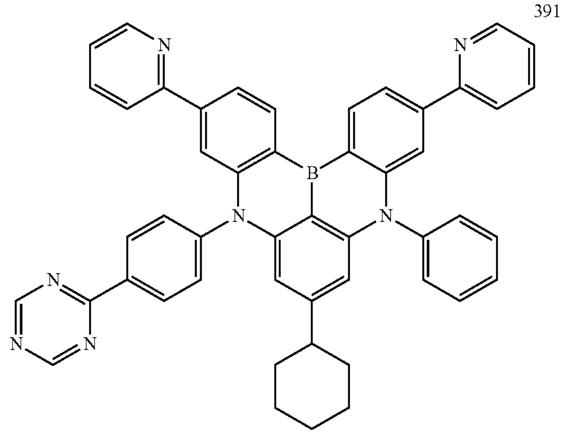
392
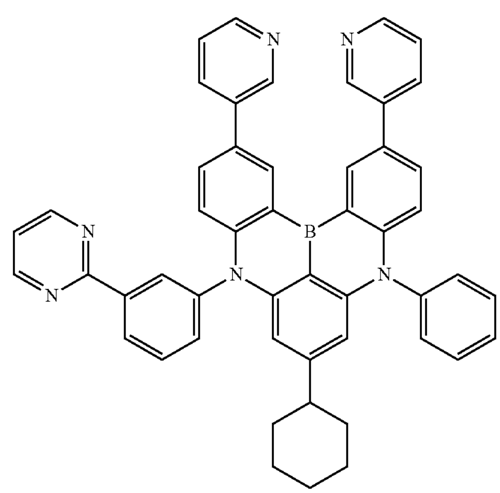

-continued
393
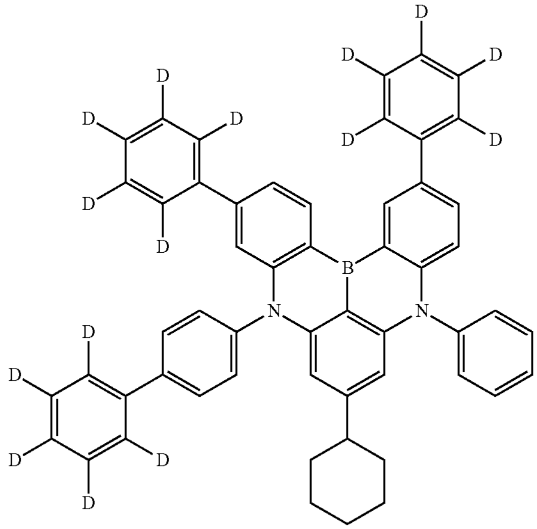
394
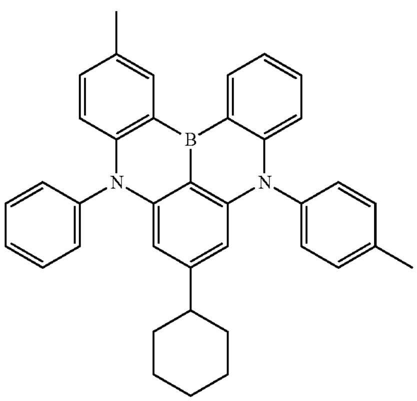
395
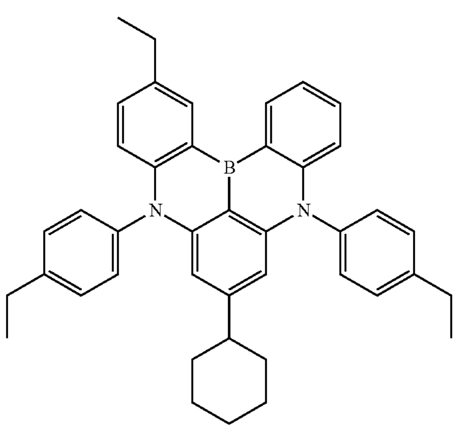
-continued
396
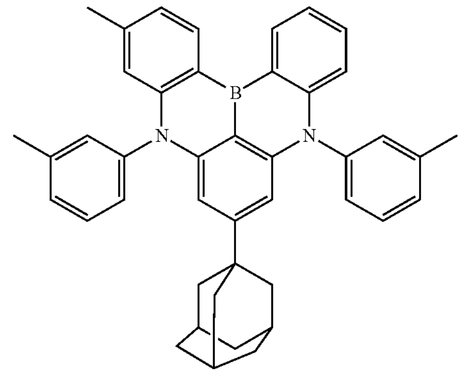
397
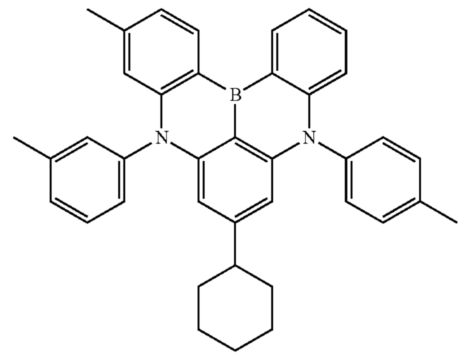
398
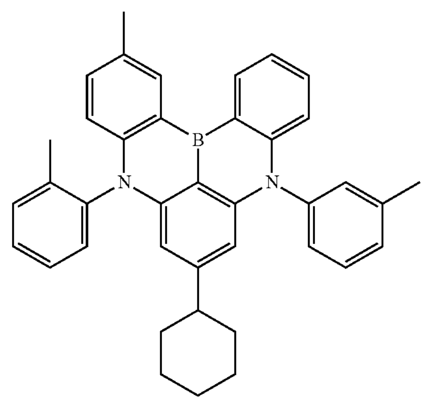
399
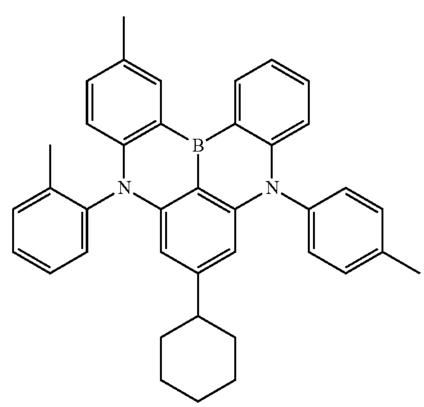

-continued
400
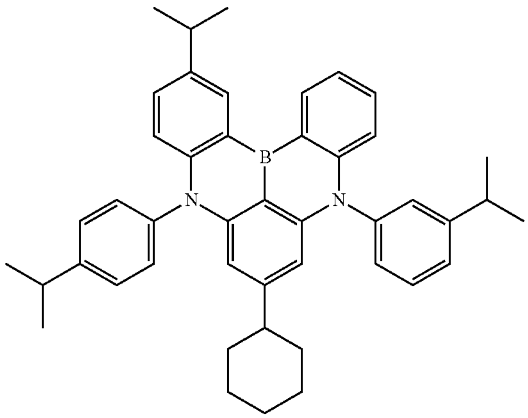
401
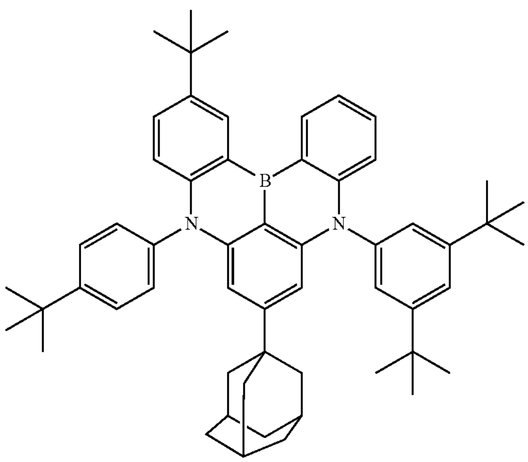
402
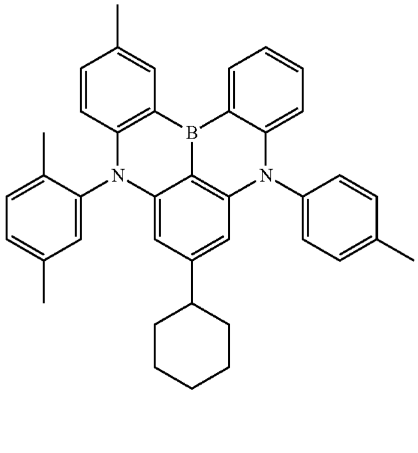
-continued
403
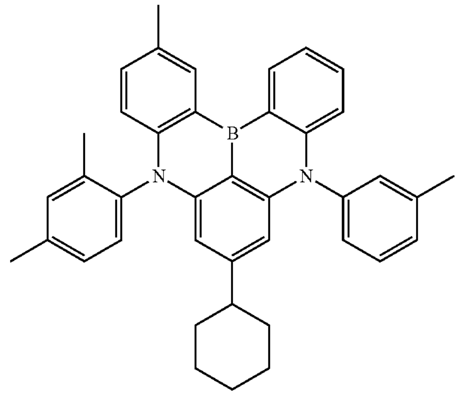
404
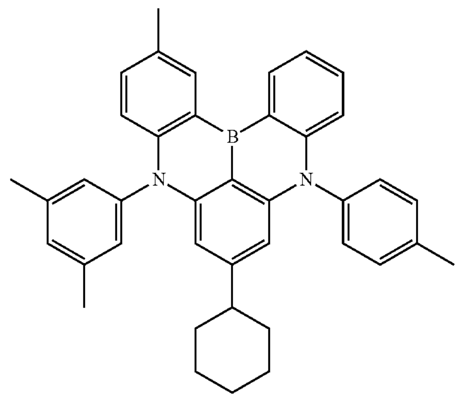
405
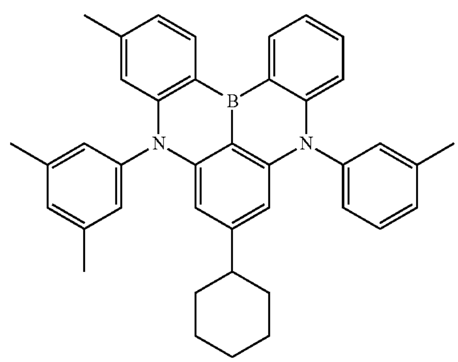
406
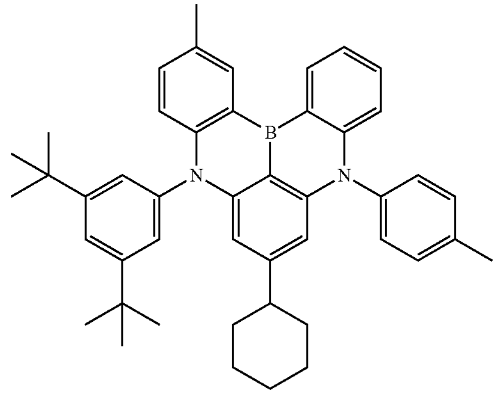

-continued
407
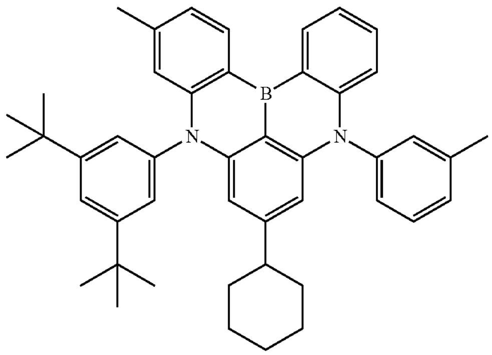
408
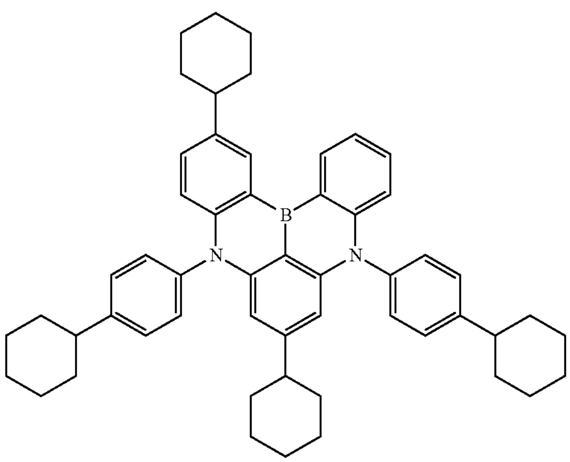
409
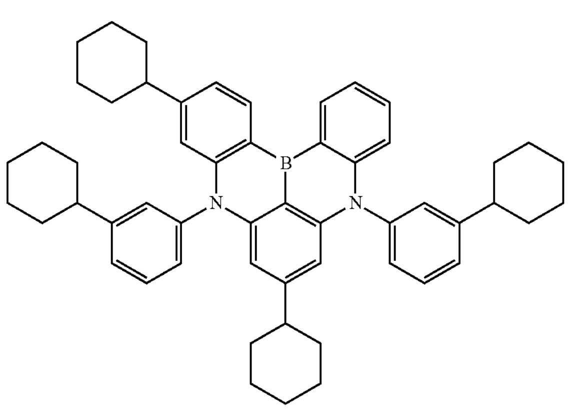
-continued
410
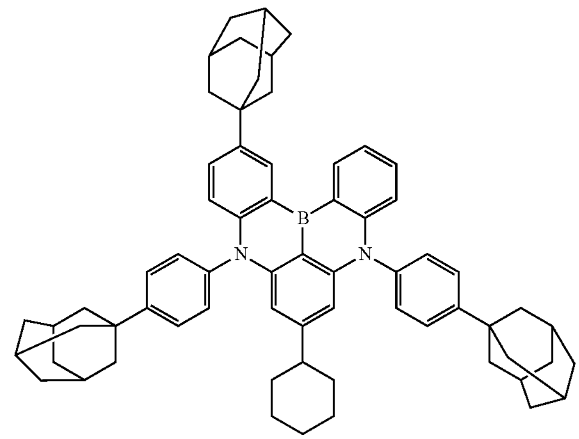
411
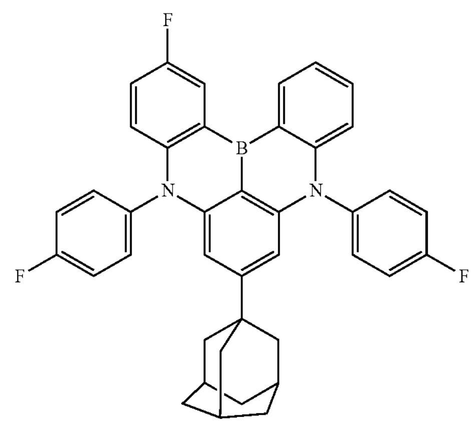
412
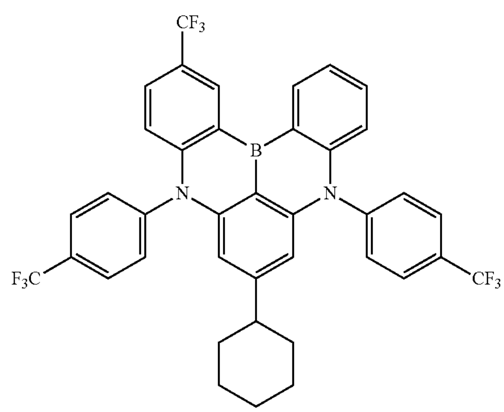
413
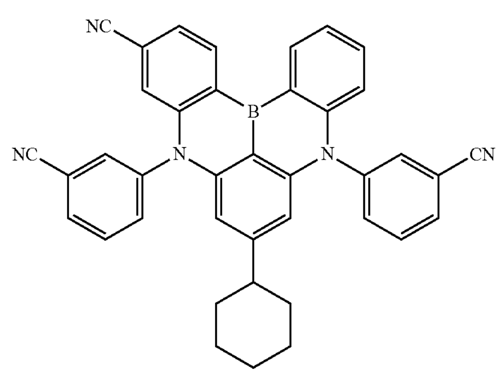

-continued
414
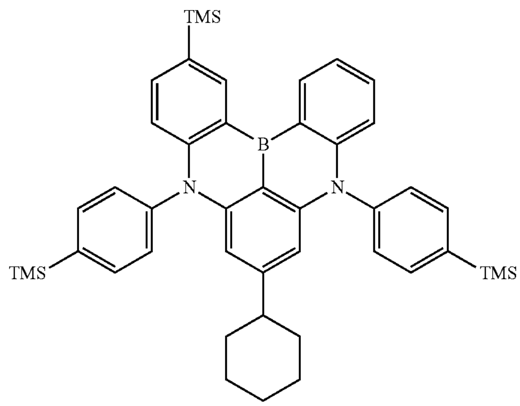
415
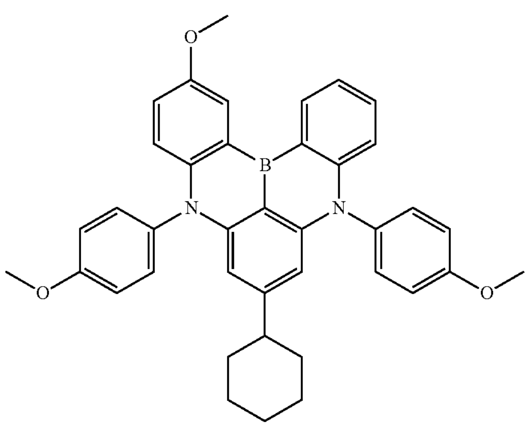
416
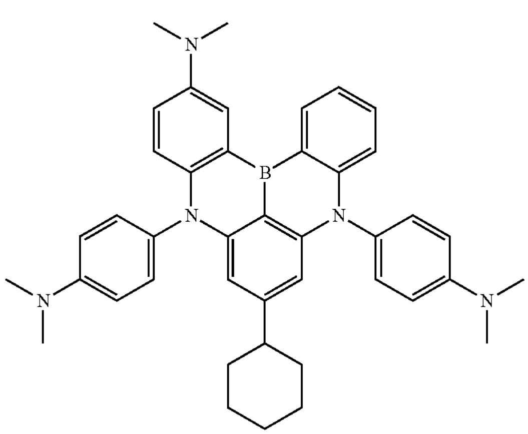
-continued
417
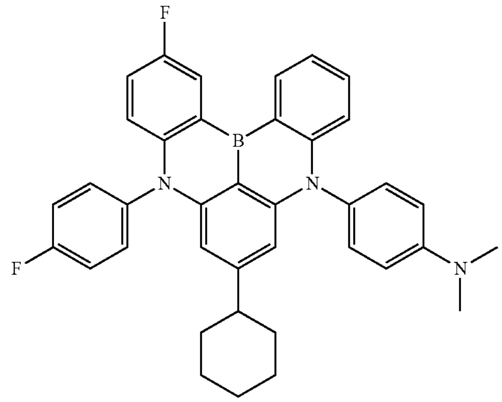
418
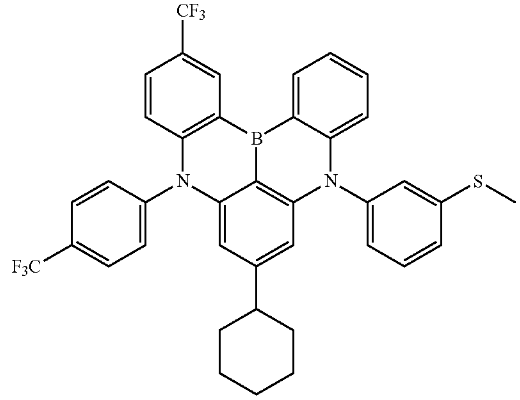
419
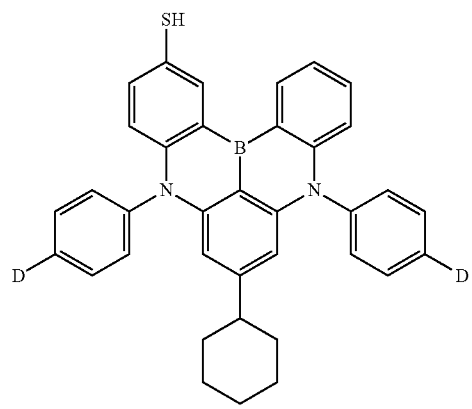
420
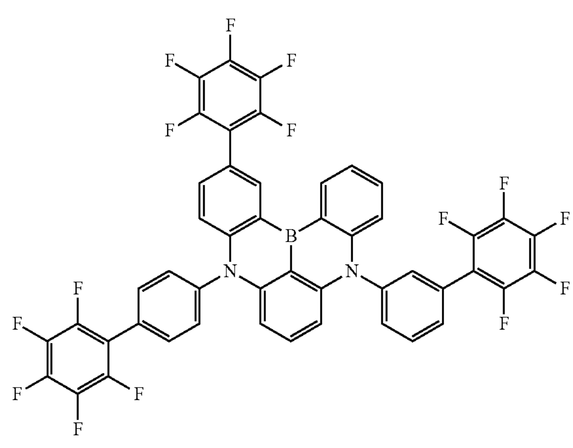

-continued
421
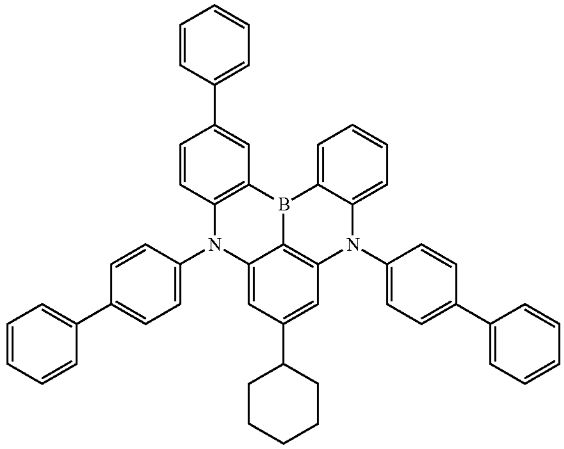
422
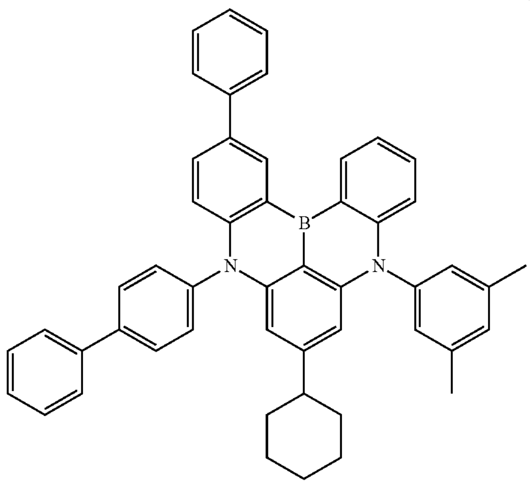
423
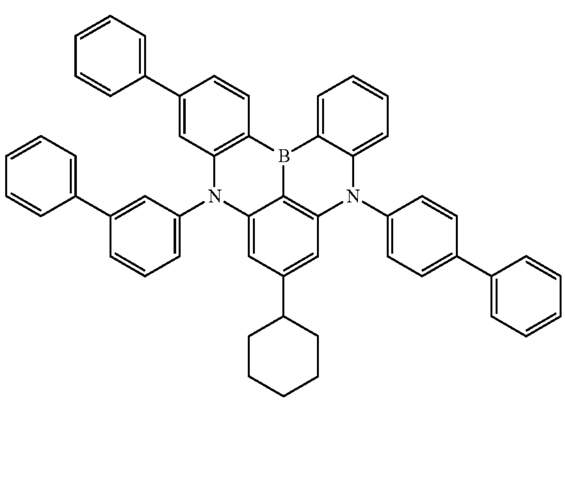
-continued
424
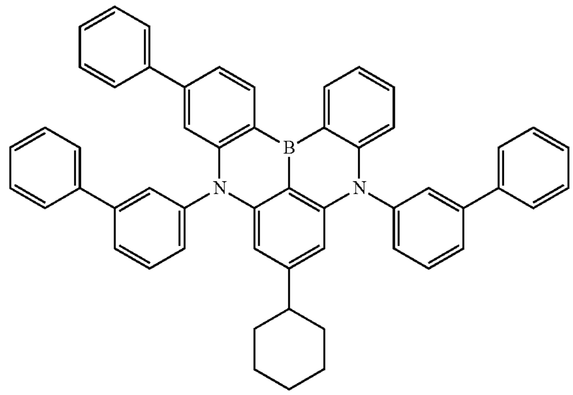
425
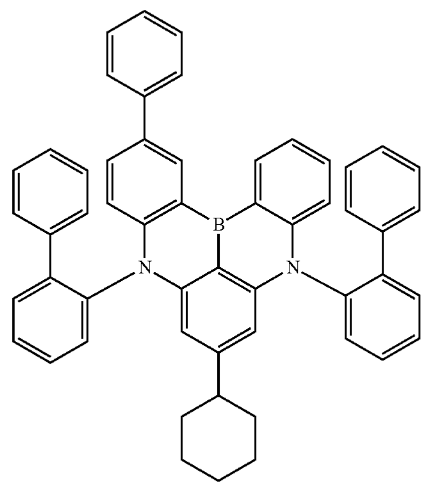
426
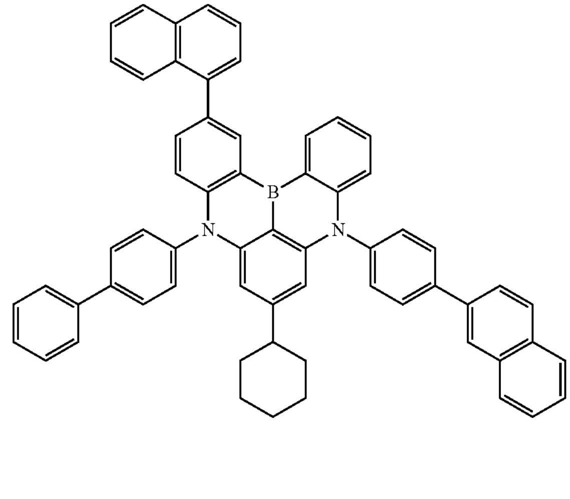

427
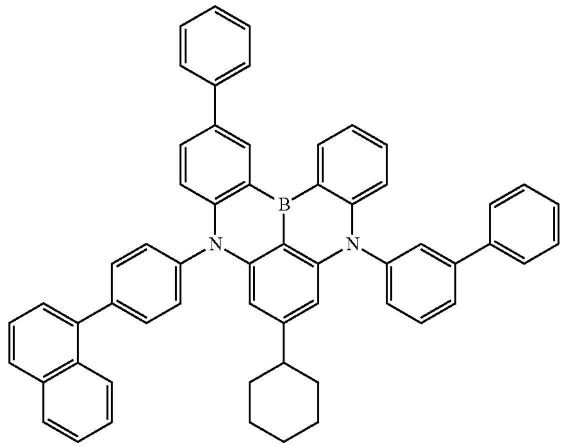
428
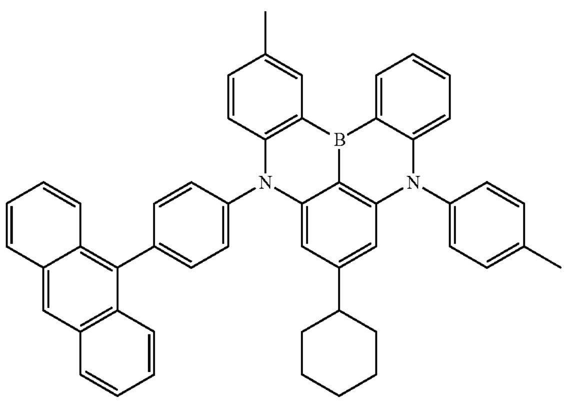
429
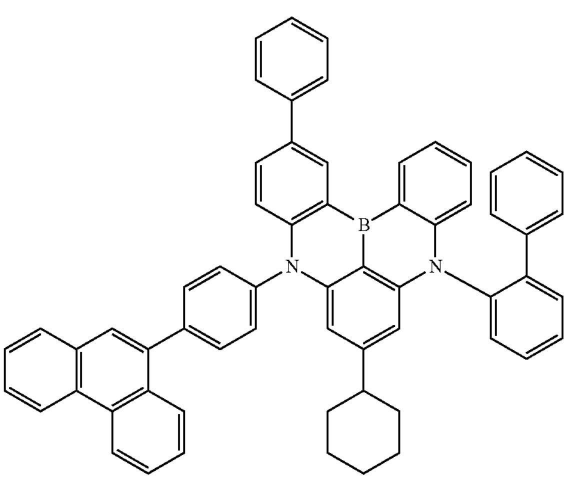
430
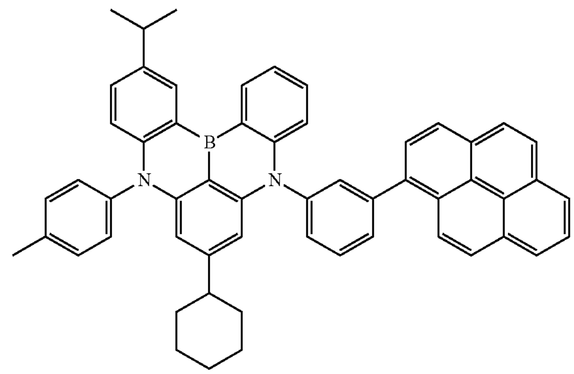
431
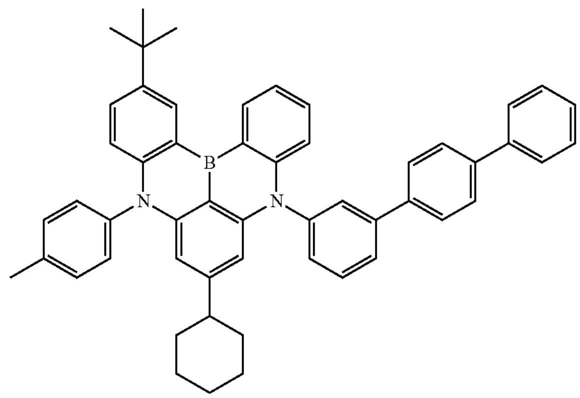
432
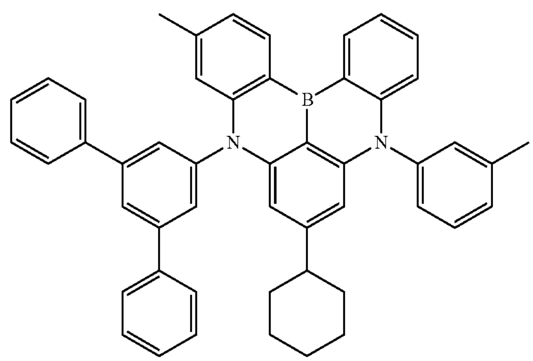
433
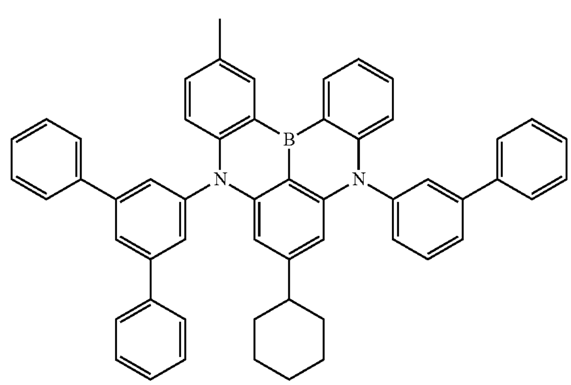

434
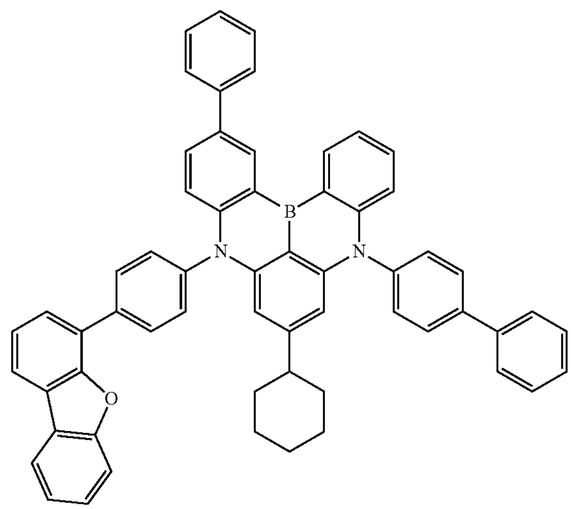
435
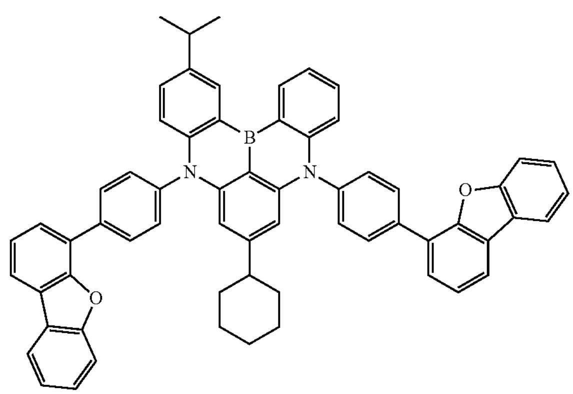
436
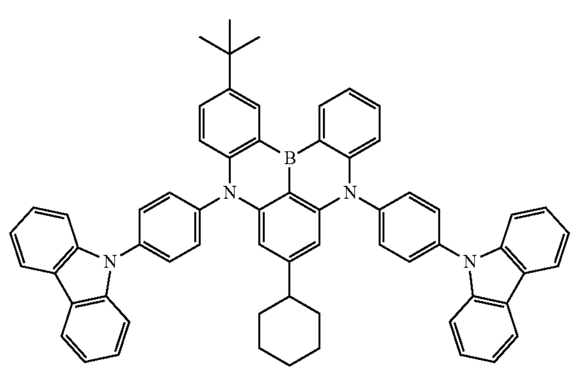
437
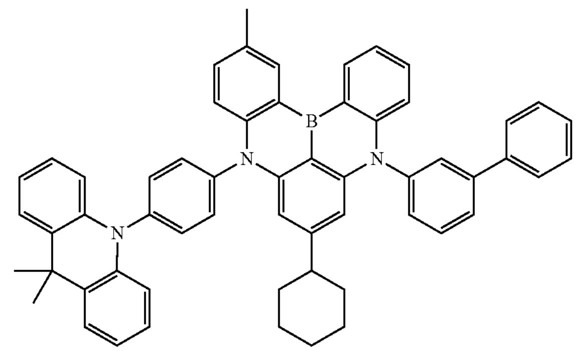
438
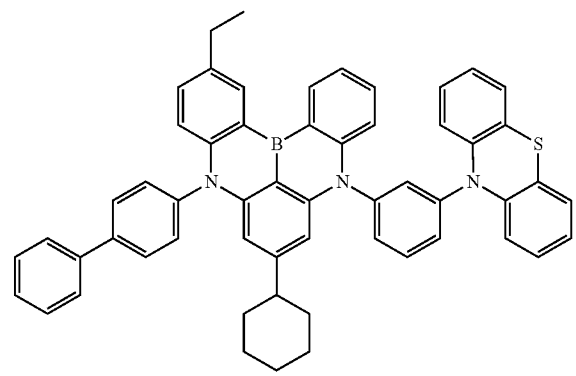
439
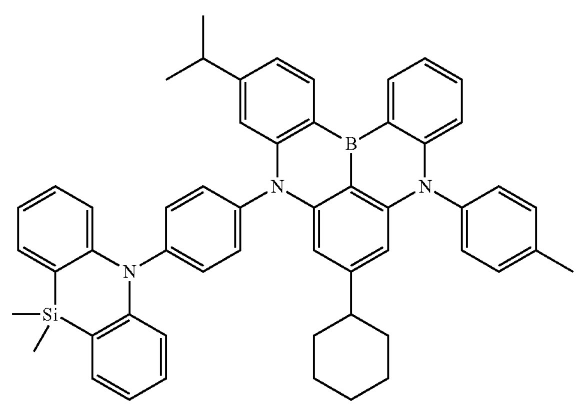
440
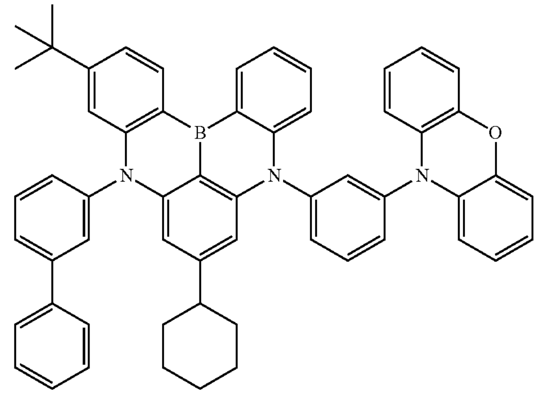

-continued
441
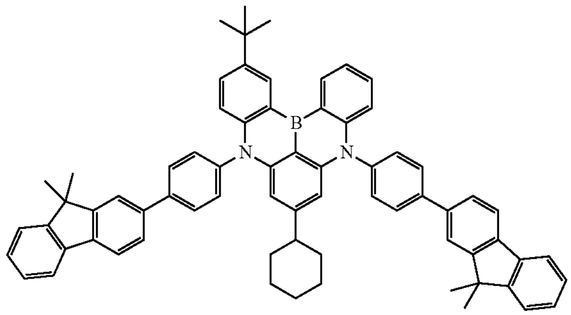
442
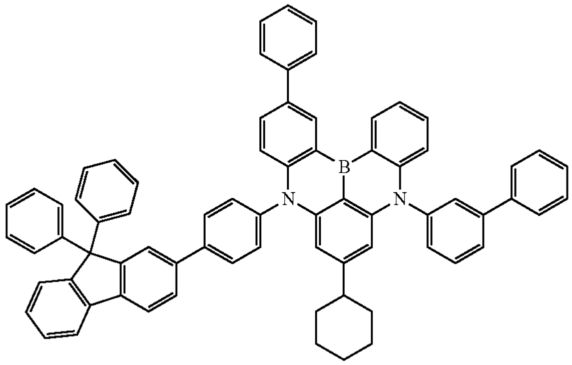
443
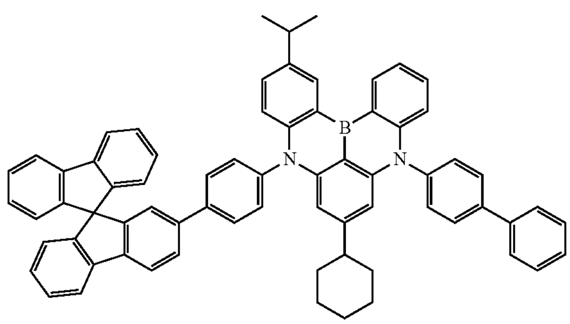
444
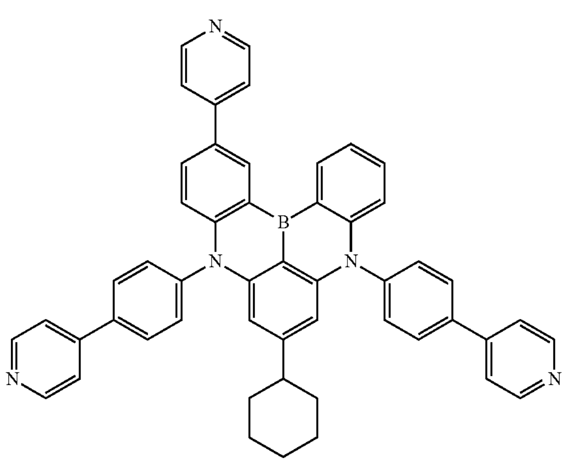
-continued
445
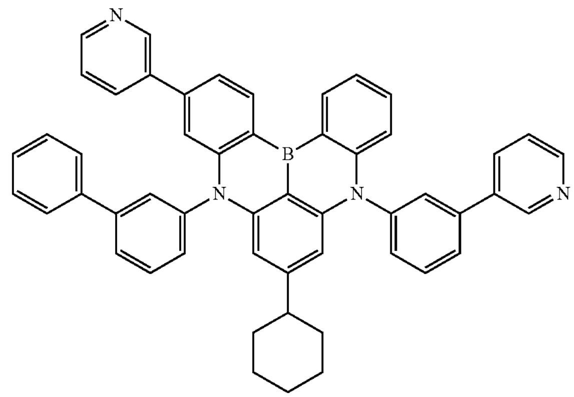
446
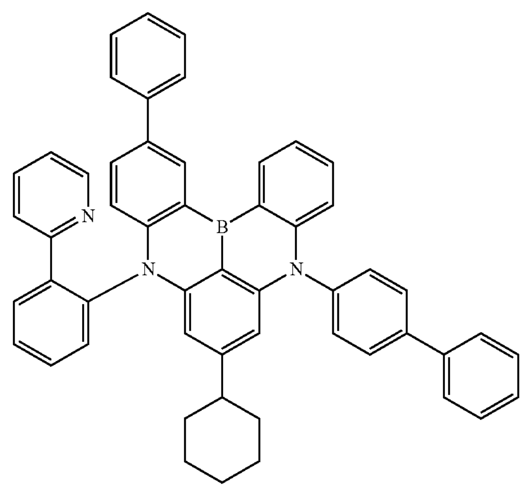
447
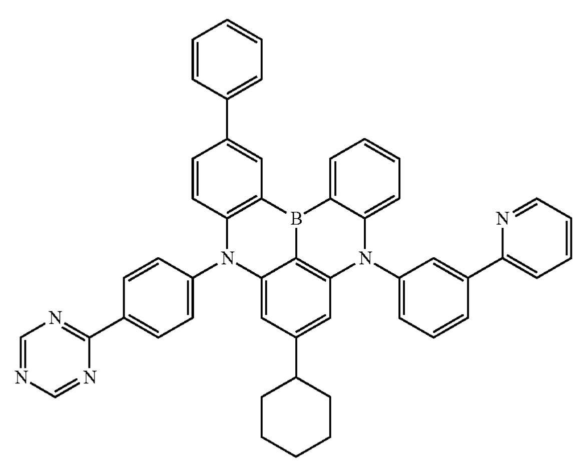

448
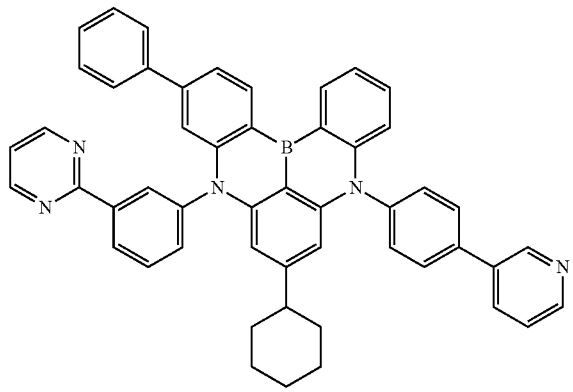
449
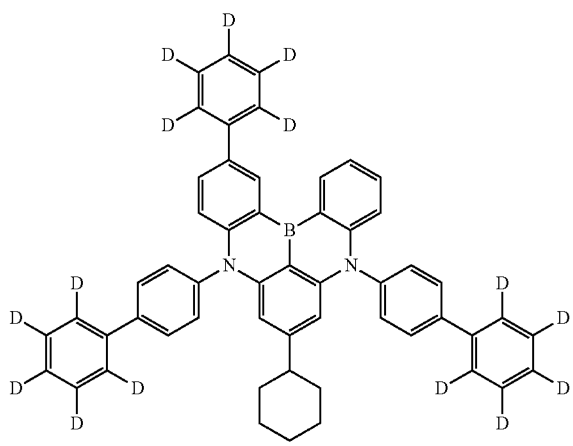
450
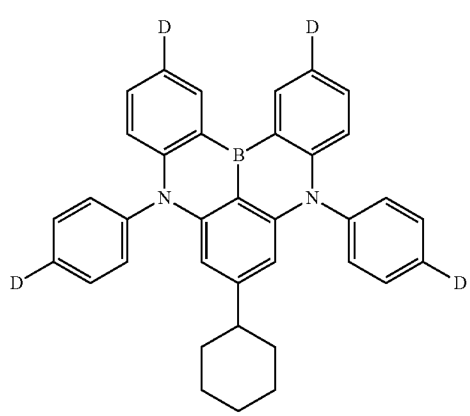
451
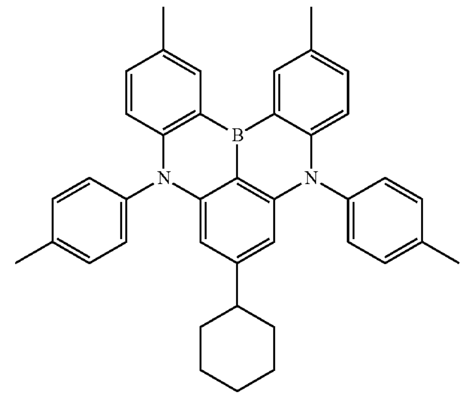
452
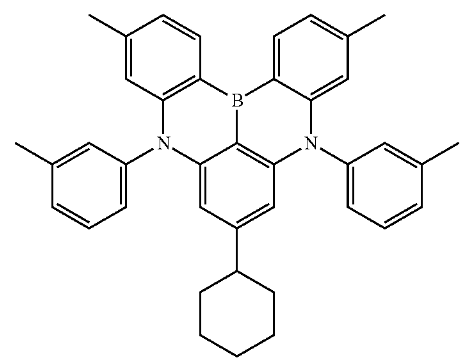
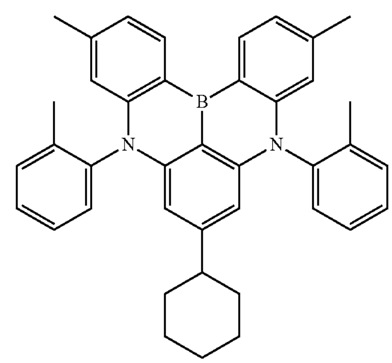
454
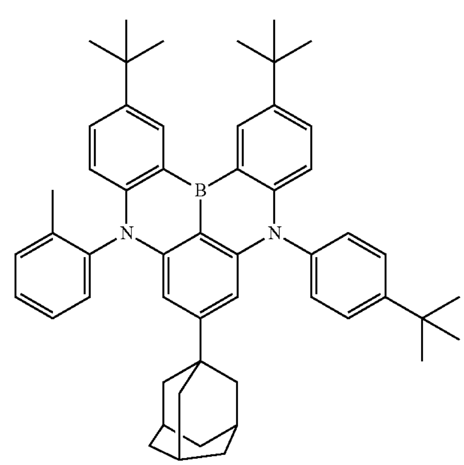

-continued
455
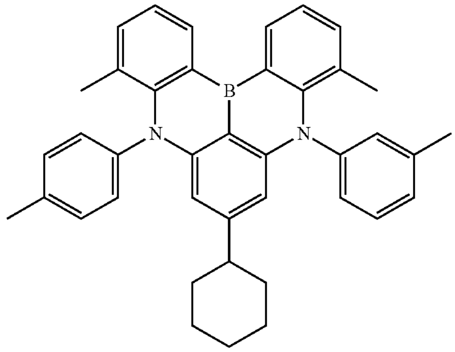
456
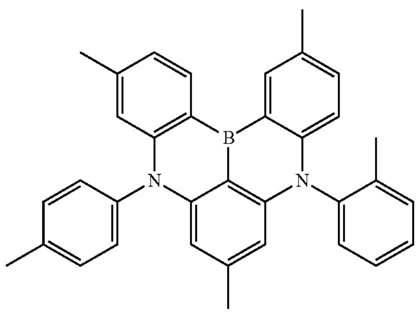
457
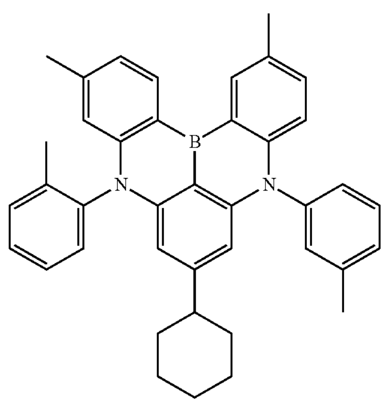
458
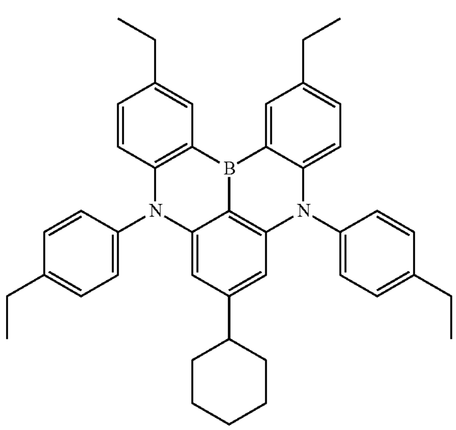
-continued
459
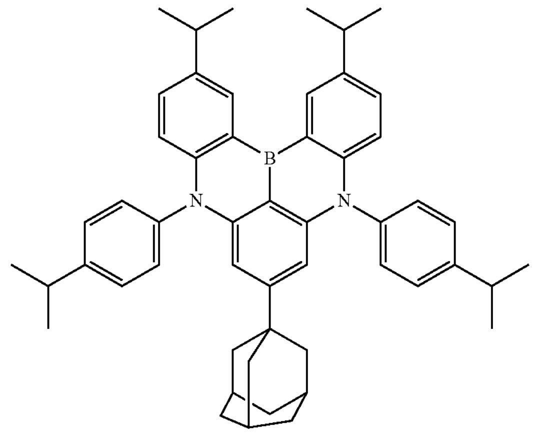
460
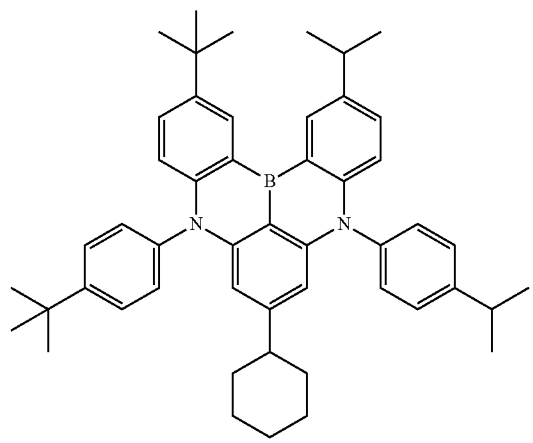
461
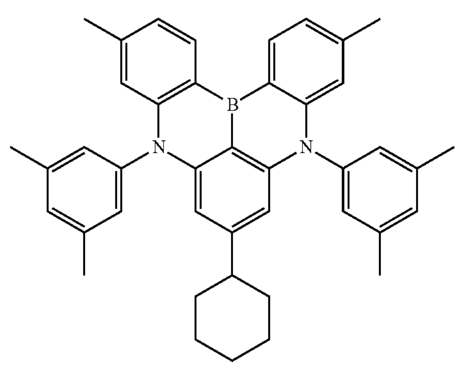

-continued
462
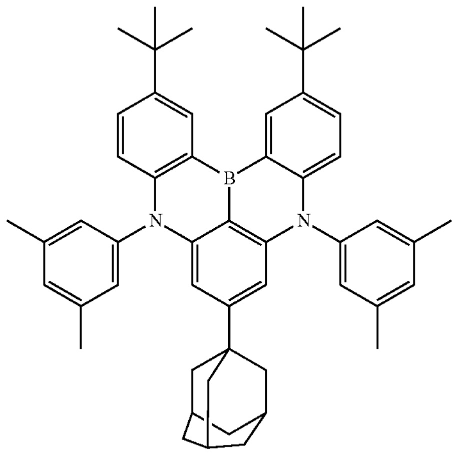
463
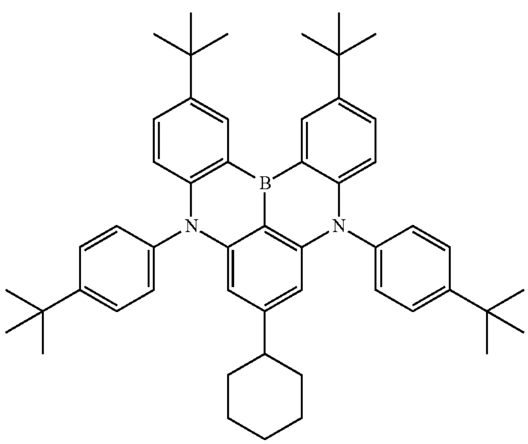
464
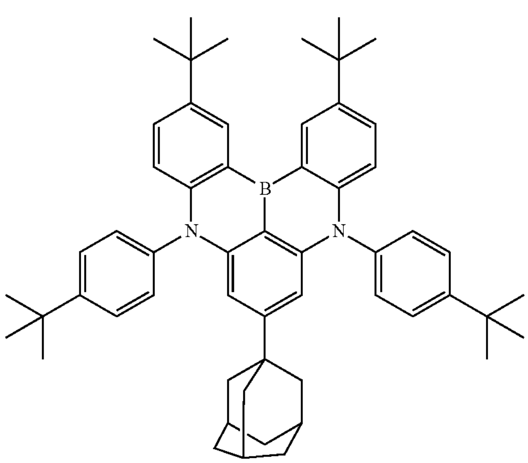
-continued
465
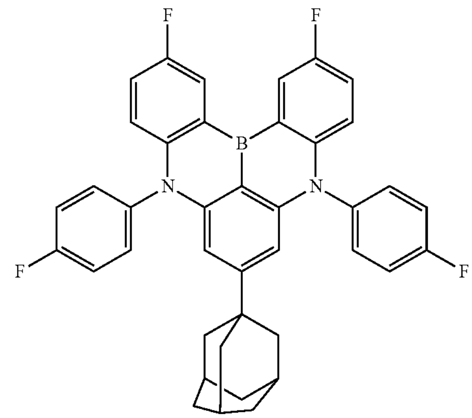
466
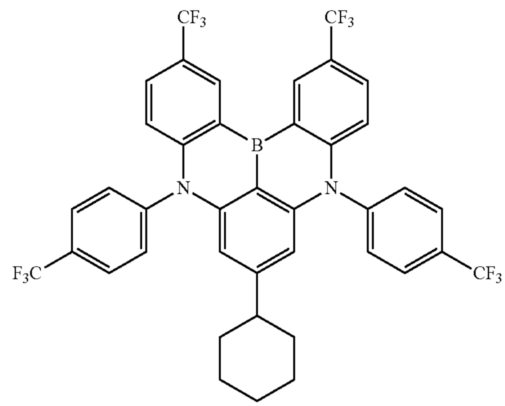
467
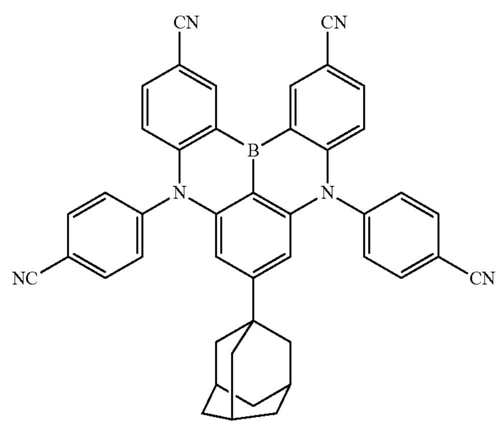
468
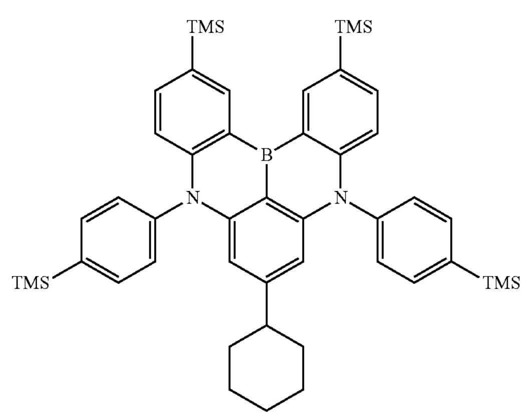

-continued
469
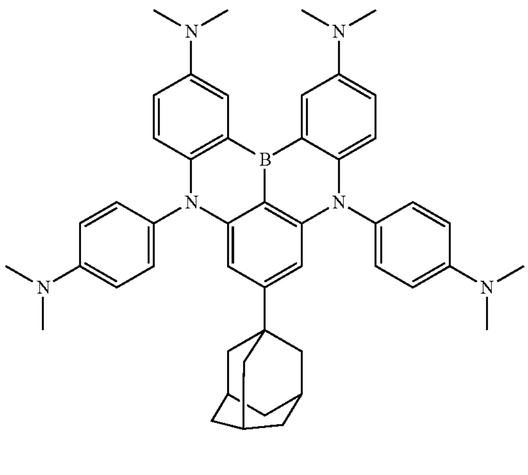
470
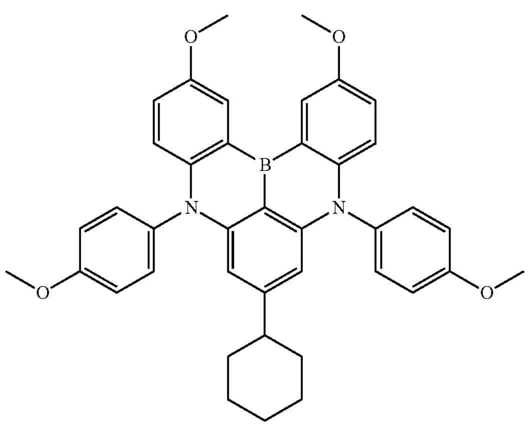
471
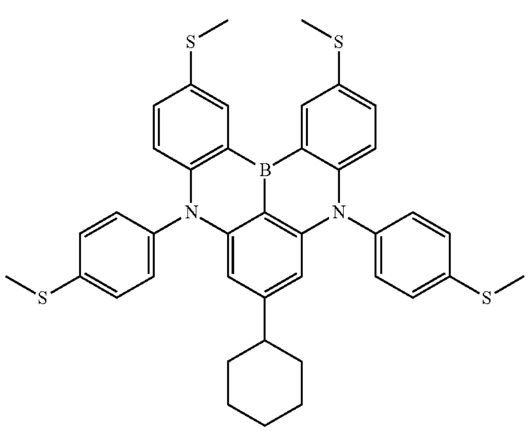
-continued
472
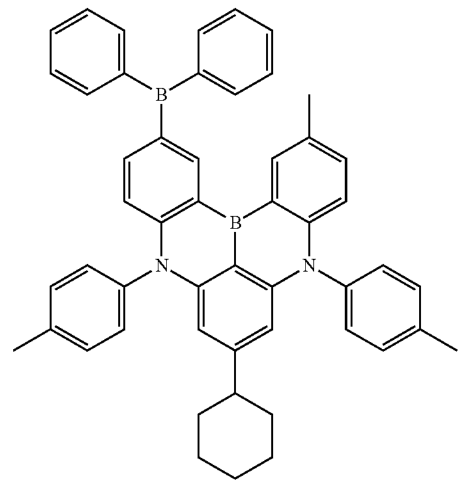
473
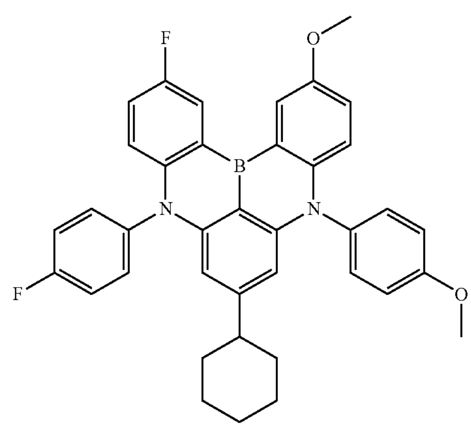
474
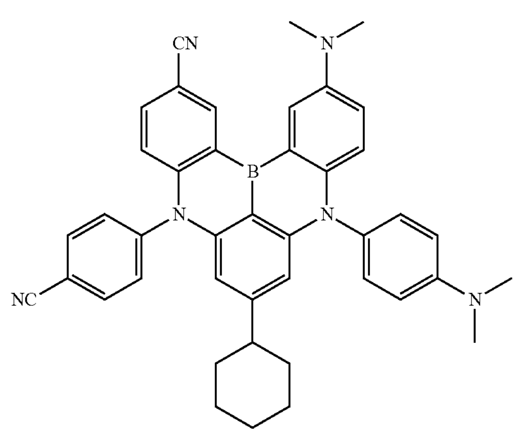

-continued
475
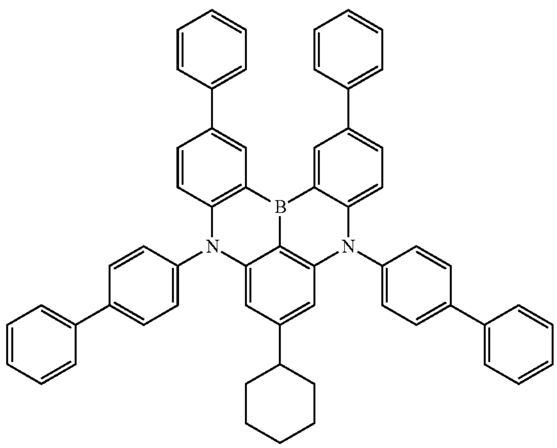
476
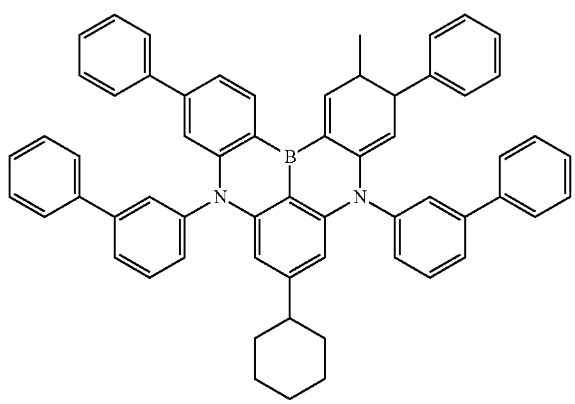
477
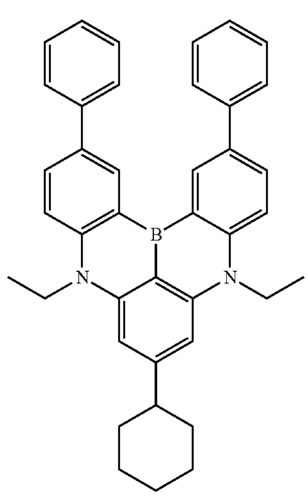
-continued
478
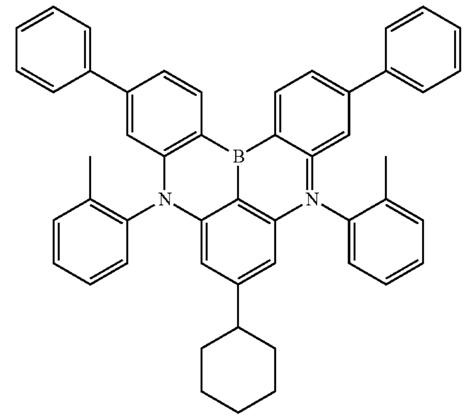
479
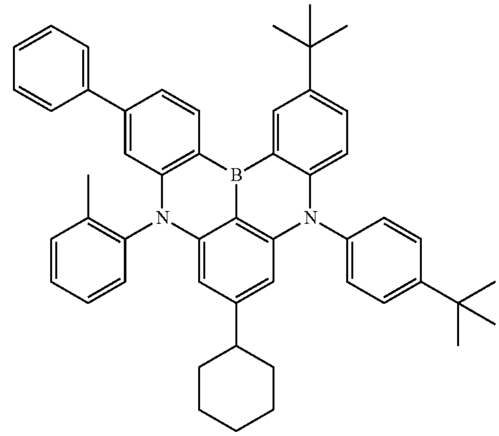
480
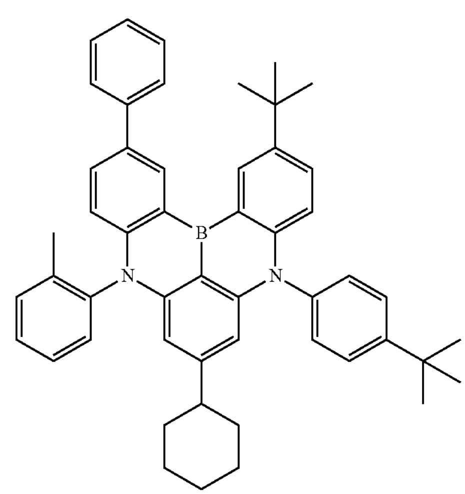

-continued
481
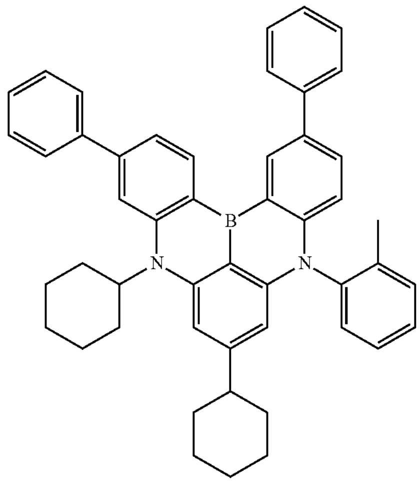
482
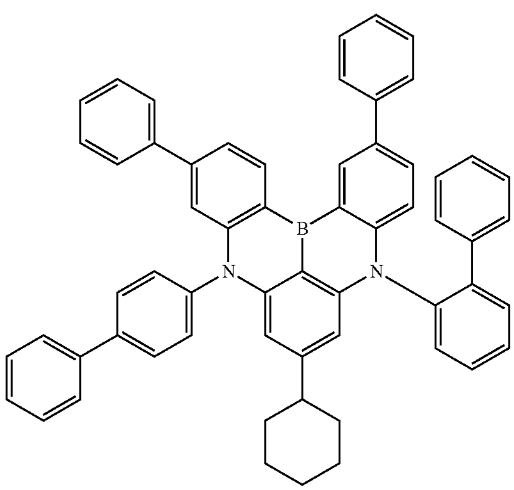
483
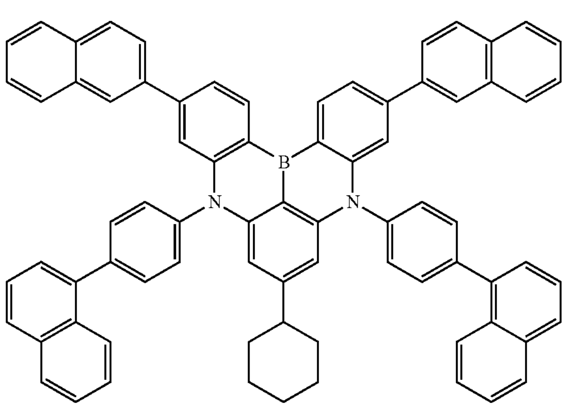
-continued
484
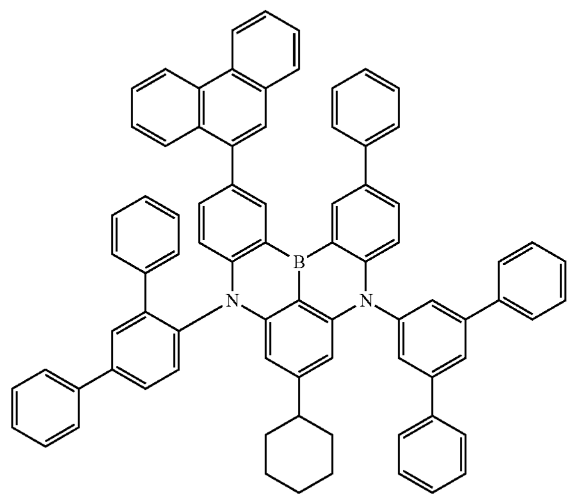
485
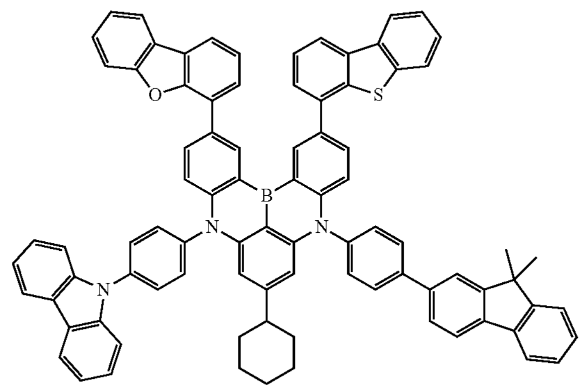
486
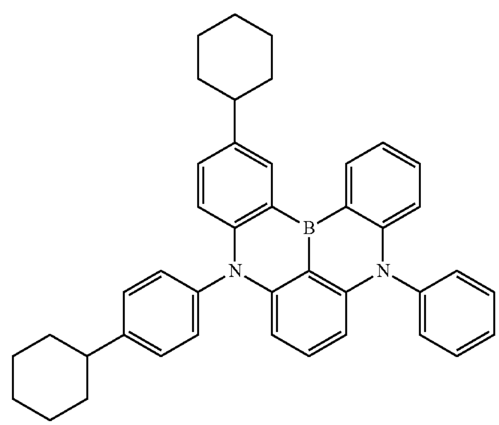
487
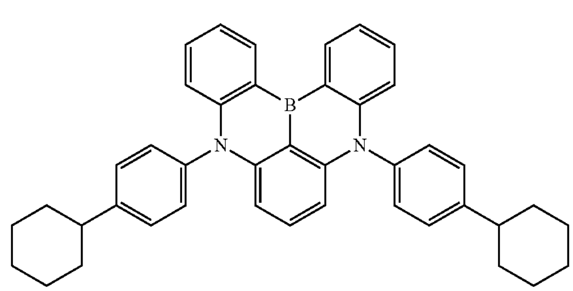

-continued
488
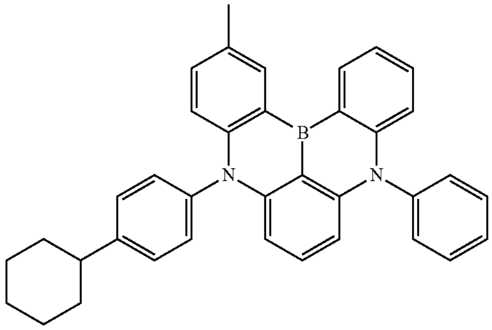
489
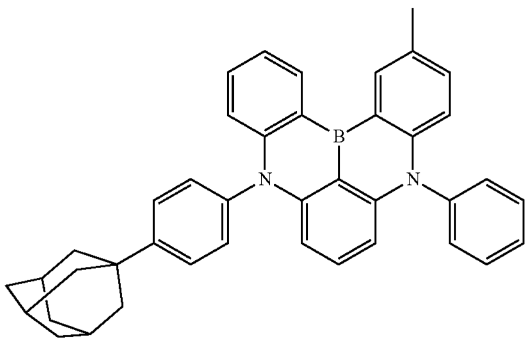
490
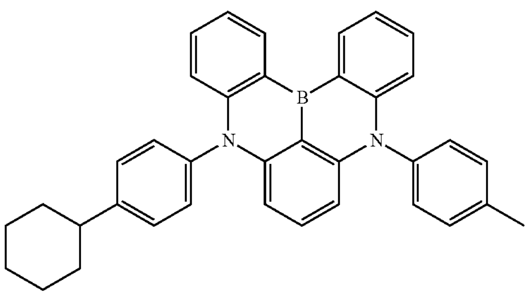
491
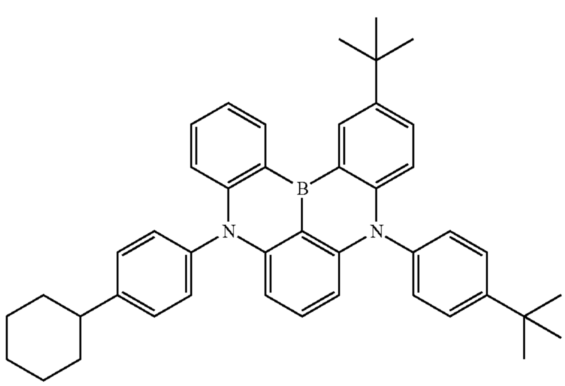
-continued
492
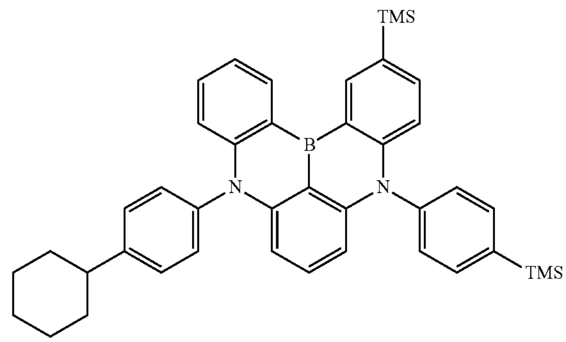
493
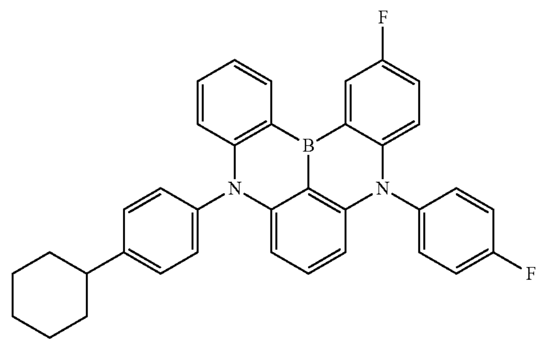
494
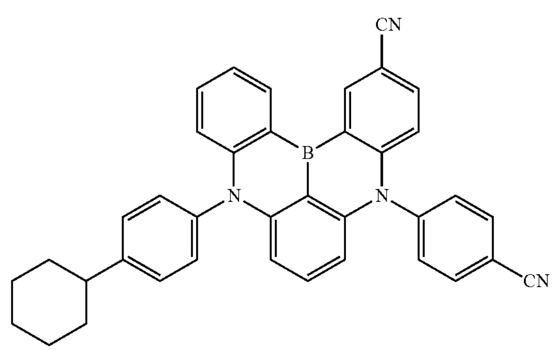
495
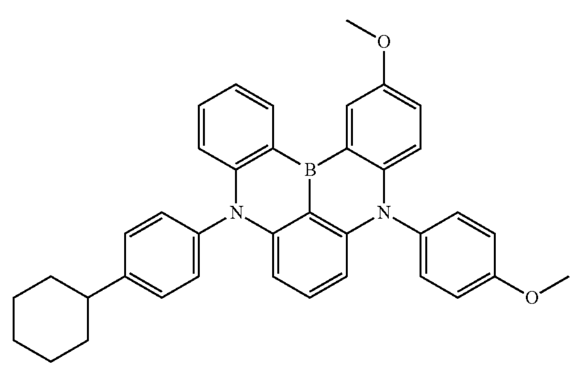

496
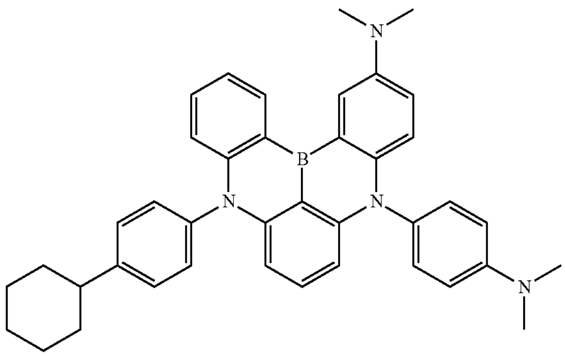
497
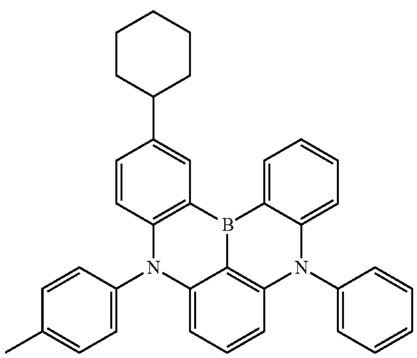
498
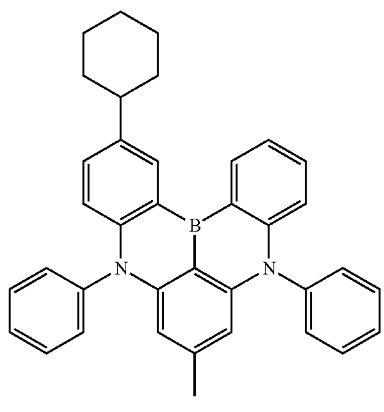
499
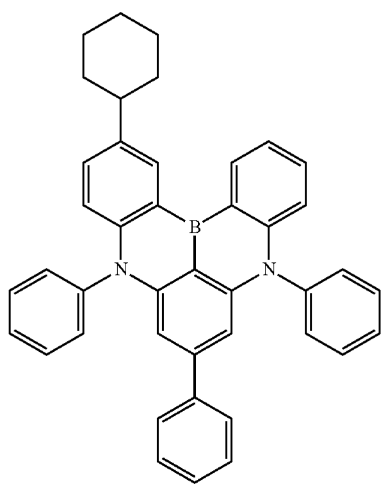
500
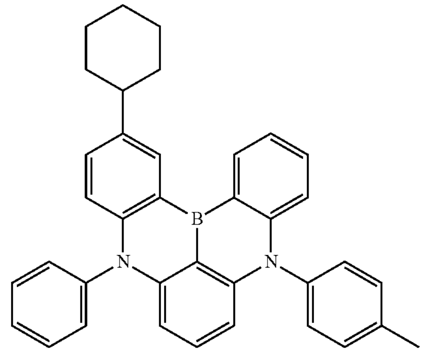
501
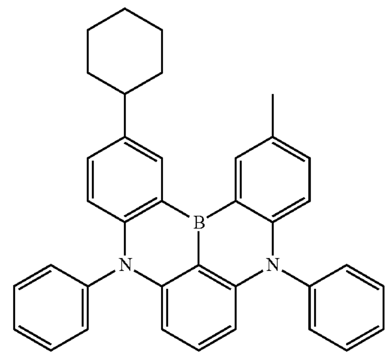
502
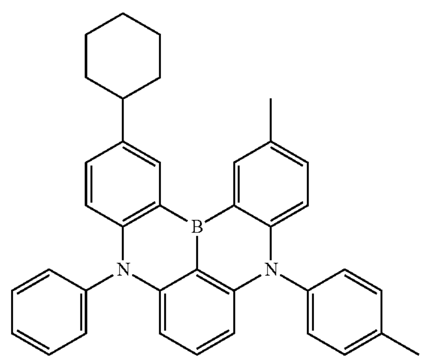
503
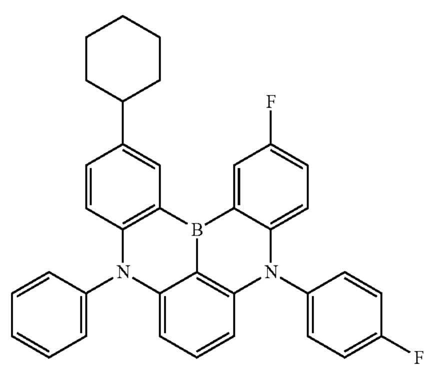

-continued
504
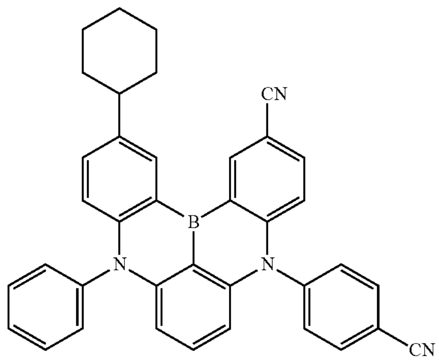
505
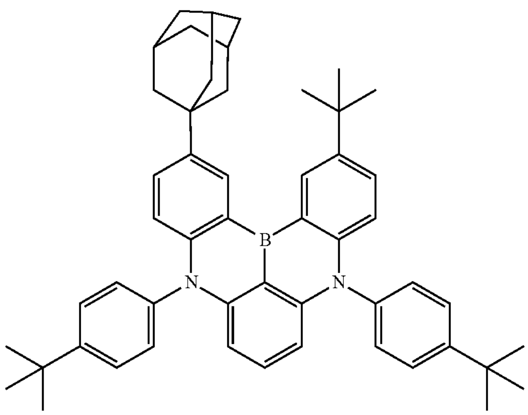
506
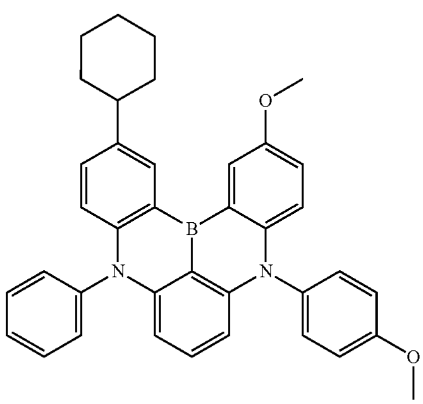
507
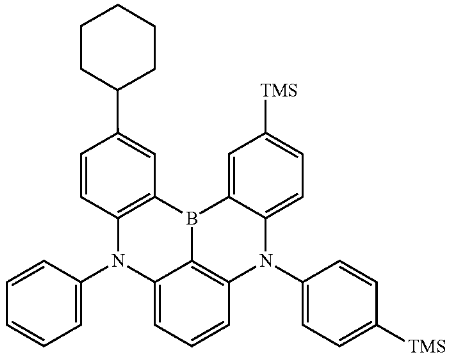
-continued
508
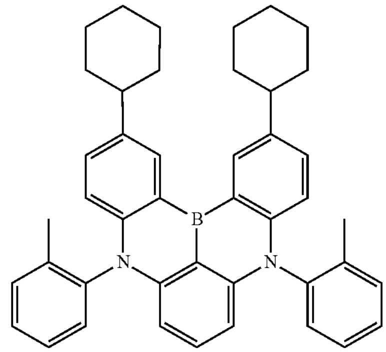
509
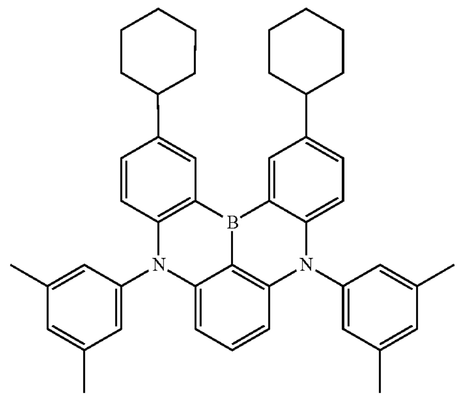
510
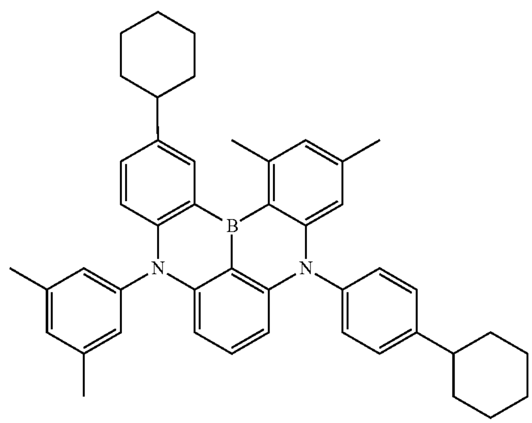
511
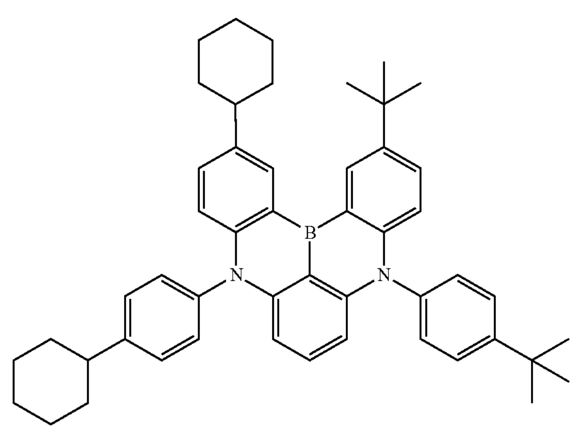

512
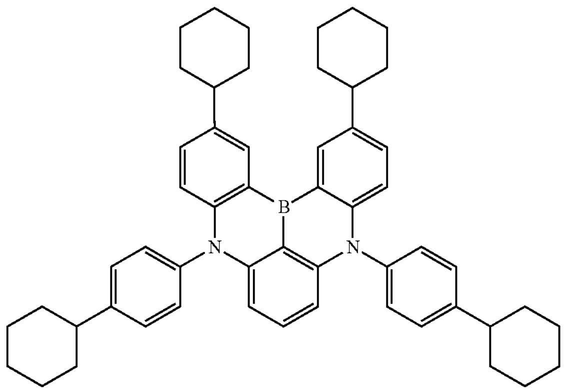
513
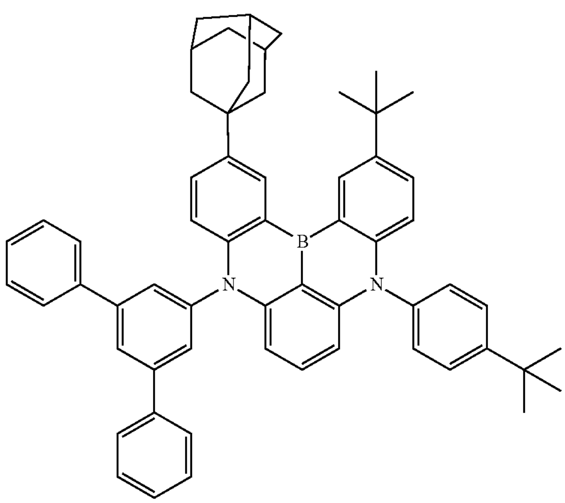
514
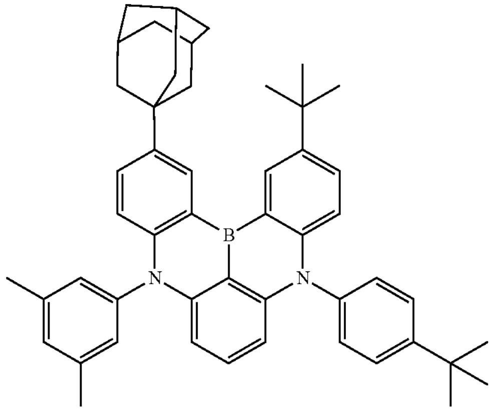
515
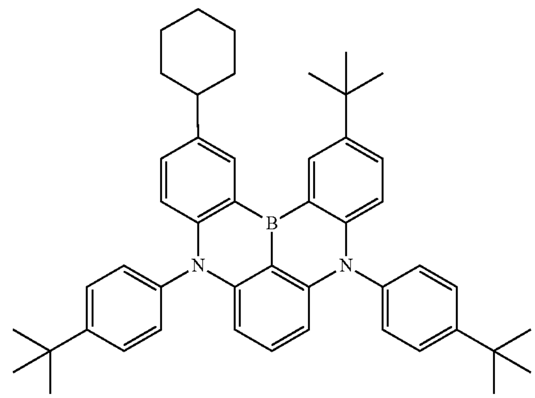
516
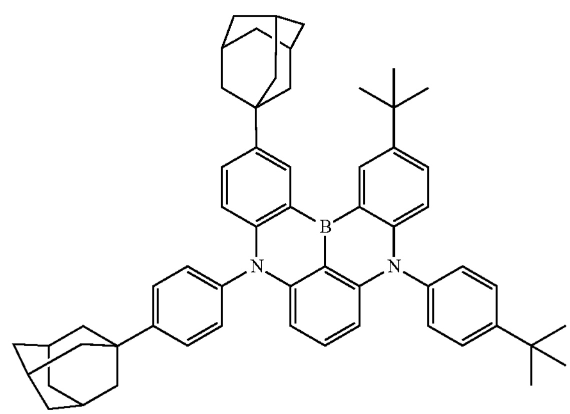
517
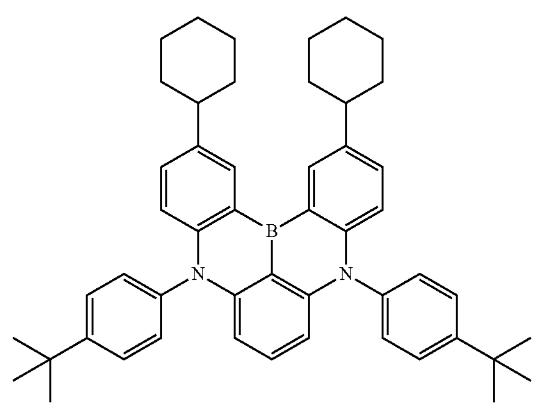

518
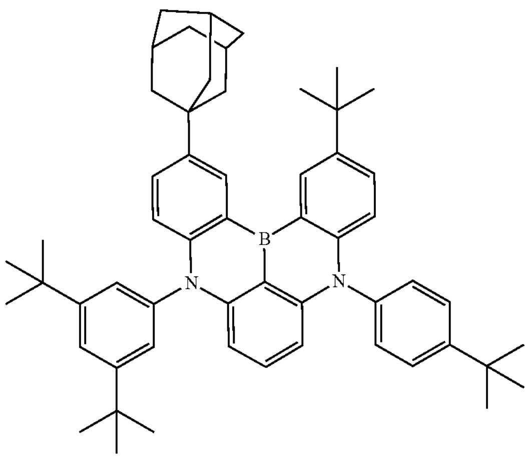
519
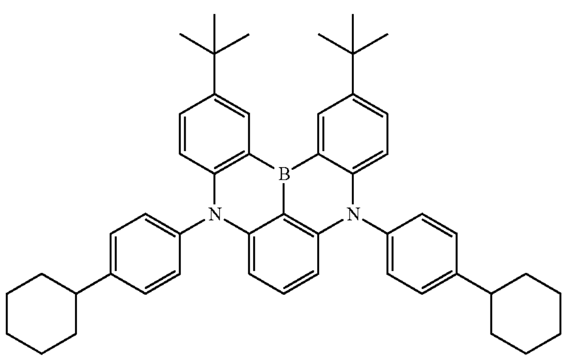
520
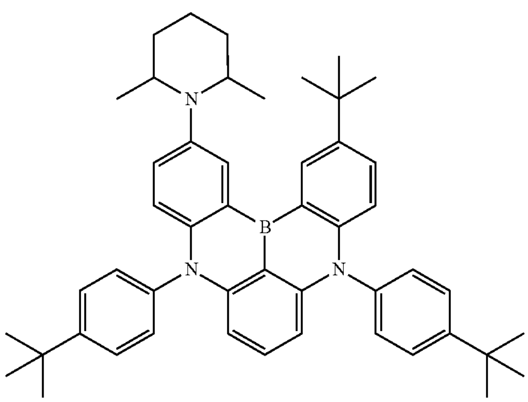
521
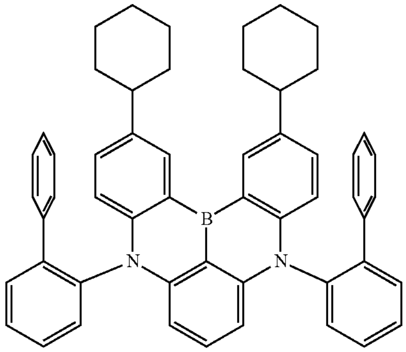
522
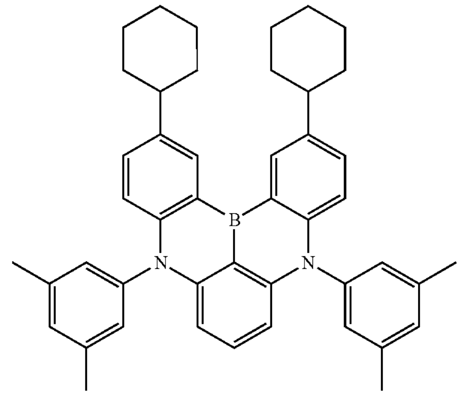
523
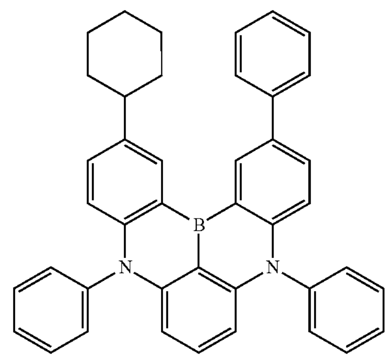
524
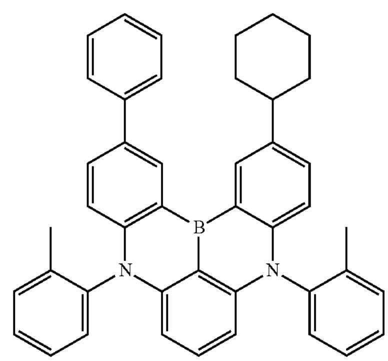
525
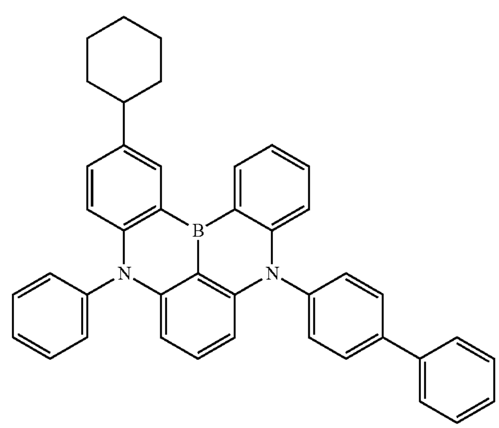

-continued
526
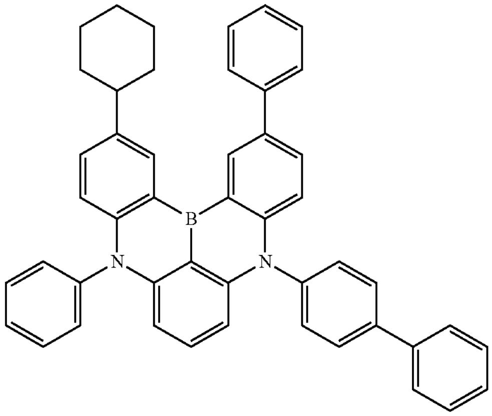
527
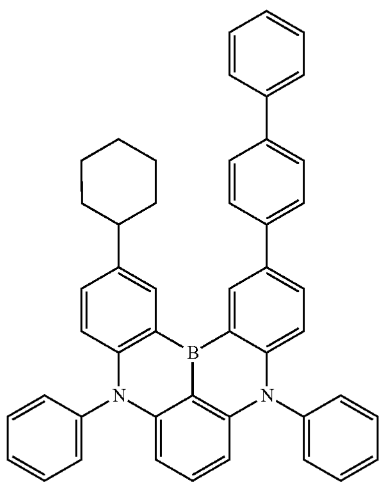
528
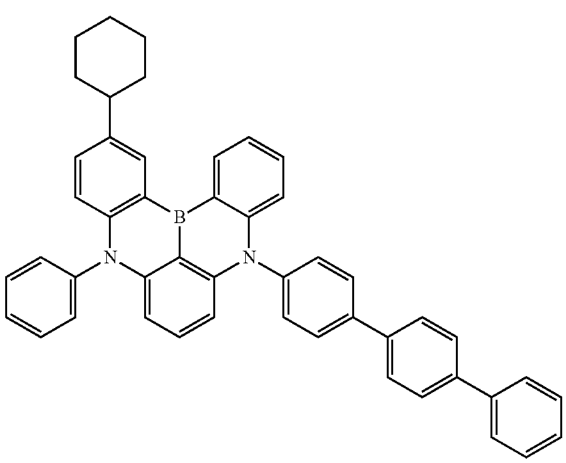
-continued
585
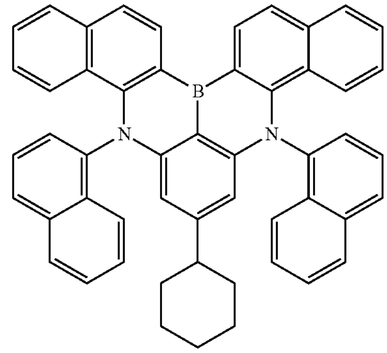
586
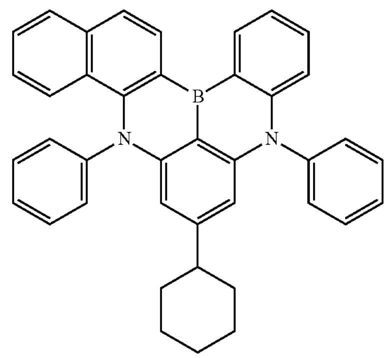
587
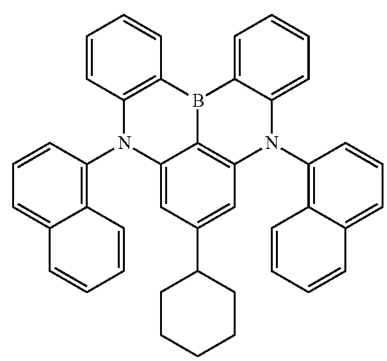
588
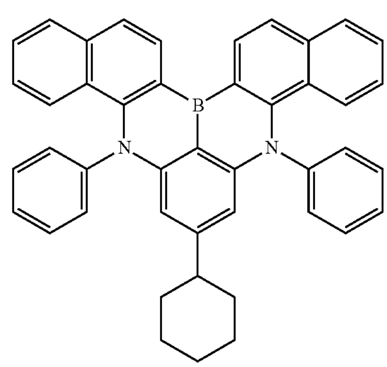

-continued
589
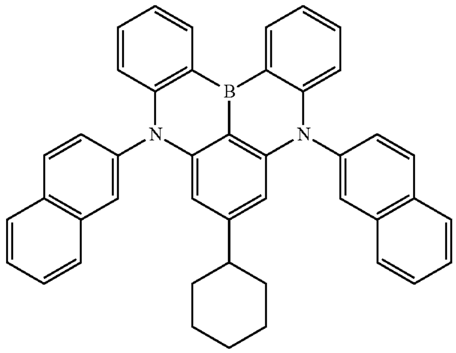
590
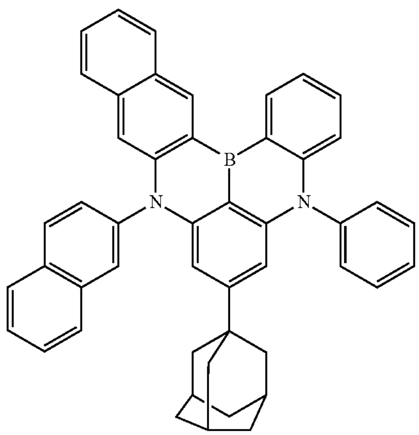
591
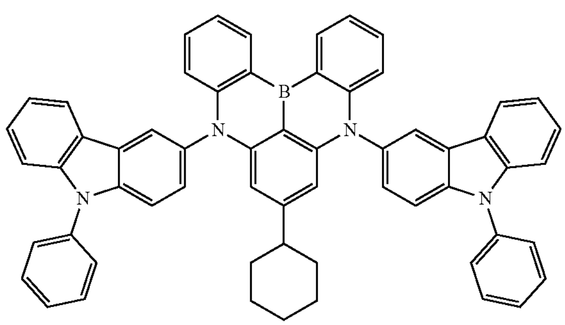
592
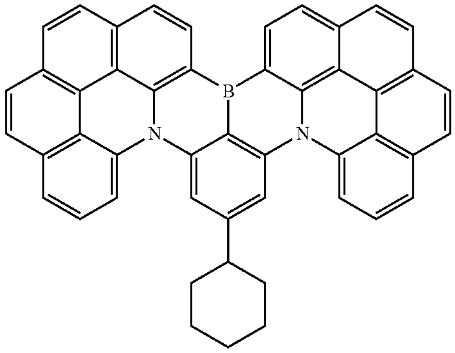
-continued
593
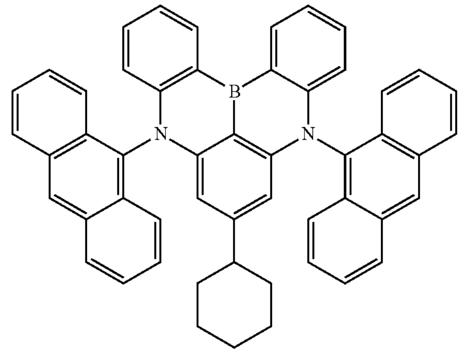
594
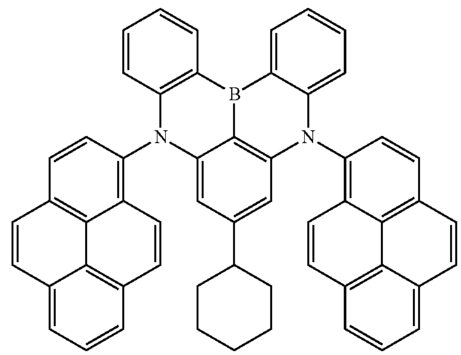
595
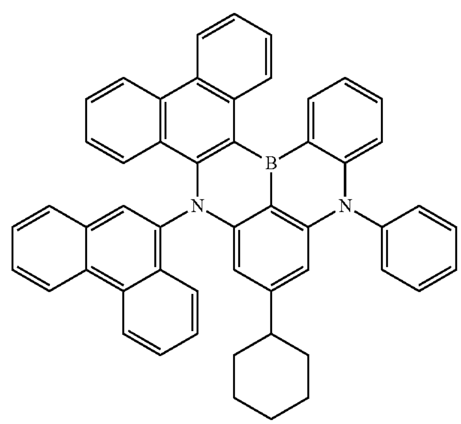
596
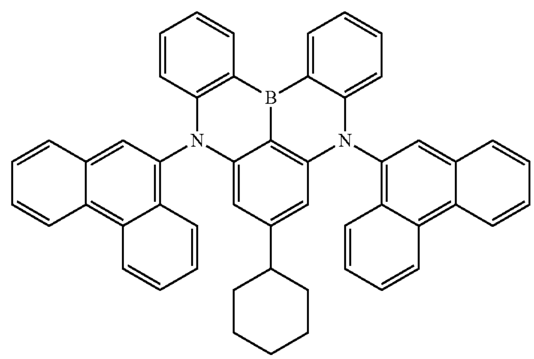

-continued
597
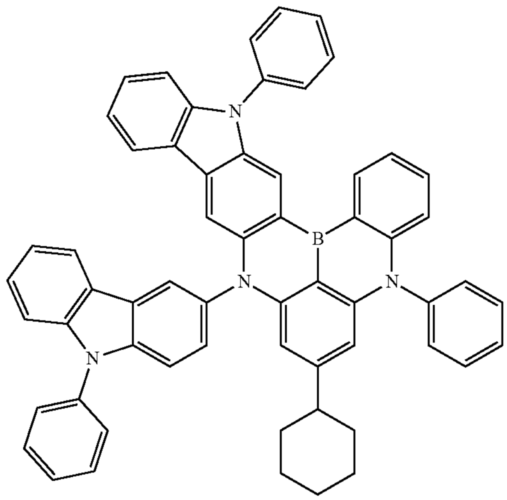
598
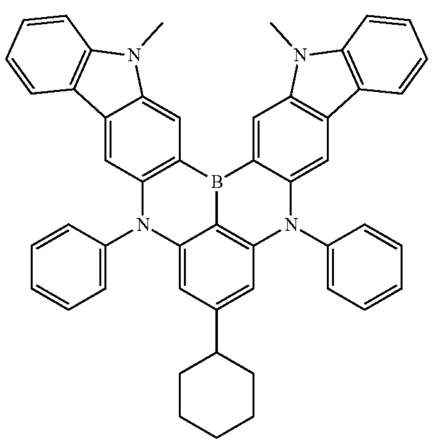
599
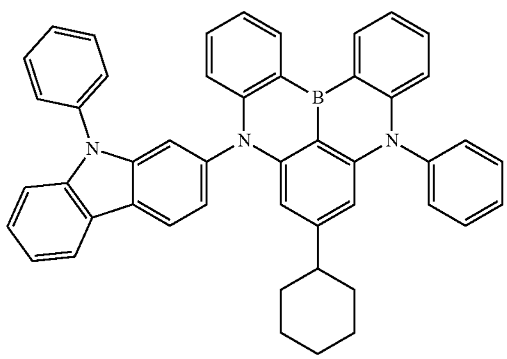
-continued
600
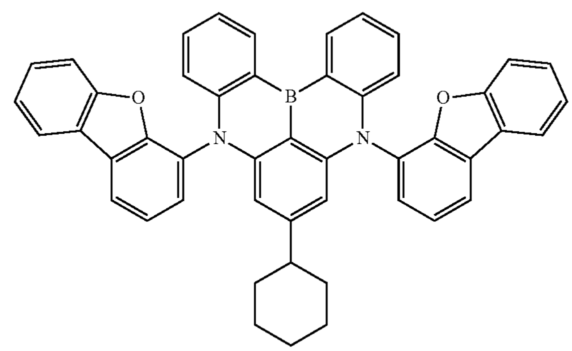
601
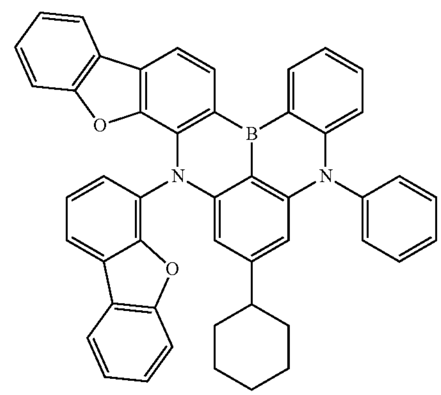
602
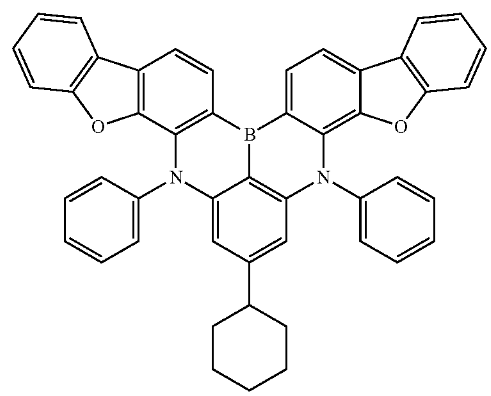
603
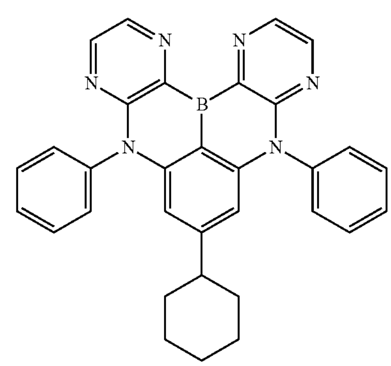

-continued
604
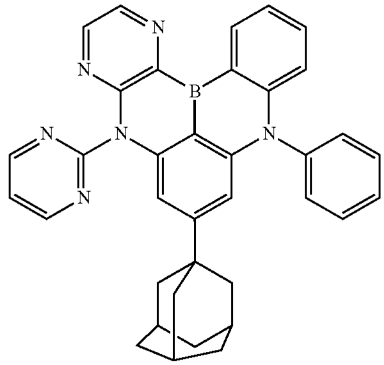
605
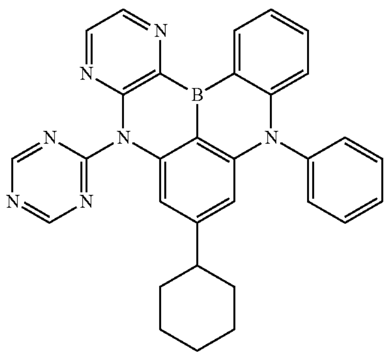
606
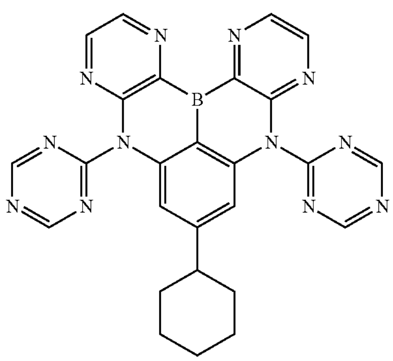
607
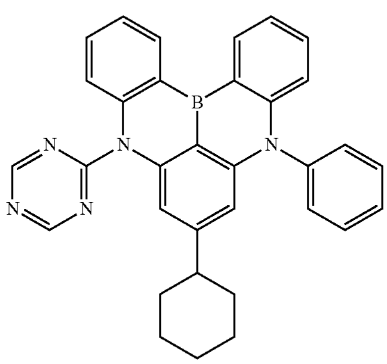
-continued
608
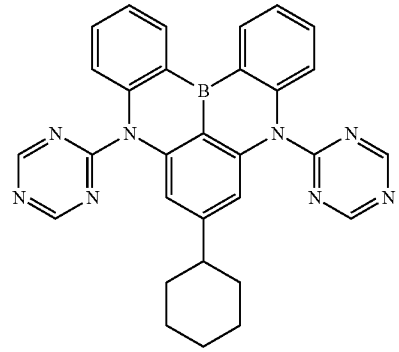
609
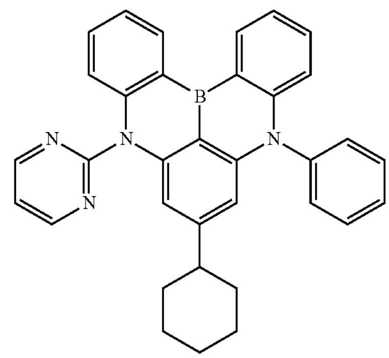
610
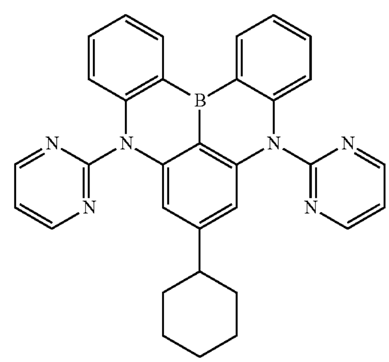
611
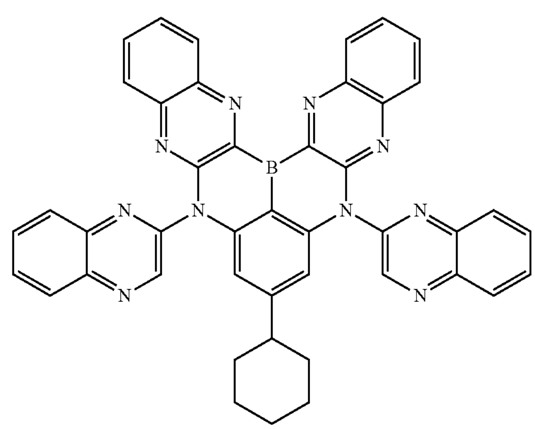

-continued
612
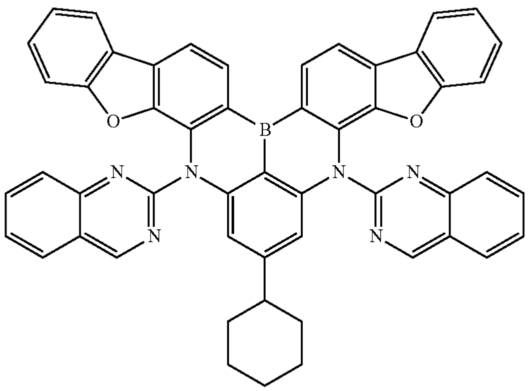
657
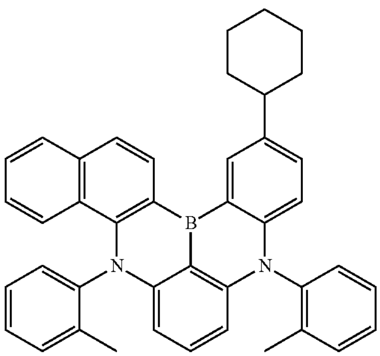
658
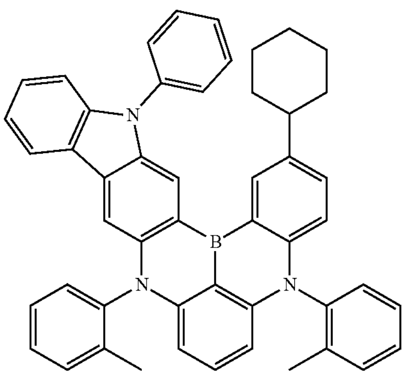
659
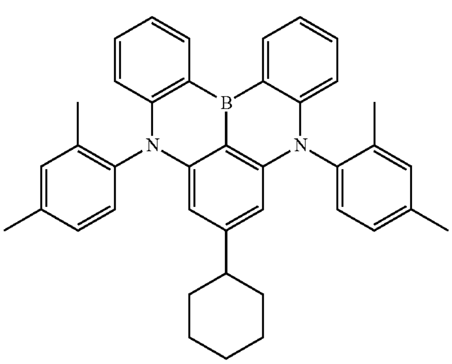
-continued
660
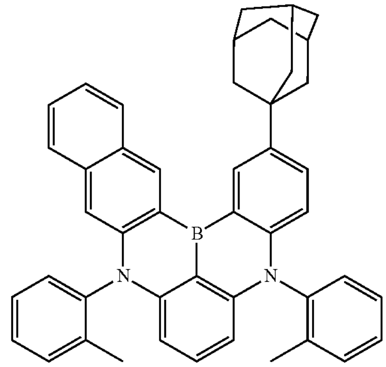
661
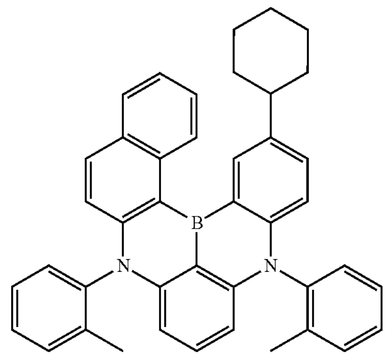
662
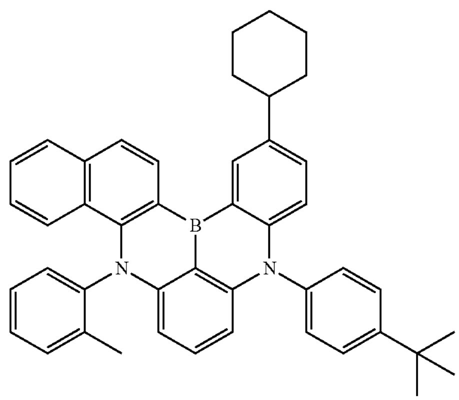
663
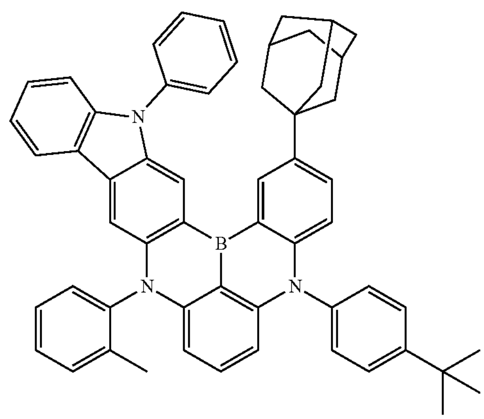

-continued

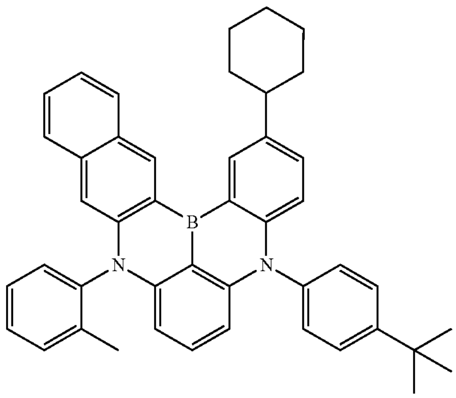

664

The compound of Formula 1 of the present invention may be usefully used as a dopant material of a light emitting layer. Specifically, the organic compound may provide, as a dopant material, an organic compound which is thermally stable and minimizes the concentration quenching phenomenon, as compared to an existing boron-based dopant.

Further, the present invention relates to a material for forming a light emitting layer, including the organic compound.

The aforementioned material for forming a light emitting layer may further include a material which is typically added when the organic compound is prepared in a form required to be used in forming a light emitting layer, for example, a host material, and the like. The material for forming the light emitting layer may be a material for a dopant.

In addition, the present invention relates to an organic electroluminescent element in which organic thin film layers each composed of a single layer or a plurality of layers including at least a light emitting layer are stacked between a negative electrode and a positive electrode, in which the light emitting layer contains the organic compound represented by Formula 1 either alone or in combination of two or more thereof.

The organic electroluminescent element may have a structure in which a positive electrode, a hole injection layer, a hole transport layer, a light emitting layer, an electron transport layer, an electron injection layer, and a negative electrode are stacked, and an electron blocking layer, a hole blocking layer, and the like may be further stacked, if necessary.

Hereinafter, the organic electroluminescent element of the present invention will be described with reference to examples. However, the content exemplified below does not limit the organic electroluminescent element of the present invention.

An exemplary embodiment of the present invention provides an organic electroluminescent element including one or more light emitting layers each including the compound represented by Formula 1 as a dopant between a first electrode and a second electrode provided to face the first electrode, and the organic electroluminescent element may additionally include an organic material layer selected from the group consisting of a hole injection layer, a hole transport layer, a hole blocking layer, an electron transport layer, and an electron injection layer, in addition to the light emitting layer. Specifically, the organic electroluminescent element of the present invention may have a structure in which a positive electrode (hole injection electrode), a hole injection layer (HIL), a hole transport layer (HTL), a light emitting layer (EML), and a negative electrode (electron injection electrode) are sequentially stacked, and preferably, may additionally include an electron blocking layer (EBL) between the positive electrode and the light emitting layer, and an electron transport layer (ETL) and an electron injection layer (EIL) between the negative electrode and the light emitting layer. Further, the organic electroluminescent element of the present invention may further include a hole blocking layer (HBL) between the negative electrode and the light emitting layer.

In a method for manufacturing an organic electroluminescent element according to the present invention, first, the surface of a substrate is coated with a material for a positive electrode by a typical method, thereby forming a positive electrode. In this case, the substrate to be used is preferably a glass substrate or a transparent plastic substrate, which is excellent in transparency, surface smoothness, ease of handling and waterproofness. Further, as a material for a positive electrode, it is possible to use indium tin oxide (ITO), indium zinc oxide (IZO), tin oxide (SnO2), zinc oxide (ZnO), and the like, which are transparent and excellent in conductivity.

Next, a hole injection layer (HIL) material is thermally vacuum-deposited onto the surface of the positive electrode or the surface of the positive electrode is spin-coated with the hole injection layer (HIL) material, by a typical method, thereby forming a hole injection layer. Examples of the hole injection layer material include copper phthalocyanine (CuPc), 4,4',4"-tris(3-methylphenylamino)triphenylamine (m-MTDATA), 4,4',4"-tris(3-methylphenylamino)phenoxybenzene (m-MTDAPB), starburst amines 4,4',4"-tri(N-carbazolyl)triphenylamine (TCTA), 4,4',4"-tris(N-(2-napthyl)-N-phenylamino)-triphenylamine(2-TNATA), or IDE406 commercially available from Idemitsu Inc.

A hole transport layer (HTL) material is thermally vacuum-deposited onto the surface of the hole injection layer or the surface of the hole injection layer is spin-coated with the hole transport layer (HTL) material, by a typical method, thereby forming a hole transport layer. In this case, examples of the hole transport layer material include bis(N-(1-naphthyl-n-phenyl))benzidine (α-NPD), N,N'-di(naphthalen-1-yl)-N,N'-biphenyl-benzidine (NPB) or N,N'-biphenyl-N,N'-bis(3-methylphenyl)-1,1'-biphenyl-4,4'-diamine (TPD).

A light emitting layer (EML) material is thermally vacuum-deposited onto the surface of the hole transport layer or the surface of the hole transport layer is spin-coated with the light emitting layer (EML) material, by a typical method, thereby forming a light emitting layer. In this case, when a single light emitting material or light emitting host material among the used light emitting layer materials is green, tris(8-hydroxyquinolinolato)aluminum (Alq3), and the like may be used, and when the material is blue, 8-hydroxyquinoline beryllium salt (Balq), a 4,4'-bis(2,2-biphenylethenyl)-1,1'-biphenyl)-based material (DPVBi), a spiro material, spiro-4,4'-bis(2,2-biphenylethenyl)-1,1'-biphenyl (spiro-DPVBi), 2-(2-benzooxazolyl)-phenollithium salt (LiPBO), bis(biphenylvinyl)benzene, an aluminum-quinoline metal complex, metal complexes of imidazole, thiazole, and oxazole, and the like may be used.

In the case of a dopant which may be used along with a light emitting host among the light emitting layer materials, the compound of the present invention may be preferably used as a blue fluorescent dopant, and as other fluorescent dopants, it is possible to use IDE102 and IDE105 commercially available from Idemitsu Inc., and as a phosphorescent dopant, it is possible to use tris(2-phenylpyridine)iridium (III)(Ir(ppy)3), iridium (III)bis[(4,6-difluorophenyl)pyridinato-N,C-2']picolinate (FIrpic) (reference literature [Chihaya Adachi et al., Appl. Phys. Lett., 2001, 79, 3082-3084]), platinum (II)octaethylporphyrin (PtOEP), TBE002 (Corbion), and the like.

Optionally, an electron blocking layer (EBL) may be additionally formed between the hole transport layer and the light emitting layer.

An electron transport layer (ETL) material is thermally vacuum-deposited onto the surface of the light emitting layer or the surface of the light emitting layer is spin-coated with the electron transport layer (ETL) material, by a typical method, thereby forming an electron transport layer. In this case, the electron transport layer material used is not particularly limited, and preferably, tris(8-hydroxyquinolinolato)aluminum (Alq3) may be used.

Optionally, by additionally forming a hole blocking layer (HBL) between the light emitting layer and the electron transport layer and using a phosphorescent dopant together in the light emitting layer, it is possible to prevent triplet excitons or holes from diffusing into the electron transport layer.

The hole blocking layer may be formed by the thermal vacuum deposition of and spin-coating with a hole blocking layer material by a typical method, and the hole blocking layer material is not particularly limited, but preferably, (8-hydroxyquinolinolato)lithium (Liq), bis(8-hydroxy-2-methylquinolinolato)-aluminumbiphenoxide (BAlq), bathocuproine (BCP), LiF, and the like may be used.

An electron injection layer (EL) material is thermally vacuum-deposited onto the surface of the electron transport layer or the surface of the electron transport layer is spin-coated with the electron injection layer (EIL) material, by a typical method, thereby forming an electron injection layer. In this case, as the electron injection layer material used, a material such as LiF, Liq, Li2O, BaO, NaCl, and CsF may be used.

A material for a negative electrode is thermally vacuum-deposited onto the surface of the electron injection layer by a typical method, thereby forming a negative electrode.

In this case, as the material for a negative electrode used, lithium (Li), aluminum (Al), aluminum-lithium (Al—Li), calcium (Ca), magnesium (Mg), magnesium-indium (Mg—In), magnesium-silver (Mg—Ag), and the like may be used. In addition, in the case of a top-emission electroluminescent element, a transparent negative electrode through which light may pass may also be formed using indium tin oxide (ITO) or indium zinc oxide (IZO).

Hereinafter, a method for synthesizing the compounds will be described below with reference to representative examples. However, the method for synthesizing the compounds of the present invention is not limited to the methods exemplified below, and the compounds of the present invention may be prepared by the methods exemplified below and methods publicly known in the art.

Synthesis Example 1

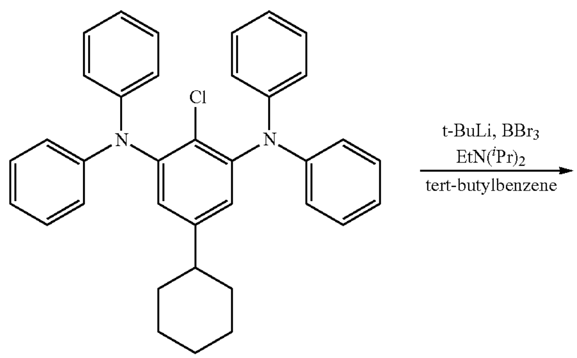

Starting Material 1

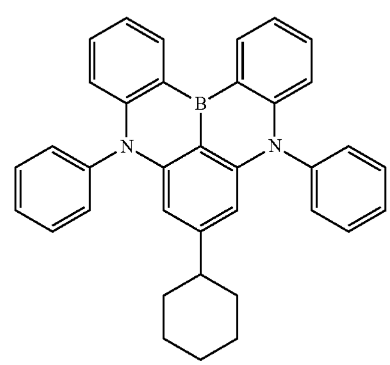

Compound 1

After 10.6 g (20 mmol) of Starting Material 1 was dissolved in tert-butylbenzene (250 ml), the resulting solution was cooled to 0° C. 24.7 ml (42 mmol) of a 1.7 M tert-butyllithium solution (in pentane) was added thereto under a nitrogen atmosphere, and the resulting solution was stirred at 60° C. for 2 hours.

Thereafter, the reactant was again cooled to 0° C., 4.0 ml (42 mmol) of BBr3 was added thereto, and then the resulting solution was stirred at room temperature for 0.5 hour. The reactant was again cooled to 0° C., 7.3 ml (42 mmol) of N,N-diisopropylethylamine was added thereto, and then the resulting solution was stirred at 60° C. for 2 hours.

The reactant was cooled to room temperature, and an organic layer was extracted using ethyl acetate and water. After the solvent of the extracted organic layer was removed, the residue was purified using a silica gel column chromatography (DCM/hexane) method. Thereafter, the obtained product was recrystallized and purified with a DCM/acetone mixed solvent to obtain 2.3 g of Compound 1 with a yield of 23.2%.

MS (MALDI-TOF) m/z: 502 [M]+

Synthesis Example 2

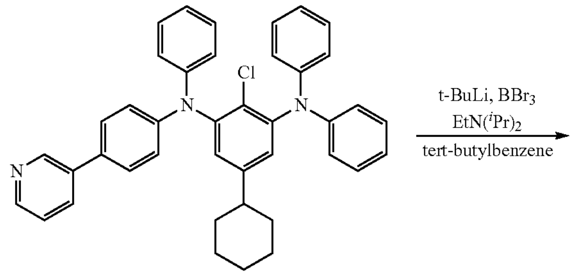

Starting Material 70

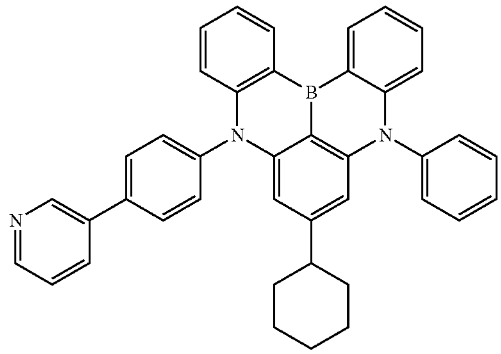

Compound 70

1.2 g of Compound 70 was obtained with a yield of 10.2% by performing an experiment in the same manner as in Synthesis Example 1, except that 12.1 g of Starting Material 70 was used instead of Starting Material 1.

MS (MALDI-TOF) m/z: 579 [M]+

Synthesis Example 3

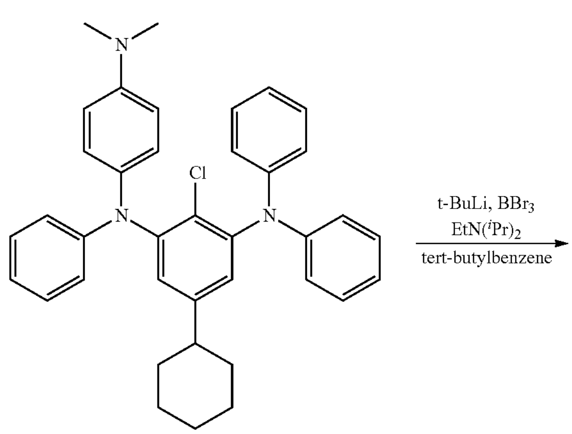

Starting Material 92

-continued

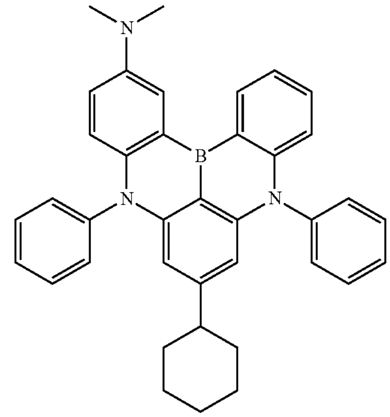

Compound 92

1.6 g of Compound 92 was obtained with a yield of 15.0% by performing an experiment in the same manner as in Synthesis Example 1, except that 11.4 g of Starting Material 92 was used instead of Starting Material 1.

MS (MALDI-TOF) m/z: 545 [M]+

Synthesis Example 4

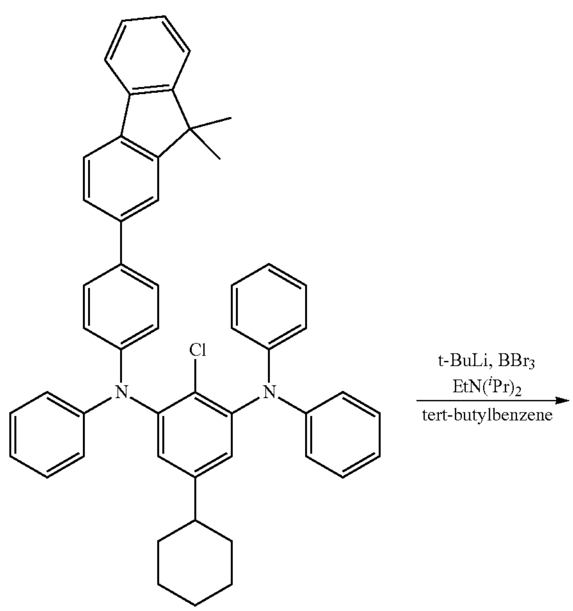

Starting Material 120

-continued

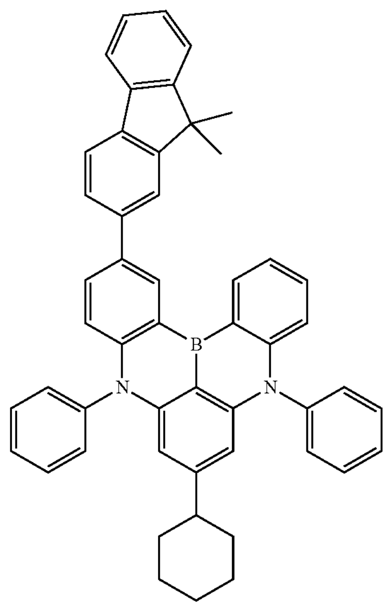

Compound 120

1.8 g of Compound 120 was obtained with a yield of 13.3% by performing an experiment in the same manner as in Synthesis Example 1, except that 14.4 g of Starting Material 120 was used instead of Starting Material 1.

MS (MALDI-TOF) m/z: 694 [M]+

Synthesis Example 5

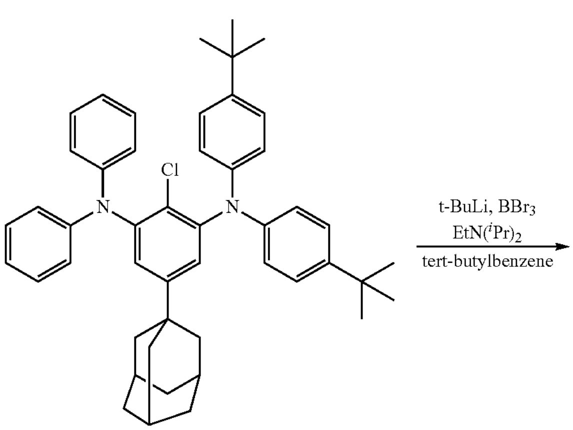

Starting Material 133

-continued

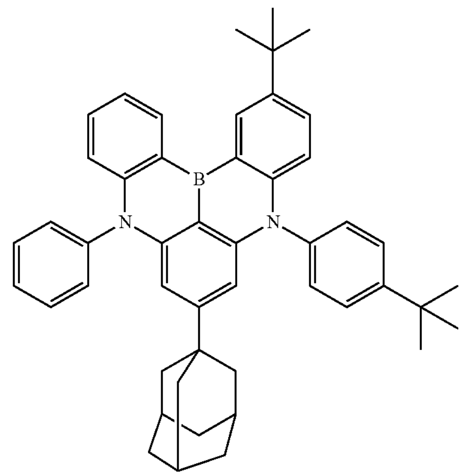

Compound 133

1.7 g of Compound 133 was obtained with a yield of 12.5% by performing an experiment in the same manner as in Synthesis Example 1, except that 13.9 g of Starting Material 133 was used instead of Starting Material 1.

MS (MALDI-TOF) m/z: 666 [M]+

Synthesis Example 6

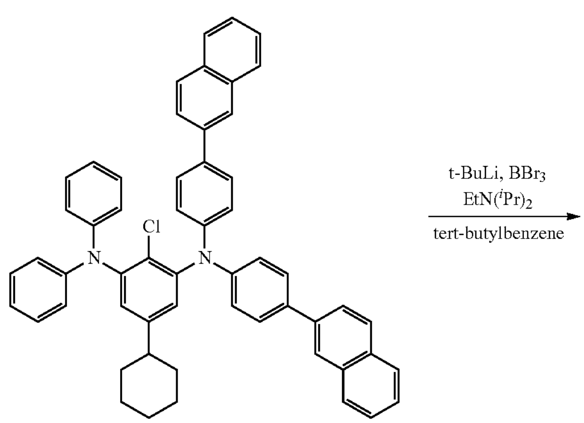

Starting Material 158

-continued

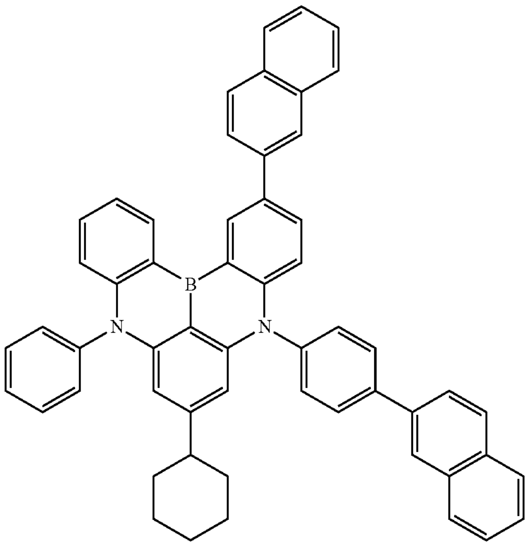

Compound 158

2.6 g of Compound 158 was obtained with a yield of 17.3% by performing an experiment in the same manner as in Synthesis Example 1, except that 15.6 g of Starting Material 158 was used instead of Starting Material 1.

MS (MALDI-TOF) m/z: 754 [M]+

Synthesis Example 7

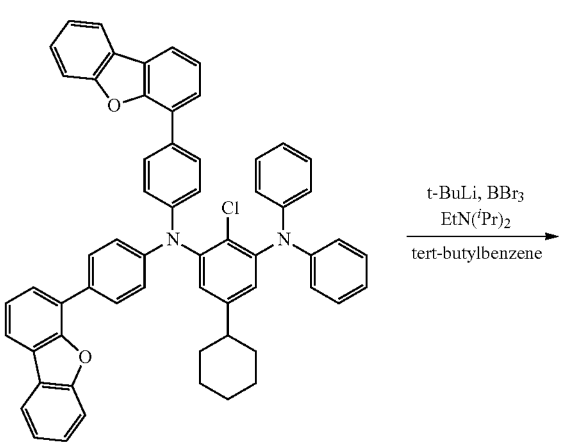

Starting Material 167

-continued

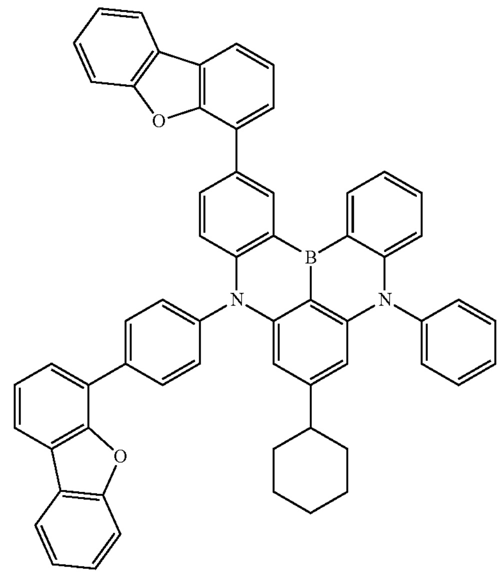

Compound 167

1.9 g of Compound 167 was obtained with a yield of 11.5% by performing an experiment in the same manner as in Synthesis Example 1, except that 17.3 g of Starting Material 167 was used instead of Starting Material 1.

MS (MALDI-TOF) m/z: 834 [M]+

Synthesis Example 8

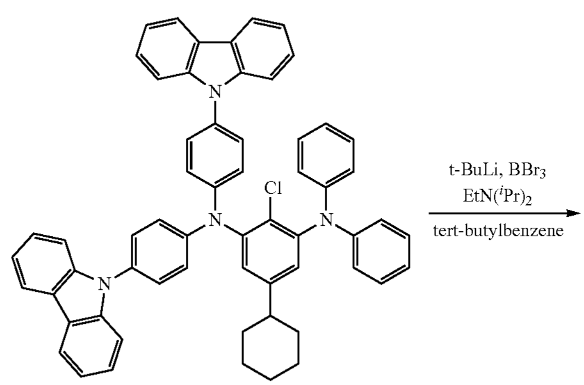

Starting Material 168

-continued

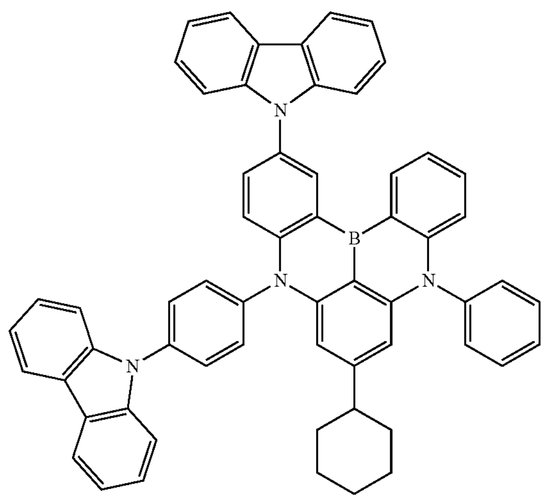

Compound 168

2.7 g of Compound 168 was obtained with a yield of 16.4% by performing an experiment in the same manner as in Synthesis Example 1, except that 17.2 g of Starting Material 168 was used instead of Starting Material 1.

MS (MALDI-TOF) m/z: 832 [M]+

Synthesis Example 9

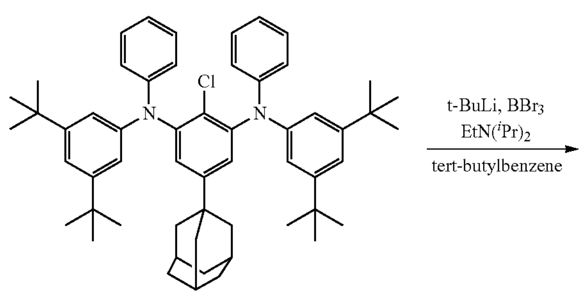

Starting Material 251

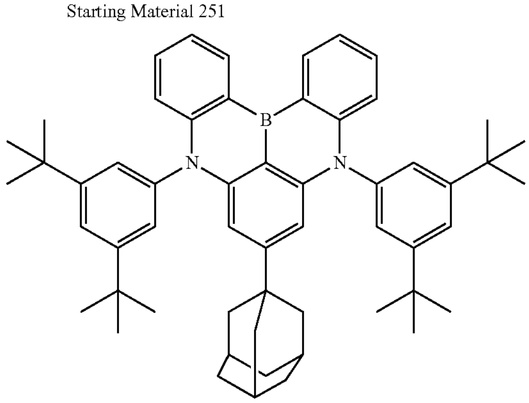

Compound 251

2.4 g of Compound 251 was obtained with a yield of 15.2% by performing an experiment in the same manner as in Synthesis Example 1, except that 16.1 g of Starting Material 251 was used instead of Starting Material 1.

MS (MALDI-TOF) m/z: 778 [M]+

Synthesis Example 10

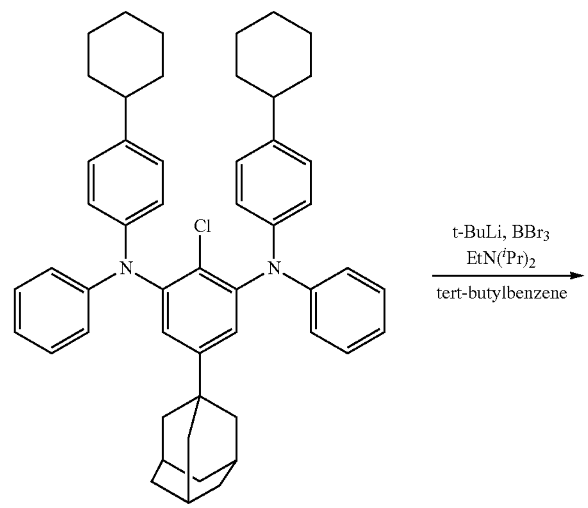

Starting Material 304

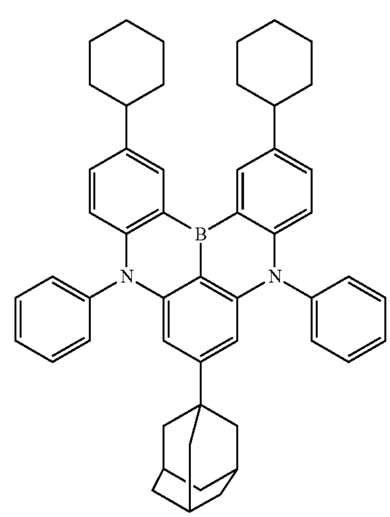

Compound 304

0.6 g of Compound 304 was obtained with a yield of 4.4% by performing an experiment in the same manner as in Synthesis Example 1, except that 14.9 g of Starting Material 304 was used instead of Starting Material 1.

MS (MALDI-TOF) m/z: 718 [M]+

Synthesis Example 11

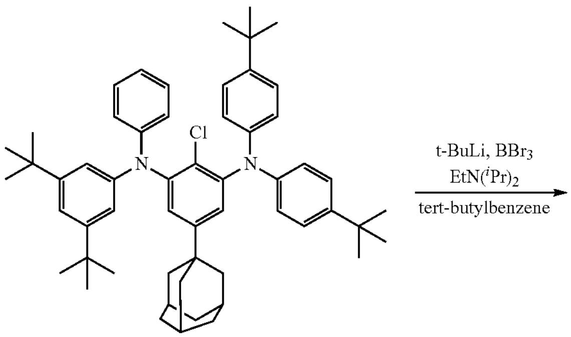

Starting Material 401

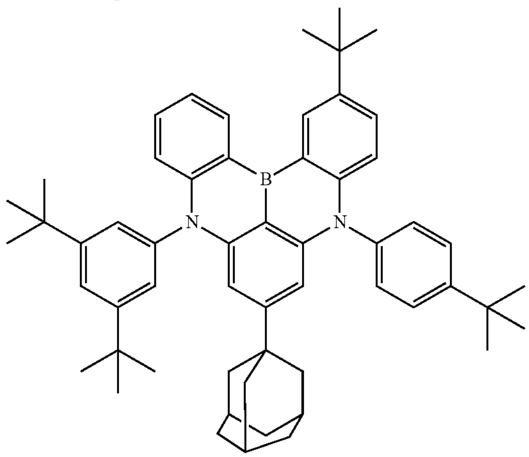

Compound 401

2.6 g of Compound 401 was obtained with a yield of 16.6% by performing an experiment in the same manner as in Synthesis Example 1, except that 16.1 g of Starting Material 401 was used instead of Starting Material 1.

MS (MALDI-TOF) m/z: 778 [M]+

Synthesis Example 12

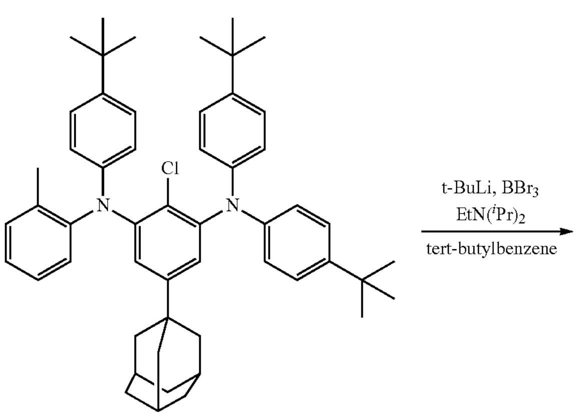

Starting Material 454

-continued

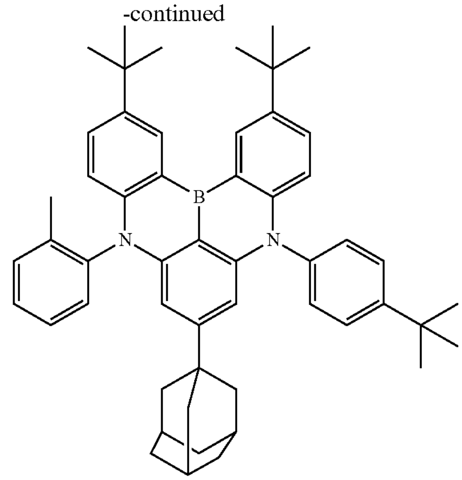

Compound 454

2.6 g of Compound 454 was obtained with a yield of 17.7% by performing an experiment in the same manner as in Synthesis Example 1, except that 15.3 g of Starting Material 454 was used instead of Starting Material 1.

MS (MALDI-TOF) m/z: 736 [M]+

Synthesis Example 13

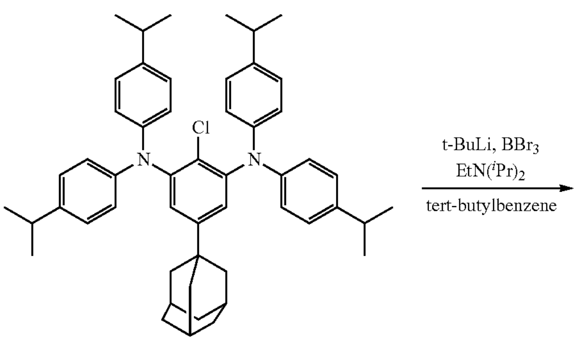

Starting Material 459

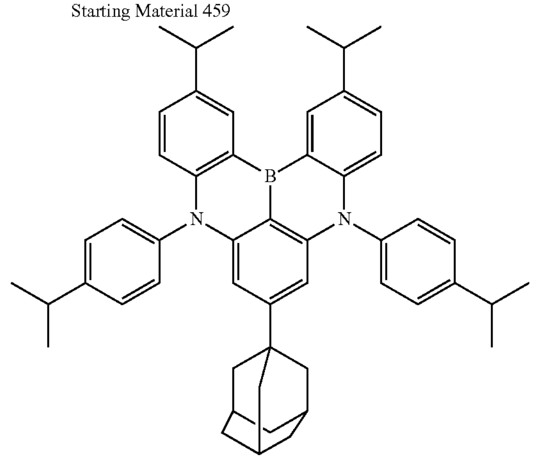

Compound 459

2.8 g of Compound 459 was obtained with a yield of 19.1% by performing an experiment in the same manner as in Synthesis Example 1, except that 15.0 g of Starting Material 459 was used instead of Starting Material 1.

MS (MALDI-TOF) m/z: 722 [M]+

Synthesis Example 14

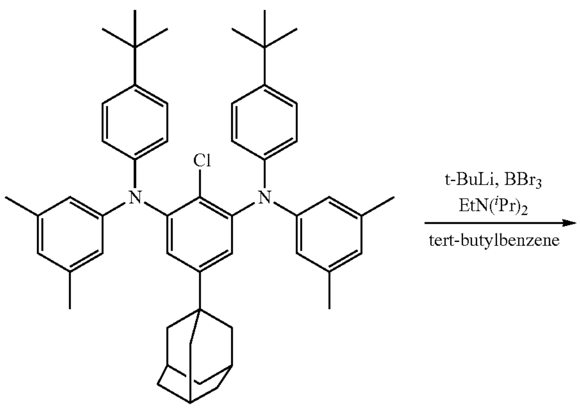

Starting Material 462

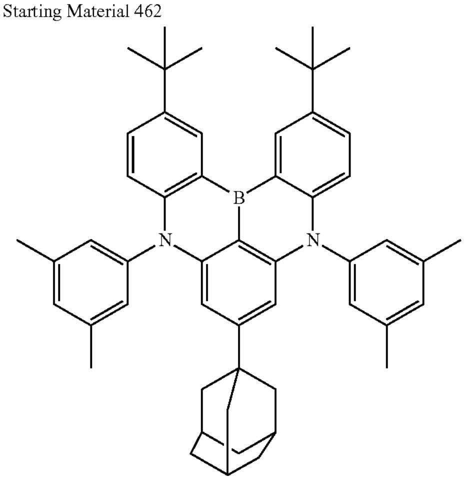

Compound 462

2.6 g of Compound 462 was obtained with a yield of 18.0% by performing an experiment in the same manner as in Synthesis Example 1, except that 15.0 g of Starting Material 462 was used instead of Starting Material 1.

MS (MALDI-TOF) m/z: 722 [M]+

Synthesis Example 15

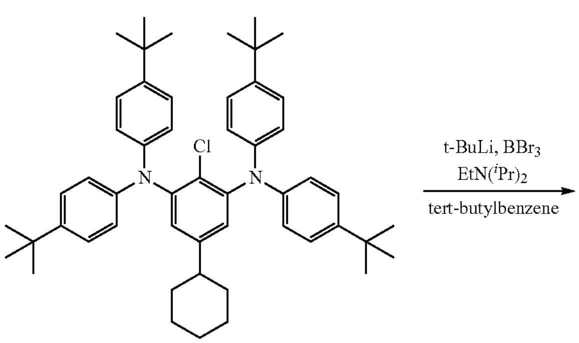

Starting Material 463

-continued

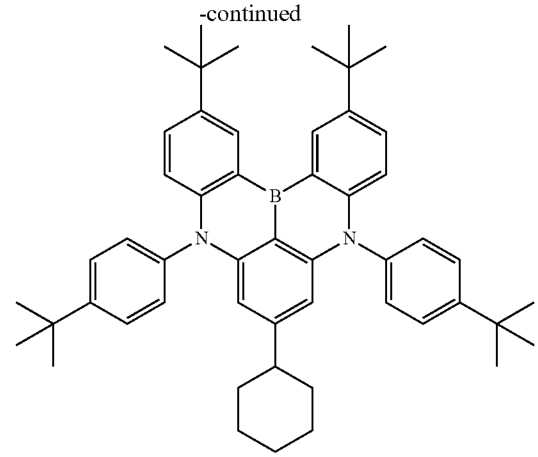

Compound 463

3.1 g of Compound 463 was obtained with a yield of 21.2% by performing an experiment in the same manner as in Synthesis Example 1, except that 15.1 g of Starting Material 463 was used instead of Starting Material 1.

MS (MALDI-TOF) m/z: 726 [M]+

Synthesis Example 16

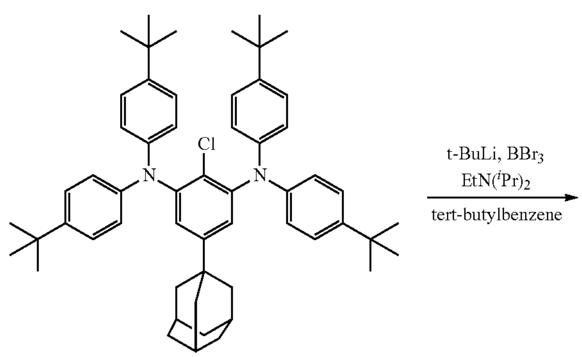

Starting Material 464

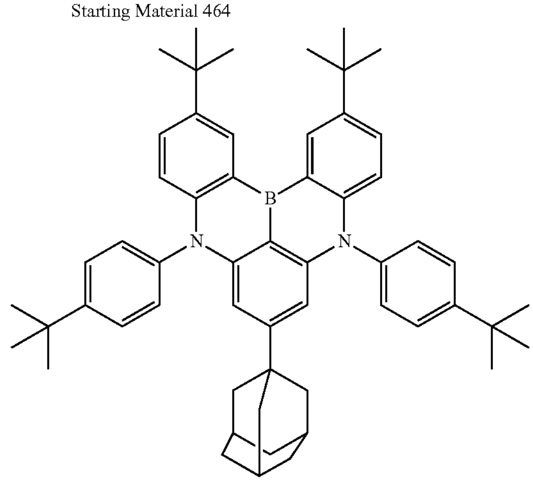

Compound 464

After 16.1 g (20 mmol) of Starting Material 464 was dissolved in tert-butylbenzene (250 ml), the resulting solution was cooled to 0° C. 24.7 ml (42 mmol) of a 1.7 M tert-butyllithium solution (in pentane) was added thereto under a nitrogen atmosphere, and the resulting solution was stirred at 60° C. for 2 hours. Thereafter, the reactant was again cooled to 0° C., 4.0 ml (42 mmol) of BBr3 was added thereto, and then the resulting solution was stirred at room temperature for 0.5 hour. The reactant was again cooled to 0° C., 7.3 ml (42 mmol) of N,N-diisopropylethylamine was added thereto, and then the resulting solution was stirred at 60° C. for 2 hours. The reactant was cooled to room temperature, and an organic layer was extracted using ethyl acetate and water. After the solvent of the extracted organic layer was removed, the residue was purified using a silica gel column chromatography (DCM/hexane) method. Thereafter, the obtained product was recrystallized and purified with a DCM/acetone mixed solvent to obtain 3.2 g of Compound 464 with a yield of 20.7%.

MS (MALDI-TOF) m/z: 778 [M]+

Synthesis Example 17

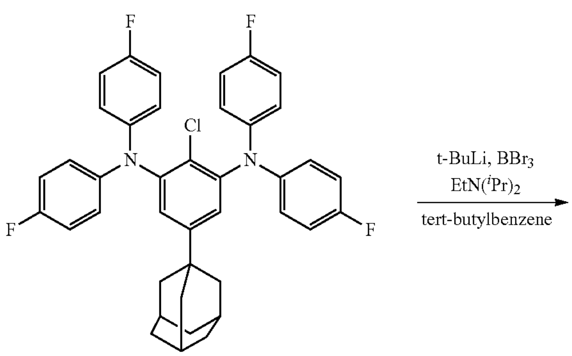

Starting Material 465

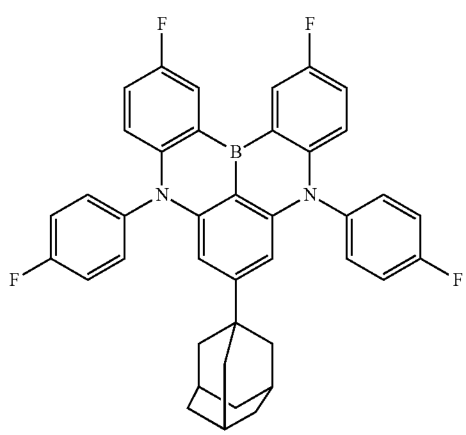

Compound 465

*1.2 g of Compound 465 was obtained with a yield of 9.9% by performing an experiment in the same manner as in Synthesis Example 1, except that 13.1 g of Starting Material 465 was used instead of Starting Material 1.

MS (MALDI-TOF) m/z: 626 [M]+

Synthesis Example 18

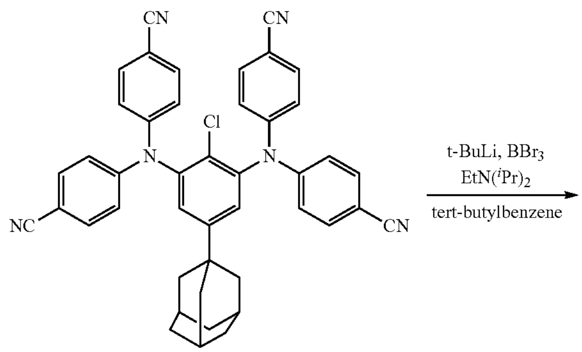

Starting Material 467

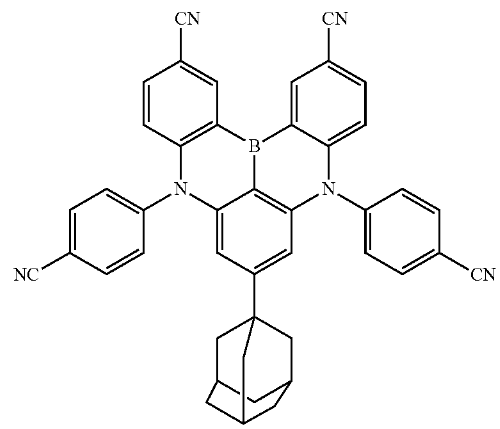

Compound 467

1.1 g of Compound 467 was obtained with a yield of 8.3% by performing an experiment in the same manner as in Synthesis Example 1, except that 13.6 g of Starting Material 467 was used instead of Starting Material 1.

MS (MALDI-TOF) m/z: 654 [M]+

Synthesis Example 19

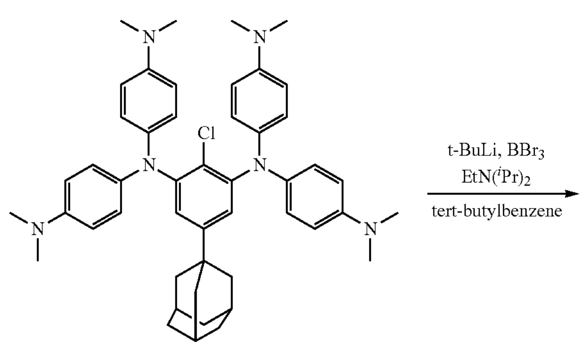

Starting Material 469

-continued
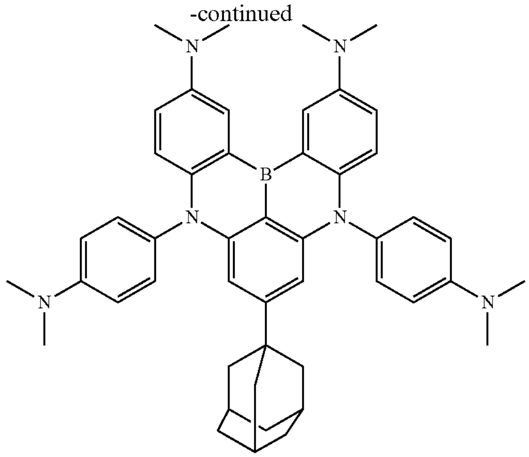
Compound 469
1.7 g of Compound 469 was obtained with a yield of 15.5% by performing an experiment in the same manner as in Synthesis Example 1, except that 15.1 g of Starting Material 469 was used instead of Starting Material 1.
MS (MALDI-TOF) m/z: 726 [M]+
Synthesis Example 20
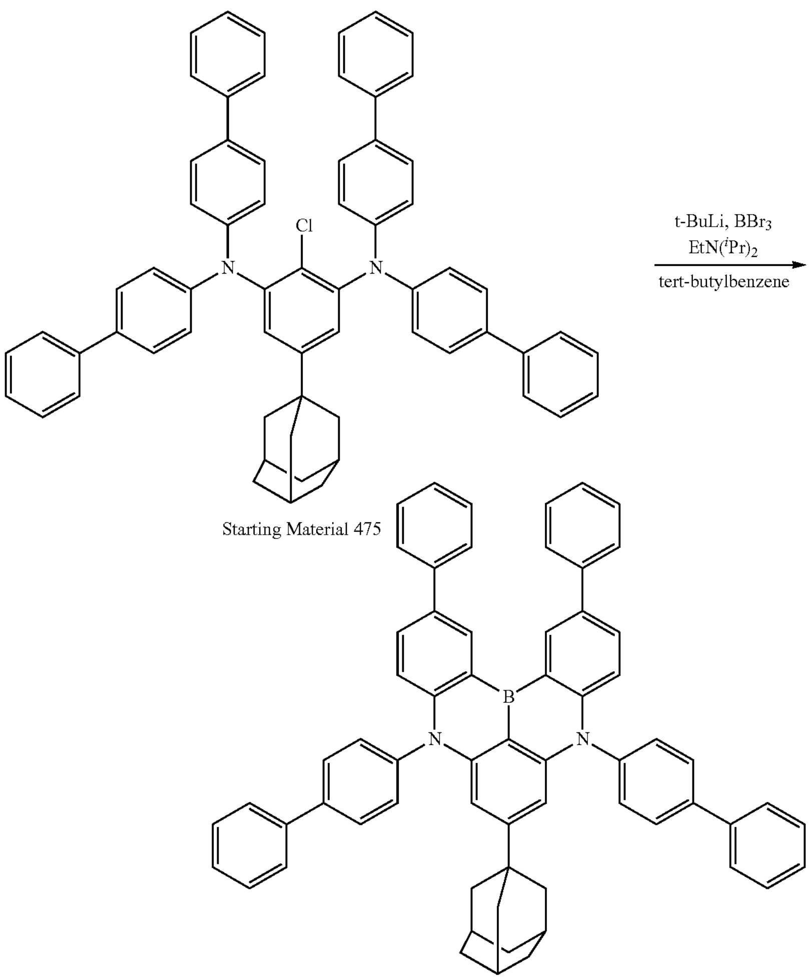
Starting Material 475
Compound 475

3.5 g of Compound 475 was obtained with a yield of 20.1% by performing an experiment in the same manner as in Synthesis Example 1, except that 17.7 g of Starting Material 475 was used instead of Starting Material 1.

MS (MALDI-TOF) m/z: 858 [M]+

Synthesis Example 21

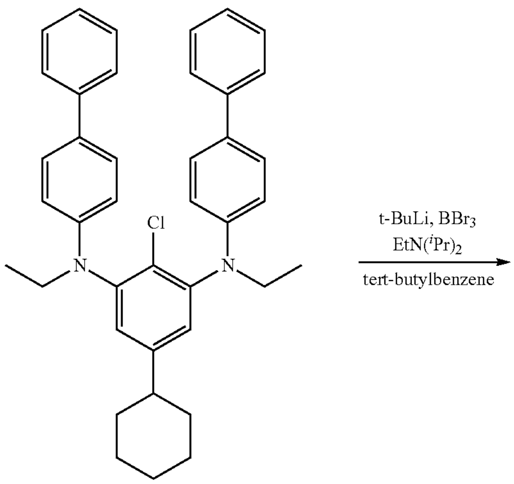

Starting Material 477

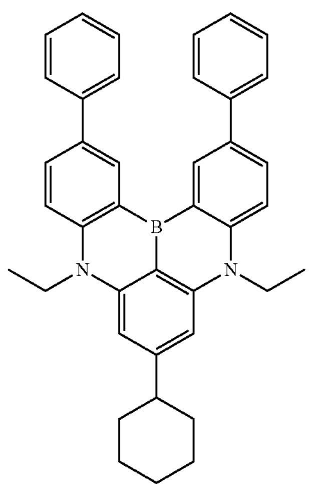

Compound 477

2.4 g of Compound 477 was obtained with a yield of 16.6% by performing an experiment in the same manner as in Synthesis Example 1, except that 14.7 g of Starting Material 477 was used instead of Starting Material 1.

MS (MALDI-TOF) m/z: 558 [M]+

Synthesis Example 22

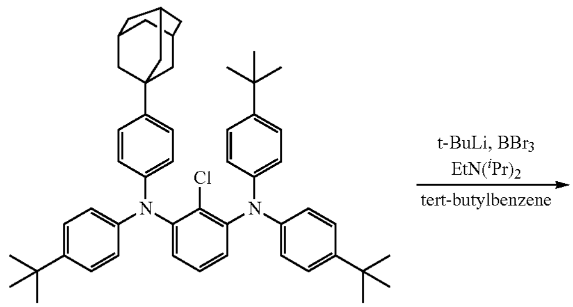

Starting Material 505

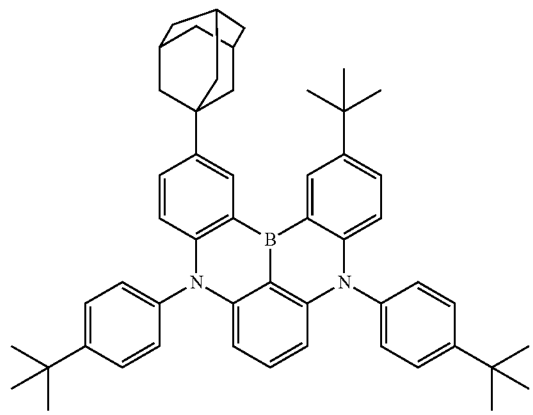

Compound 505

2.7 g of Compound 505 was obtained with a yield of 18.8% by performing an experiment in the same manner as in Synthesis Example 1, except that 15.0 g of Starting Material 505 was used instead of Starting Material 1.

MS (MALDI-TOF) m/z: 722 [M]+

Synthesis Example 23

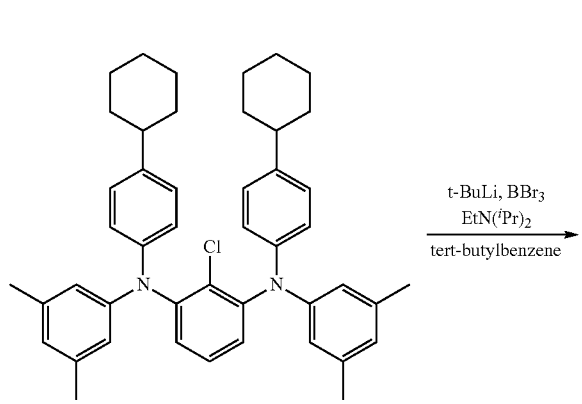

Starting Material 509

-continued

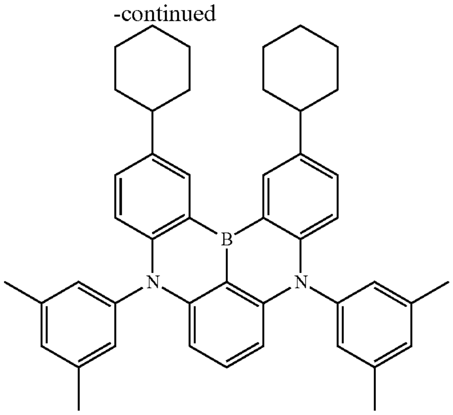

Compound 509

2.3 g of Compound 509 was obtained with a yield of 17.8% by performing an experiment in the same manner as in Synthesis Example 1, except that 13.3 g of Starting Material 509 was used instead of Starting Material 1.

MS (MALDI-TOF) m/z: 640 [M]+

Synthesis Example 24

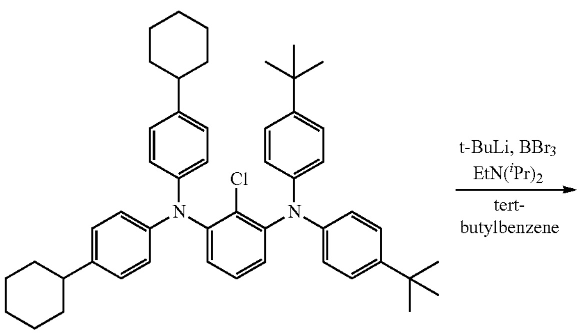

Starting Material 511

-continued

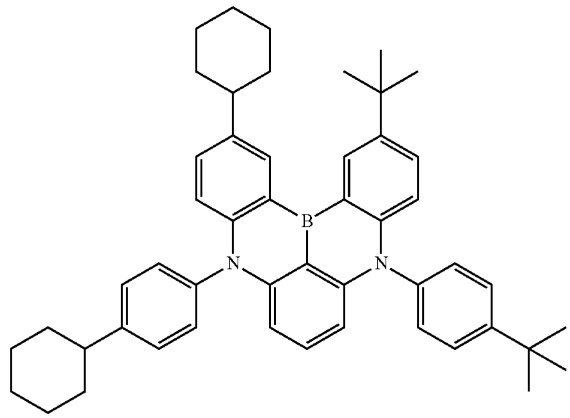

Compound 511

2.8 g of Compound 511 was obtained with a yield of 20.4% by performing an experiment in the same manner as in Synthesis Example 1, except that 14.5 g of Starting Material 511 was used instead of Starting Material 1.

MS (MALDI-TOF) m/z: 696 [M]+

Synthesis Example 25

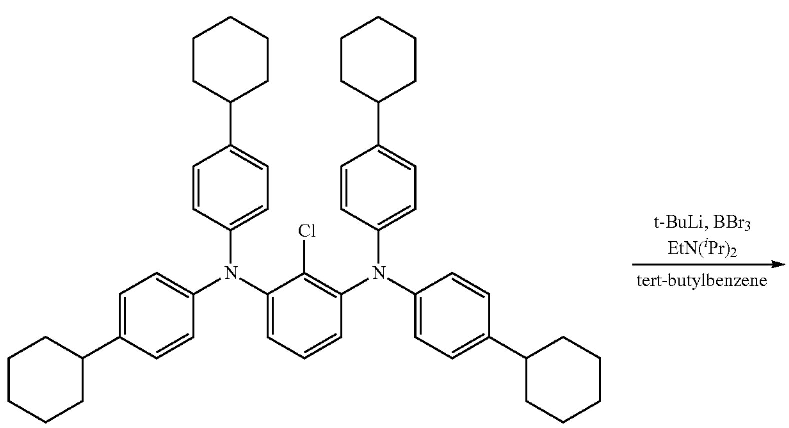

Starting Material 512

-continued

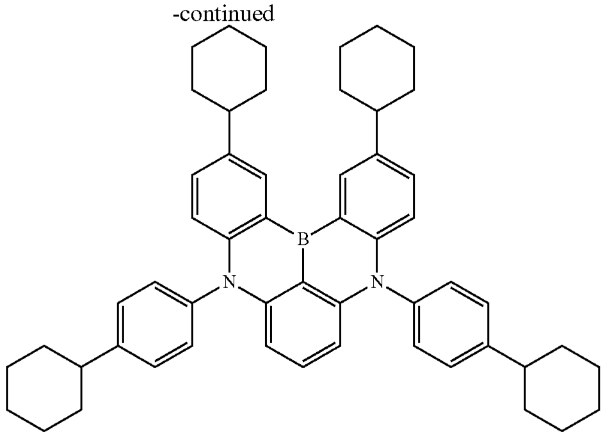

Compound 512

3.2 g of Compound 512 was obtained with a yield of 21.1% by performing an experiment in the same manner as in Synthesis Example 1, except that 15.5 g of Starting Material 512 was used instead of Starting Material 1.

MS (MALDI-TOF) m/z: 748 [M]+

Synthesis Example 26

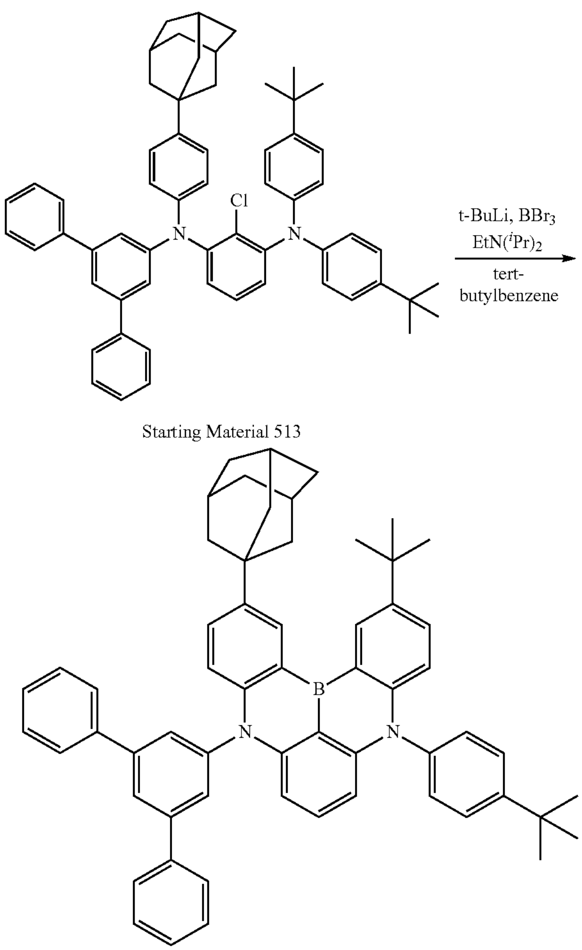

Compound 513

3.0 g of Compound 513 was obtained with a yield of 18.2% by performing an experiment in the same manner as in Synthesis Example 1, except that 16.9 g of Starting Material 513 was used instead of Starting Material 1.

MS (MALDI-TOF) m/z: 818 [M]+

Synthesis Example 27

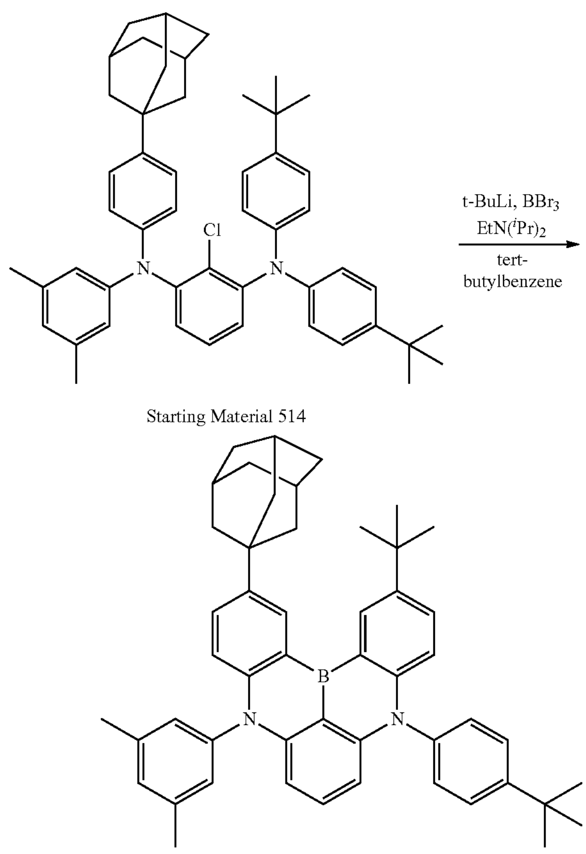

Compound 514

2.7 g of Compound 514 was obtained with a yield of 19.5% by performing an experiment in the same manner as in Synthesis Example 1, except that 14.4 g of Starting Material 514 was used instead of Starting Material 1.

MS (MALDI-TOF) m/z: 694 [M]+

Synthesis Example 28

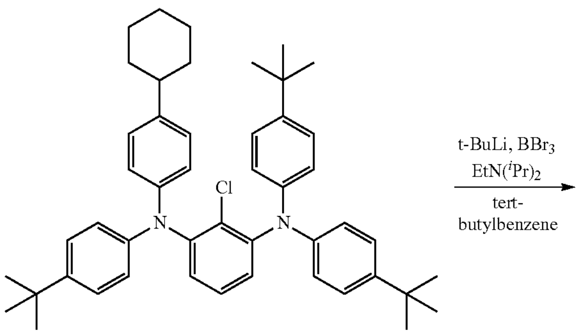

Starting Material 515

-continued

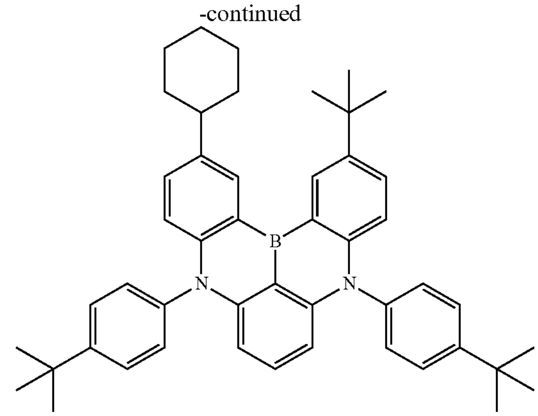

Compound 515

2.6 g of Compound 515 was obtained with a yield of 19.2% by performing an experiment in the same manner as in Synthesis Example 1, except that 13.9 g of Starting Material 515 was used instead of Starting Material 1.

MS (MALDI-TOF) m/z: 670 [M]+

Synthesis Example 29

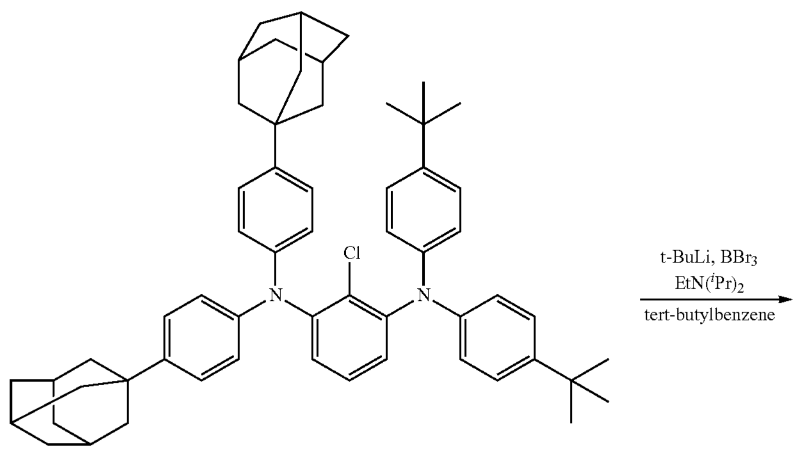

Starting Material 516

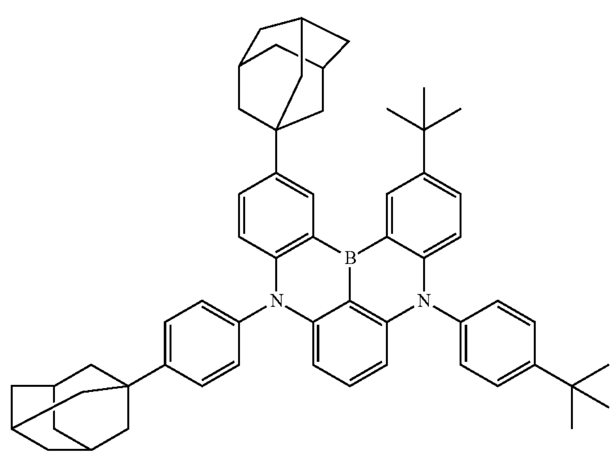

Compound 516

2.9 g of Compound 516 was obtained with a yield of 17.8% by performing an experiment in the same manner as in Synthesis Example 1, except that 16.6 g of Starting Material 516 was used instead of Starting Material 1.

MS (MALDI-TOF) m/z: 800 [M]+

Synthesis Example 30

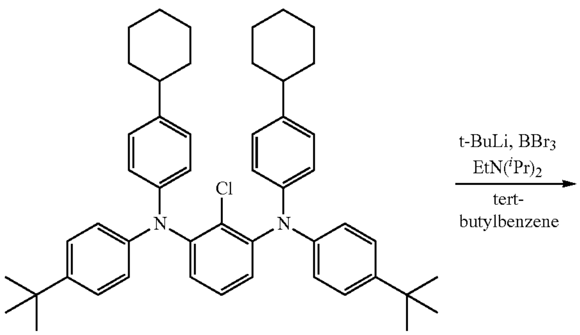

Starting Material 517

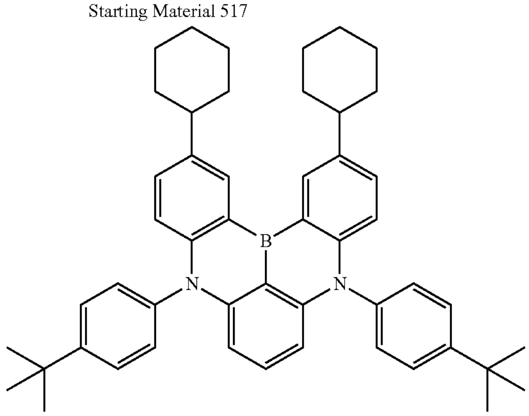

Compound 517

2.1 g of Compound 517 was obtained with a yield of 15.4% by performing an experiment in the same manner as in Synthesis Example 1, except that 14.5 g of Starting Material 517 was used instead of Starting Material 1.

MS (MALDI-TOF) m/z: 696 [M]+

Synthesis Example 31

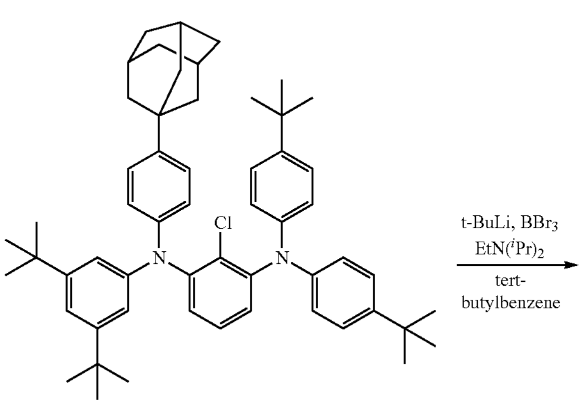

Starting Material 518

-continued

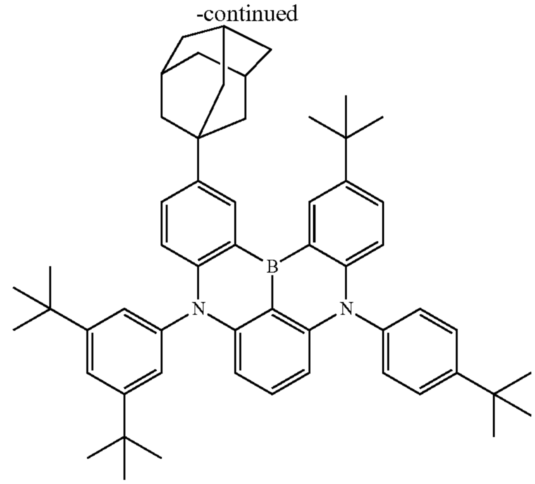

Compound 518

2.9 g of Compound 518 was obtained with a yield of 18.3% by performing an experiment in the same manner as in Synthesis Example 1, except that 16.1 g of Starting Material 518 was used instead of Starting Material 1.

MS (MALDI-TOF) m/z: 778 [M]+

Synthesis Example 32

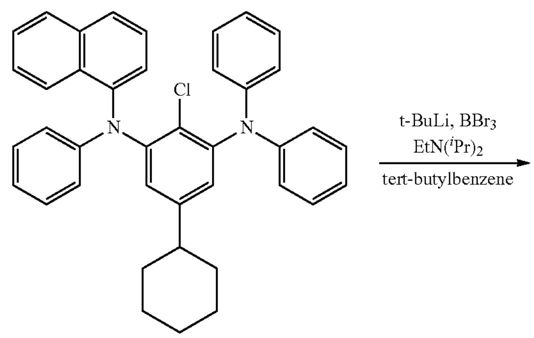

Starting Material 586

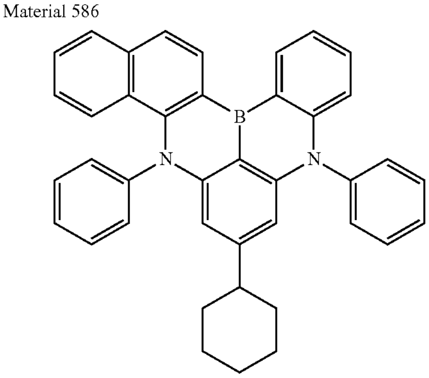

Compound 586

0.9 g of Compound 586 was obtained with a yield of 8.4% by performing an experiment in the same manner as in Synthesis Example 1, except that 11.6 g of Starting Material 586 was used instead of Starting Material 1.

MS (MALDI-TOF) m/z: 552 [M]+

Comparative Example 1—Synthesis of Compound A

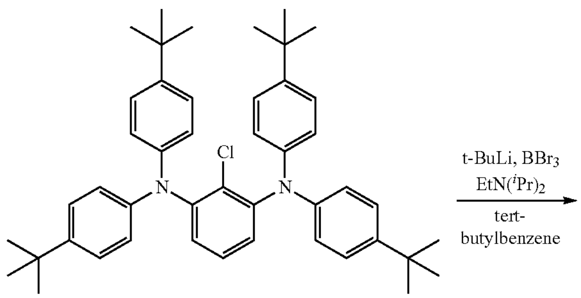

Starting Material A

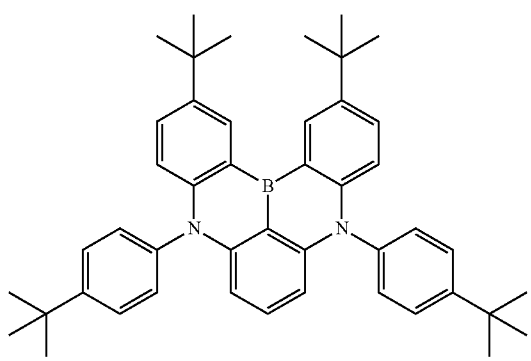

Compound A 2.7 g of Compound A was obtained with a yield of 21.7% by performing an experiment in the same manner as in Synthesis Example 1, except that 13.4 g of Starting Material A was used instead of Starting Material 1.

MS (MALDI-TOF) m/z: 644 [M]+

Comparative Example 2—Synthesis of Compound B

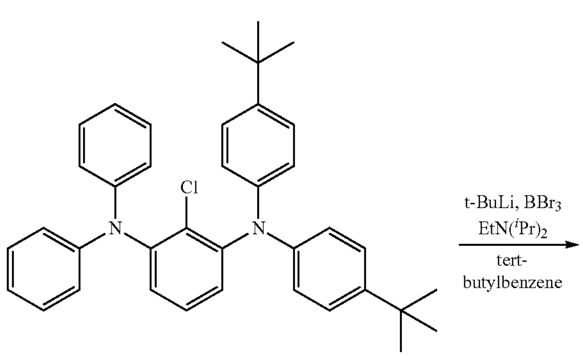

Starting Material B

-continued

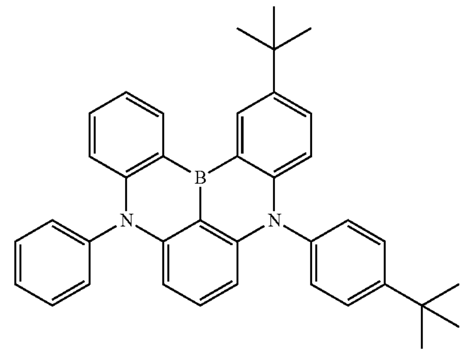

Compound B 2.0 g of the compound was obtained with a yield of 18.5% by performing an experiment in the same manner as in Synthesis Example 1, except that 11.2 g of Starting Material B was used instead of Starting Material 1.

MS (MALDI-TOF) m/z: 532 [M]+

Comparative Example 3—Synthesis of Compound C

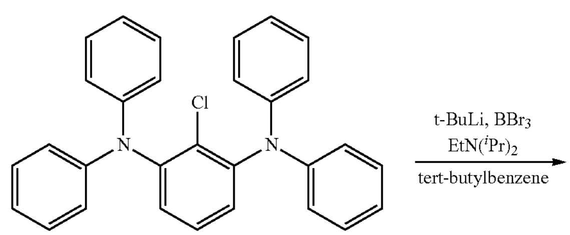

Starting Material C

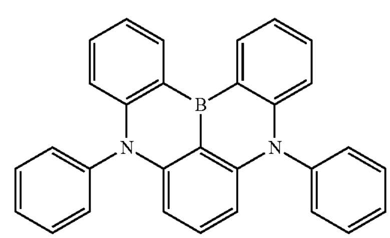

Compound C 1.7 g of Compound C was obtained with a yield of 20.2% by performing an experiment in the same manner as in Synthesis Example 1, except that 8.9 g of Starting Material C was used instead of Starting Material 1.

MS (MALDI-TOF) m/z: 420 [M]+

Comparative Example 4—Synthesis of Compound D

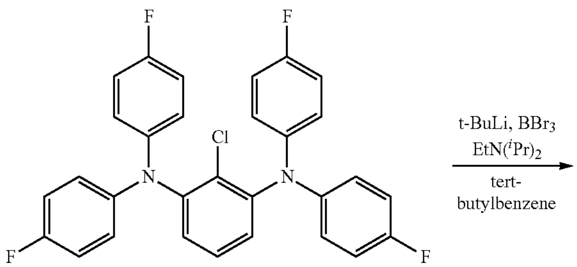

Starting Material D

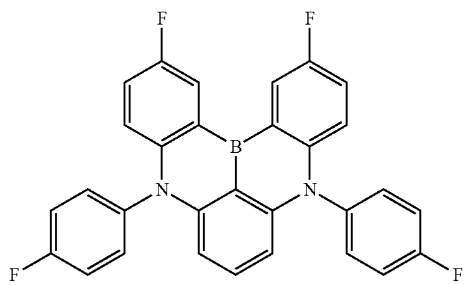

Compound D 1.3 g of Compound D was obtained with a yield of 12.7% by performing an experiment in the same manner as in Synthesis Example 1, except that 10.4 g of Starting Material D was used.

MS (MALDI-TOF) m/z: 492 [M]+

Comparative Example 5—Synthesis of Compound E

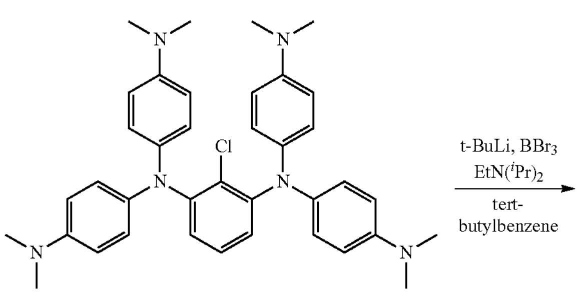

Starting Material E

-continued

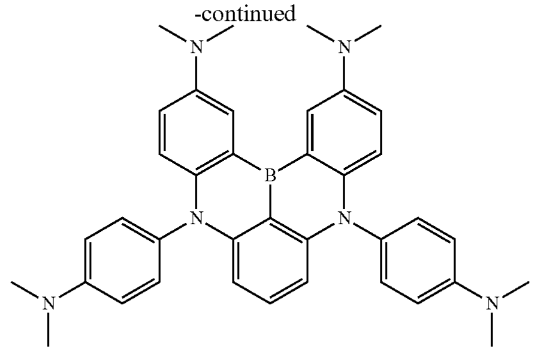

Compound E 1.9 g of Compound E was obtained with a yield of 16.4% by performing an experiment in the same manner as in Synthesis Example 1, except that 12.4 g of Starting Material E was used.

MS (MALDI-TOF) m/z: 592 [M]+

EXAMPLES

<Method for Manufacturing Organic Electroluminescent Element with Bottom Emission Structure>

A substrate on which ITO (100 nm) as a positive electrode of an organic electroluminescent element had been stacked was patterned by distinguishing negative electrode and positive electrode regions and an insulation layer through a photo-lithography process, and thereafter, the surface thereof was treated with a UV ozone treatment and O2:N2 plasma for the purpose of increasing a work-function of the positive electrode (ITO) and washing the substrate. A hole injection layer (HIL) was formed to have a thickness of 10 nm thereon. Subsequently, a hole transport layer were vacuum-deposited on the top of the hole injection layer and formed to have a thickness of 60 nm, and an electron blocking layer (EBL) was formed to have a thickness of 5 nm on the top of the hole transport layer (HTL). The electron blocking layer (EBL) was doped with 3% of Compound 463 as a dopant of a blue light emitting layer at the same time as a host thereof was deposited on the top of the electron blocking layer (EBL), thereby forming a light emitting layer (EML) having a thickness of 25 nm.

An electron transport layer (ETL) was deposited to have a thickness of 25 nm thereon, an electron injection layer was deposited to have a thickness of 1 nm on the electron transport layer, and aluminum as a negative electrode was deposited to have a thickness of 100 nm thereon. Thereafter, a seal cap including an adsorbent (getter) was laminated with a UV-curable adhesive in order to protect an organic electroluminescent element from oxygen or moisture in the air, thereby manufacturing an organic electroluminescent element.

Examples 2 to 22: Manufacture of Organic Electroluminescent Element

Organic electroluminescent elements were manufactured using the same method as in Example 1, except that as a dopant, Compounds 464, 505, 515, 517, 251, 133, 511, 516, 514, 1, 512, 465, 469, 459, 462, 477, 509, 513, 514, 518, and 586 were used instead of Compound 463.

Comparative Examples 1 to 5: Manufacture of Organic Electroluminescent Element

Organic electroluminescent elements were manufactured using the same method as in Example 1, except that as a dopant, Compounds A to E were used instead of Compound 463.

Analysis of Characteristics of Organic Electroluminescent Element

Hereinafter, electroluminescence characteristics of the organic electroluminescent elements with a bottom emission structure, which were manufactured in Examples 1 to 22 and Comparative Examples 1 to 5, were measured, and the results thereof are compared and shown in the following Table 1.

TABLE 1

| | Compound | Efficiency [Cd/A] | CIEx | CIEy | Peak wave-length [nm] | FWHM [nm] |
|---|---|---|---|---|---|---|
| Example 1 | Compound 463 | 6.1 | 0.126 | 0.115 | 465 | 25 |
| Example 2 | Compound 464 | 6.2 | 0.126 | 0.115 | 466 | 25 |
| Example 3 | Compound 505 | 6.3 | 0.126 | 0.114 | 464 | 25 |
| Example 4 | Compound 515 | 6.2 | 0.126 | 0.114 | 464 | 25 |
| Example 5 | Compound 517 | 6.3 | 0.126 | 0.115 | 465 | 25 |
| Example 6 | Compound 251 | 6.2 | 0.128 | 0.113 | 464 | 27 |
| Example 7 | Compound 133 | 5.9 | 0.126 | 0.116 | 465 | 26 |
| Example 8 | Compound 511 | 5.9 | 0.126 | 0.115 | 464 | 26 |
| Example 9 | Compound 516 | 6.2 | 0.126 | 0.115 | 464 | 26 |
| Example 10 | Compound 514 | 6.1 | 0.126 | 0.119 | 464 | 28 |
| Example 11 | Compound 1 | 5.8 | 0.125 | 0.112 | 461 | 25 |
| Example 12 | Compound 512 | 5.9 | 0.126 | 0.115 | 465 | 25 |
| Example 13 | Compound 465 | 5.7 | 0.126 | 0.129 | 470 | 25 |
| Example 14 | Compound 469 | 5.5 | 0.129 | 0.111 | 461 | 25 |
| Example 15 | Compound 459 | 5.8 | 0.126 | 0.115 | 466 | 25 |
| Example 16 | Compound 462 | 5.3 | 0.126 | 0.119 | 464 | 29 |
| Example 17 | Compound 477 | 7.0 | 0.138 | 0.159 | 470 | 28 |
| Example 18 | Compound 509 | 5.9 | 0.126 | 0.116 | 465 | 26 |
| Example 19 | Compound 513 | 6.0 | 0.126 | 0.117 | 465 | 27 |
| Example 20 | Compound 514 | 6.0 | 0.128 | 0.113 | 464 | 27 |
| Example 21 | Compound 518 | 6.0 | 0.126 | 0.115 | 466 | 25 |
| Example 22 | Compound 586 | 6.3 | 0.124 | 0.132 | 468 | 26 |
| Comparative Example 1 | Compound A | 5.4 | 0.126 | 0.114 | 464 | 28 |
| Comparative Example 2 | Compound B | 5.2 | 0.125 | 0.111 | 462 | 25 |
| Comparative Example 3 | Compound C | 5.1 | 0.125 | 0.111 | 461 | 25 |
| Comparative Example 4 | Compound D | 5.1 | 0.126 | 0.129 | 468 | 26 |
| Comparative Example 5 | Compound E | 5.2 | 0.13 | 0.089 | 457 | 25 |

From the results in Table 1, it can be seen that the devices in the Examples have better light emitting efficiencies than the devices in the Comparative Examples.

<Method for Manufacturing Organic Electroluminescent Element with Top Emission Structure>

A substrate on which an Ag alloy (10 nm) as a light-reflective layer and ITO (50 nm) as a positive electrode of an organic electroluminescent element had been sequentially stacked was patterned by distinguishing negative electrode and positive electrode regions and an insulation layer through a photo-lithography process, and thereafter, the surface thereof was treated with a UV ozone treatment and O2:N2 plasma for the purpose of increasing a work-function of the positive electrode (ITO) and washing the substrate. A hole injection layer (HIL) was formed to have a thickness of 10 nm thereon. Subsequently, a hole transport layer were vacuum-deposited on the top of the hole injection layer and formed to have a thickness of 110 nm, and an electron blocking layer (EBL) was formed to have a thickness of 15 nm on the top of the hole transport layer (HTL). The electron blocking layer (EBL) was doped with 1 to 5% of a dopant of a blue light emitting layer at the same time as a host thereof was deposited on the top of the electron blocking layer (EBL), thereby forming a light emitting layer (EML) having a thickness of 20 nm.

An electron transport layer (ETL) was deposited to have a thickness of 30 nm thereon, and magnesium (Mg) and silver (Ag) as a negative electrode were deposited at a ratio of 9:1 to have a thickness of 17 nm. Furthermore, a capping layer (CPL) was deposited onto the negative electrode, and then a seal cap including an adsorbent (getter) was laminated with a UV-curable adhesive in order to protect an organic electroluminescent element was protected from oxygen or moisture in the air, thereby manufacturing an organic electroluminescent element.

Analysis of Characteristics of Organic Electroluminescent Element

Hereinafter, the relationships between doping concentration and light emitting efficiency (doping concentration dependency) were measured and compared by applying the compounds of Examples 2, 4, 5, and 6 and the compound of Comparative Example 1 (Compound A) to the organic electroluminescent element with a top emission structure, and the results thereof are shown in the following Tables 2 and 3.

According to the following Table 2, it can be seen that in the case of Comparative Example 1-1, when the doping concentration is increased using Compound A, the light emitting efficiency is decreased as the concentration is increased, whereas the light emitting efficiency is constantly maintained in Examples 2-1, 4-1, 5-1, and to 6-1. This means that in the case of the present invention, the light emitting efficiency is not affected by the doping concentration.

TABLE 2

| Classification | Doping Concentration | Cd/A | $Cd/m^2$ | CIEx | CIEy | λmax | $T_{95}$ |
|---|---|---|---|---|---|---|---|
| Comparative Example 1-1 (Compound A) | 1% | 5.4 | 543 | 0.138 | 0.05 | 460 | 169 |
| | 2% | 5.8 | 579 | 0.136 | 0.054 | 464 | 195 |
| | 3% | 6.1 | 608 | 0.135 | 0.056 | 464 | 178 |
| | 4% | 5.3 | 533 | 0.134 | 0.06 | 464 | 117 |
| | 5% | 4.7 | 473 | 0.134 | 0.06 | 464 | 33 |
| Example 2-1 (Compound 464) | 1% | 8.5 | 854 | 0.135 | 0.05 | 463 | 148 |
| | 2% | 9.1 | 910 | 0.134 | 0.053 | 464 | 180 |
| | 3% | 9.4 | 936 | 0.133 | 0.054 | 464 | 165 |
| | 4% | 9.0 | 901 | 0.133 | 0.055 | 464 | 130 |
| | 5% | 8.8 | 876 | 0.132 | 0.057 | 464 | 108 |
| Example 4-1 (Compound 515) | 1% | 7.0 | 702 | 0.138 | 0.046 | 462 | 189 |
| | 2% | 7.9 | 785 | 0.135 | 0.049 | 463 | 231 |
| | 3% | 7.6 | 760 | 0.135 | 0.05 | 463 | 213 |
| | 4% | 7.6 | 763 | 0.134 | 0.051 | 464 | 168 |
| | 5% | 7.0 | 701 | 0.134 | 0.051 | 463 | 137 |
| Example 5-1 (Compound 517) | 1% | 8.0 | 800 | 0.136 | 0.048 | 460 | 169 |
| | 2% | 8.5 | 850 | 0.135 | 0.051 | 461 | 195 |
| | 3% | 9.0 | 897 | 0.133 | 0.056 | 462 | 178 |
| | 4% | 8.8 | 881 | 0.13 | 0.061 | 462 | 138 |
| | 5% | 8.6 | 859 | 0.131 | 0.061 | 462 | 117 |
| Example 6-1 (Compound 251) | 1% | 8.0 | 802 | 0.132 | 0.057 | 464 | 123 |
| | 2% | 8.6 | 859 | 0.131 | 0.058 | 464 | 150 |
| | 3% | 8.8 | 881 | 0.13 | 0.061 | 464 | 138 |
| | 4% | 9.0 | 904 | 0.127 | 0.068 | 468 | 107 |
| | 5% | 8.6 | 855 | 0.129 | 0.063 | 468 | 92 |

TABLE 3

| Blue Index(cd/A/CIEy) Change | | | | | |
|---|---|---|---|---|---|
| Doping concentration | Comparative Example 1-1 | Example 2-1 | Example 4-1 | Example 5-1 | Example 6-1 |
| 1% | 167 | 169 | 152 | 109 | 141 |
| 2% | 168 | 172 | 161 | 107 | 148 |
| 3% | 162 | 173 | 153 | 108 | 145 |
| 4% | 151 | 164 | 149 | 95 | 132 |
| 5% | 140 | 155 | 138 | 89 | 135 |
| Max. value-Min. value | 27.78 | 17.98 | 23.38 | 19.70 | 15.54 |
| Standard deviation | 11.90 | 7.44 | 8.43 | 9.08 | 6.50 |

According to the following Table 3, it can be seen that in the case of Comparative Example 1-1, the light emitting efficiency is decreased according to an increase in concentration as the doping concentration is increased using Compound A, and that the light emitting efficiency is constantly maintained in Examples 2-1 to 6-1. This means that in the case of the present invention, the light emitting efficiency is not affected by the doping concentration. From the results of Tables 2 and 3, it can be seen that in a boron-based compound of the present invention in which the cycloalkyl is substituted, the concentration quenching phenomenon is minimized as compared to a compound in which the cycloalkyl is not unsubstituted, and it can be seen that as the doping concentration is increased, the change in decrease in service life is minimized.

The present invention is not limited to the Examples, but may be prepared in various forms, and a person with ordinary skill in the art to which the present invention belongs will understand that the present invention can be carried out in another specific form without changing the technical spirit or essential feature of the present invention. Therefore, it should be understood that the above-described Examples are illustrative only in all aspects and are not restrictive.

The invention claimed is:

1. An organic electroluminescent element comprising:

a first electrode;

a second electrode provided to face the first electrode; and one or more organic layers interposed between the first electrode and the second electrode, wherein at least one of the one or more organic layers comprise a light emitting layer, wherein the light emitting layer comprises a compound represented by the following Formula 1 as a dopant:

[Formula 1]

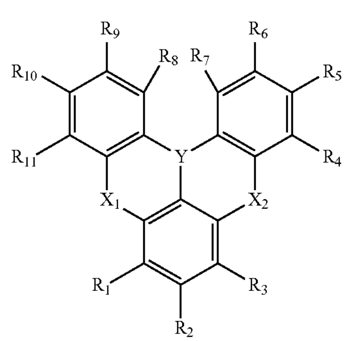

Y is B, $X_1$ and $X_2$ are $N(R_{12})$, $R_1$ to $R_3$ are the same as or different from each other, and are each independently selected from the group consisting of hydrogen, deuterium, a cyano group, a trifluoromethyl group, a nitro group, a halogen group, a hydroxyl group, a substituted or unsubstituted alkylthio group having 1 to 4 carbon atoms, a substituted or unsubstituted alkyl group having 1 to 30 carbon atoms, a substituted or unsubstituted cycloalkyl group having 3 to 20 carbon atoms, a substituted or unsubstituted alkenyl group having 2 to 30 carbon atoms, a substituted or unsubstituted alkynyl group having 2 to 24 carbon atoms, a substituted or unsubstituted aryl group having 6 to 30 carbon atoms, and a substituted or unsubstituted heteroaryl group having 5 to 60 nuclear atoms, $R_4$ to $R_{12}$ are the same as or different from each other, and are each independently selected from the group consisting of hydrogen, deuterium, a cyano group, a trifluoromethyl group, a halogen group, an alkylthio group having 1 to 4 carbon atoms, a substituted or unsubstituted alkyl group having 1 to 10 carbon atoms, a substituted or unsubstituted cycloalkyl group having 3 to 20 carbon atoms, a substituted or unsubstituted aryl group having 6 to 30 carbon atoms, a substituted or unsubstituted heteroaryl group having 5 to 60 nuclear atoms, a substituted or unsubstituted heteroarylalkyl group having 6 to 30 carbon atoms, a substituted or unsubstituted alkoxy group having 1 to 10 carbon atoms, a substituted or unsubstituted alkylamino group having 1 to 10 carbon atoms, a substituted or unsubstituted arylamino group having 6 to 20 carbon atoms, a substituted or unsubstituted aralkylamino group having 6 to 20 carbon atoms, a substituted or unsubstituted heteroarylamino group having 2 to 24 carbon atoms, and a substituted or unsubstituted aryloxy group having 6 to 20 carbon atoms, at least one of $R_2$, $R_6$ and $R_9$ is a substituted or unsubstituted cyclohexyl group or a substituted or unsubstituted adamantyl group, and each of $R_1$ to $R_{12}$ is optionally substituted with one or more substituents selected from the group consisting of hydrogen, deuterium, a cyano group, a nitro group, a halogen group, a hydroxyl group, an alkylthio group having 1 to 4 carbon atoms, a substituted or unsubstituted alkyl group having 1 to 30 carbon atoms, a substituted or unsubstituted cycloalkyl group having 3 to 20 carbon atoms, an aryloxy group having 6 to 30 carbon atoms, an alkoxy group having 1 to 30 carbon atoms, an alkylamino group having 1 to 30 carbon atoms, an arylamino group having 6 to 30 carbon atoms, an aralkylamino group having 6 to 30 carbon atoms, a heteroarylamino group having 2 to 24 carbon atoms, an alkyl group having 1 to 30 carbon atoms, an alkenyl group having 2 to 30 carbon atoms, an alkynyl group having 2 to 24 carbon atoms, an aralkyl group having 7 to 30 carbon atoms, an aryl group having 6 to 30 carbon atoms, a heteroaryl group having 5 to 60 nuclear atoms, and a heteroarylalkyl group having 6 to 30 carbon atoms.

2. The organic electroluminescent element of claim 1, wherein $R_1$ to $R_3$ are the same as or different from each other, and are each independently selected from the group consisting of hydrogen, a substituted or unsubstituted cyclopropyl group, a substituted or unsubstituted cyclobutyl group, a substituted or unsubstituted cyclopentyl group, a substituted or unsubstituted cyclohexyl group, a substituted or unsubstituted cycloheptyl group, and a substituted or unsubstituted adamantyl group.

3. The organic electroluminescent element of claim 1, wherein at least one or more of $R_1$ to $R_3$ are a substituted or unsubstituted cyclohexyl group or a substituted or unsubstituted adamantyl group.

4. The organic electroluminescent element of claim 1, wherein $R_4$ to $R_{11}$ are each independently selected from the group consisting of hydrogen, deuterium, a methyl group, an ethyl group, an isopropyl group, a sec-butyl group, a tert-butyl group, a cyano group, a trifluoromethyl group, a fluoro group, a dimethylamino group, a diethylamino group, a methylthieno group, an ethylthieno group, a methoxy group, an ethoxy group, a substituted or unsubstituted cyclopropyl group, a substituted or unsubstituted cyclobutyl group, a substituted or unsubstituted cyclopentyl group, a substituted or unsubstituted cyclohexyl group, a substituted or unsubstituted cycloheptyl group, a substituted or unsubstituted adamantyl group, a substituted or unsubstituted phenyl group, a substituted or unsubstituted naphthyl group, a substituted or unsubstituted anthracenyl group, a substituted or unsubstituted phenanthryl group, a substituted or unsubstituted naphthacenyl group, a substituted or unsubstituted pyrenyl group, a substituted or unsubstituted biphenyl group, a substituted or unsubstituted p-terphenyl group, a substituted or unsubstituted m-terphenyl group, a substituted or unsubstituted chrycenyl group, a substituted or unsubstituted phenothiazinyl group, a substituted or unsubstituted phenoxazinyl group, a substituted or unsubstituted pyridyl group, a substituted or unsubstituted pyrimidinyl group, a substituted or unsubstituted pyrazinyl group, a substituted or unsubstituted triazinyl group, a substituted or unsubstituted thiophenyl group, a substituted or unsubstituted triphenylenyl group, a substituted or unsubstituted perylenyl group, a substituted or unsubstituted indenyl group, a substituted or unsubstituted furanyl group, a substituted or unsubstituted pyrrolyl group, a substituted or unsubstituted pyrazolyl group, a substituted or unsubstituted imidazolyl group, a substituted or unsubstituted triazolyl group, a substituted or unsubstituted oxazolyl group, a substituted or unsubstituted thiazolyl group, a substituted or unsubstituted oxadiazolyl group, a substituted or unsubstituted thiadiazolyl group, a substituted or unsubstituted pyridyl group, a substituted or unsubstituted pyrimidinyl group, a substituted or unsubstituted pyrazinyl group, a substituted or unsubstituted benzofuranyl group, a substituted or unsubstituted benzimidazolyl group, a substituted or unsubstituted indolyl group, a substituted or unsubstituted quinolinyl group, a substituted or unsubstituted isoquinolinyl group, a substituted or unsubstituted quinazolinyl group, a substituted or unsubstituted qunioxalinyl group, a substituted or unsubstituted naphthyridinyl group, a substituted or unsubstituted benzoxazinyl group, a substituted or unsubstituted benzothiazinyl group, a substituted or unsubstituted acridinyl group, and the following Formulae 2 to 6:

[Formula 2]

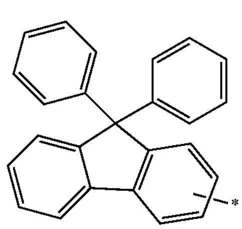

-continued

[Formula 3]

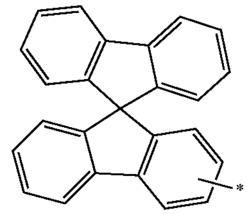

[Formula 4]

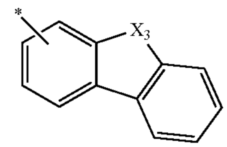

[Formula 5]

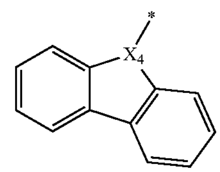

[Formula 6]

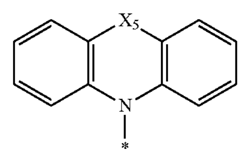

in the formulae, $X_3$ and $X_5$ are S, O, N(R'), C(R')(R"), or Si(R')(R"); and $X_4$ is N, and R' and R" are each independently hydrogen, an alkyl group having 1 to 4 carbon atoms, or an aryl group having 6 to 20 carbon atoms.

5. The organic electroluminescent element of claim 1, wherein one or more of $R_4$ to $R_{11}$ are a substituted or unsubstituted aryl group having 6 to 20 carbon atoms, and when the one or more of $R_4$ to $R_{11}$ are the substituted aryl group, the aryl group is substituted with one or more substituents selected from the group consisting of deuterium, a methyl group, an ethyl group, an isopropyl group, a sec-butyl group, a tert-butyl group, a cyano group, a trifluoromethyl group, a fluoro group, a dimethylamino group, a diethylamino group, a methylthieno group, an ethylthieno group, a methoxy group, an ethoxy group, a phenoxy group, a cyclopropyl group, a cyclobutyl group, a cyclopentyl group, a cyclohexyl group, a cycloheptyl group, an adamantyl group, a phenyl group, a naphthyl group, an anthracenyl group, a phenanthryl group, a naphthacenyl group, a pyrenyl group, a biphenyl group, a p-terphenyl group, an m-terphenyl group, a chrycenyl group, a phenothiazinyl group, a phenoxazinyl group, a pyridyl group, a pyrimidinyl group, a pyrazinyl group, a triazinyl group, a thiophenyl group, a triphenylenyl group, a perylenyl group, an indenyl group, a furanyl group, a pyrrolyl group, a pyrazolyl group, an imidazolyl group, a triazolyl group, an oxazolyl group, a thiazolyl group, an oxadiazolyl group, a thiadiazolyl group, a pyridyl group, a pyrimidinyl group, a pyrazinyl group, a benzofuranyl group, a benzimidazolyl group, an indolyl group, a quinolinyl group, an isoquinolinyl group, a quinazolinyl group, a qunioxalinyl group, a naphthyridinyl group, a benzoxazinyl group, a benzothiazinyl group, an acridinyl group, and the following Formulae 2 to 13;

[Formula 2]

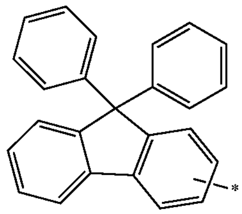

[Formula 3]

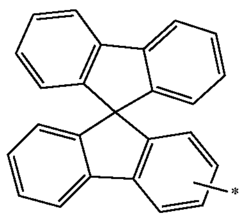

[Formula 4]

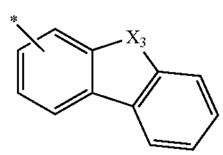

[Formula 5]

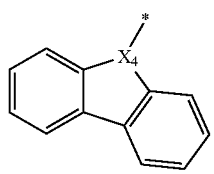

[Formula 6]

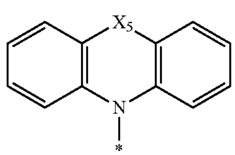

[Formula 7]

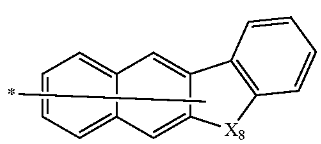

[Formula 8]

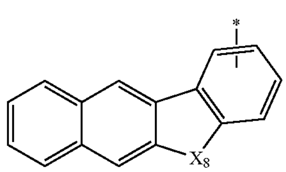

[Formula 9]

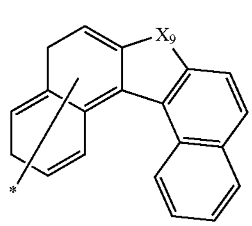

-continued

[Formula 10]

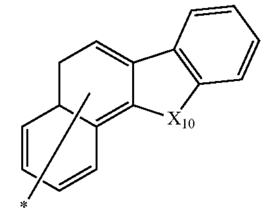

[Formula 11]

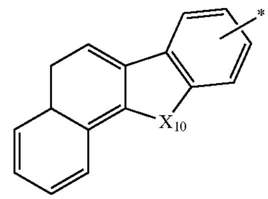

[Formula 12]

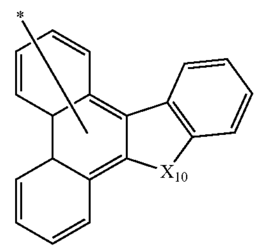

; and

[Formula 13]

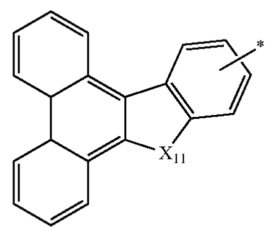

;

in the formulae, $X_3$, $X_5$, and $X_8$ to $X_{11}$ are S, O, N(R'), C(R')(R"), or Si(R')(R"); and $X_4$ is N, and R' and R" are each independently hydrogen, an alkyl group having 1 to 4 carbon atoms, or an aryl group having 6 to 20 carbon atoms.

6. The organic electroluminescent element of claim 1, wherein the compound represented by Formula 1 is selected from the group consisting of the following compounds:

1

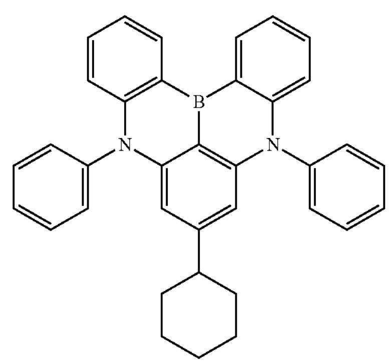

-continued
2
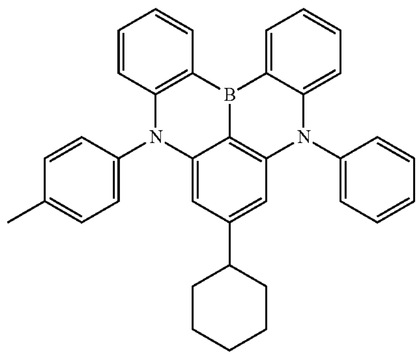
3
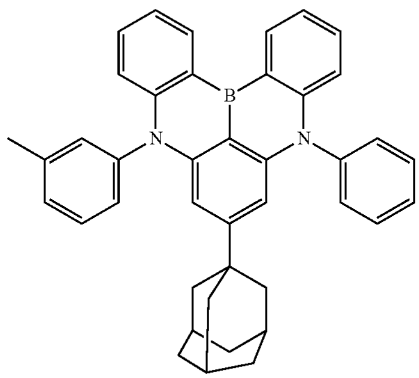
4
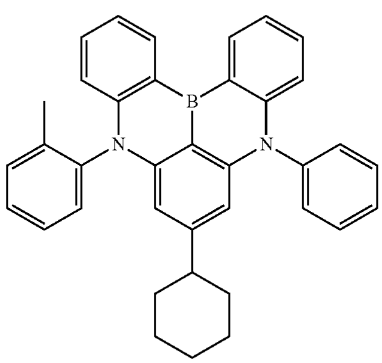
5
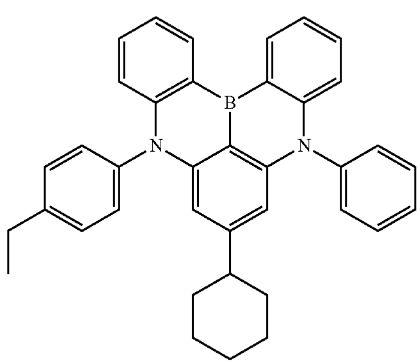
-continued
6
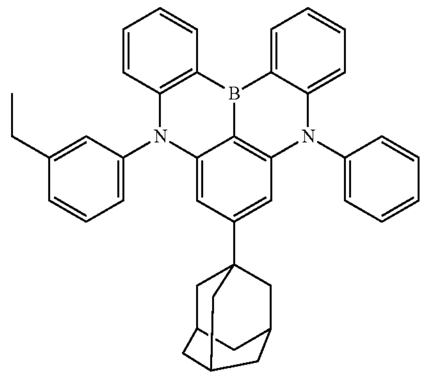
7
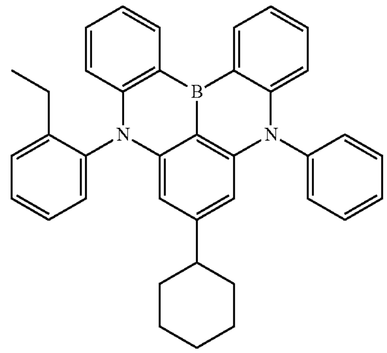
8
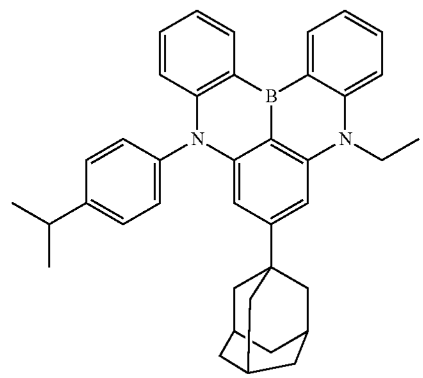
9
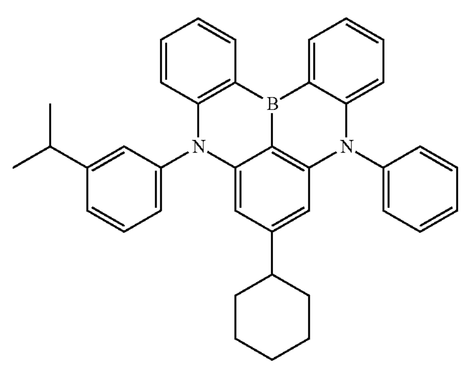

-continued
10
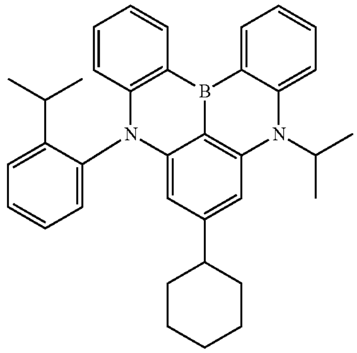
11
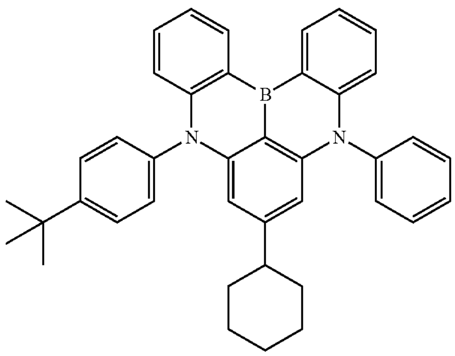
12
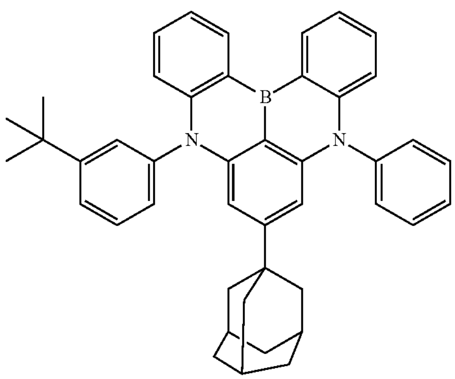
13
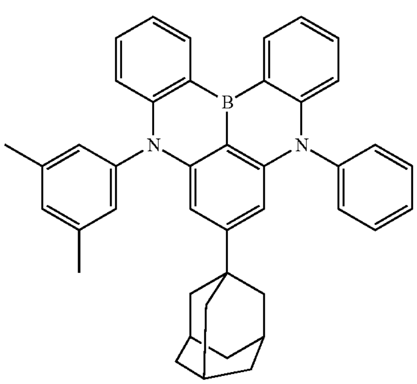
-continued
14
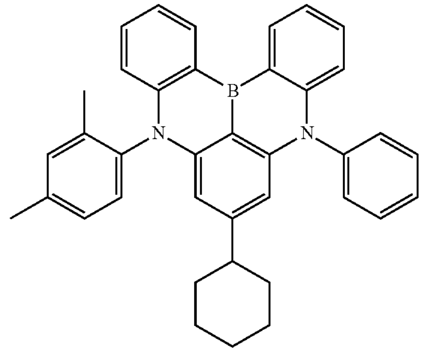
15
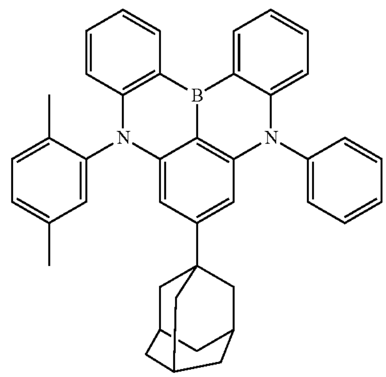
16
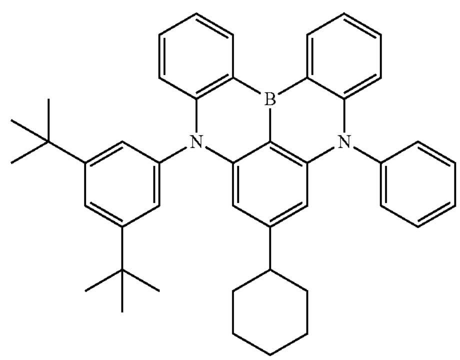
17
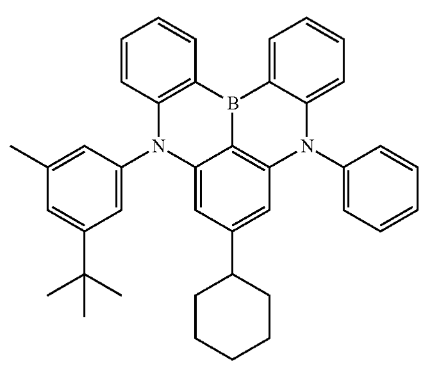

-continued
18
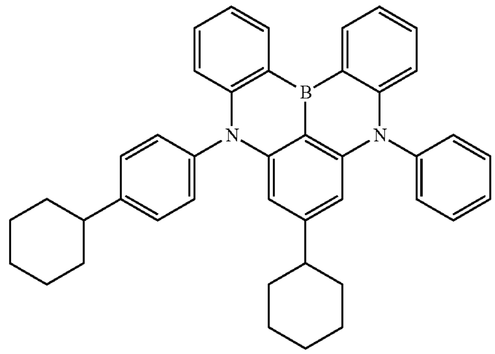
19
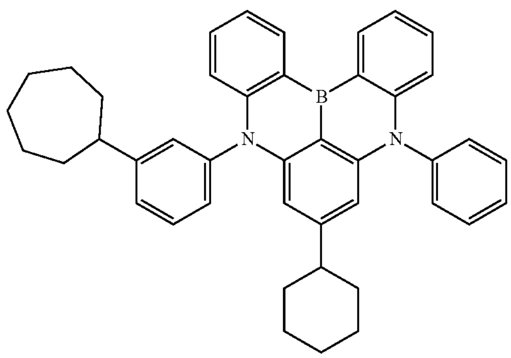
20
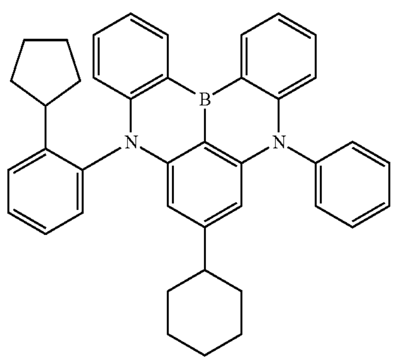
21
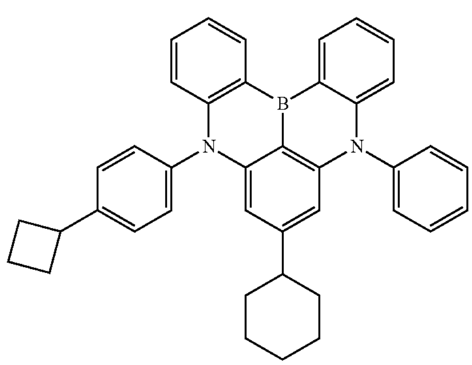
-continued
22
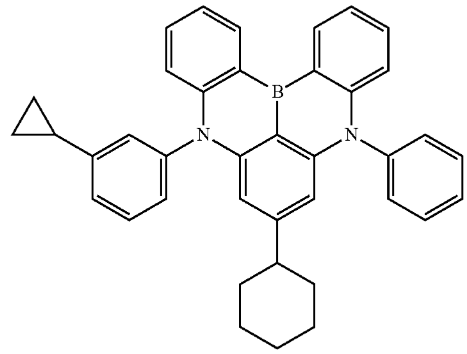
23
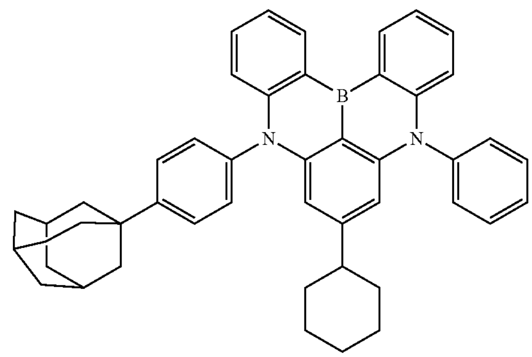
24
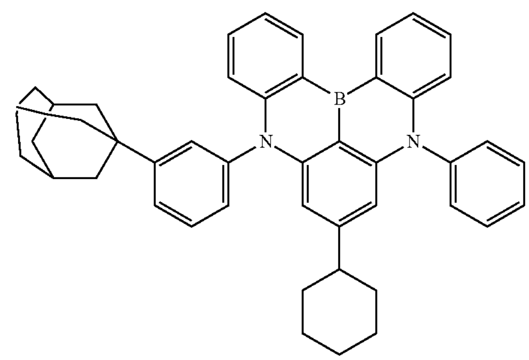
25
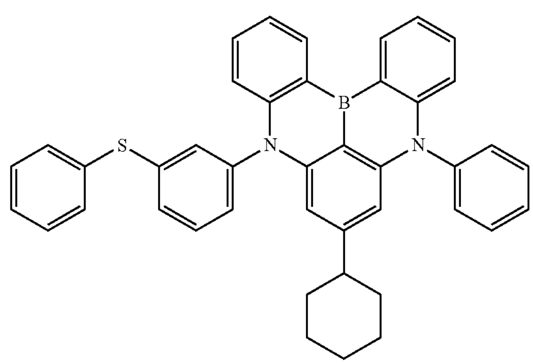

26
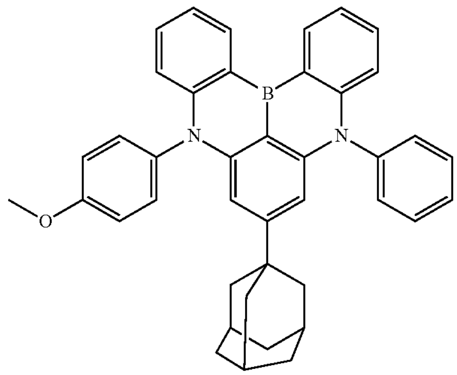
27
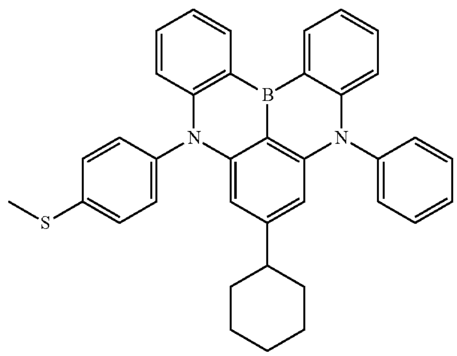
29
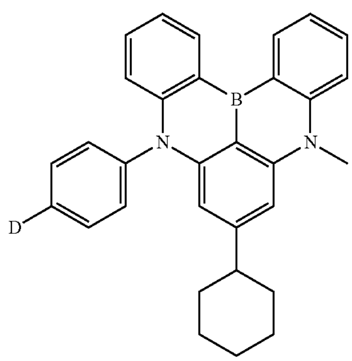
30
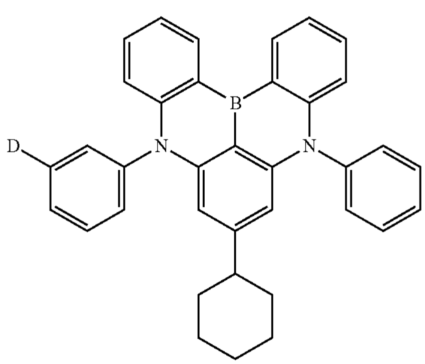
31
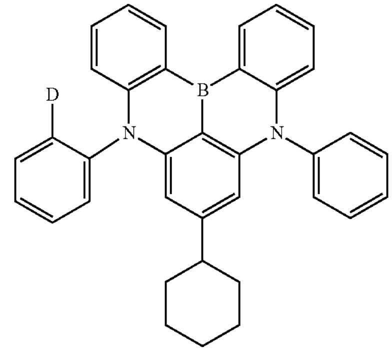
32
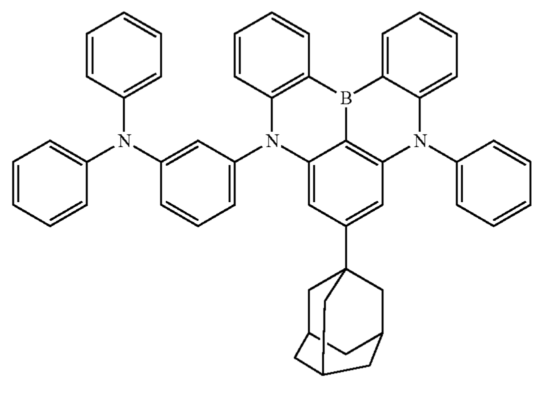
33
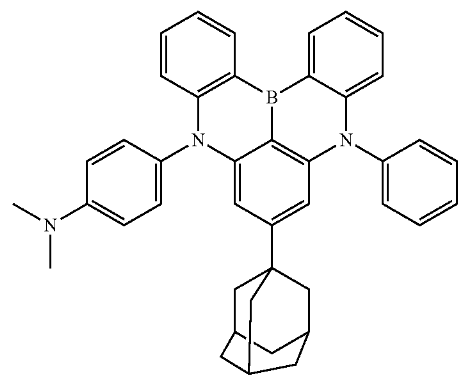
34
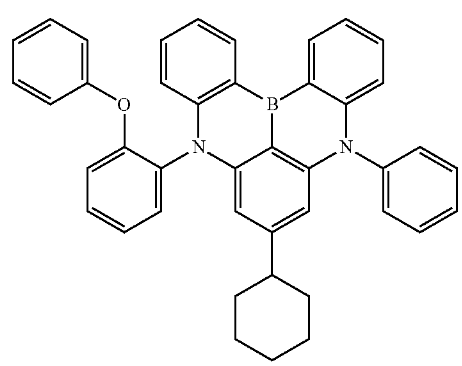

-continued
35
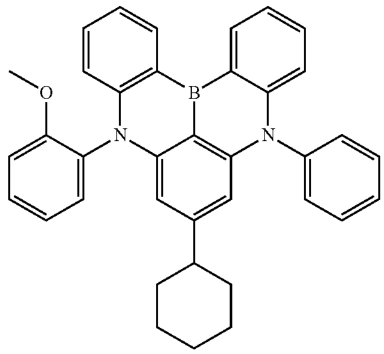
36
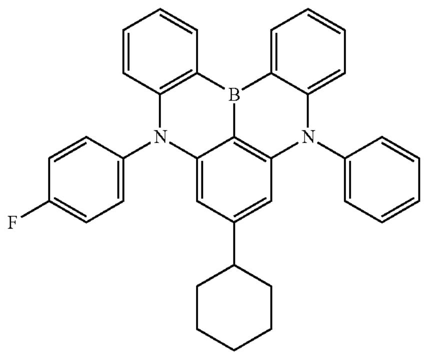
37
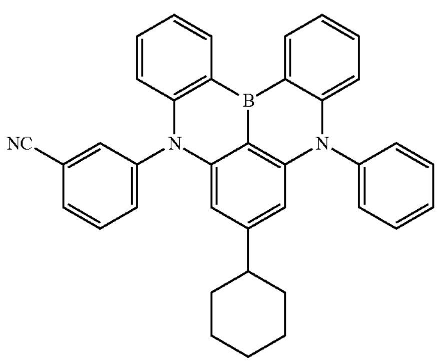
38
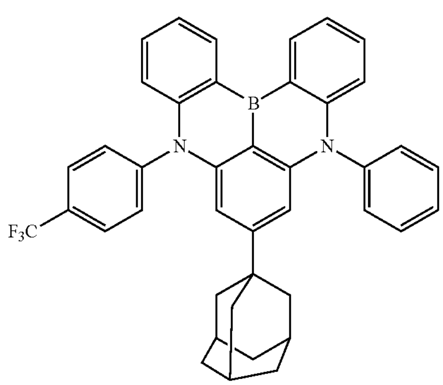
-continued
39
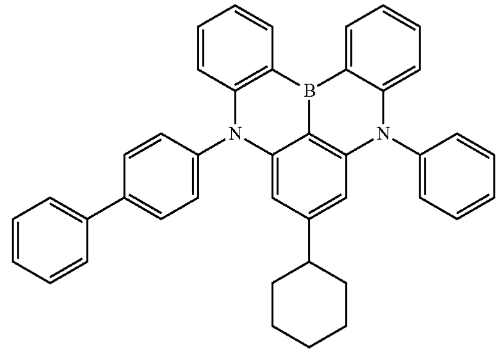
40
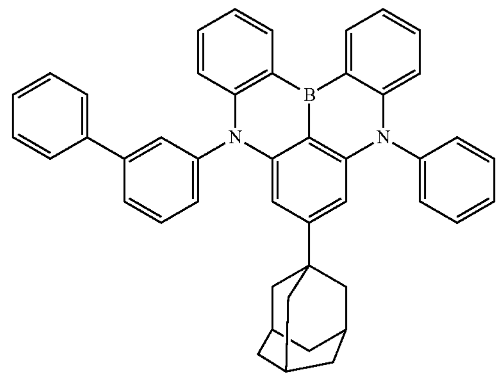
41
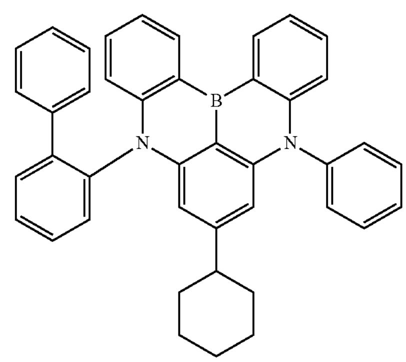
42
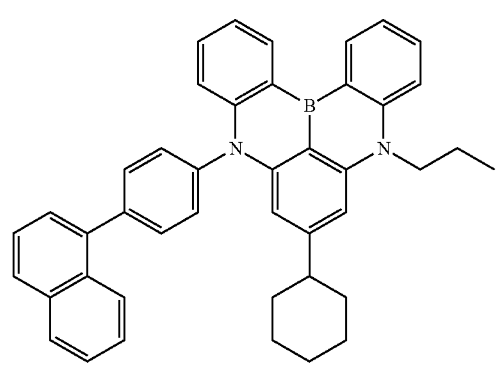

-continued
43
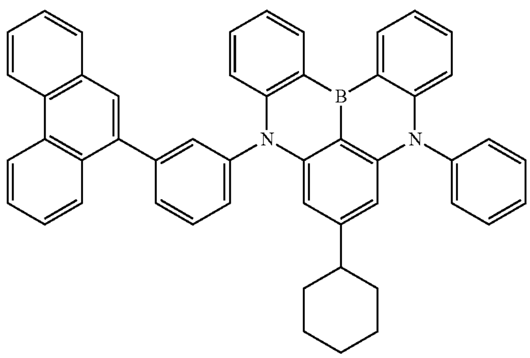
44
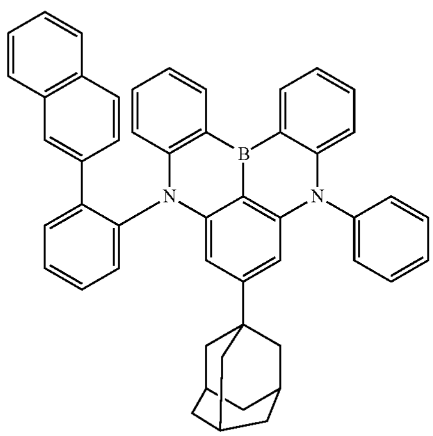
45
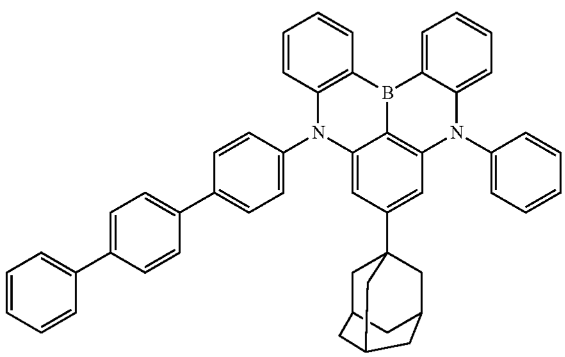
46
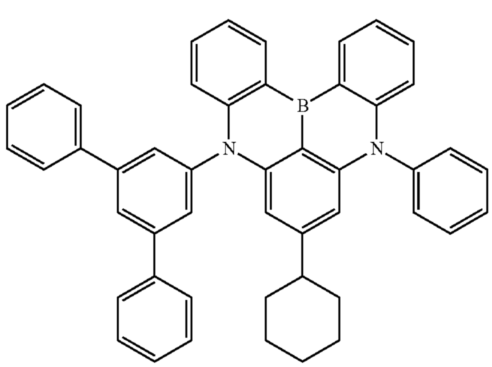
-continued
47
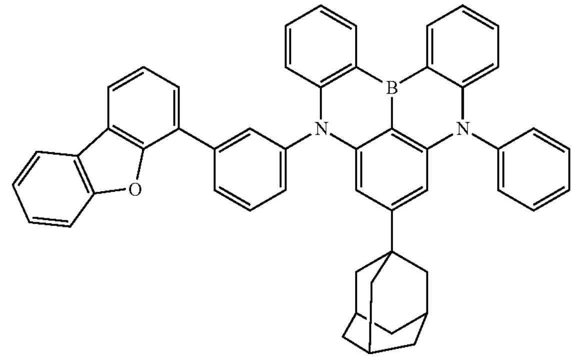
48
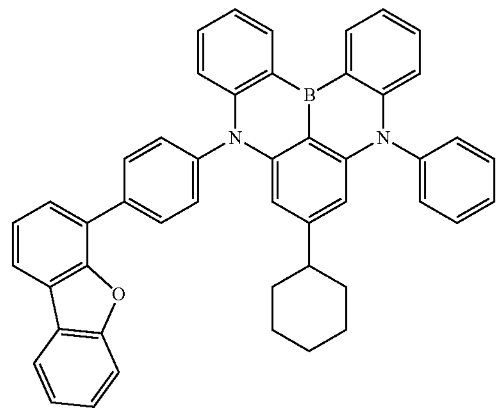
49
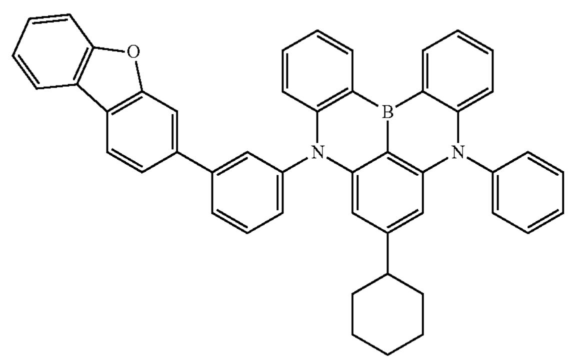
50
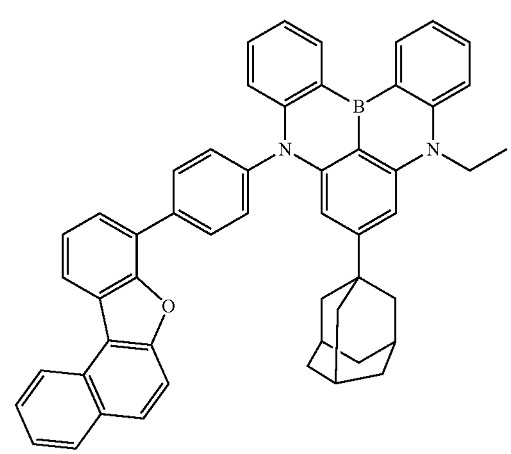

-continued
51
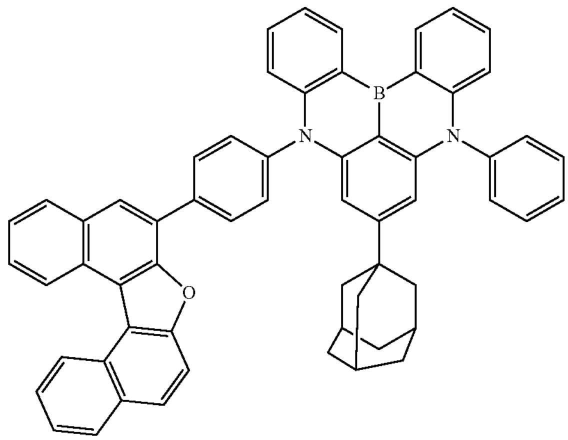
52
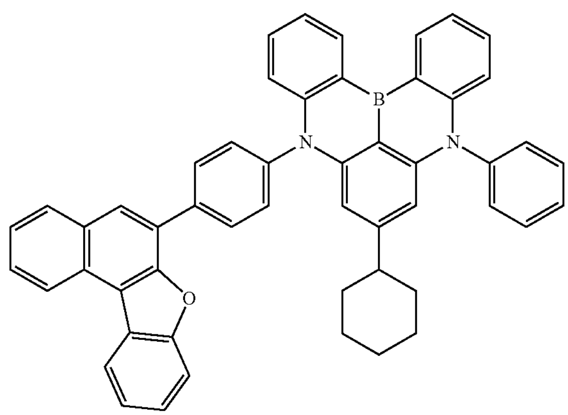
53
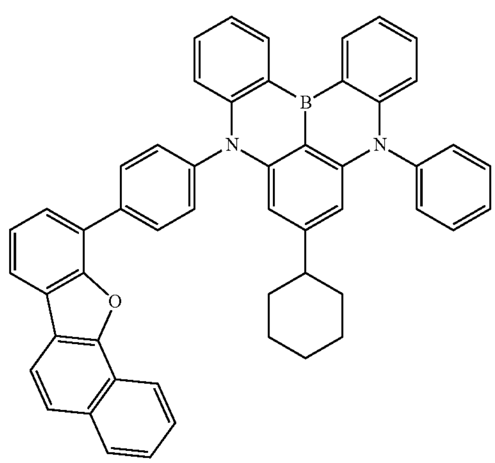
-continued
54
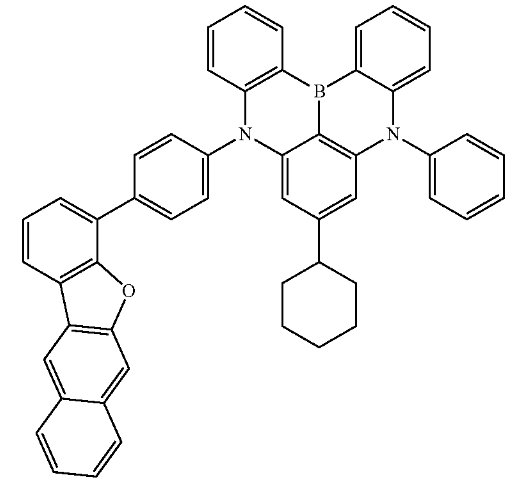
55
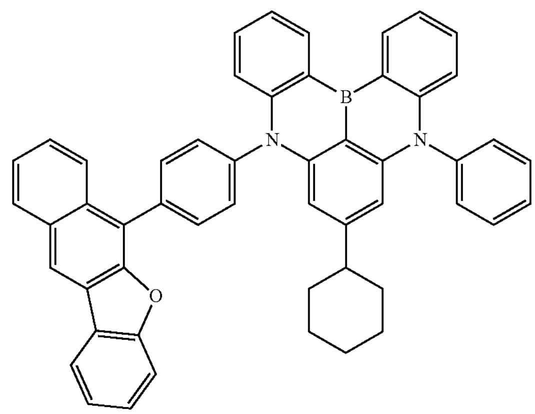
56
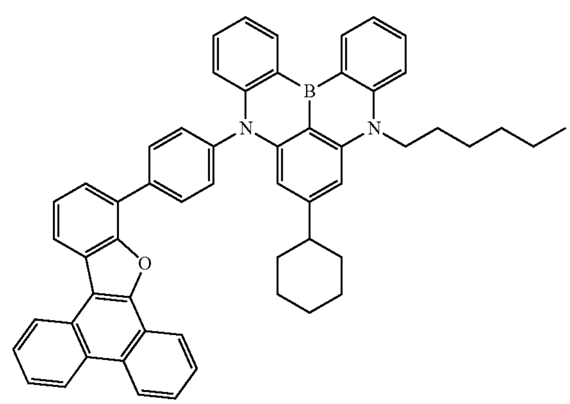

-continued
57
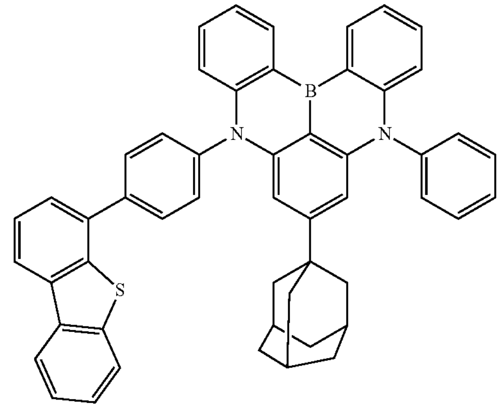
58
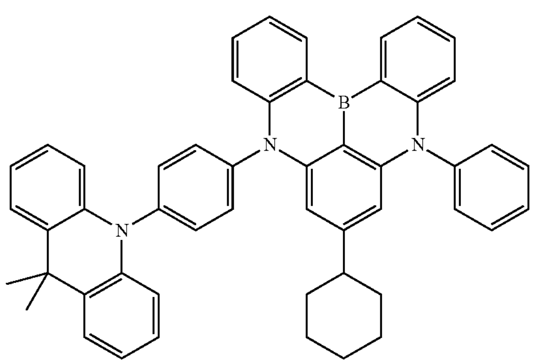
59
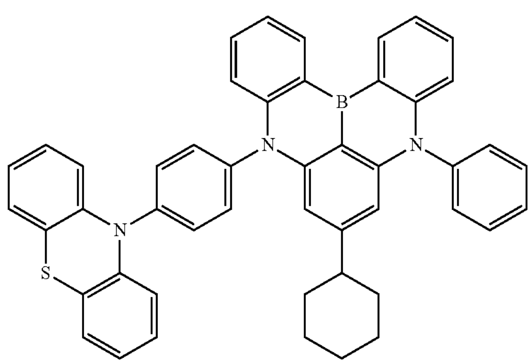
61
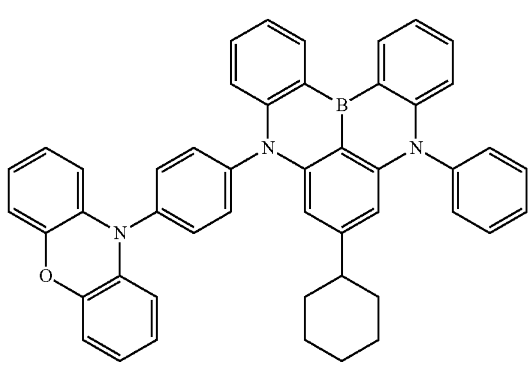
-continued
62
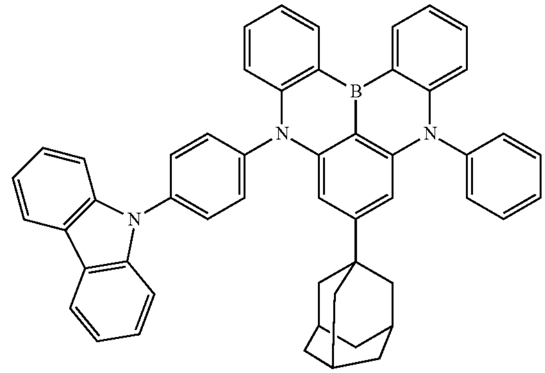
63
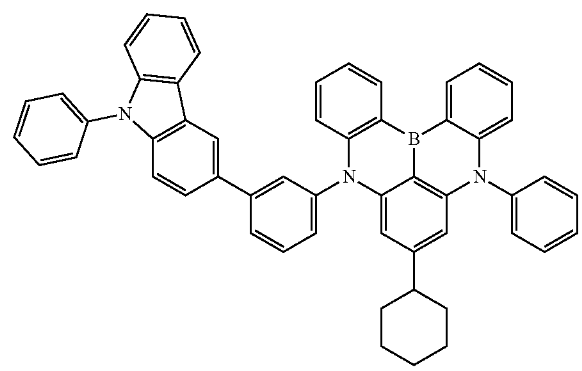
64
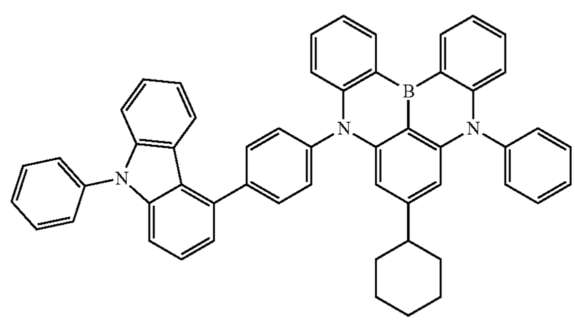
65
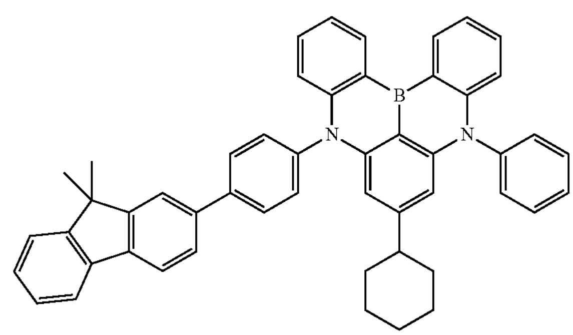

66
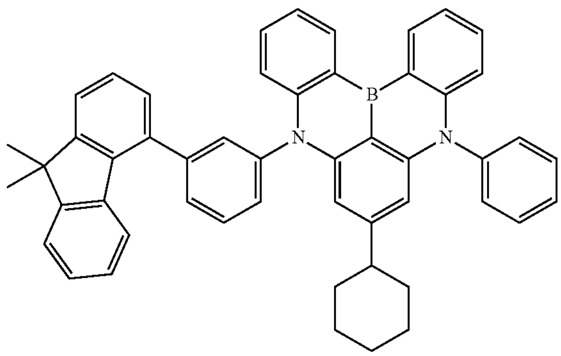
67
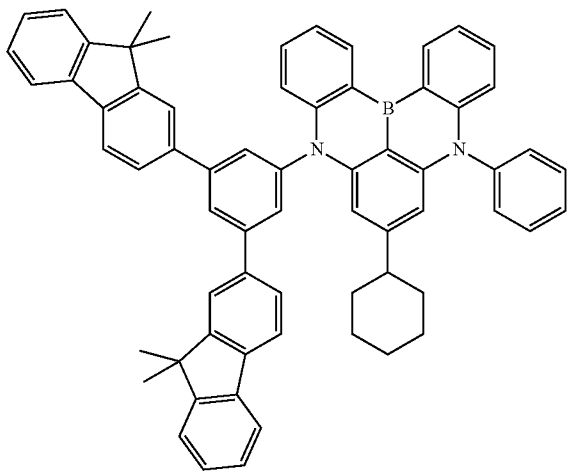
68
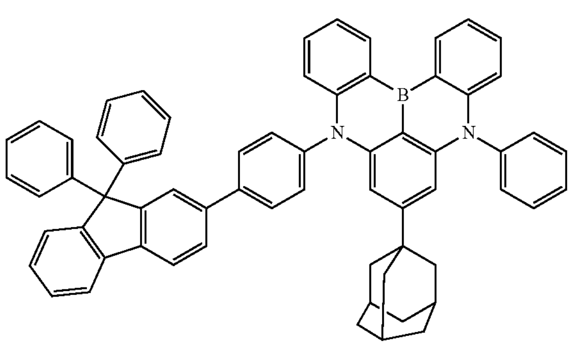
69
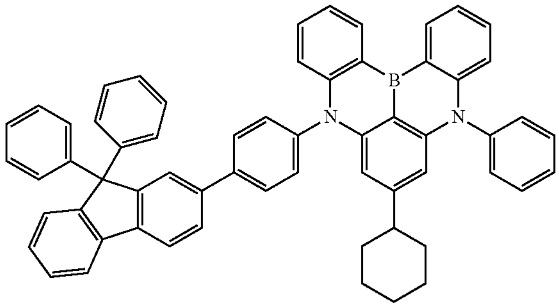
70
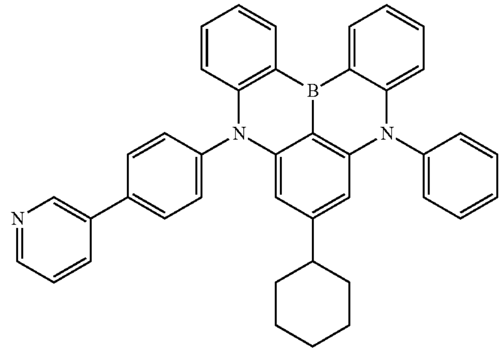
71
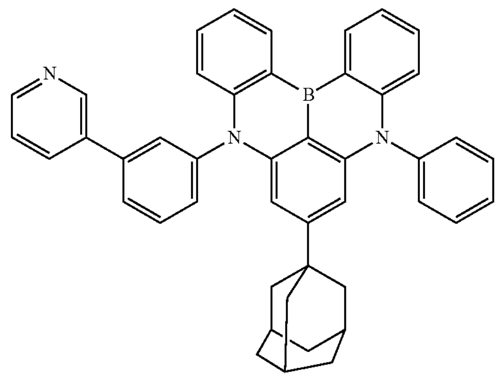
72
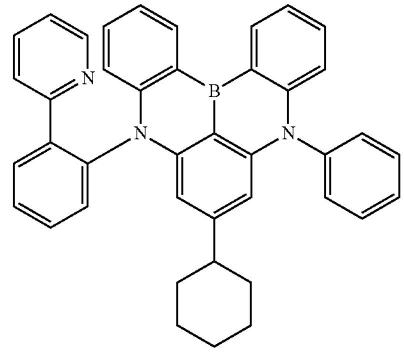
73
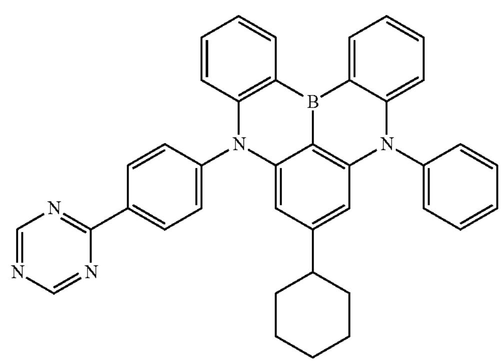

-continued
74
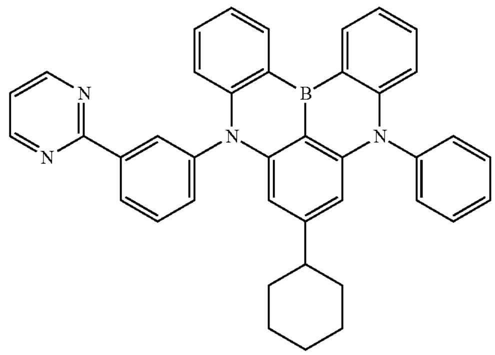
75
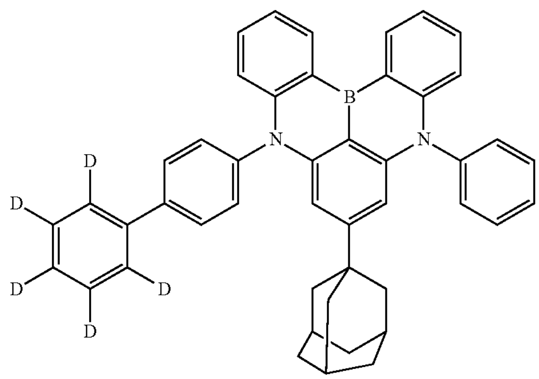
76
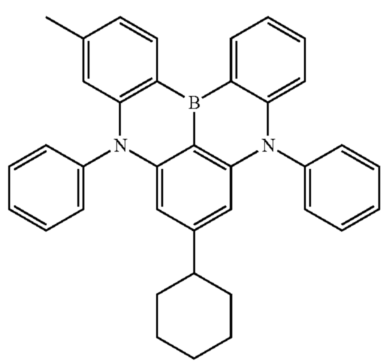
77
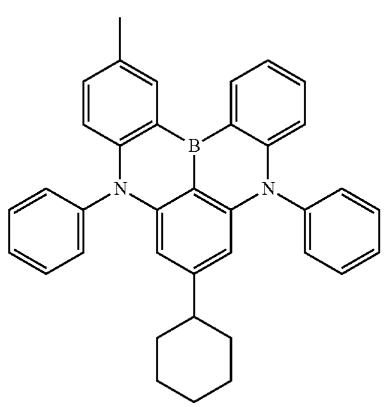
-continued
78
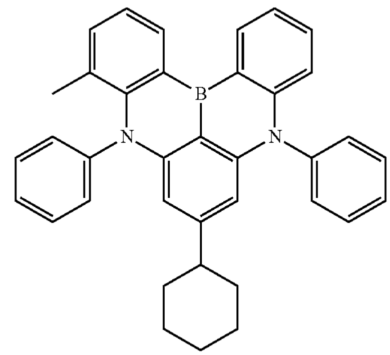
79
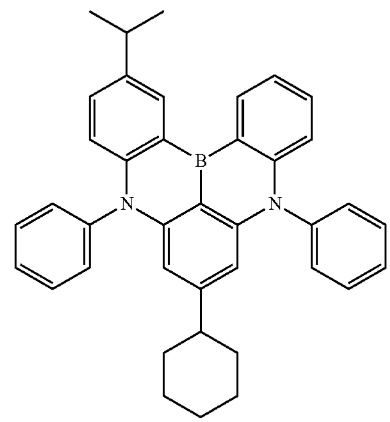
80
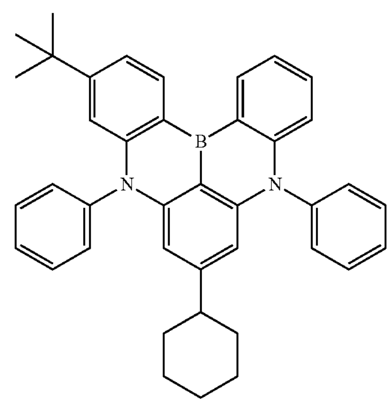
81
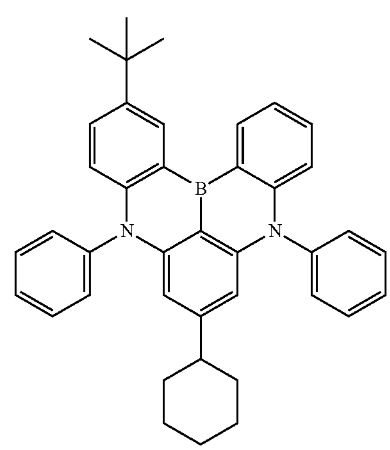

-continued
82
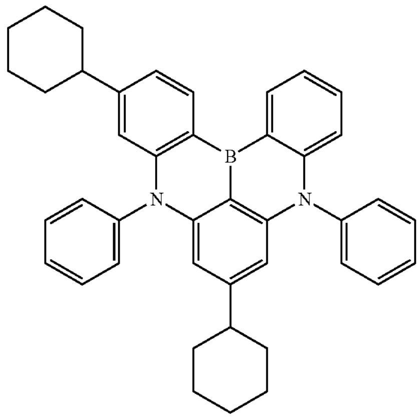
83
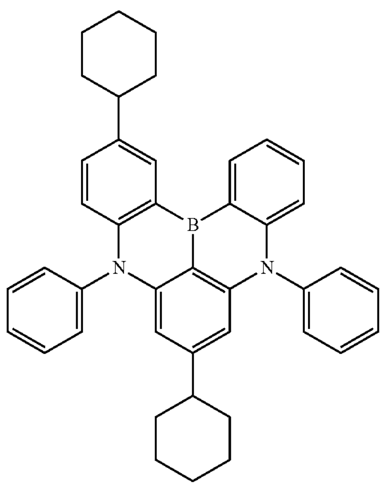
84
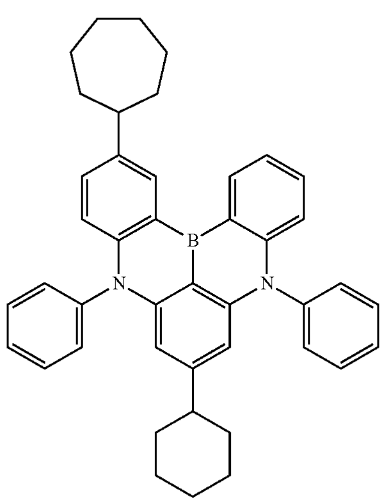
-continued
85
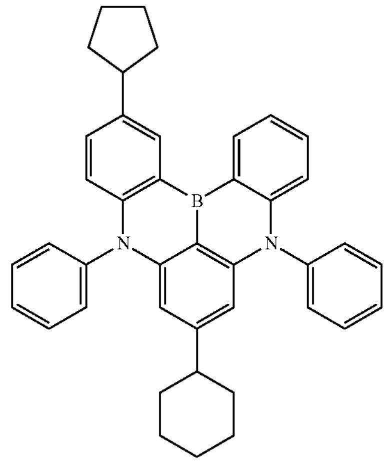
86
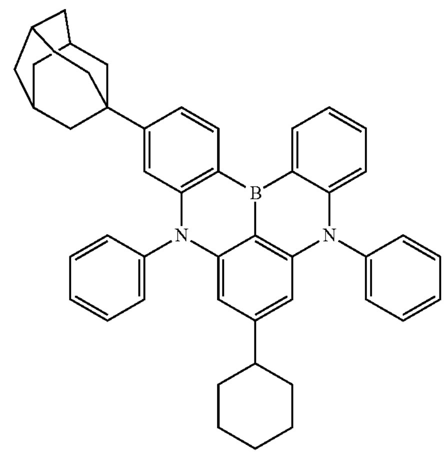
87
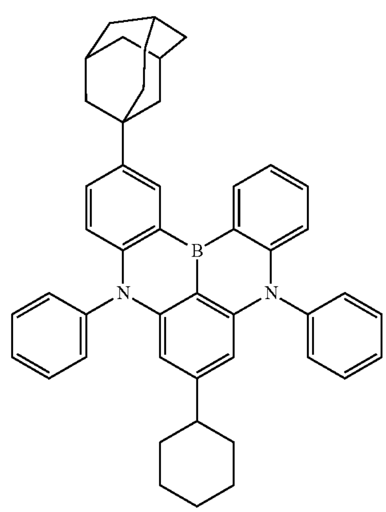

88
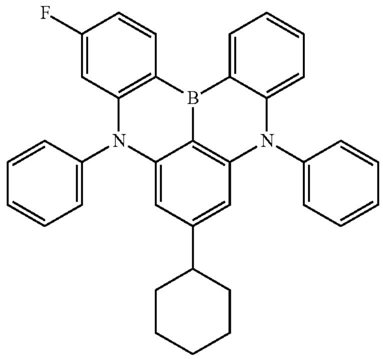
89
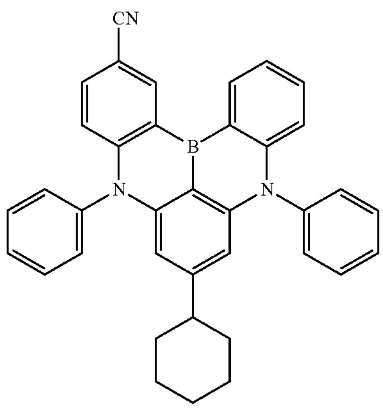
90
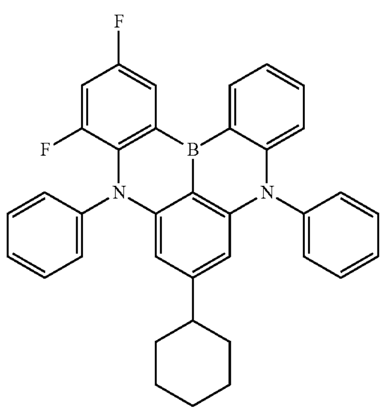
91
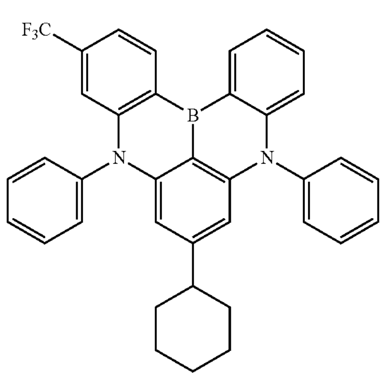
92
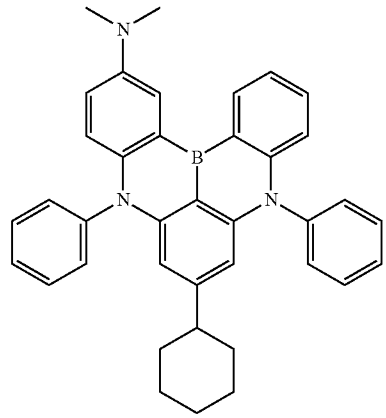
93
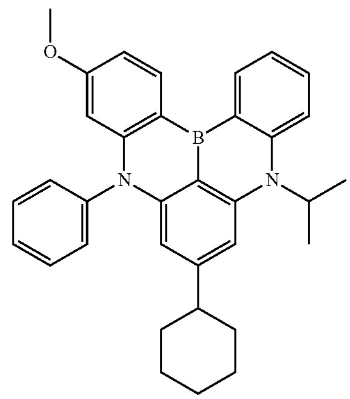
95
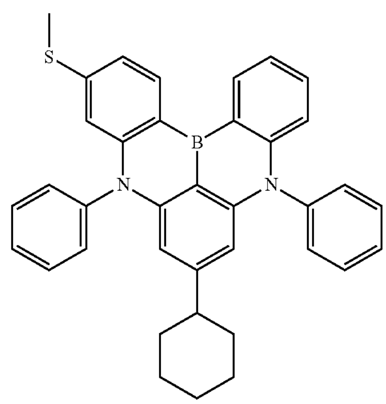
96
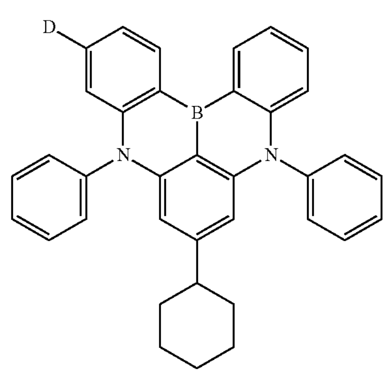

-continued
97
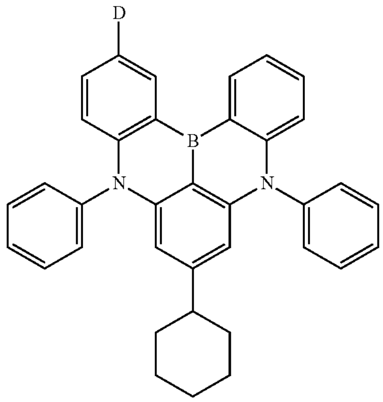
98
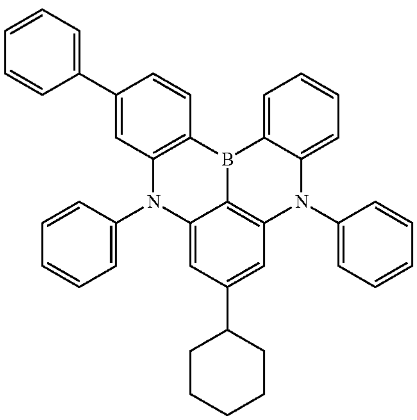
99
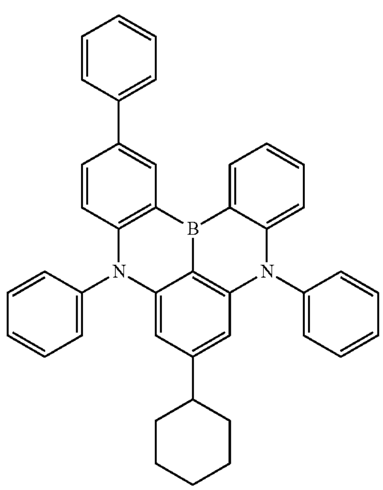
-continued
100
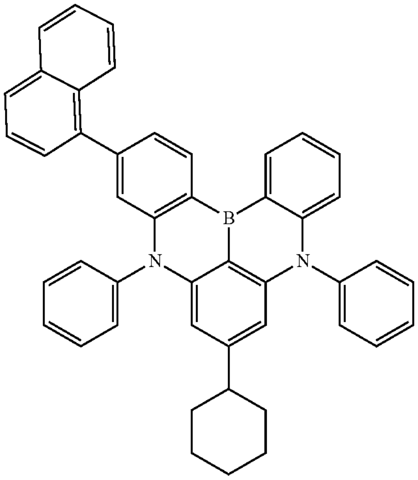
101
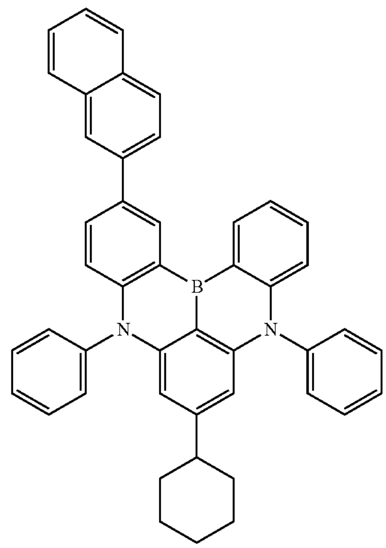
102
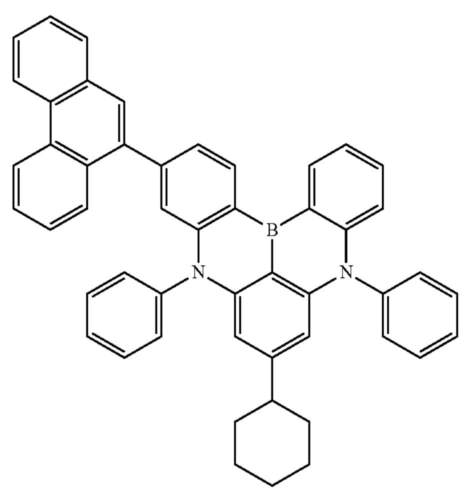

-continued
103
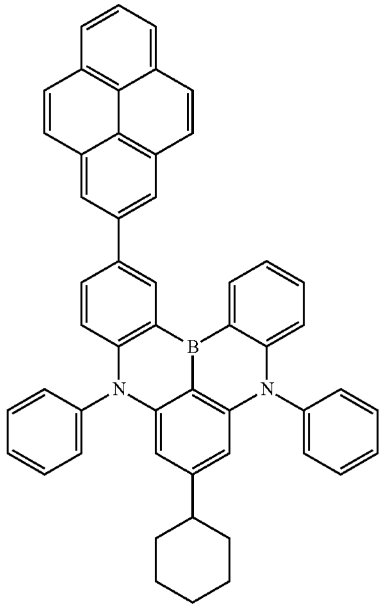
104
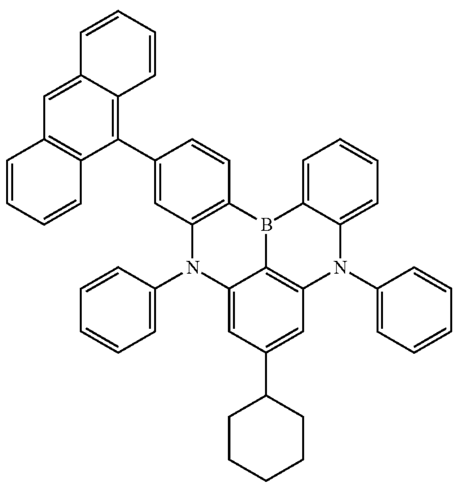
105
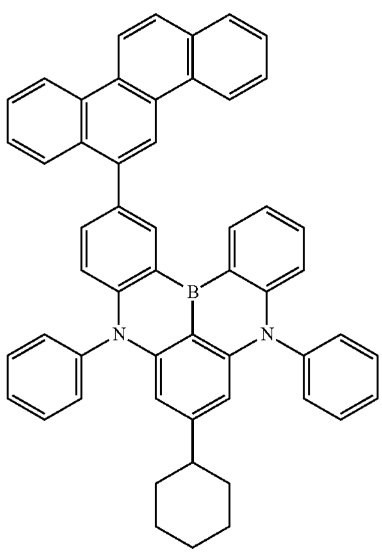
-continued
106
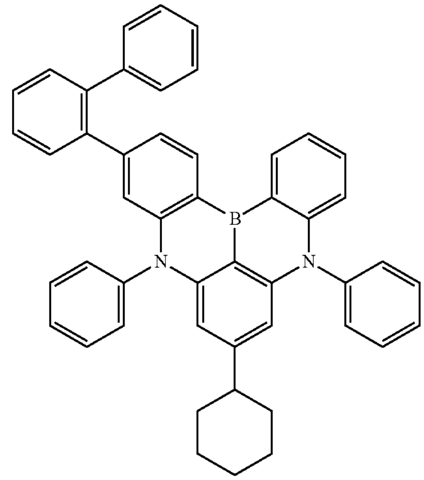
107
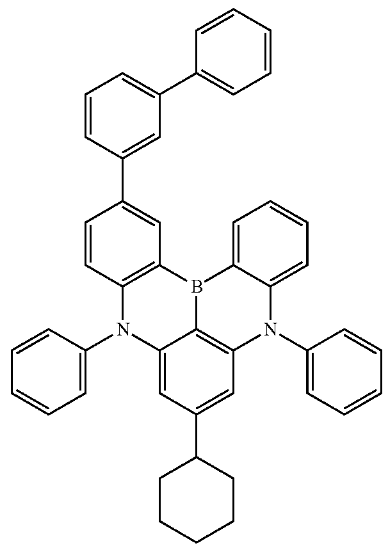
108
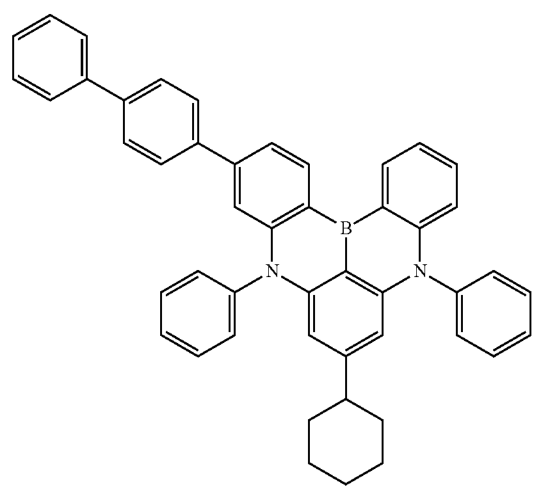

-continued
109
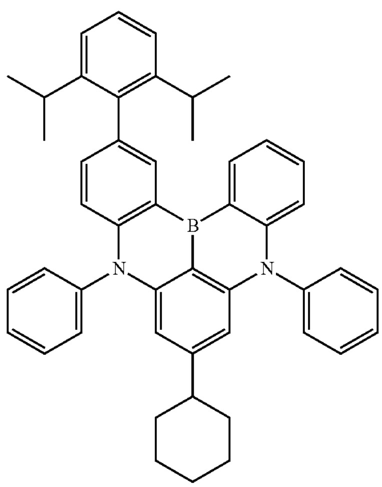
110
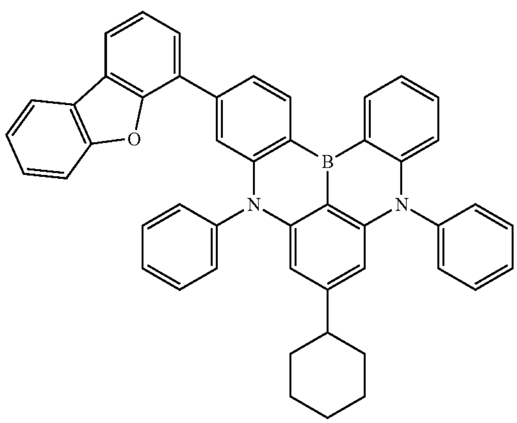
111
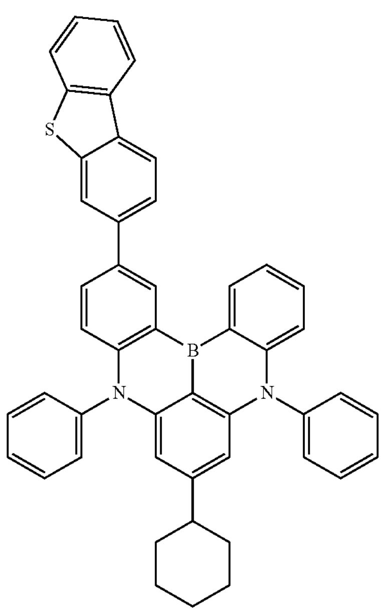
-continued
112
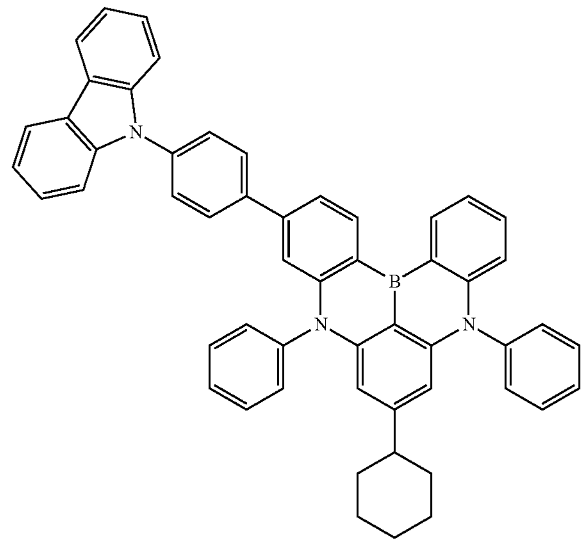
113
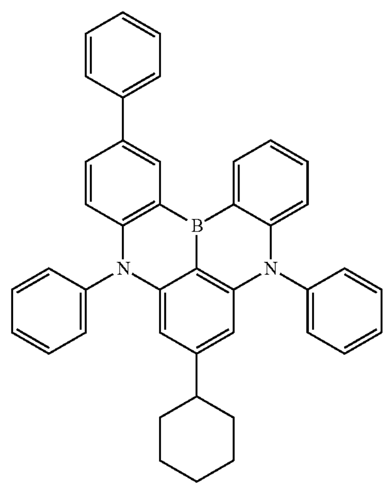
114
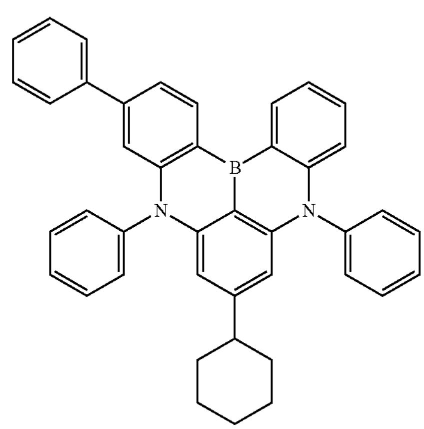

115
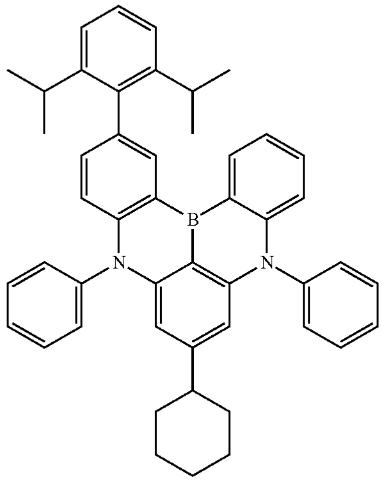
116
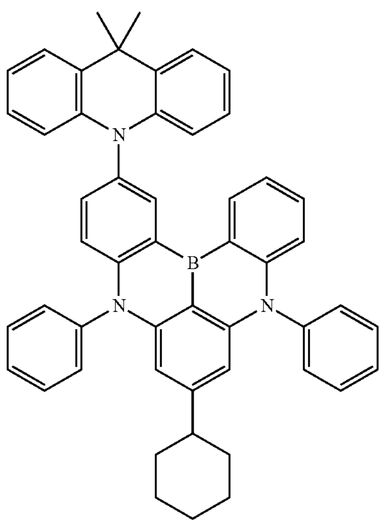
118
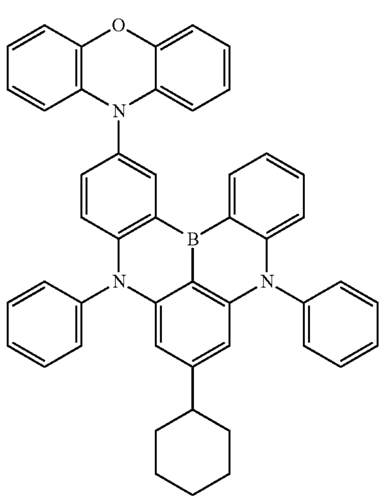
119
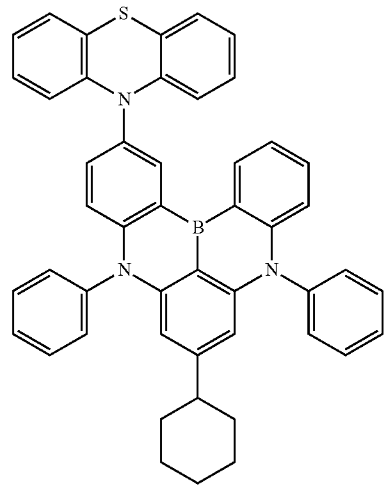
120
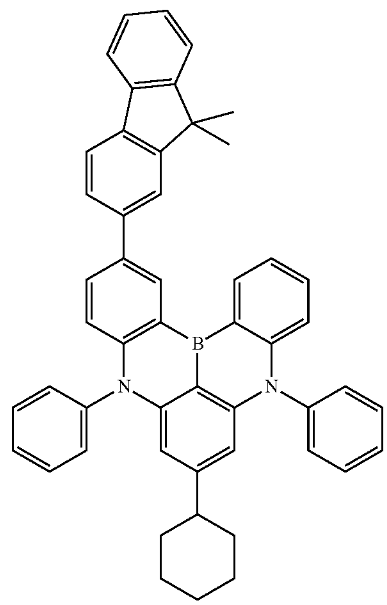
121
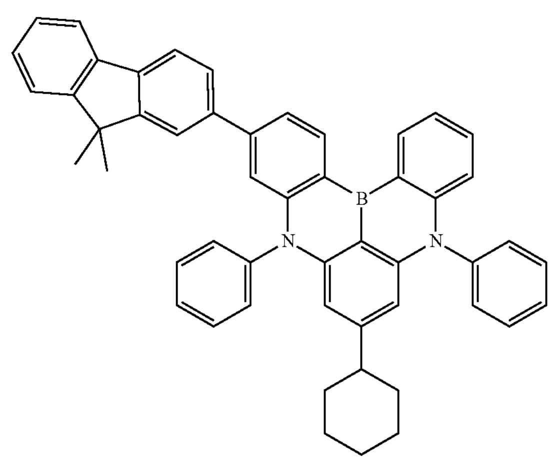

122
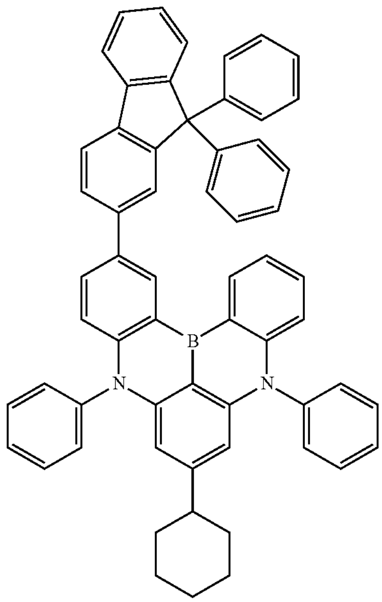
123
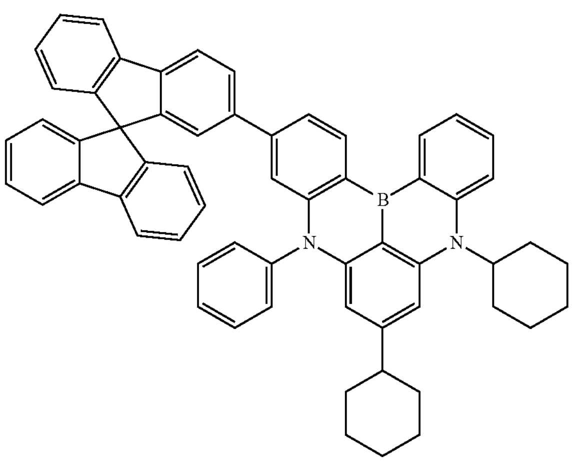
124
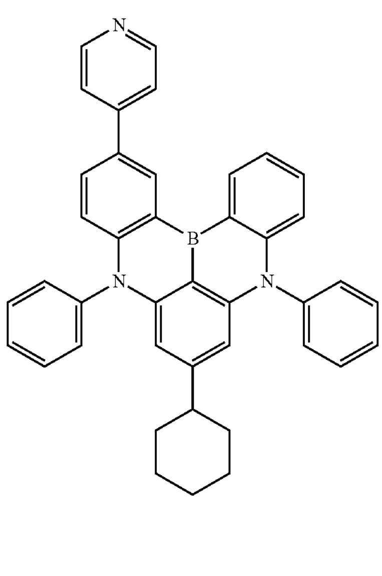
125
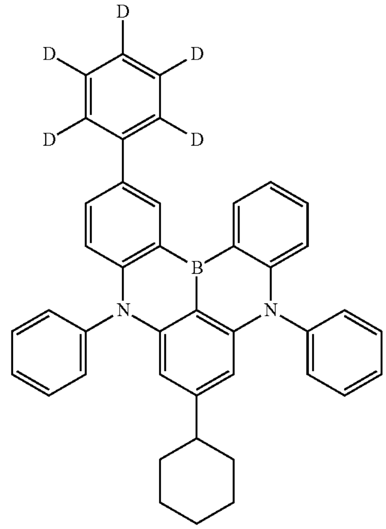
126
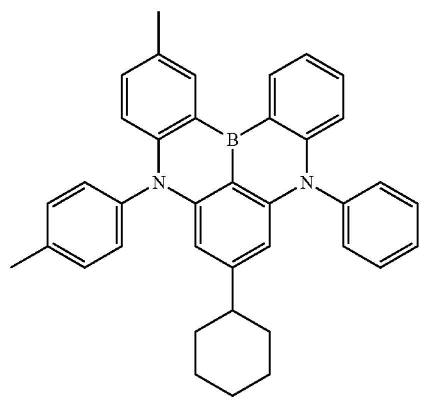
127
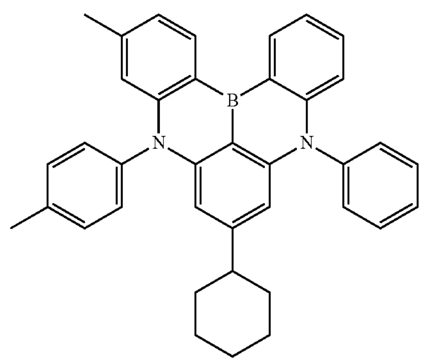
128
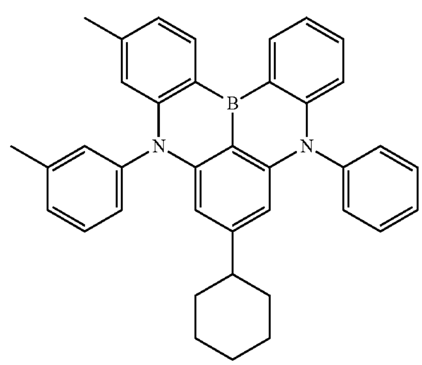

-continued
129
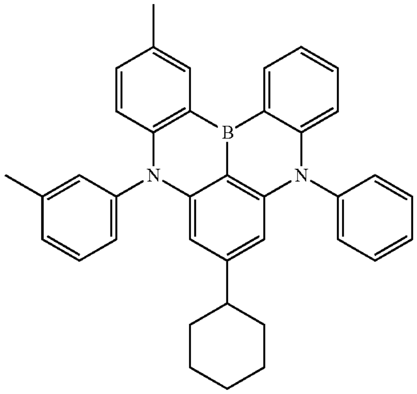
130
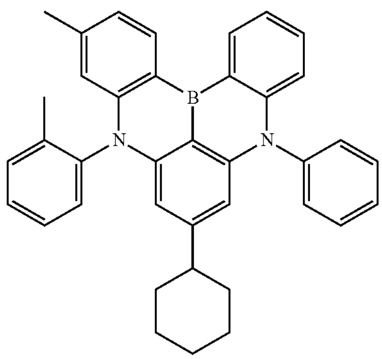
131
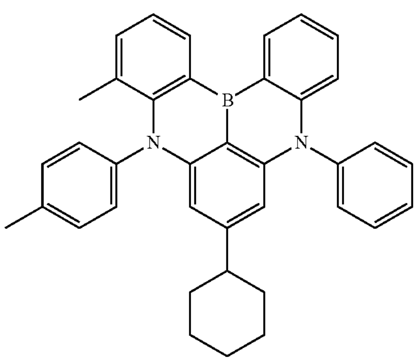
132
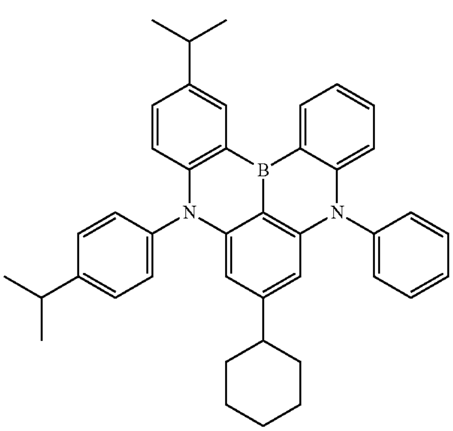
-continued
133
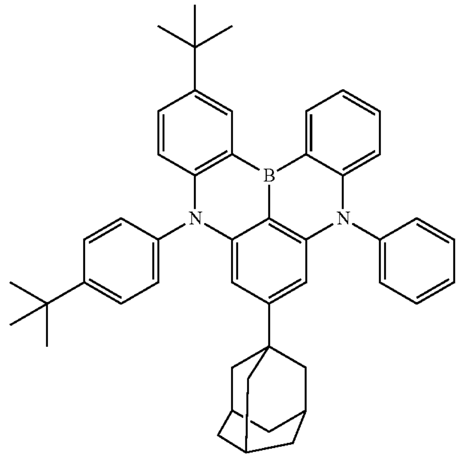
134
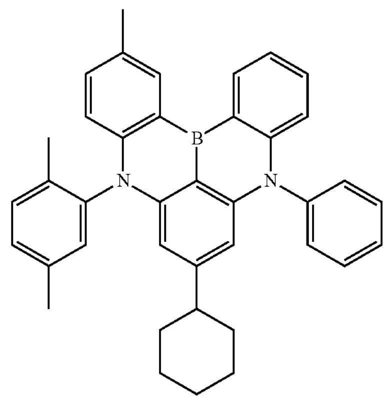
135
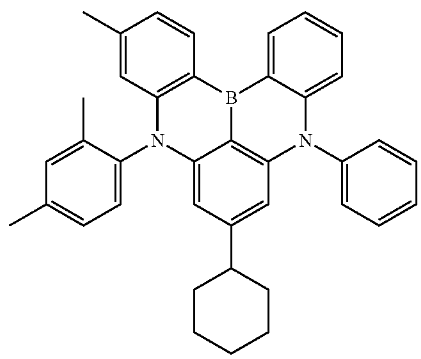
136
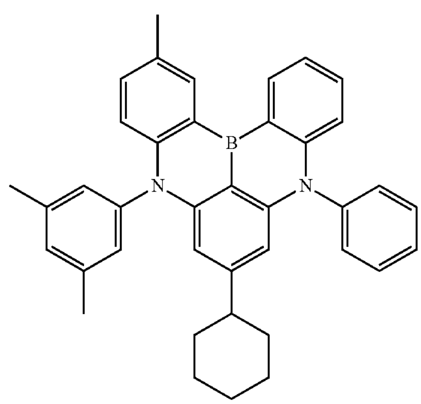

141
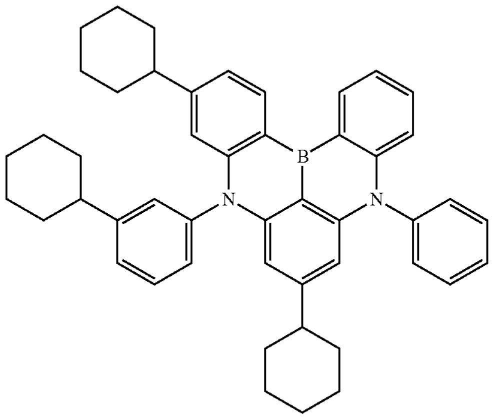
142
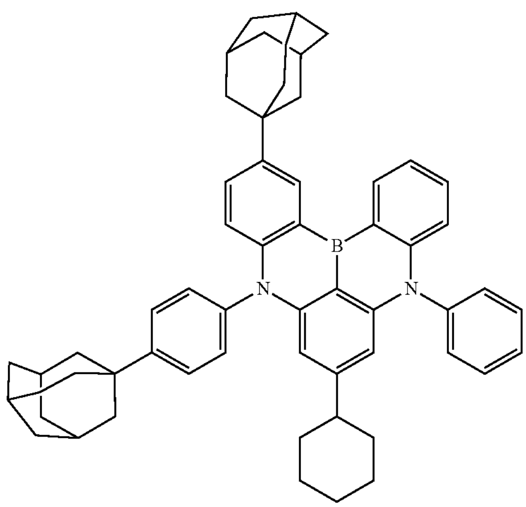
143
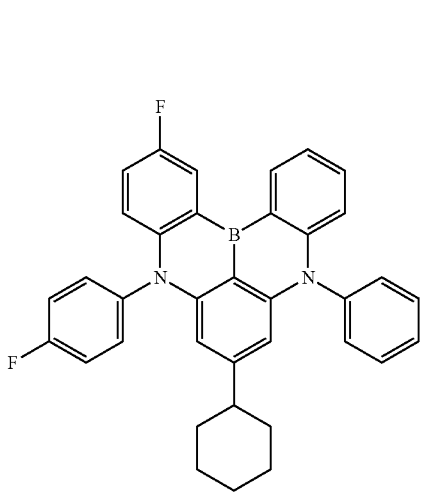
144
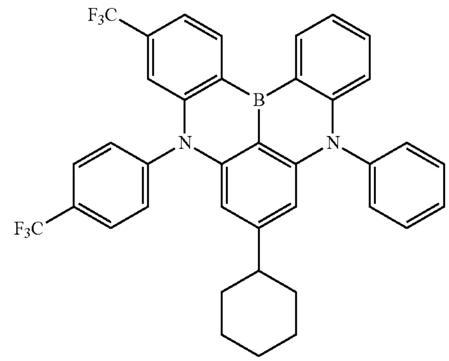
145
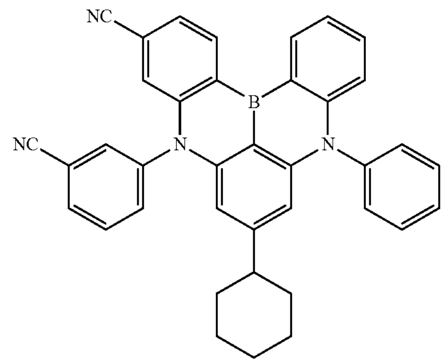
147
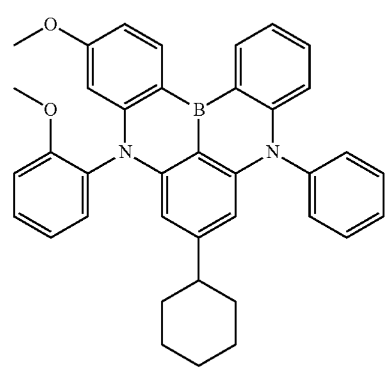
148
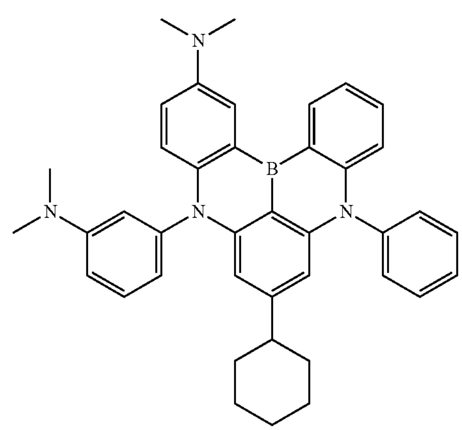

-continued
149
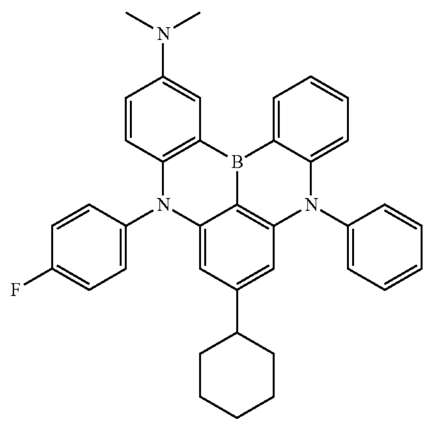
150
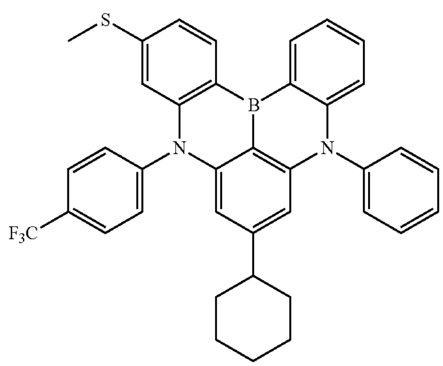
151
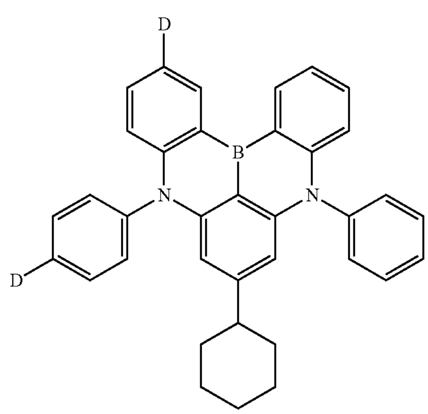
-continued
152
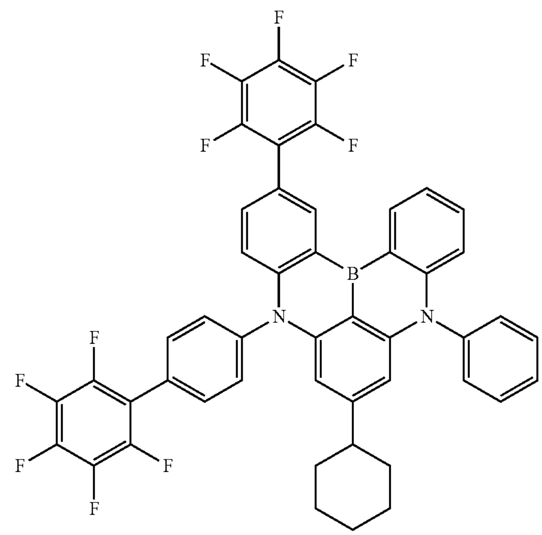
153
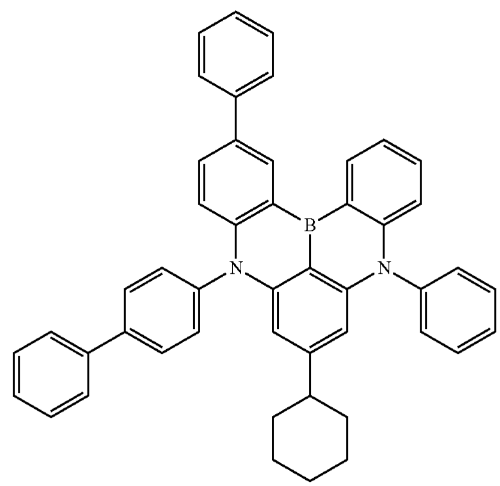
154
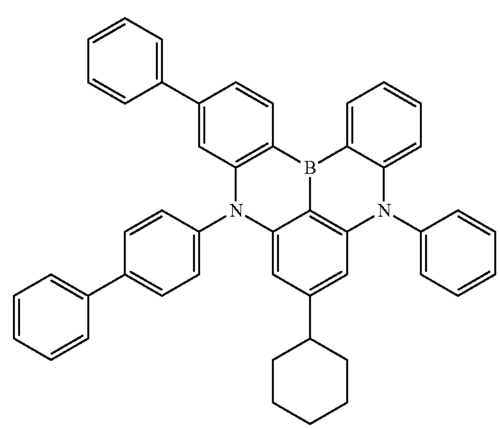

-continued
155
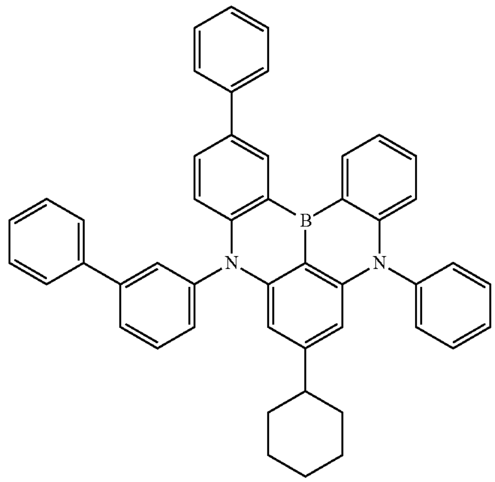
156
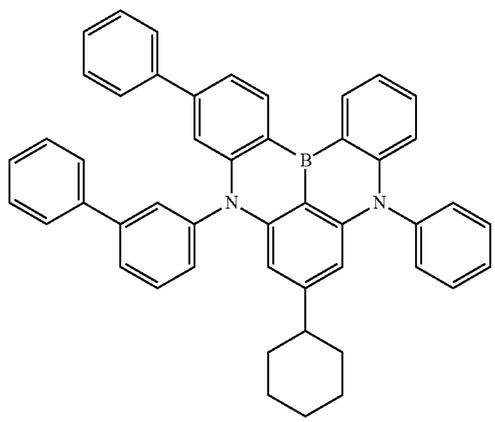
157
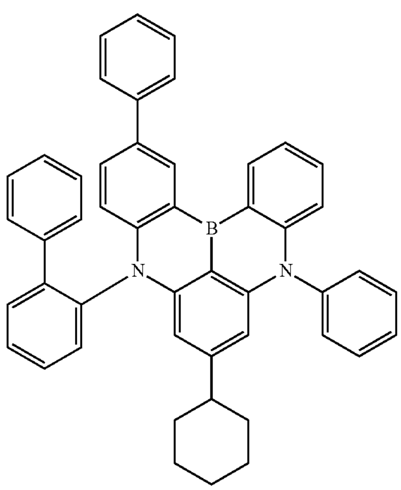
-continued
158
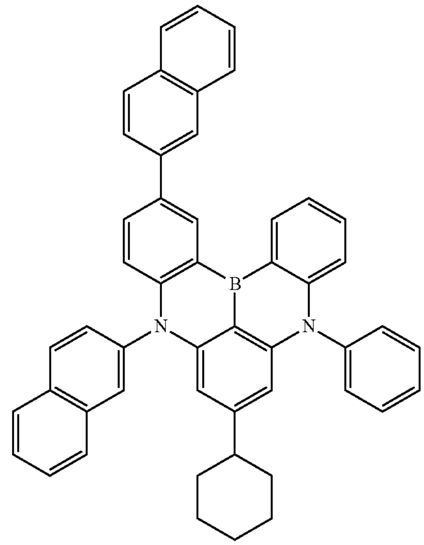
159
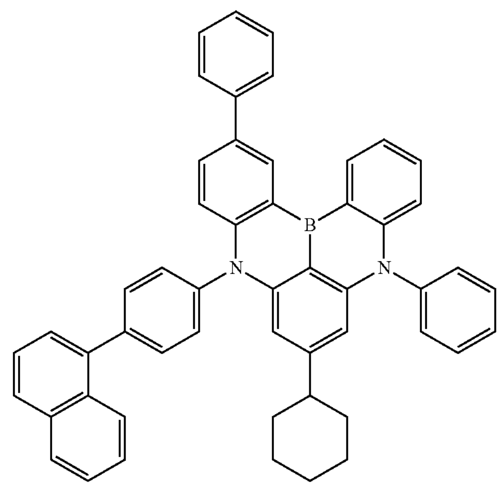
160
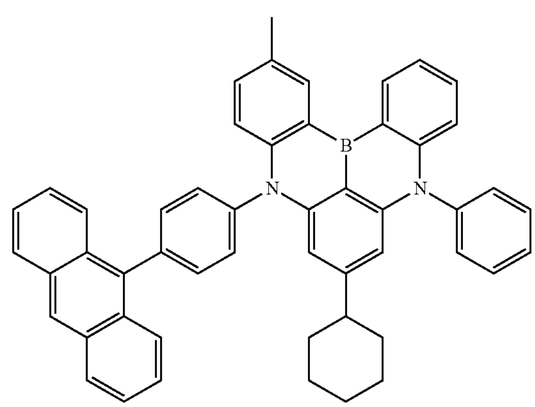

-continued
161
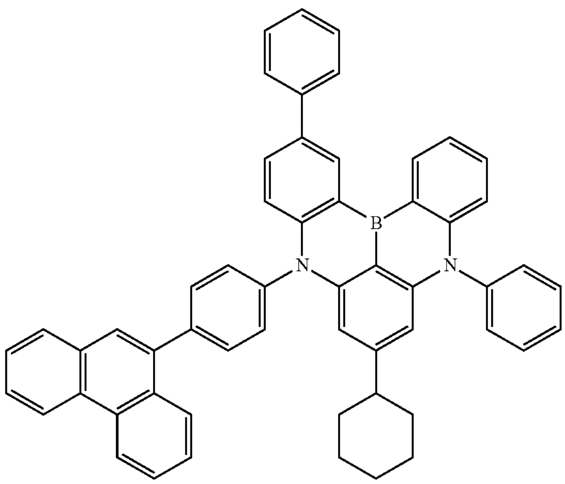
162
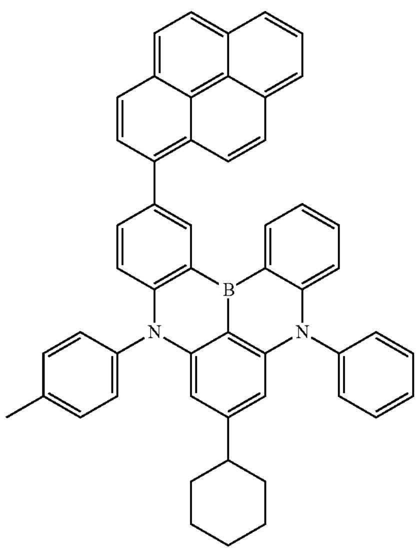
163
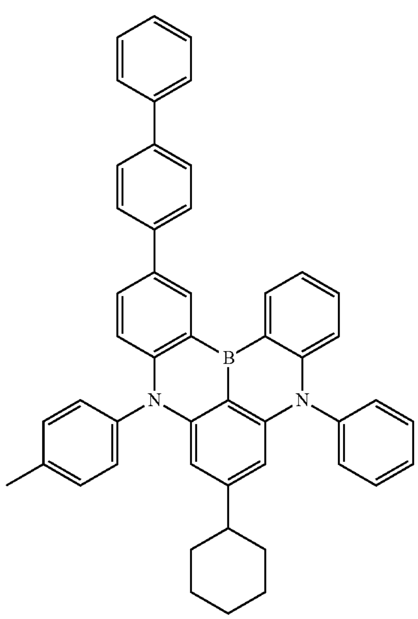
-continued
164
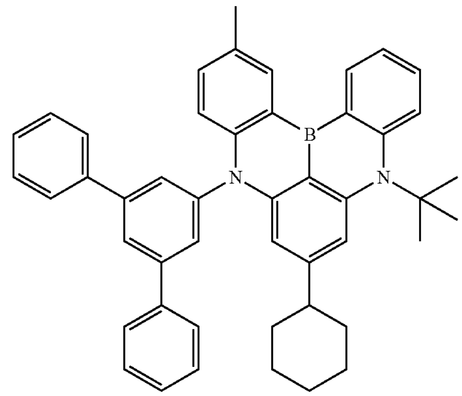
165
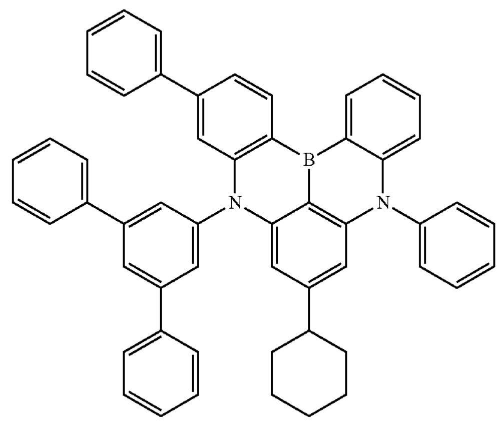
166
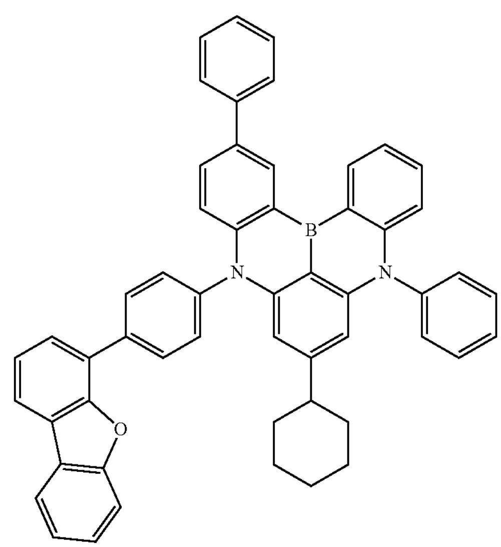

-continued
167
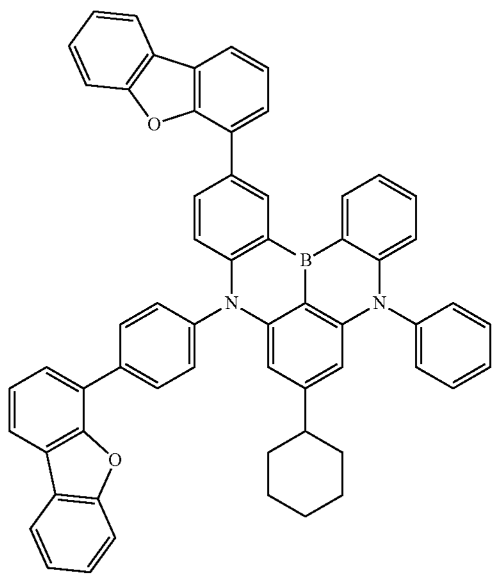
168
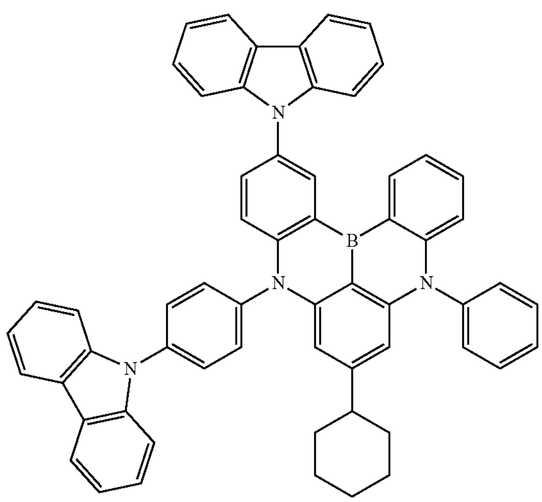
169
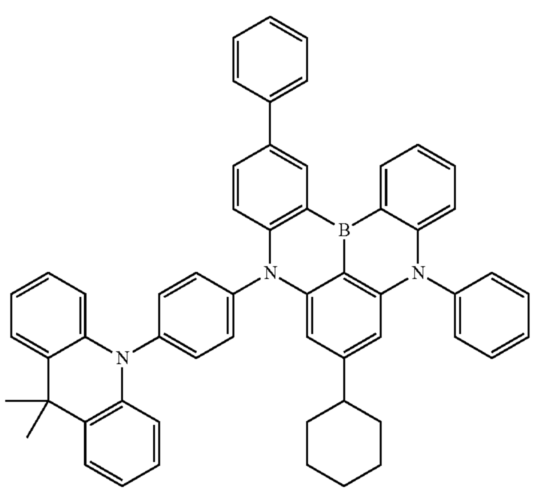
-continued
170
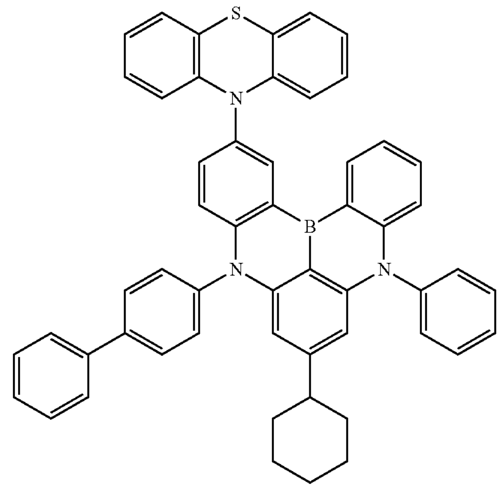
172
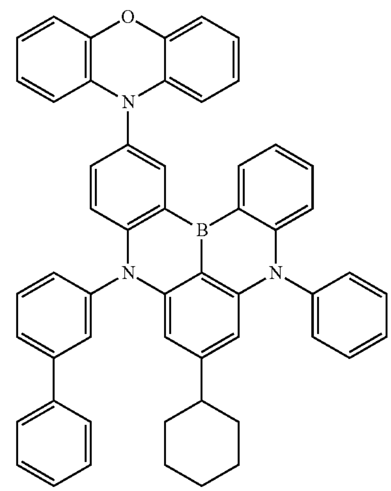
173
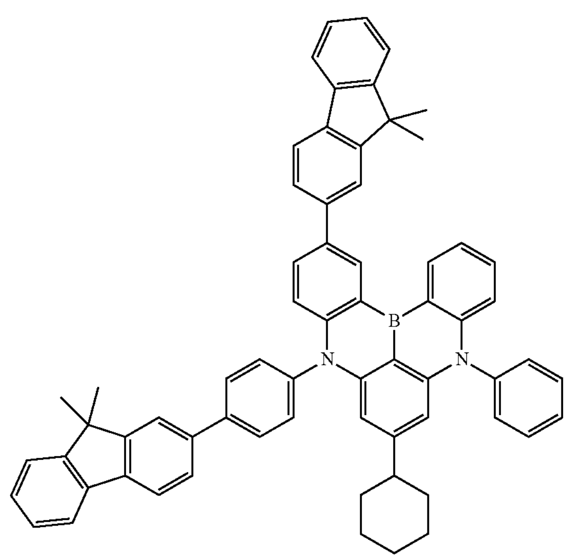

-continued
174
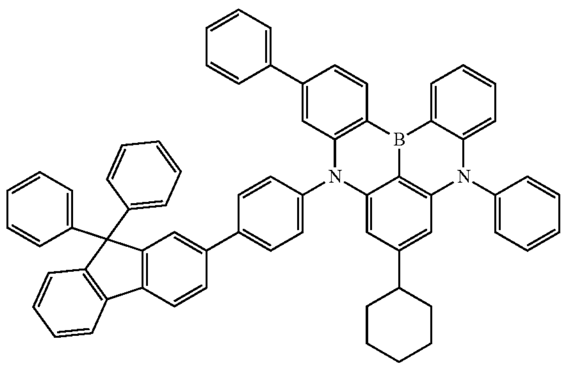
175
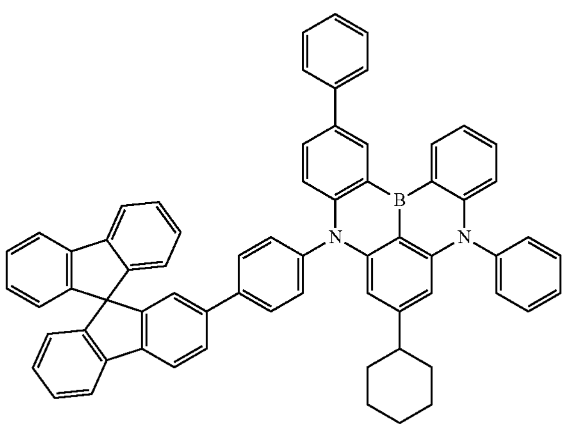
176
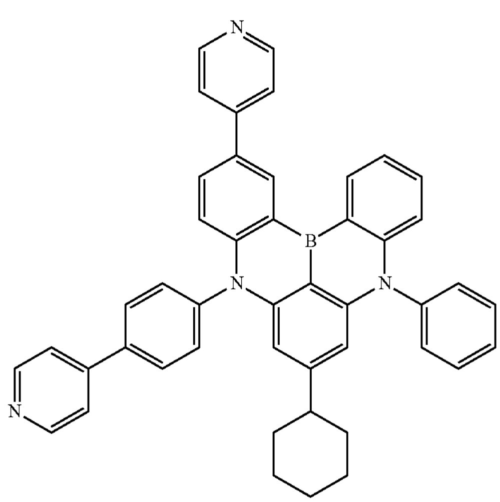
-continued
177
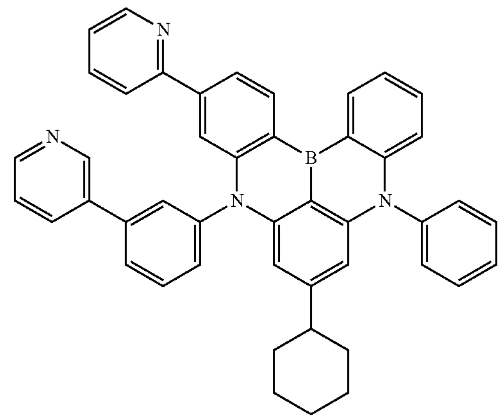
178
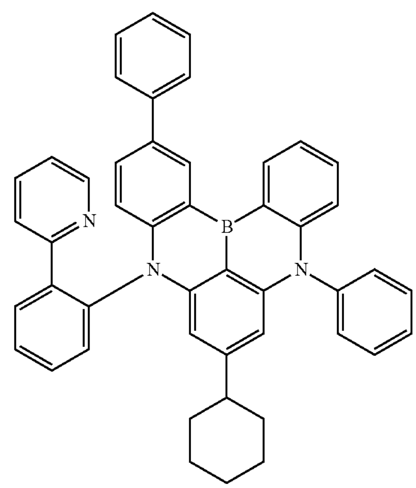
179
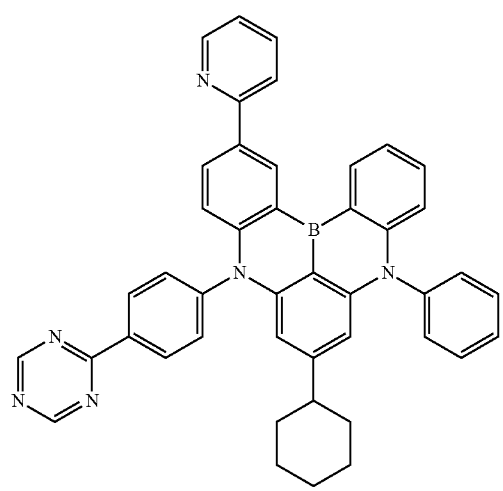

180
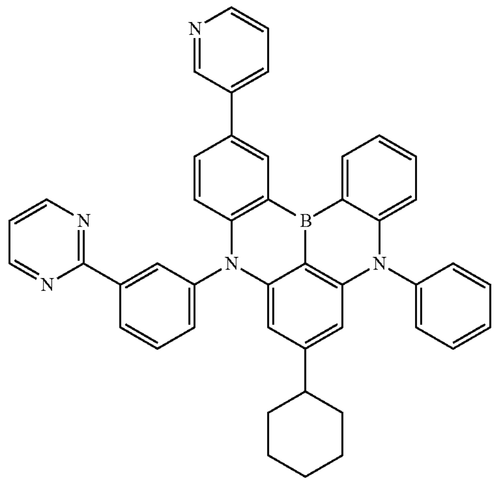
181
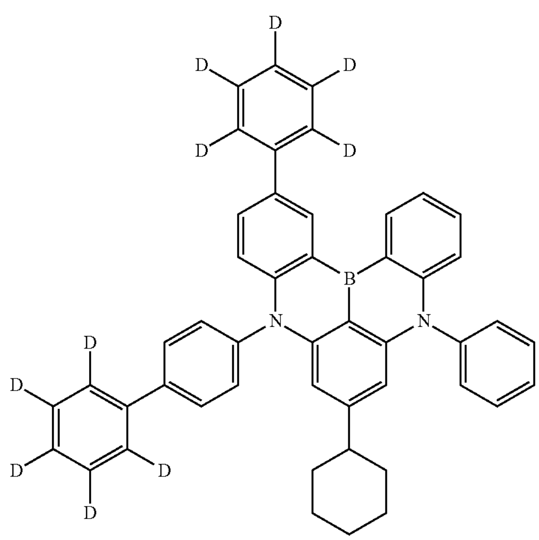
182
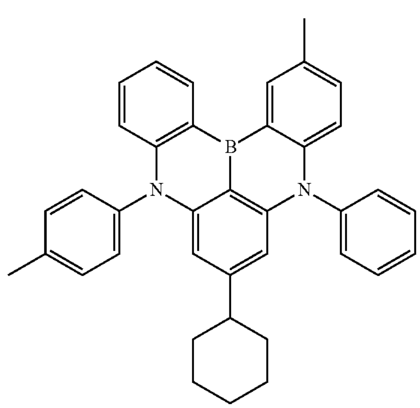
183
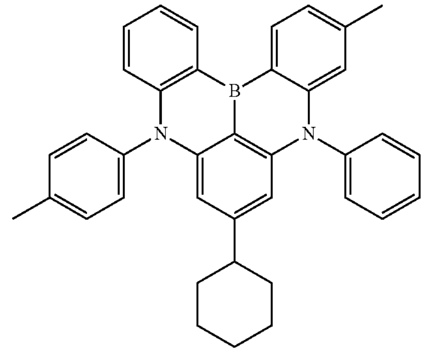
184
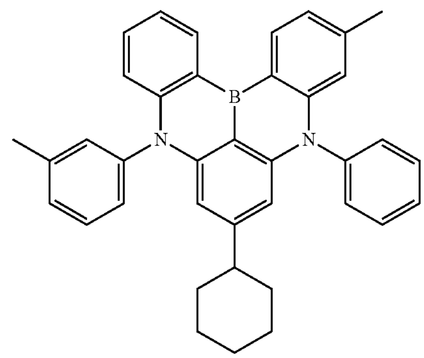
185
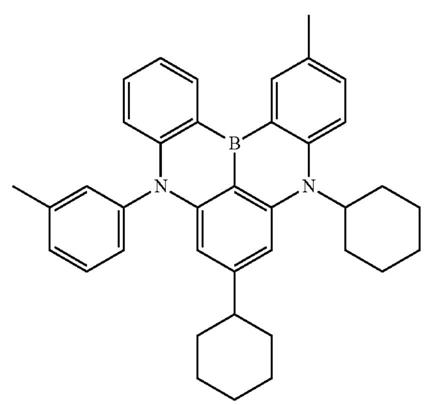
186
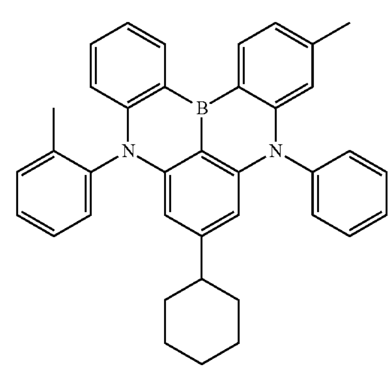

-continued
187
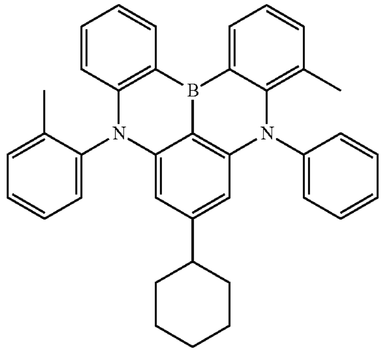
188
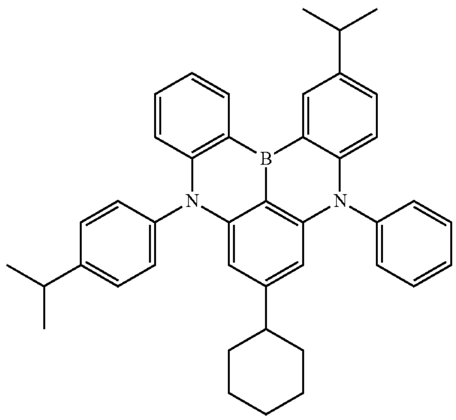
190
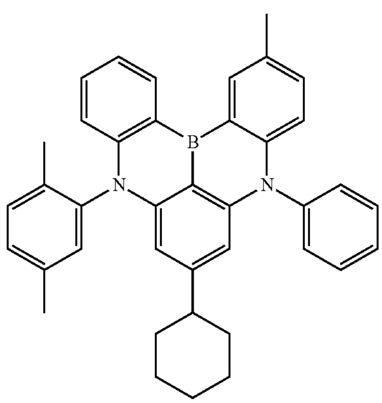
191
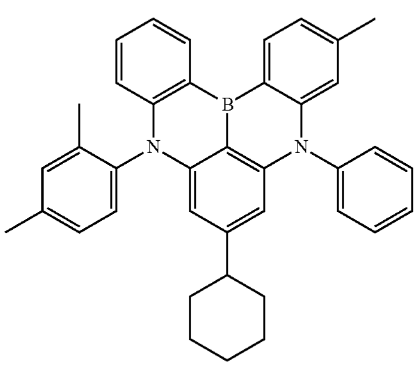
-continued
192
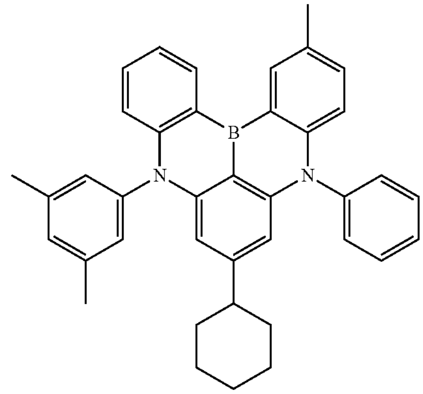
193
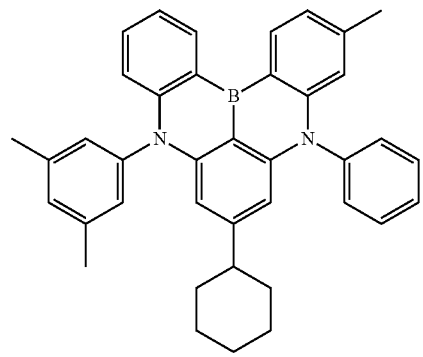
194
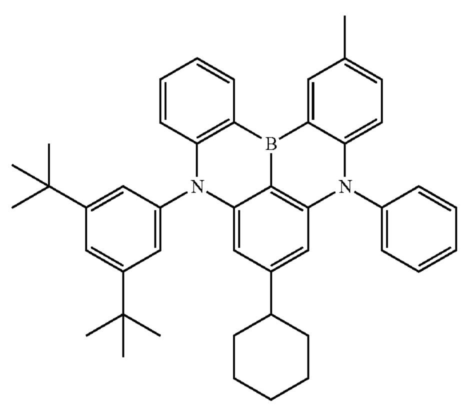
195
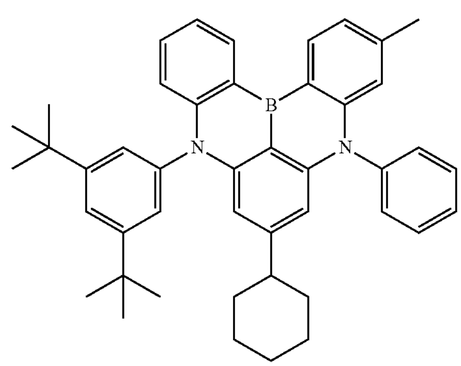

-continued
196
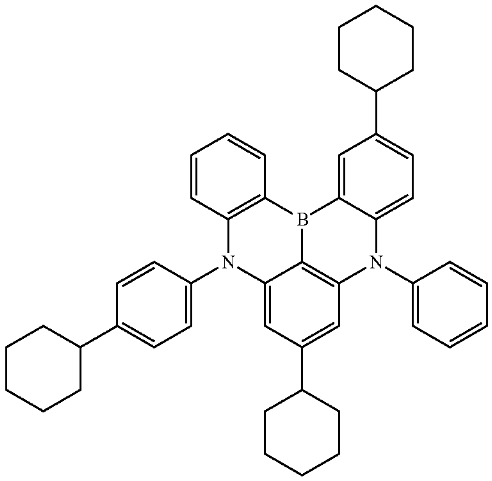
197
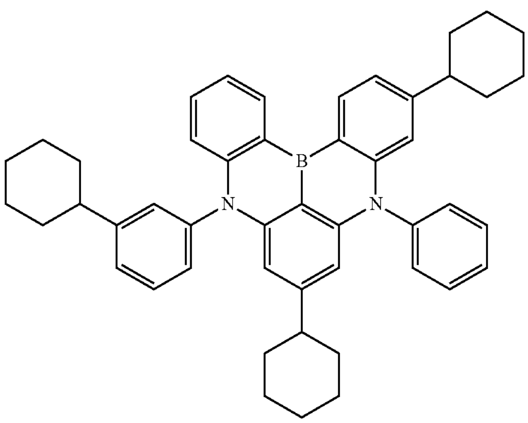
198
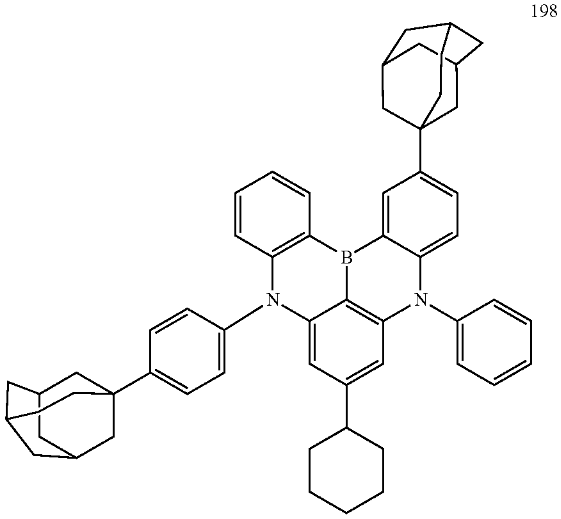
-continued
199
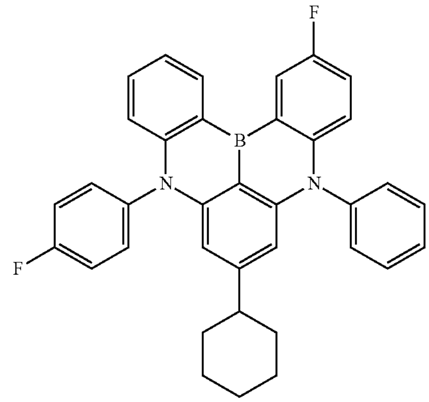
200
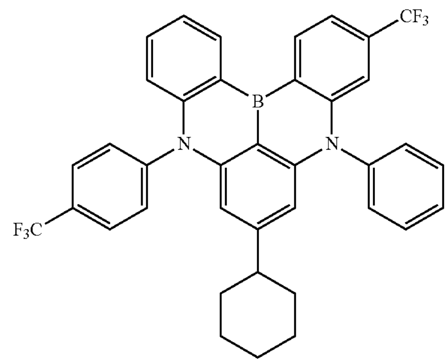
201
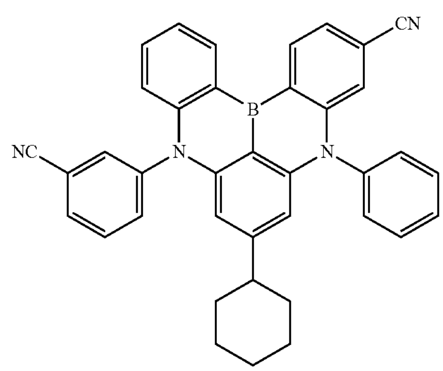
203
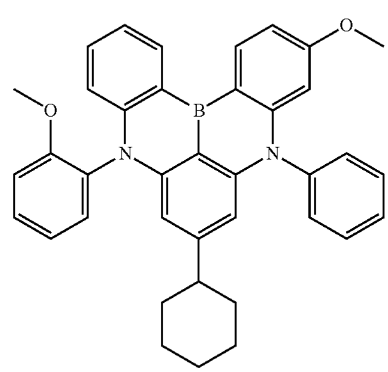

-continued
204
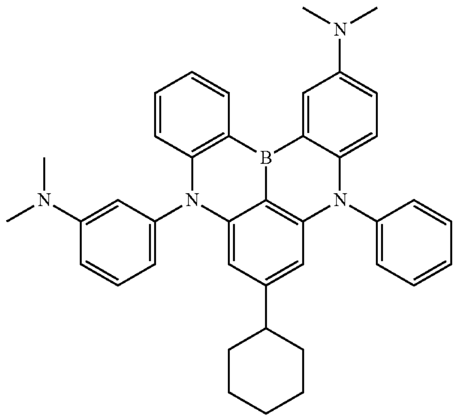
205
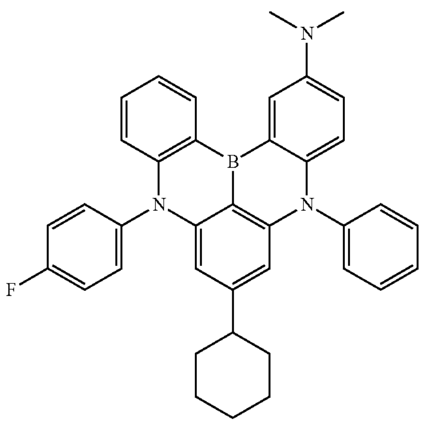
206
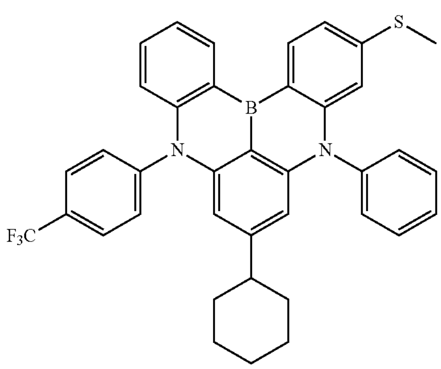
207
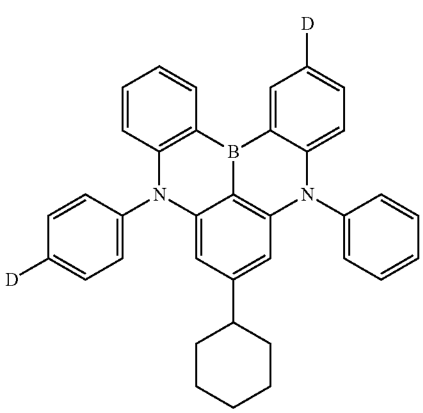
-continued
208
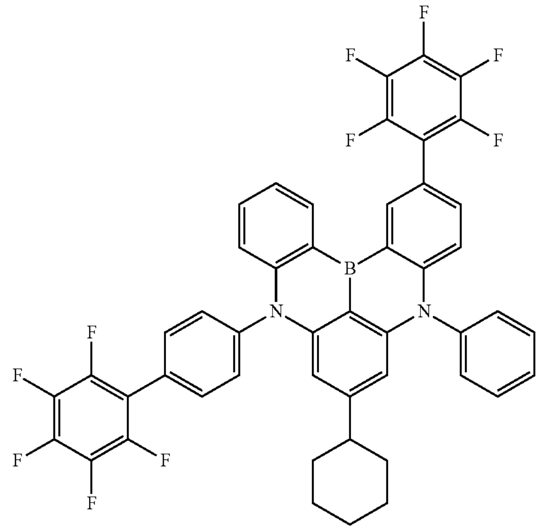
209
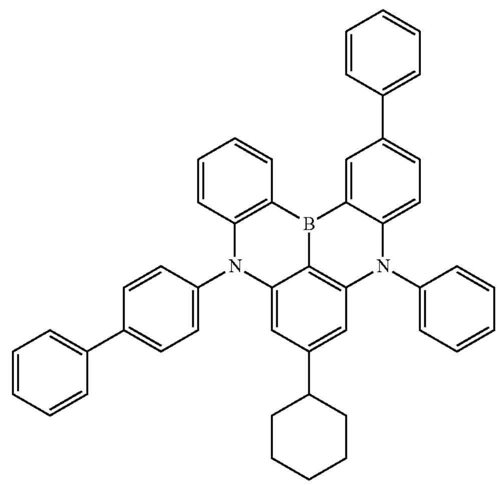
210
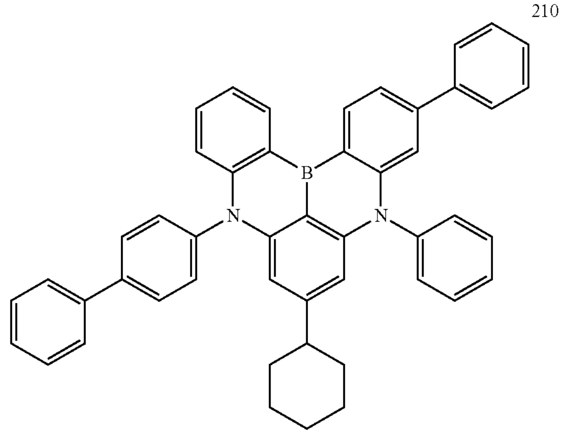

-continued
211
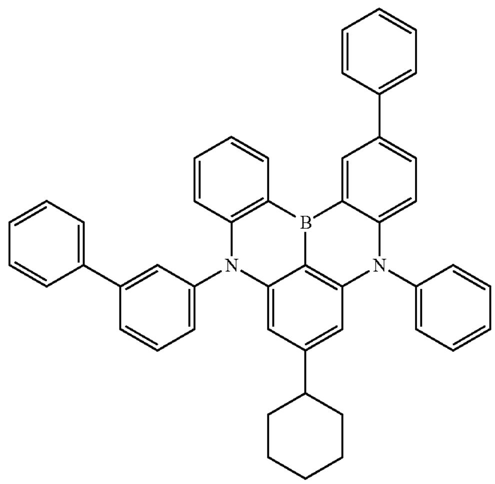
212
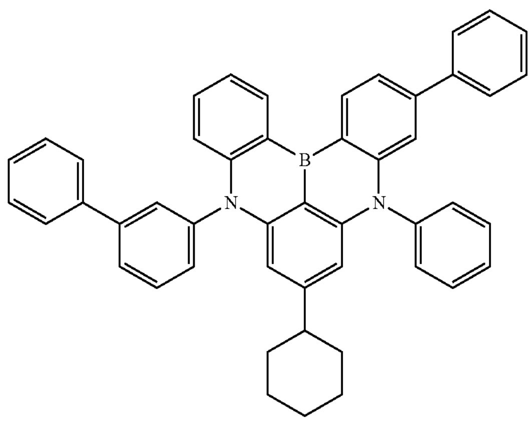
213
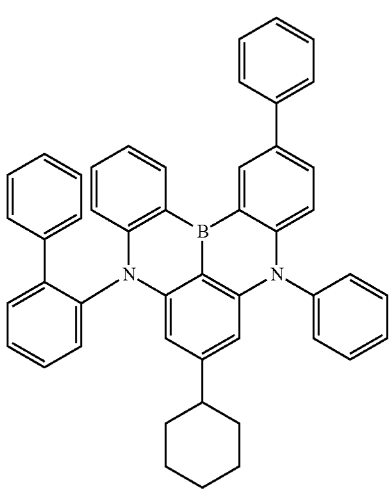
-continued
214
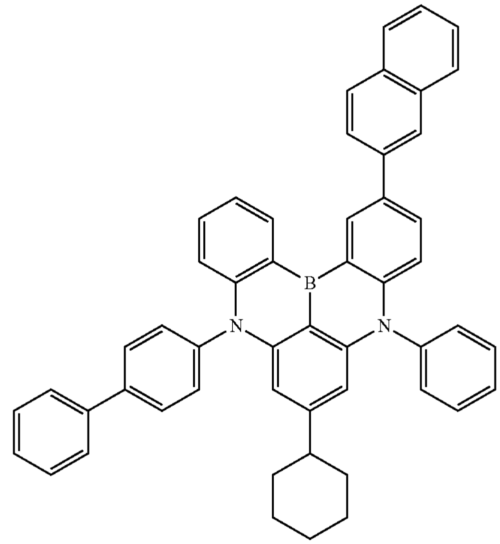
215
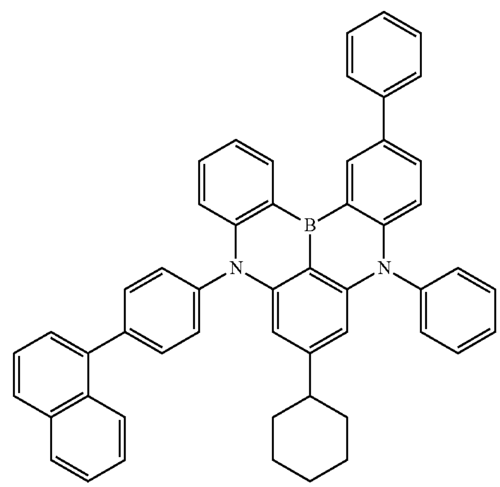
216
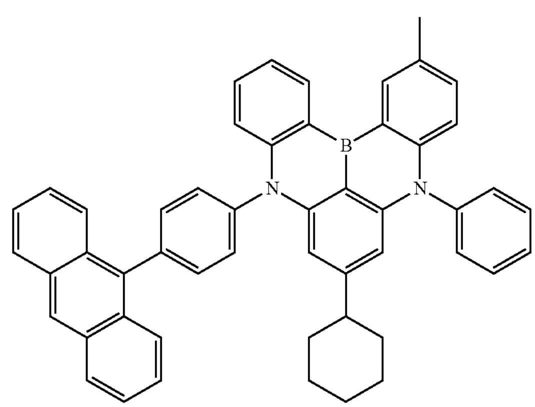

-continued
217
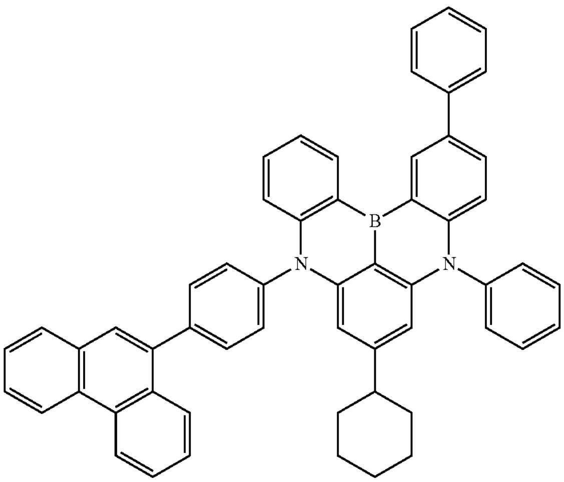
218
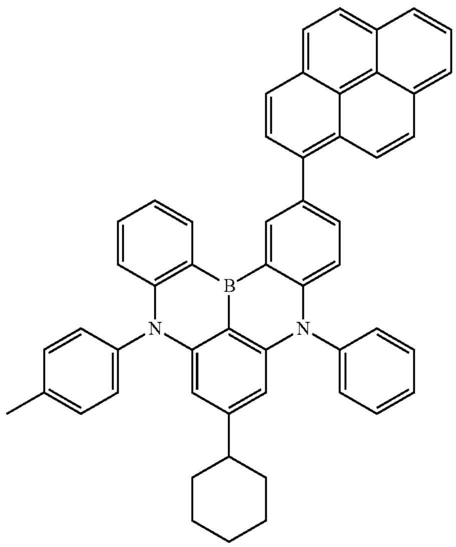
219
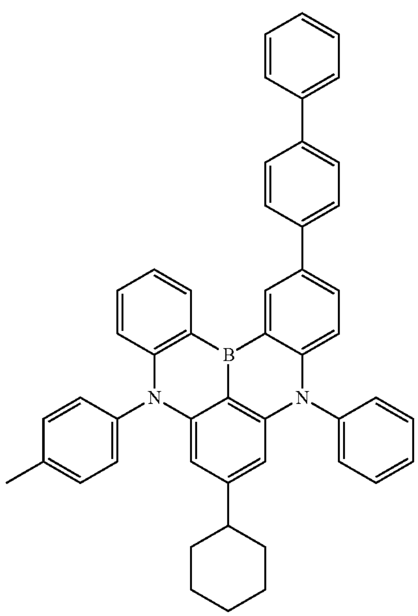
-continued
220
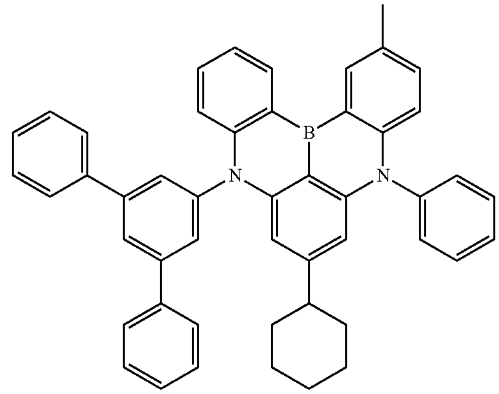
225
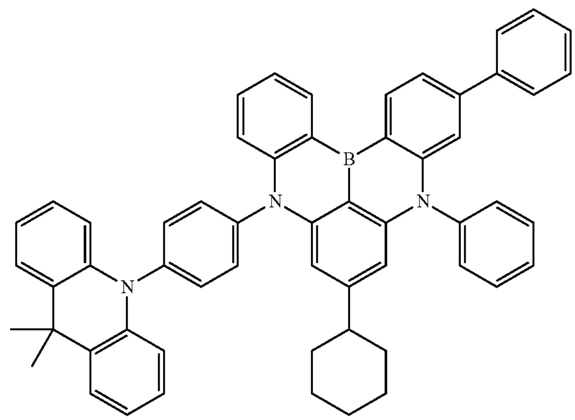
226
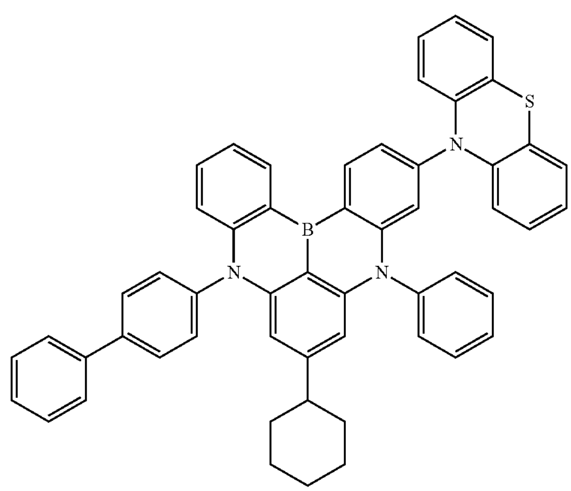

-continued
228
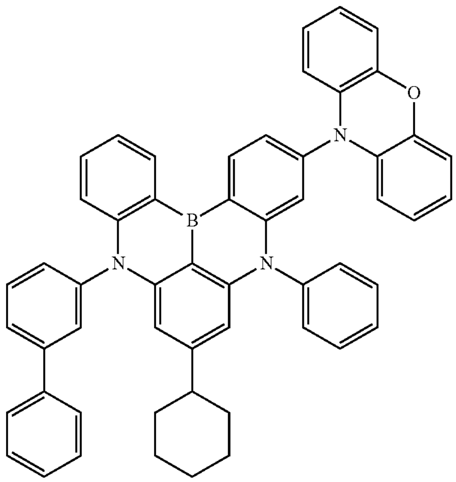
229
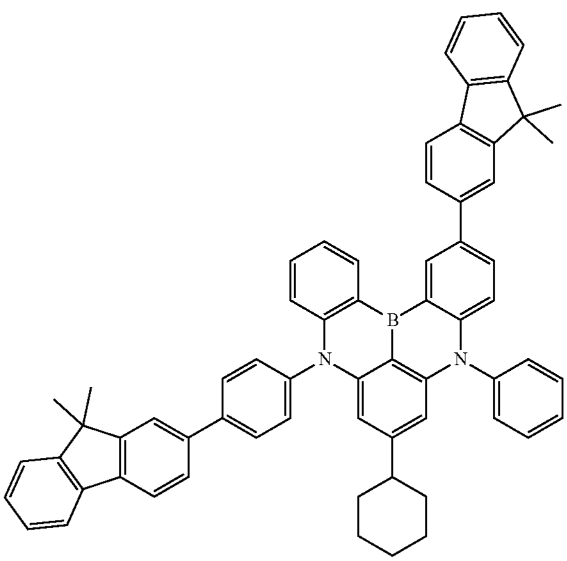
230
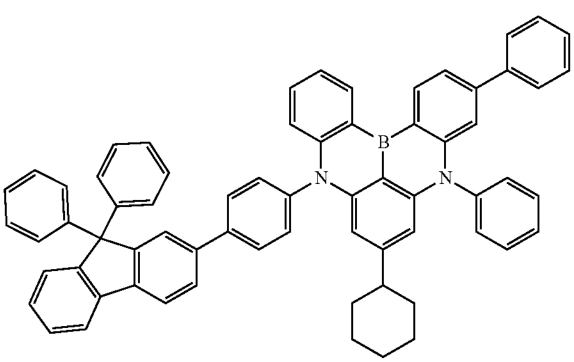
-continued
231
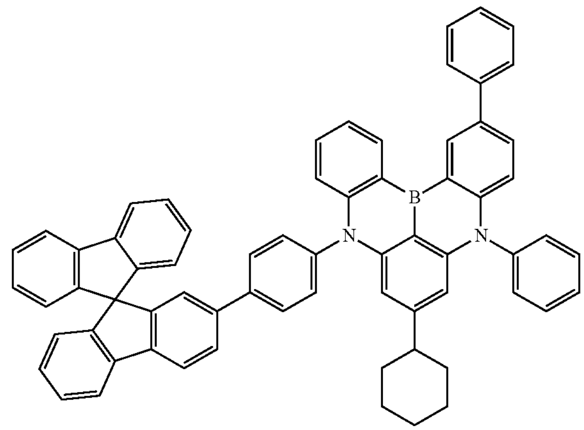
232
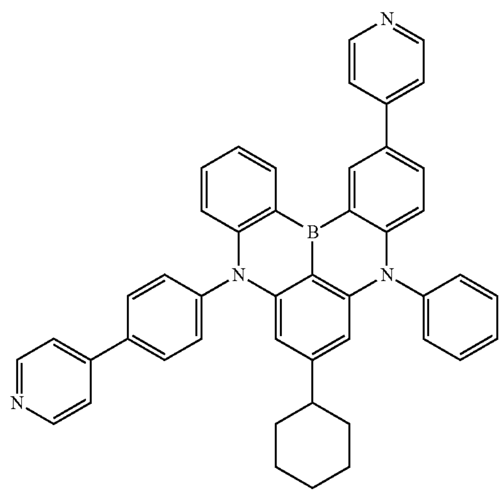
233
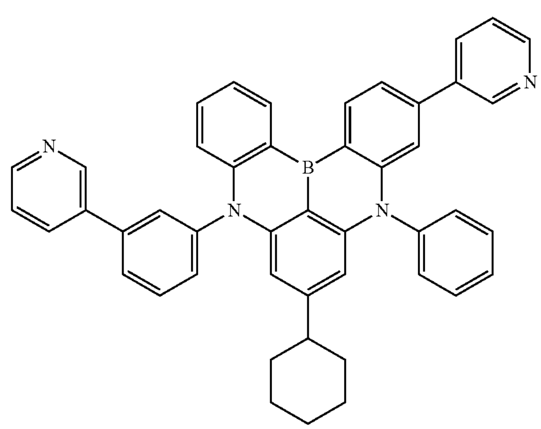

-continued
234
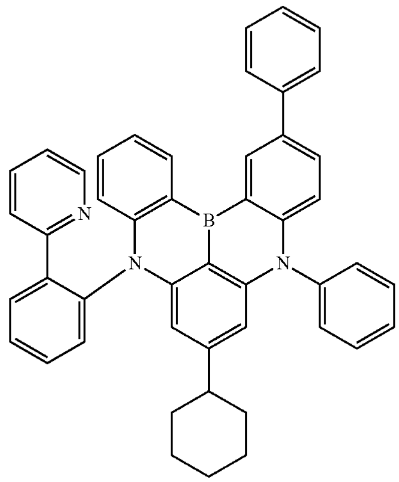
235
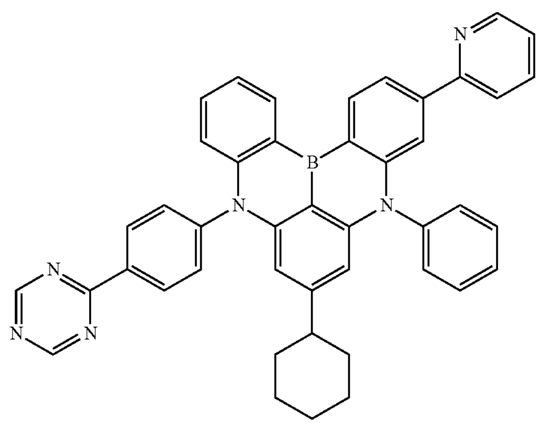
236
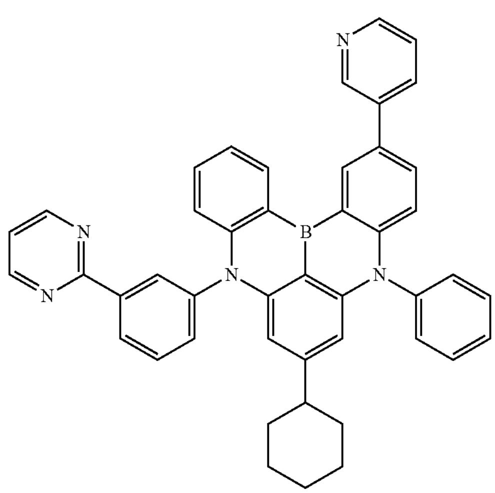
-continued
237
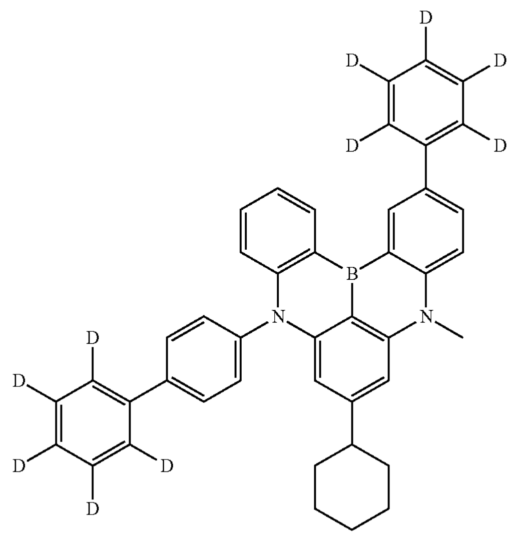
238
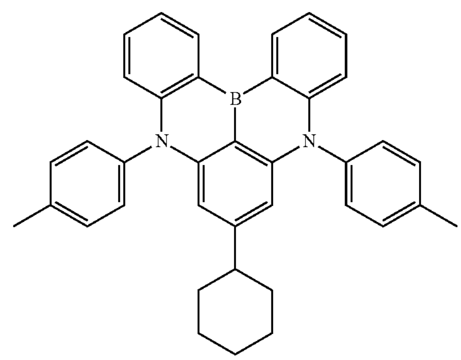
239
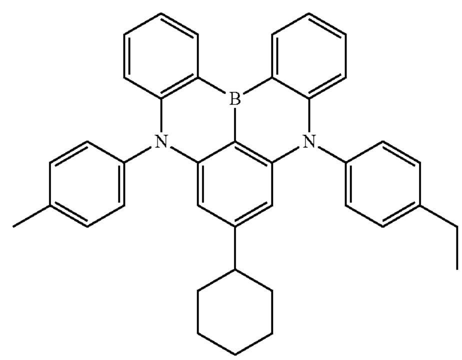
240
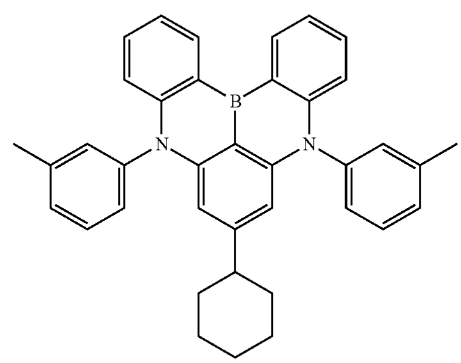

-continued
241
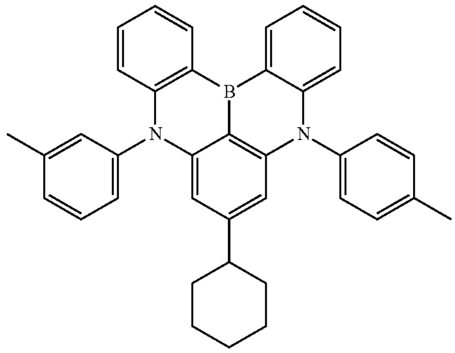
242
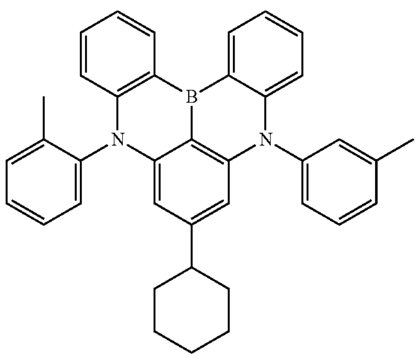
243
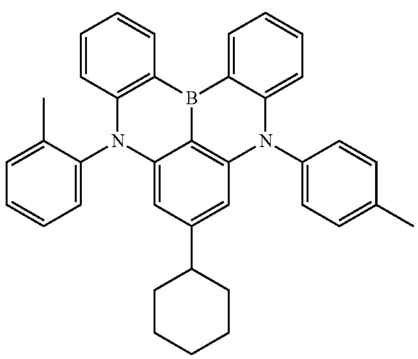
244
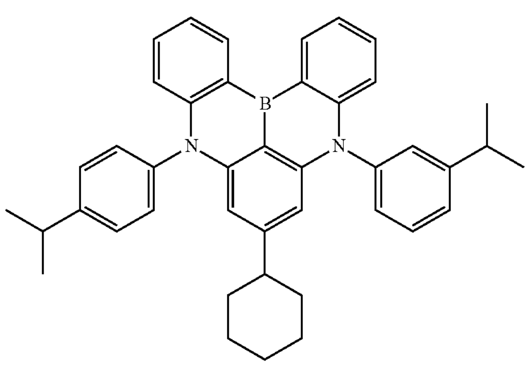
-continued
245
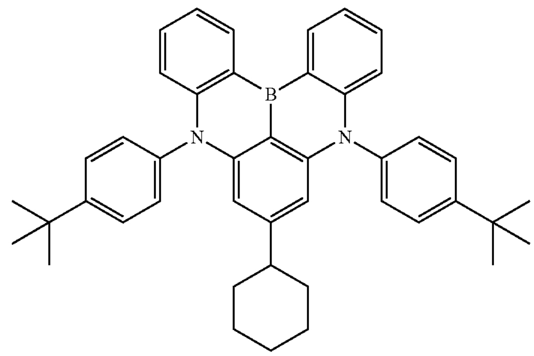
246
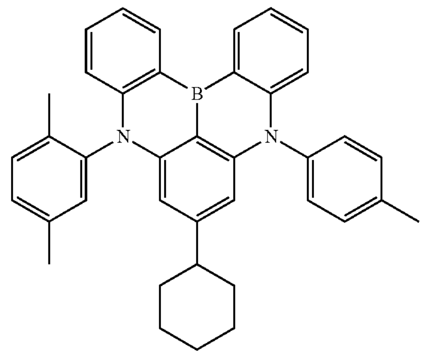
247
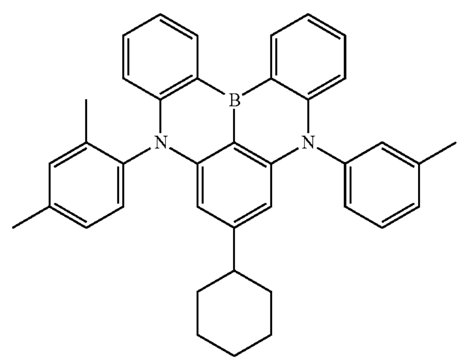
248
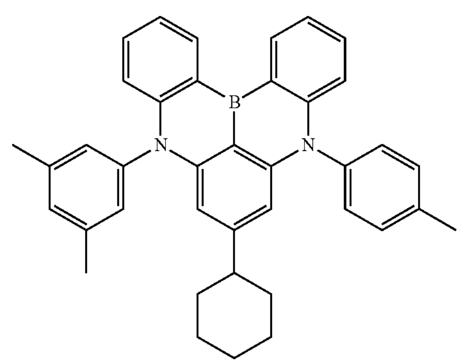

249
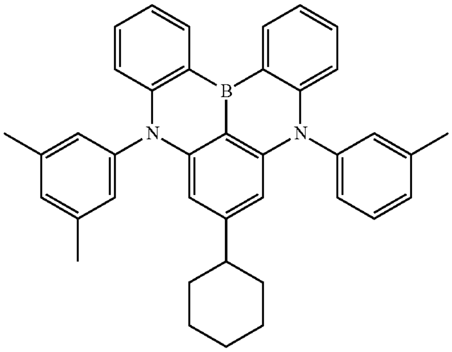
250
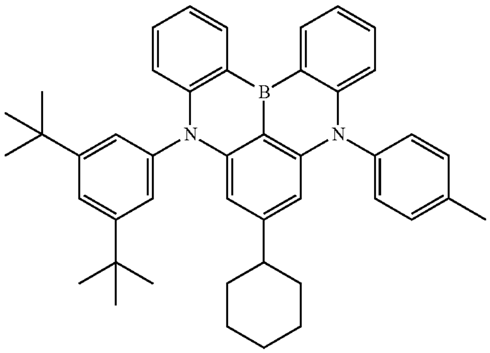
251
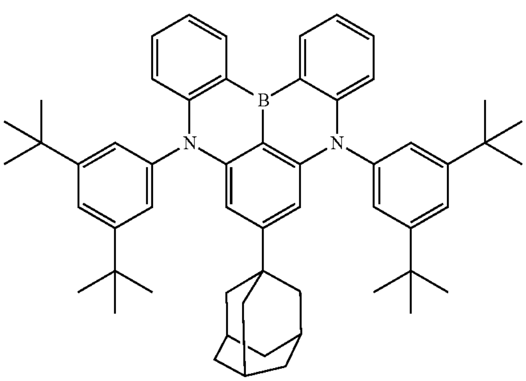
252
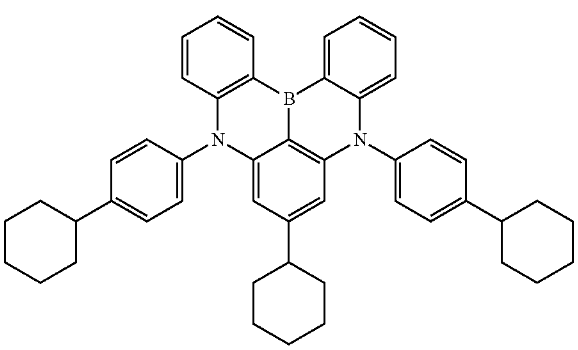
253
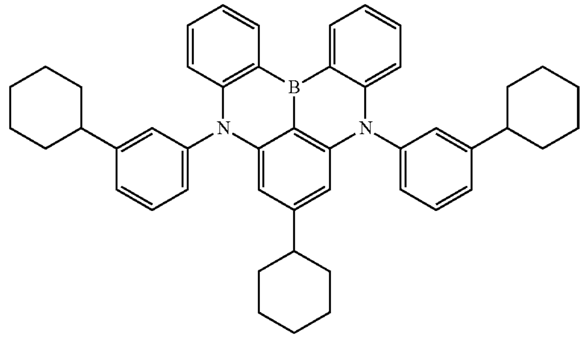
254
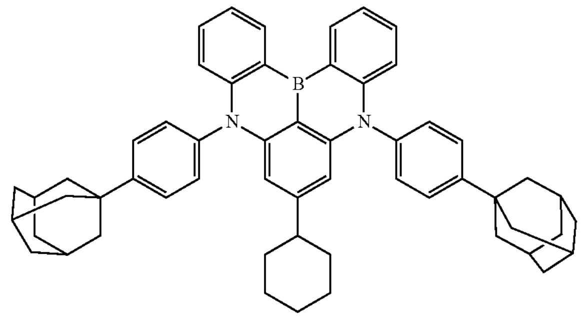
255
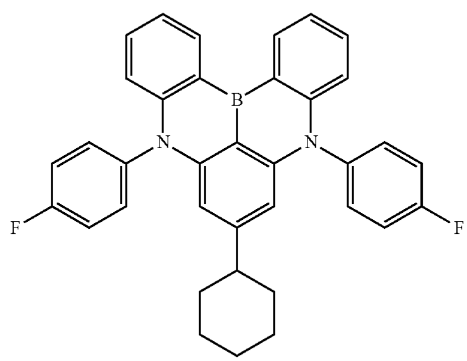
256
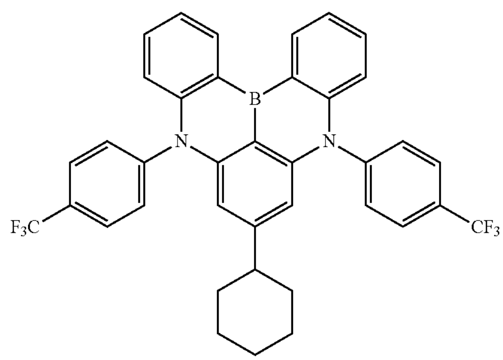

257
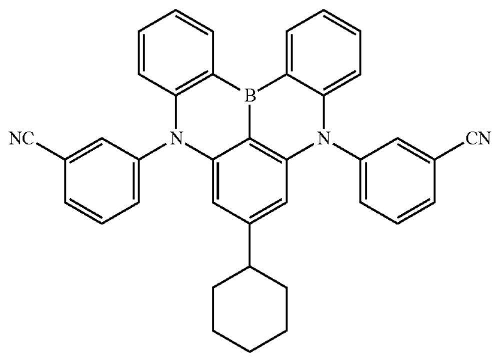
259
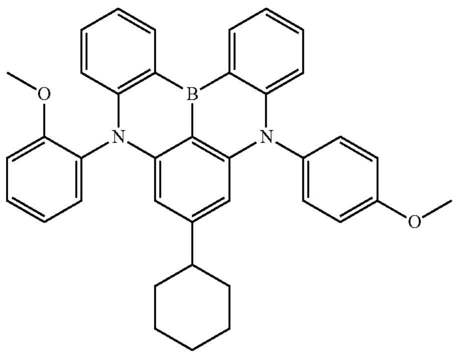
260
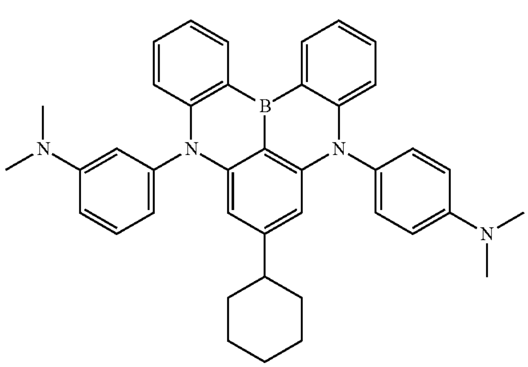
261
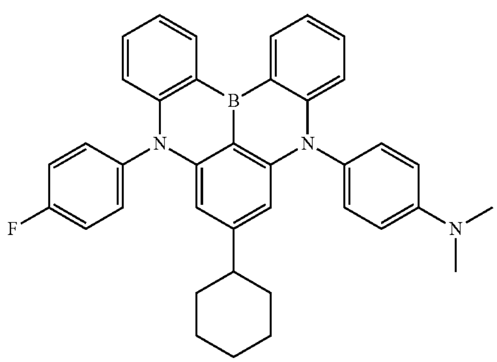
262
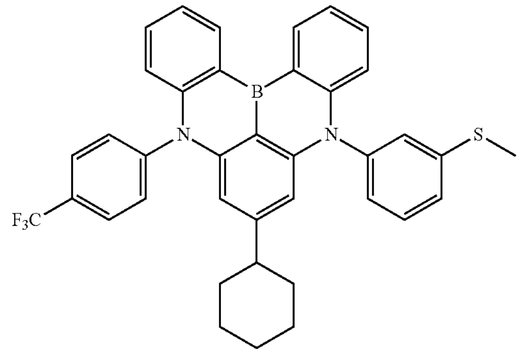
263
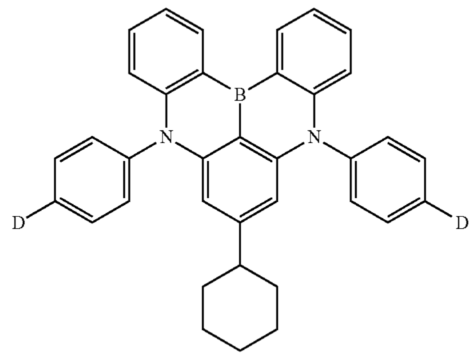
264
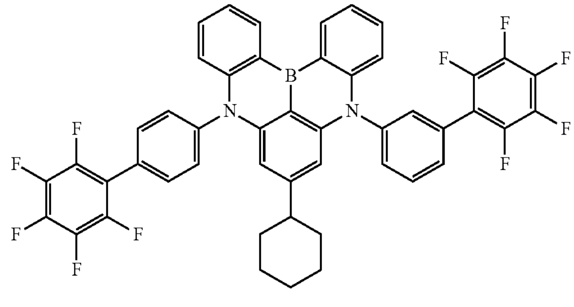
265
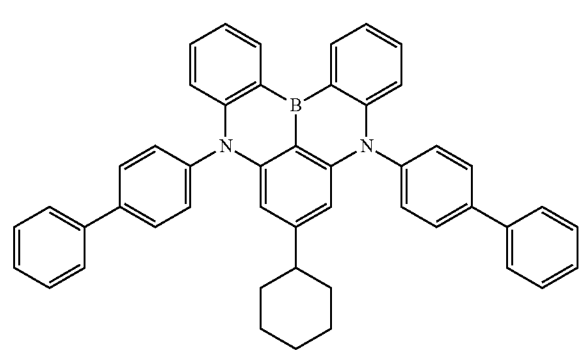

266
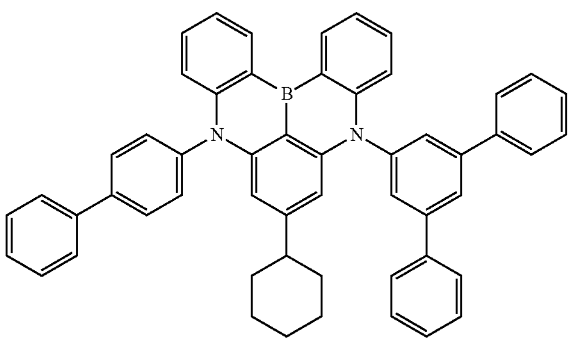
267
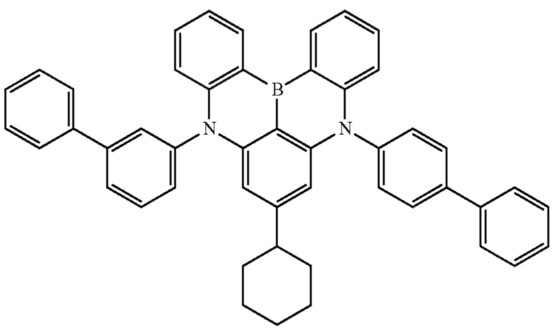
268
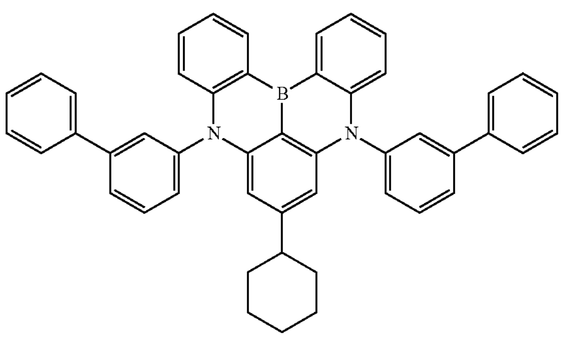
269
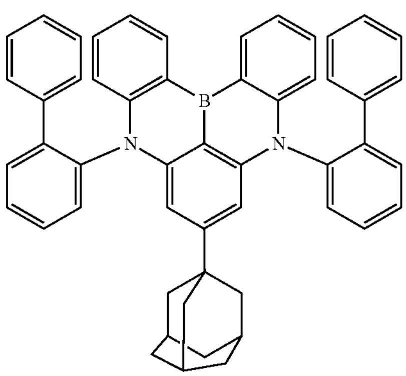
270
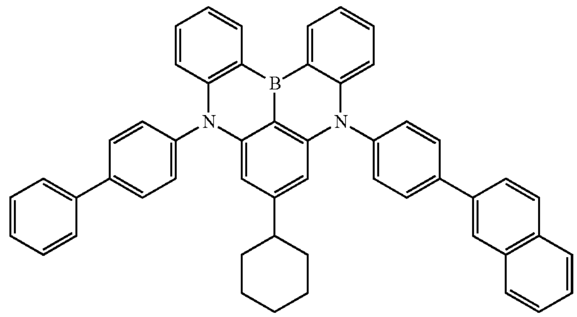
271
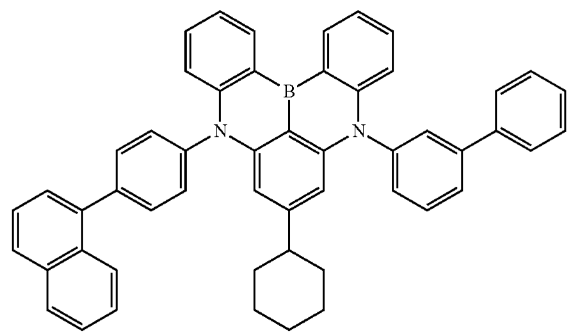
272
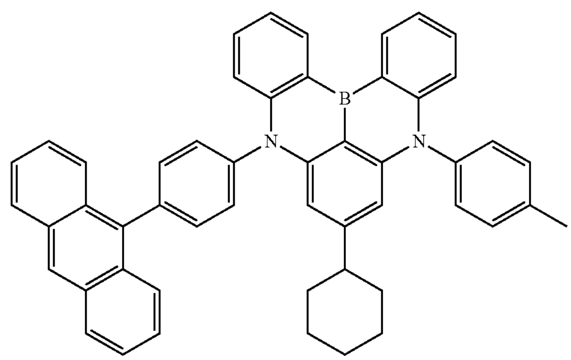
273
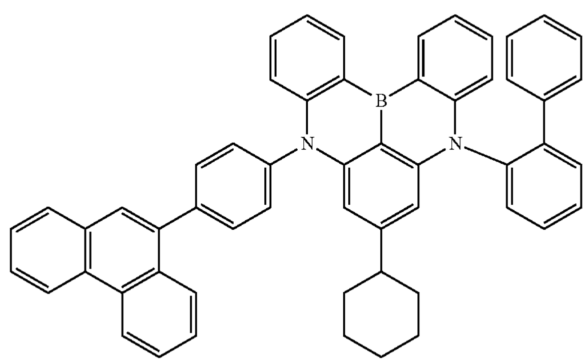

-continued
274
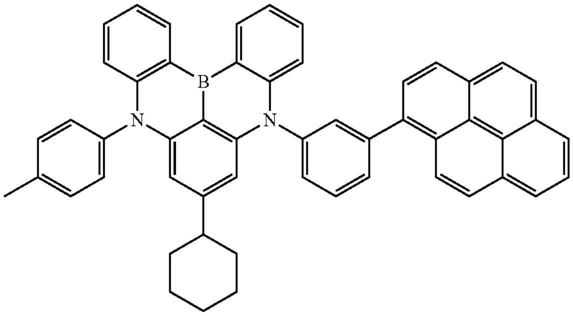
275
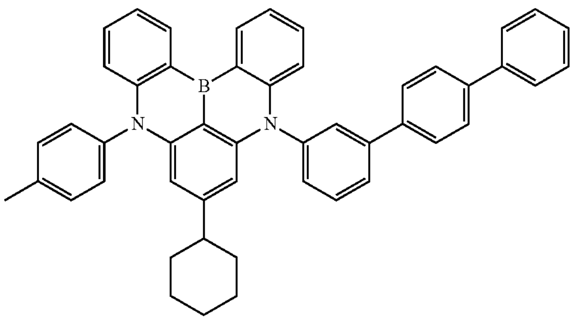
276
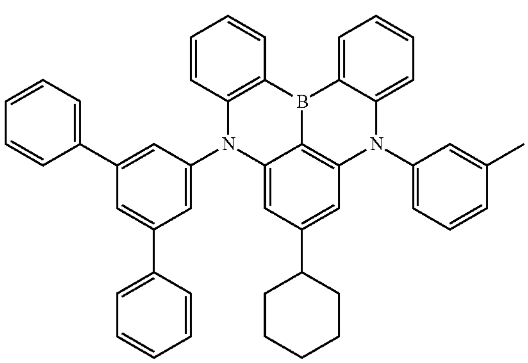
277
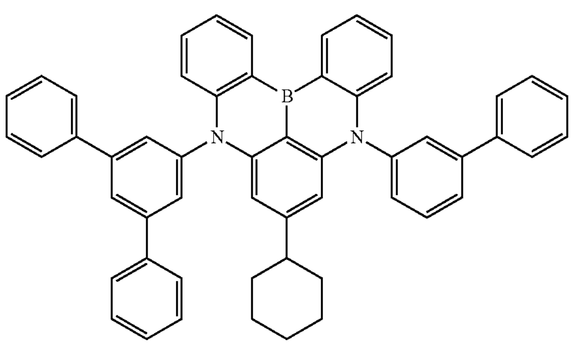
-continued
278
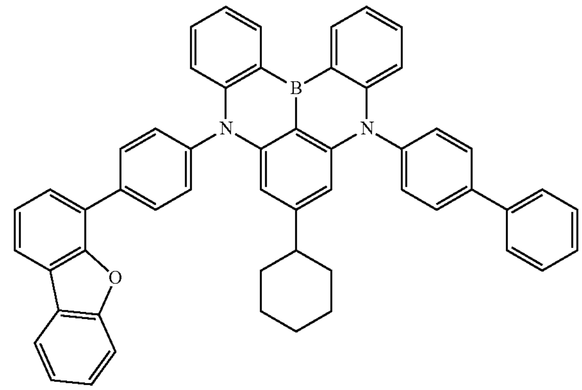
279
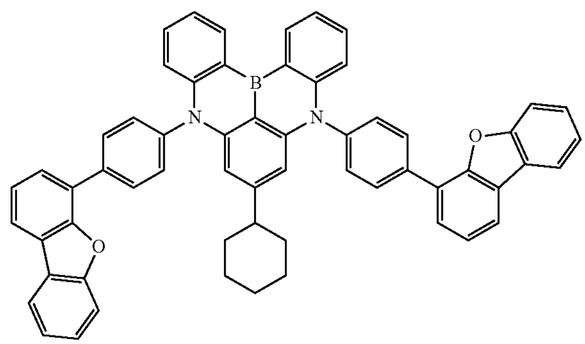
280
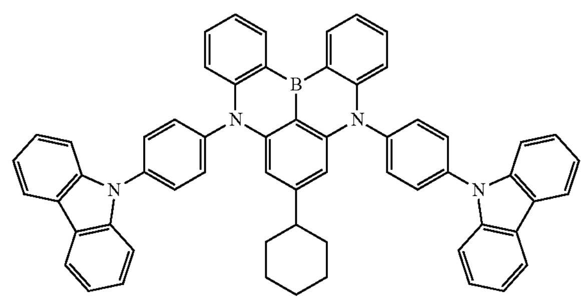
281
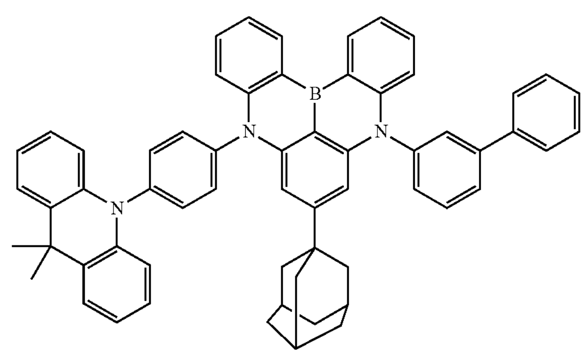

282
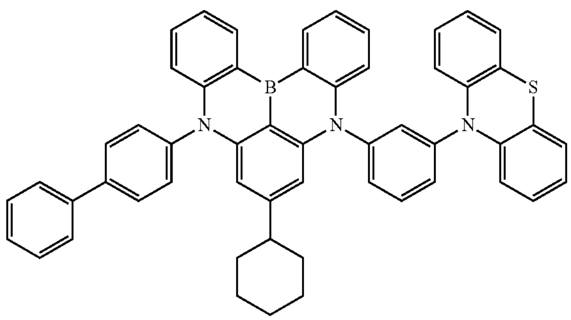
284
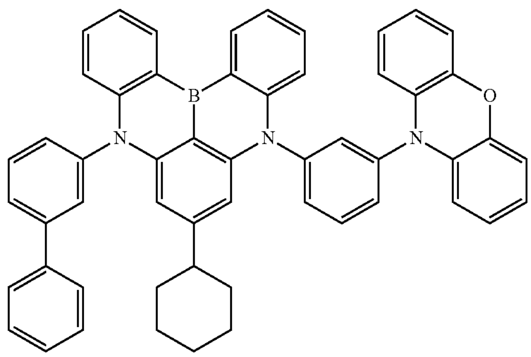
285
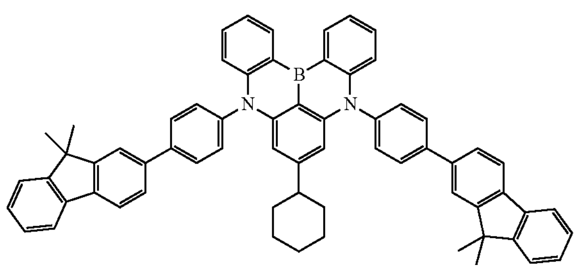
286
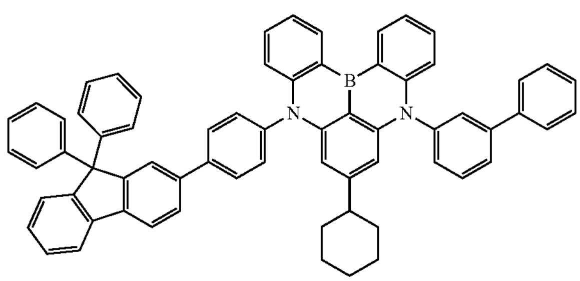
287
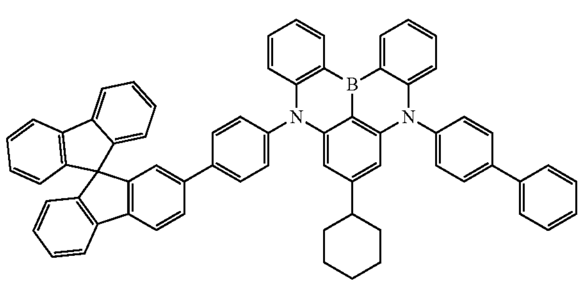
288
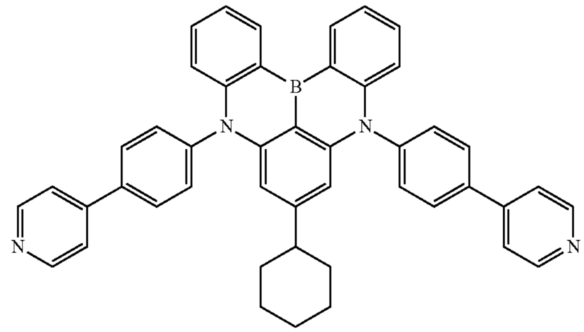
298
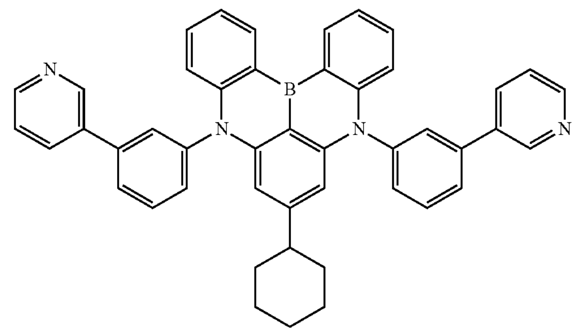
290
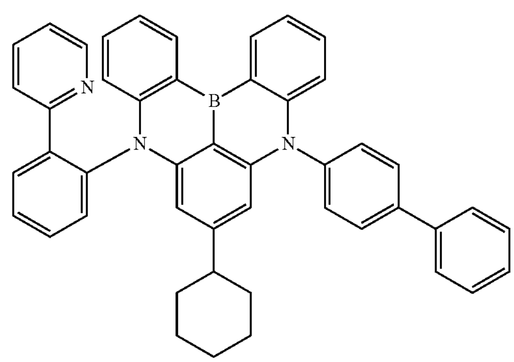
291
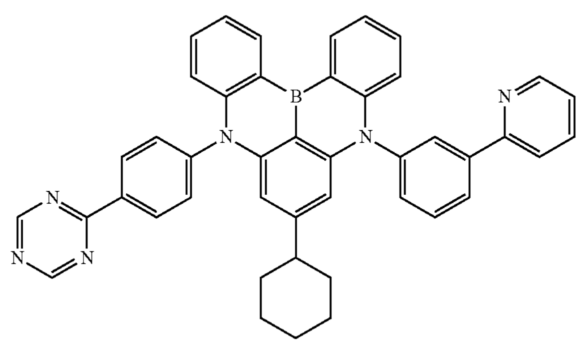

292
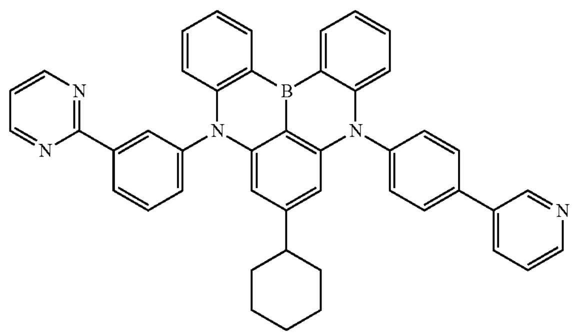
293
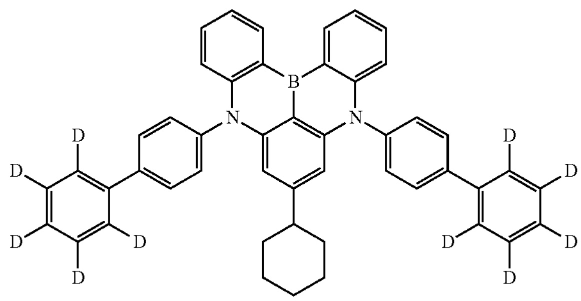
294
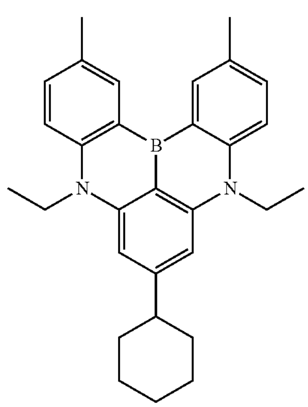
295
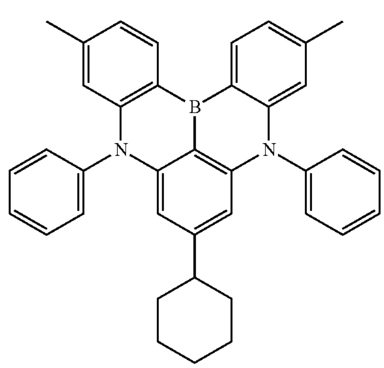
296
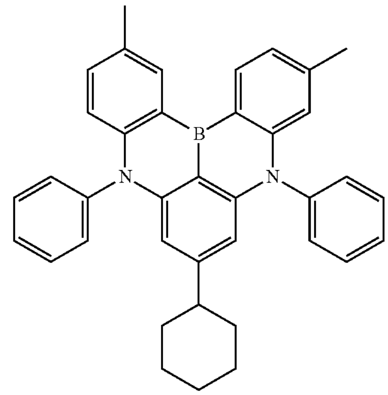
297
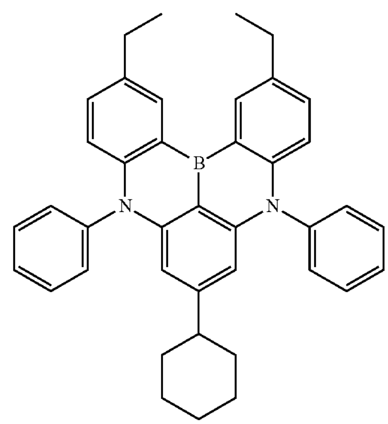
298
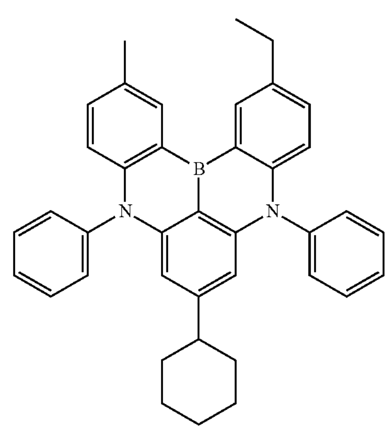

-continued
299
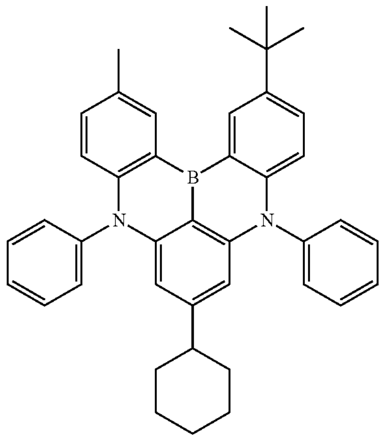
300
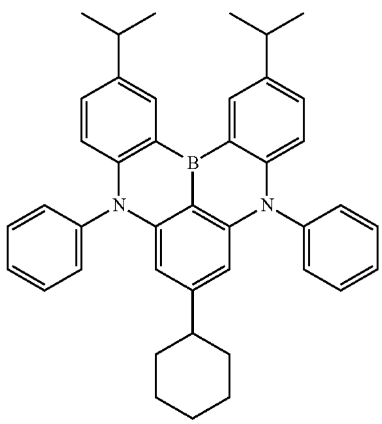
301
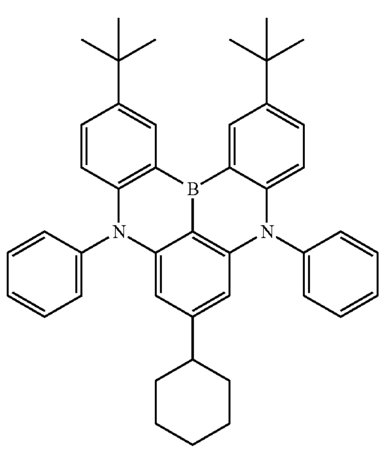
-continued
302
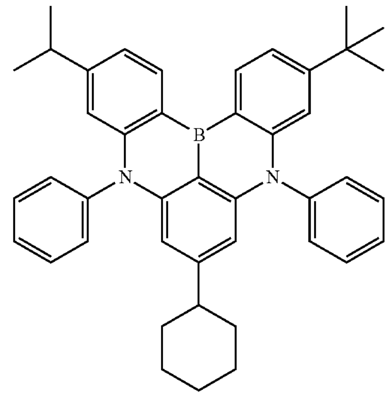
303
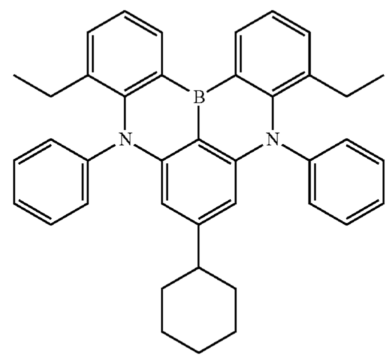
304
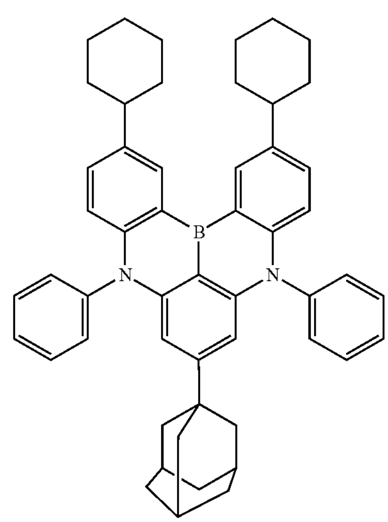

-continued
305
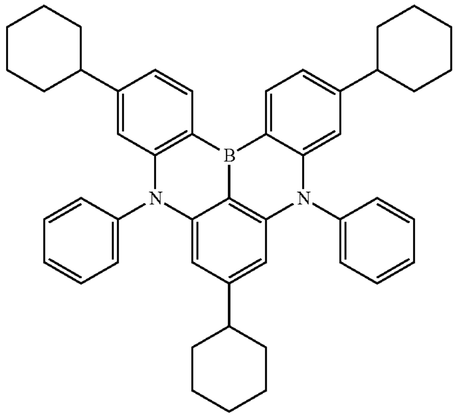
306
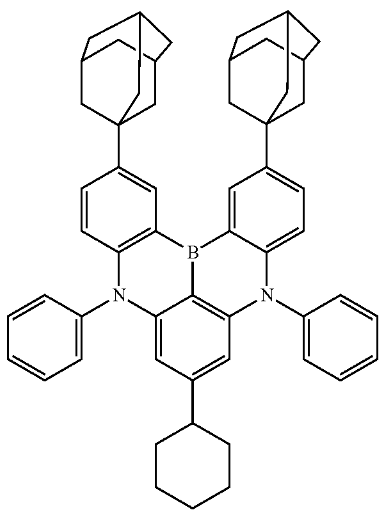
307
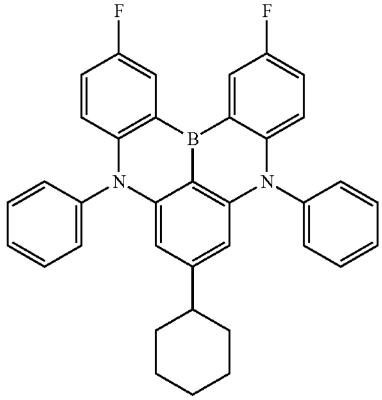
-continued
308
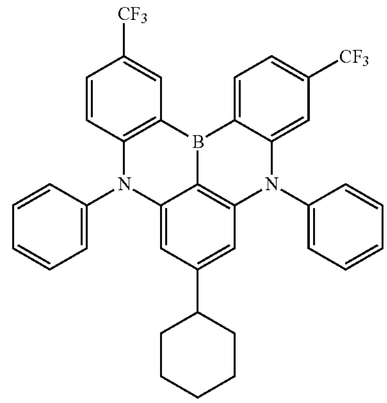
309
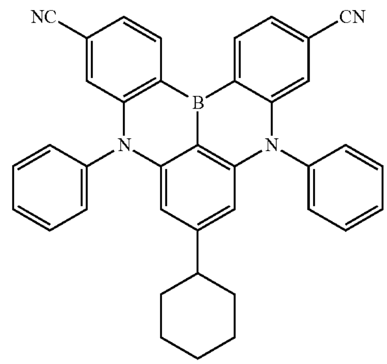
311
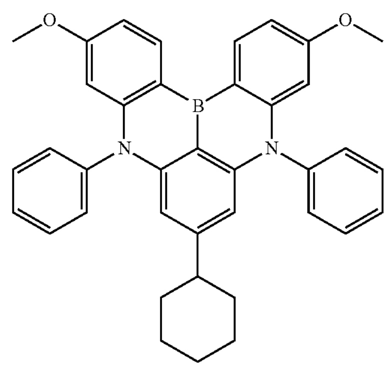
312
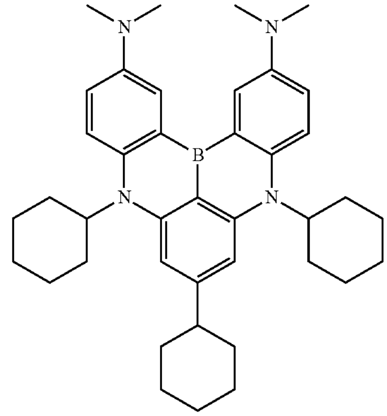

-continued
313
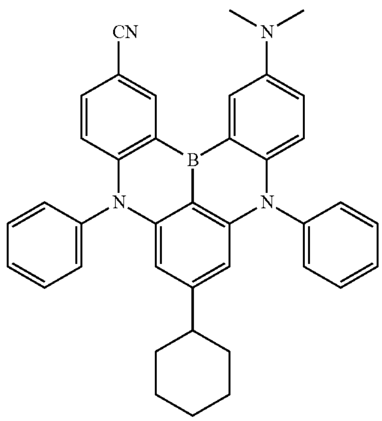
314
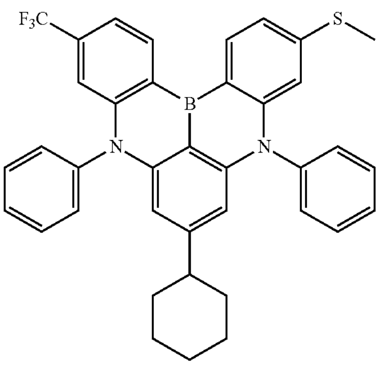
315
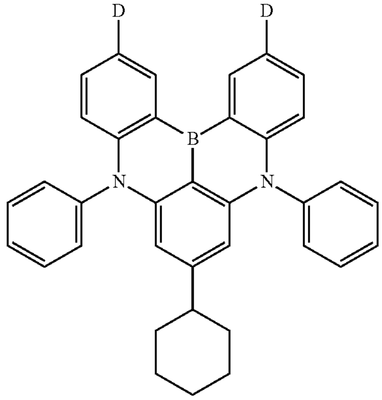
-continued
316
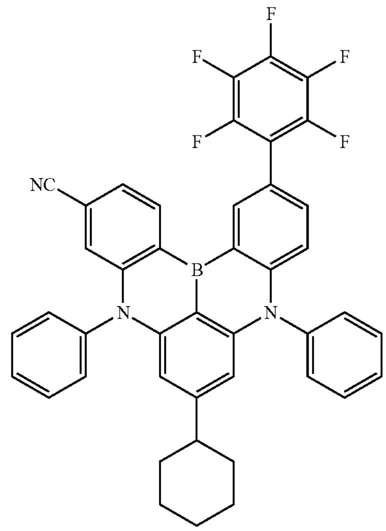
317
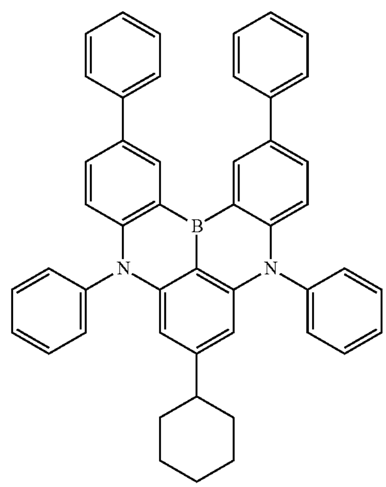
318
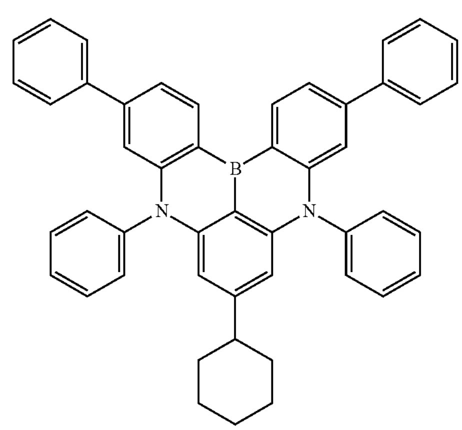

-continued
319
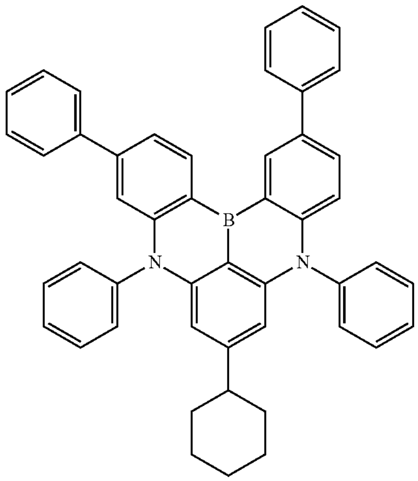
320
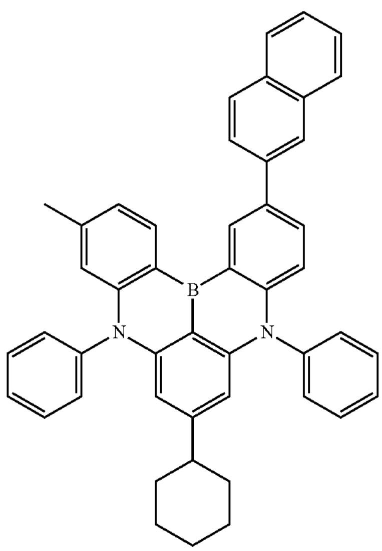
321
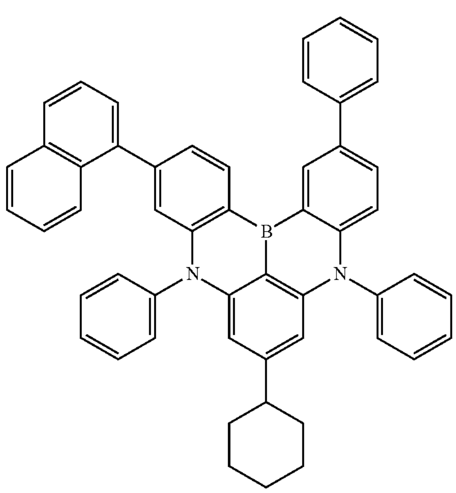
-continued
322
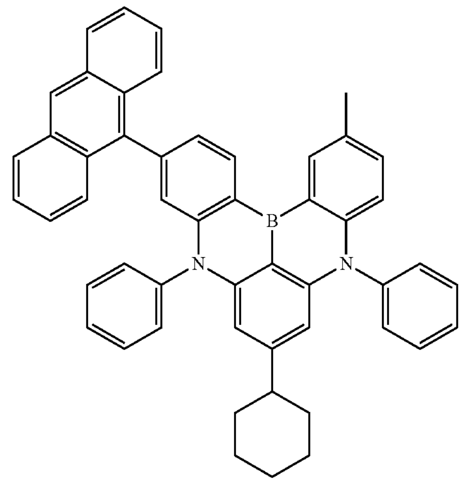
323
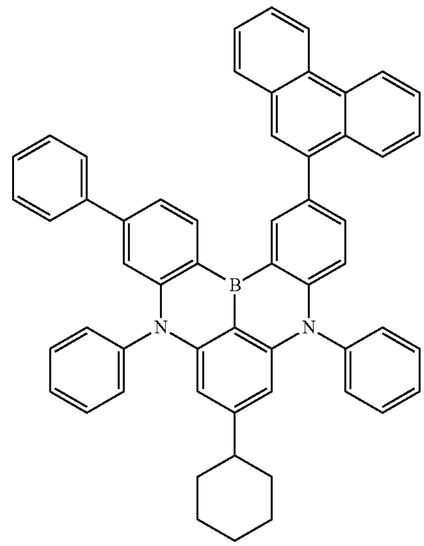
324
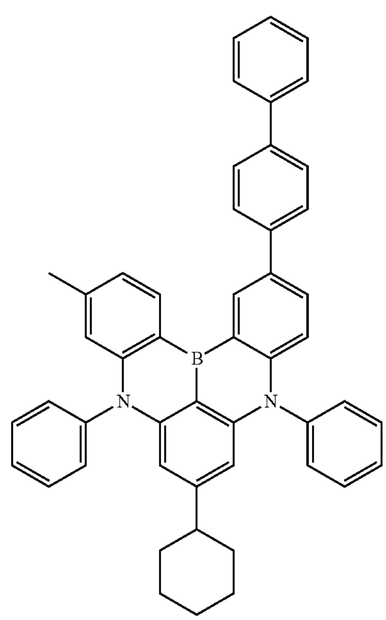

-continued
325
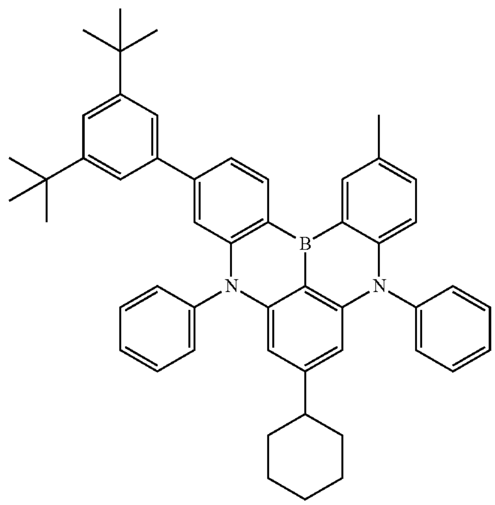
326
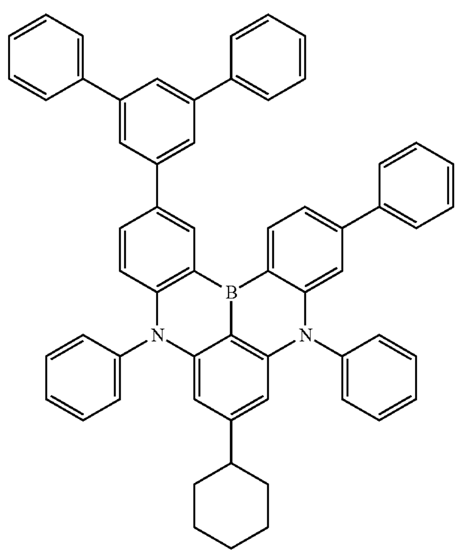
327
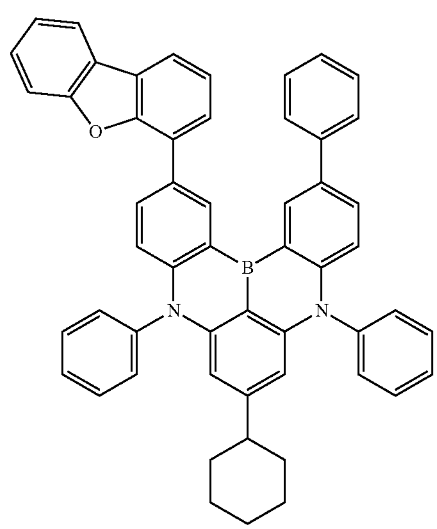
-continued
328
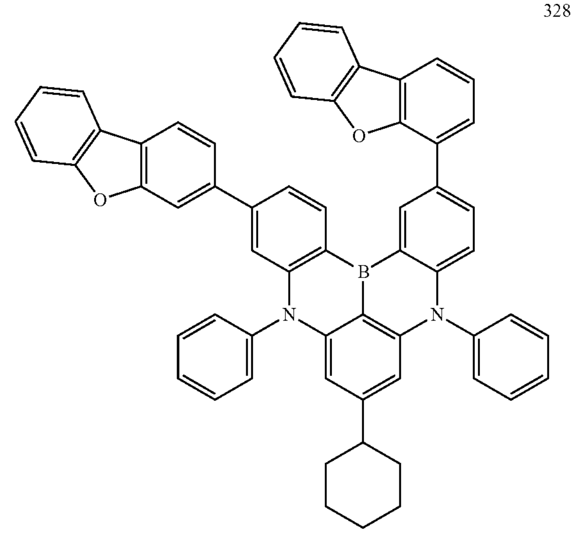
329
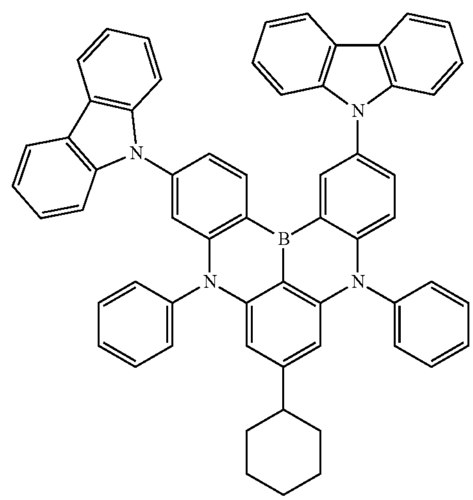
330
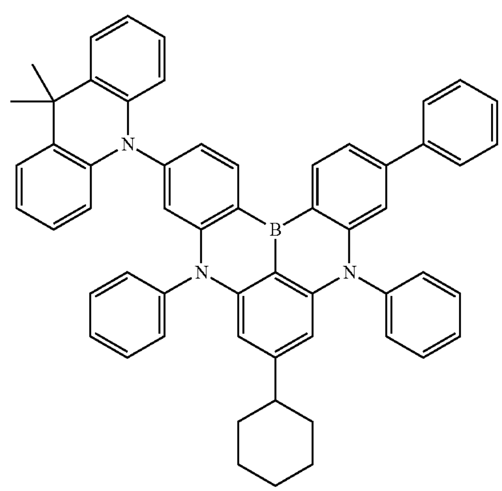

331
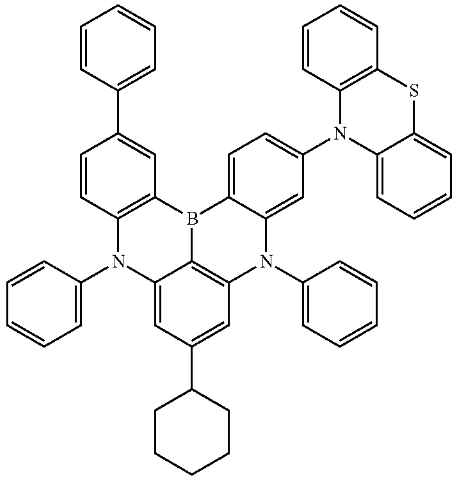
333
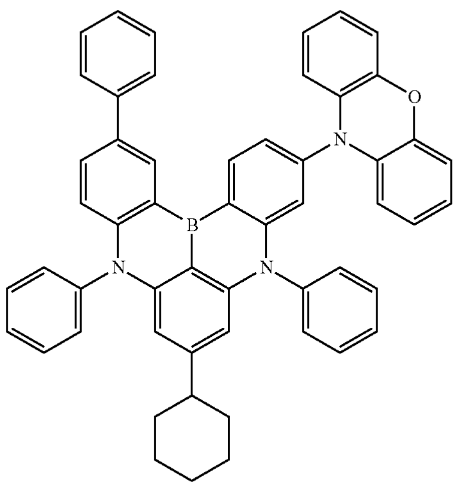
334
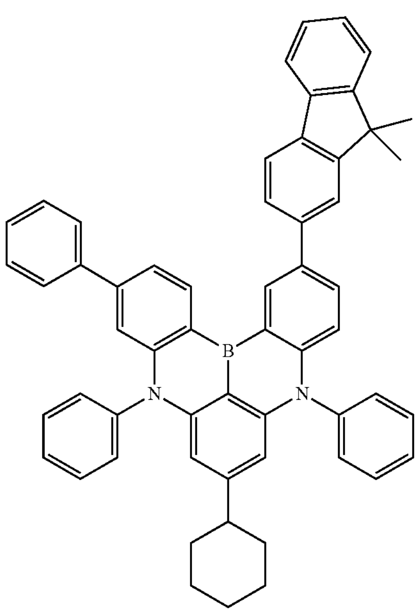
335
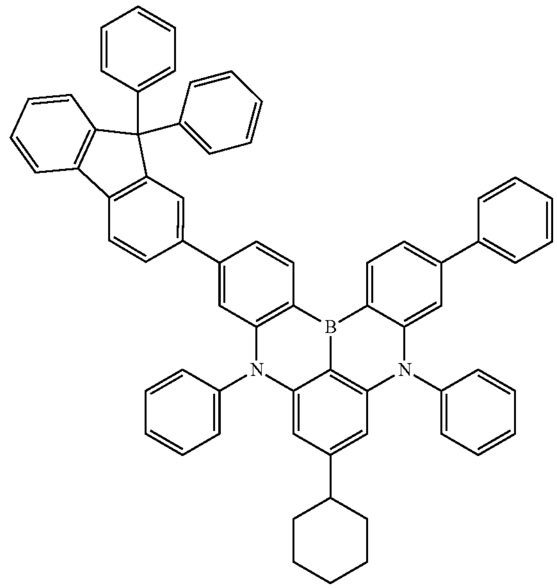
336
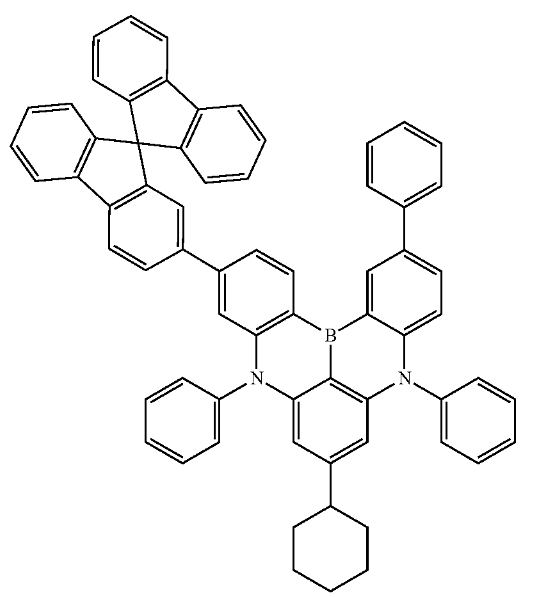

337
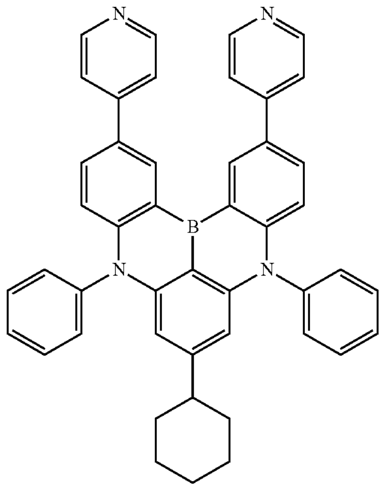
338
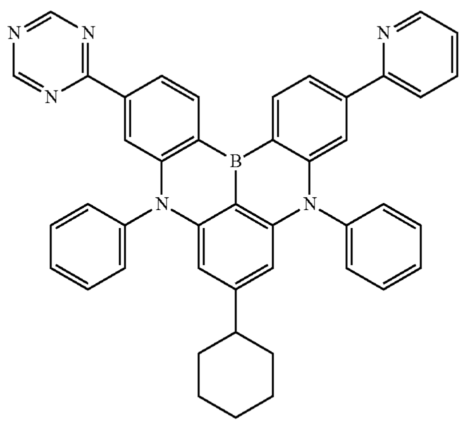
339
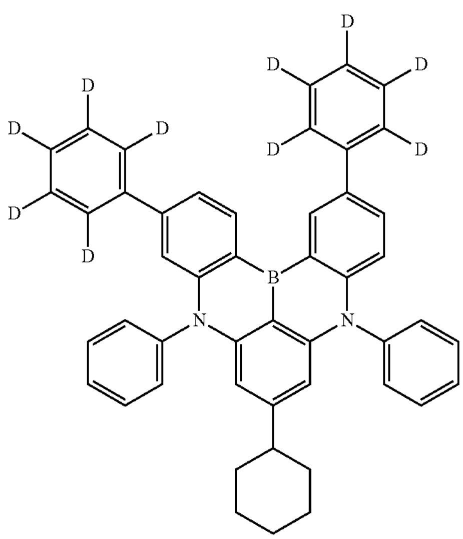
340
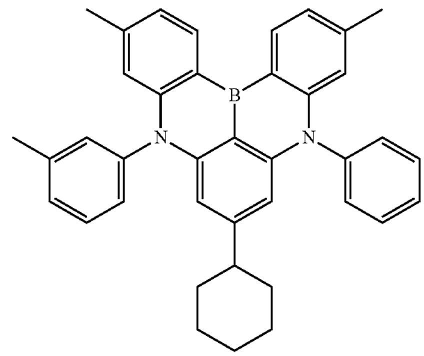
341
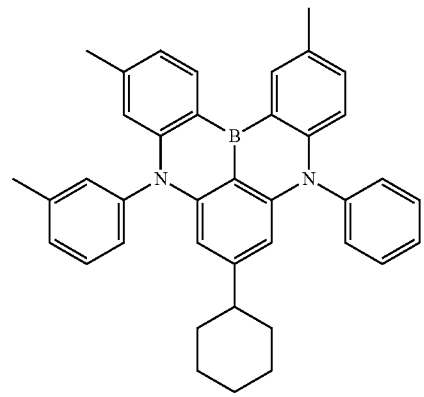
342
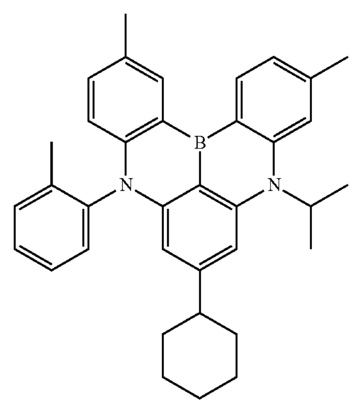
343
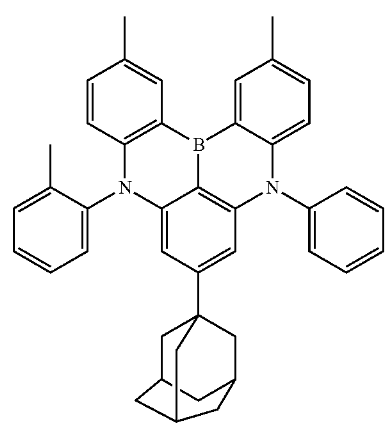

-continued
344
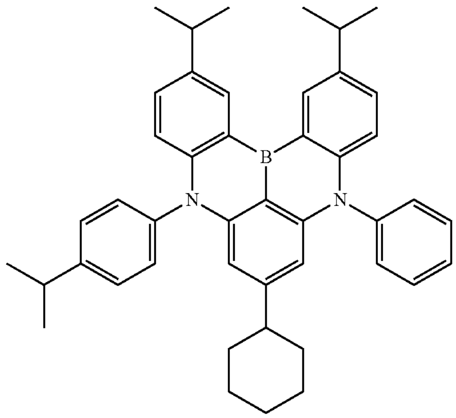
345
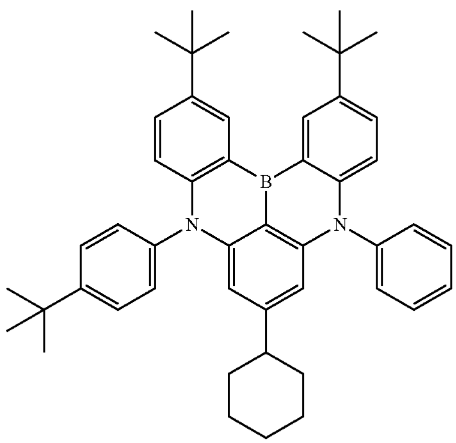
346
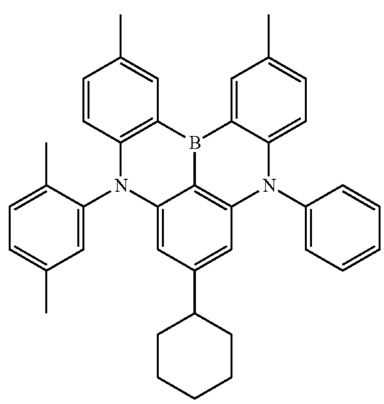
347
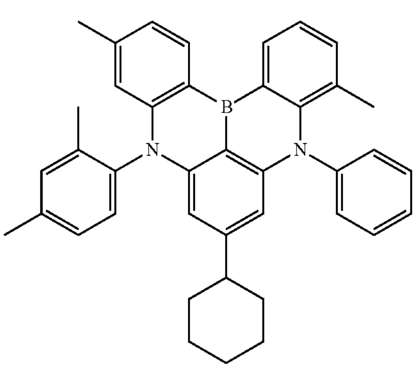
-continued
348
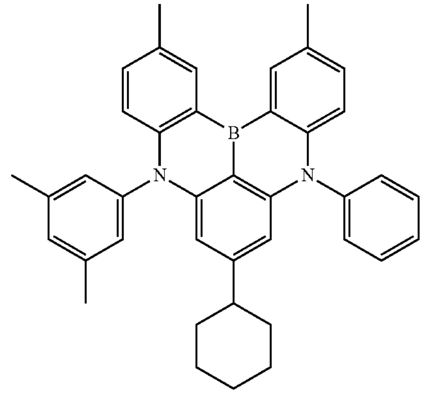
349
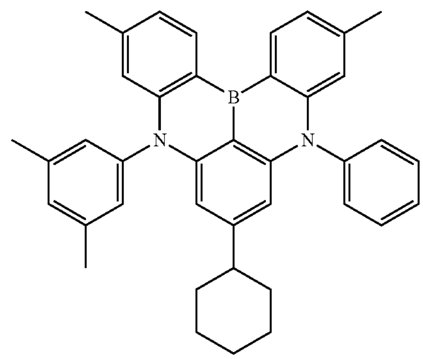
350
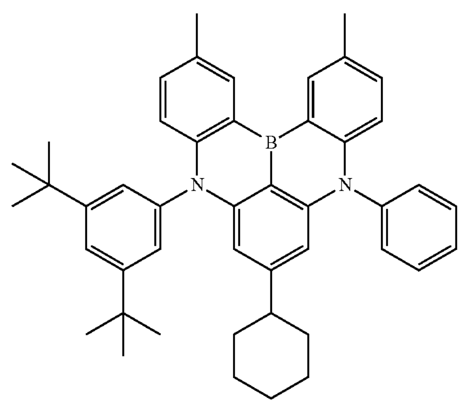
351
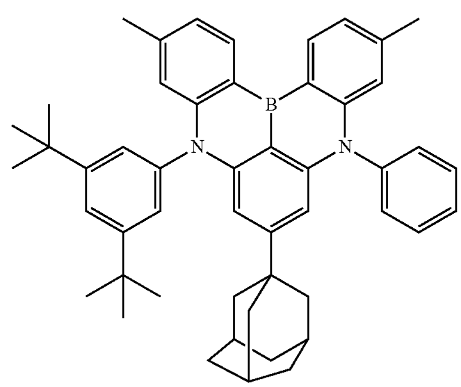

-continued
352
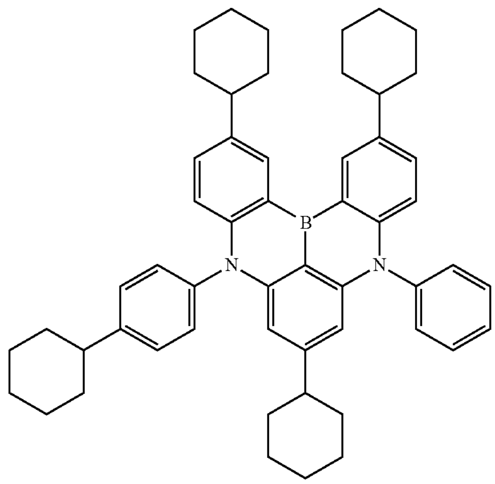
353
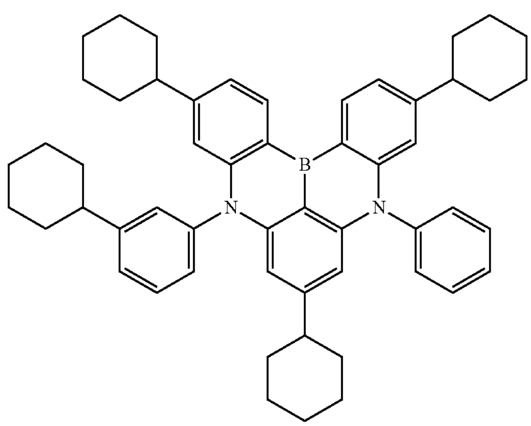
354
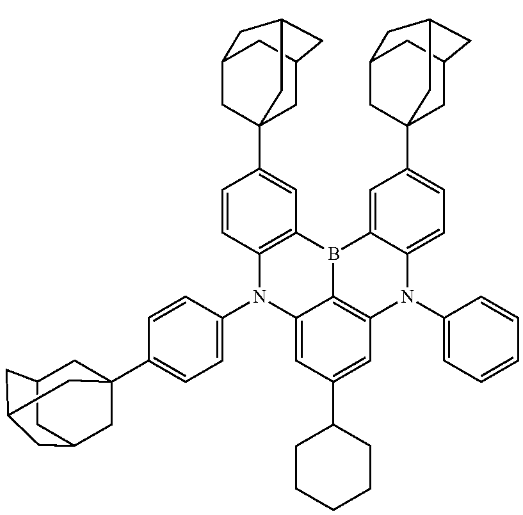
-continued
355
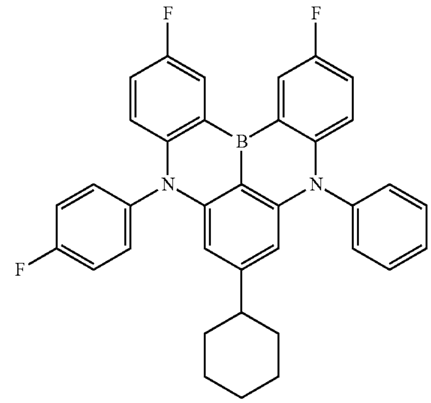
356
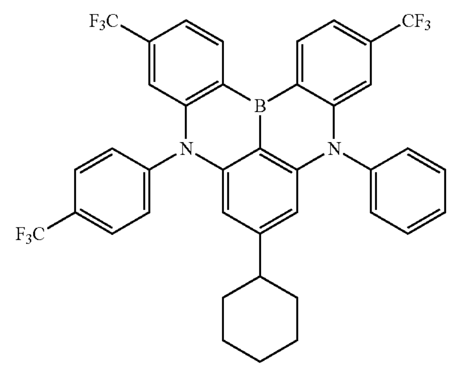
357
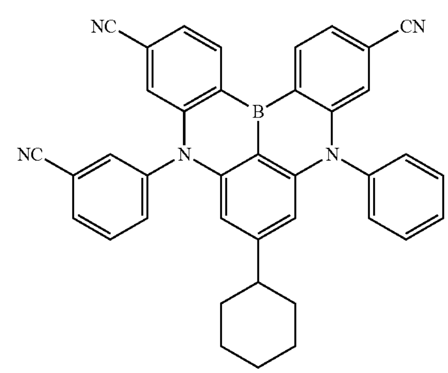
359
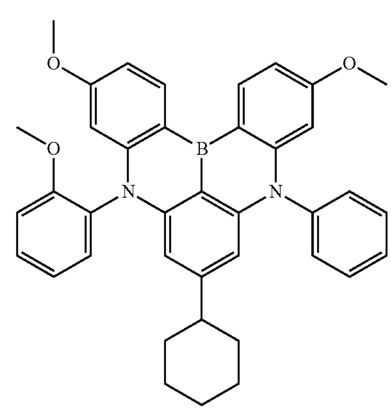

-continued
360
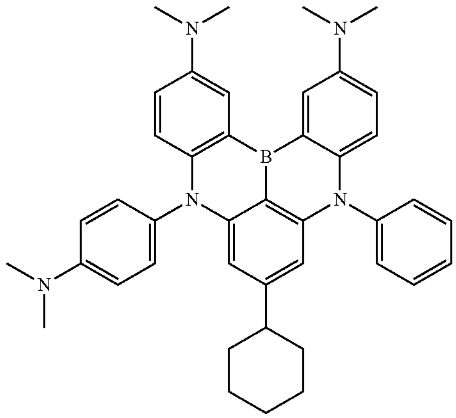
361
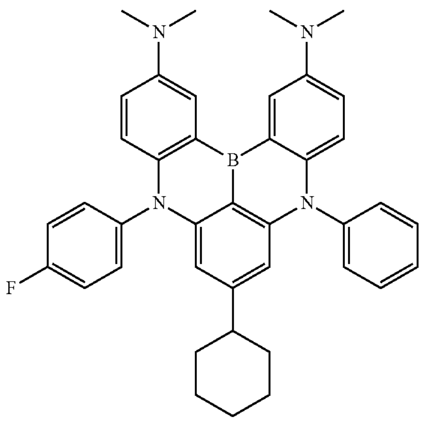
362
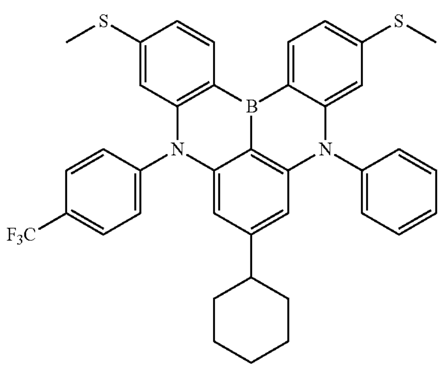
363
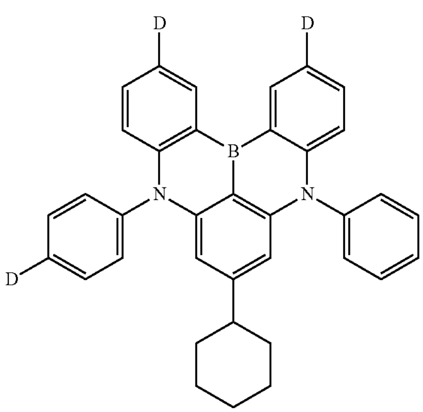
-continued
364
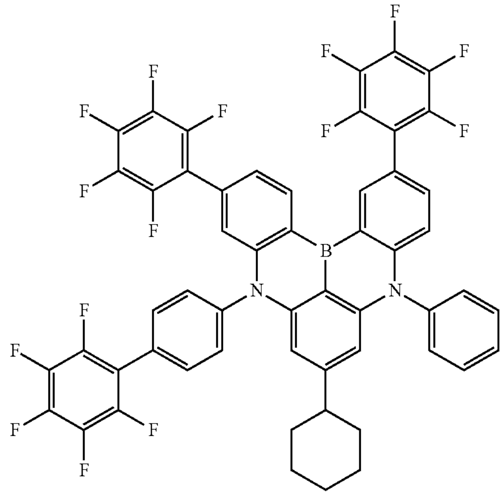
365
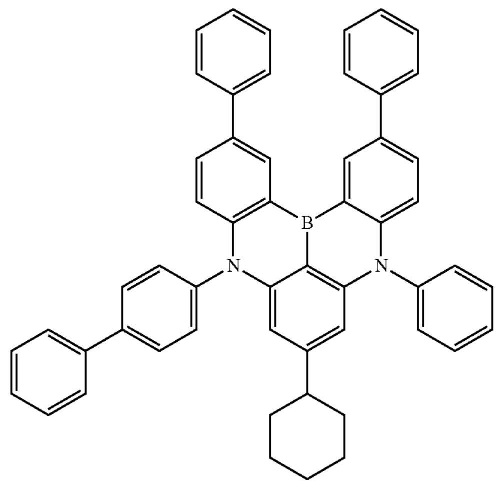
366
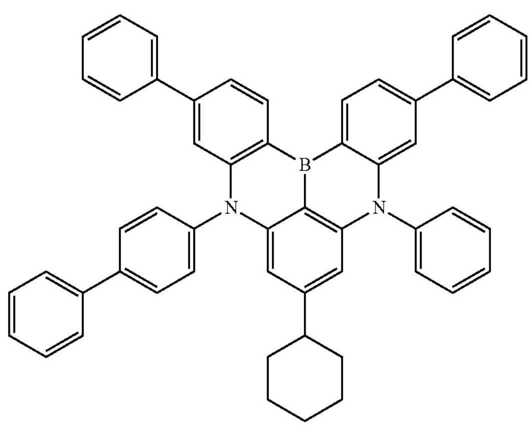

367
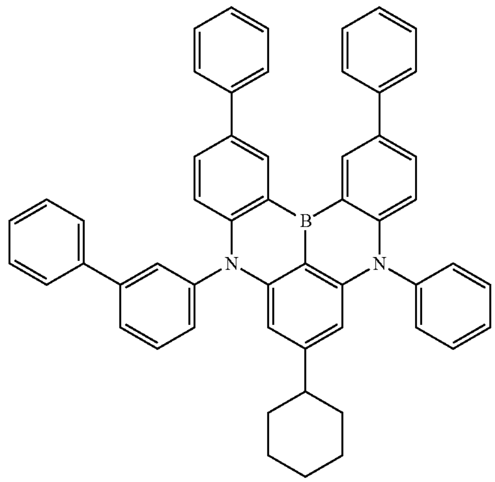
368
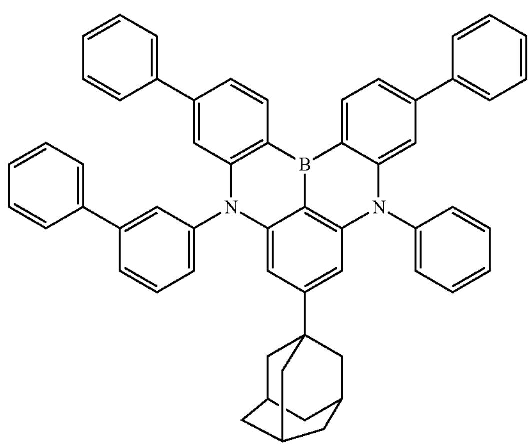
369
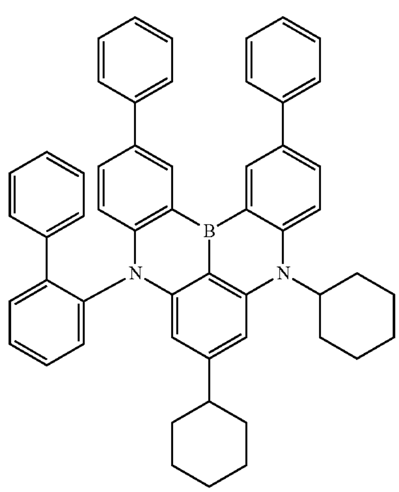
370
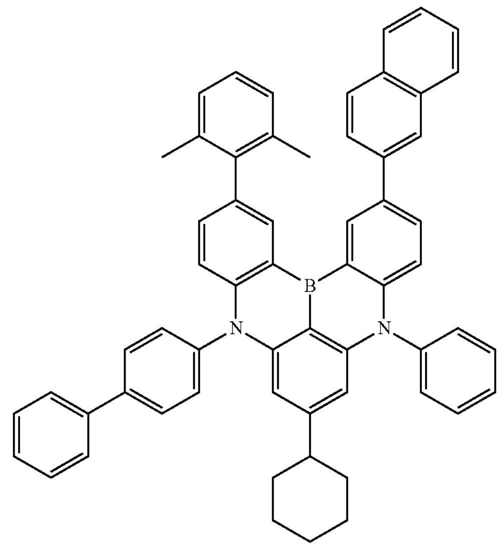
371
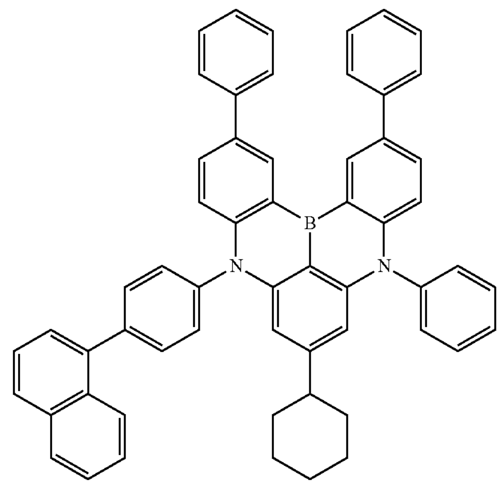
372
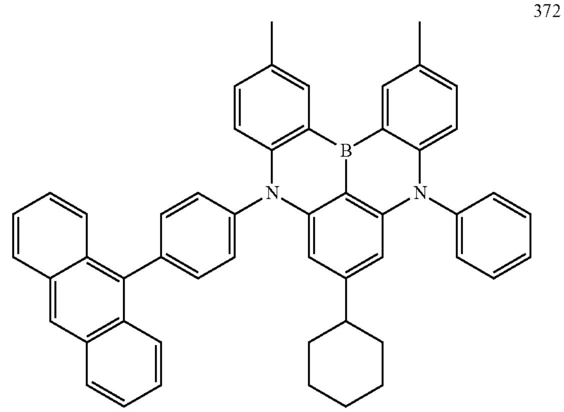

373
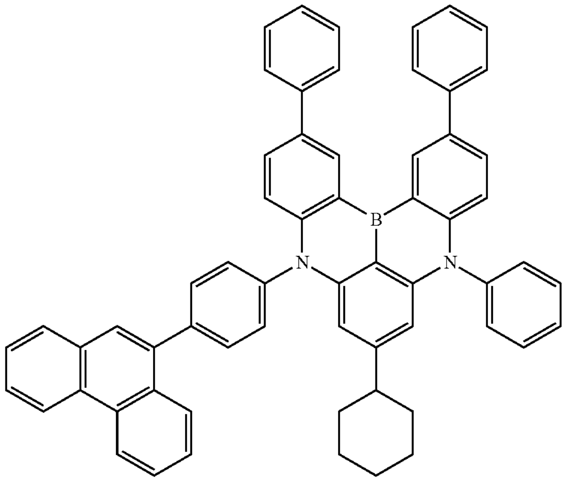
374
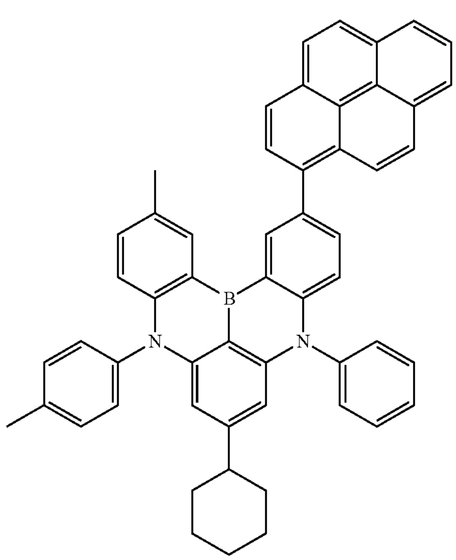
375
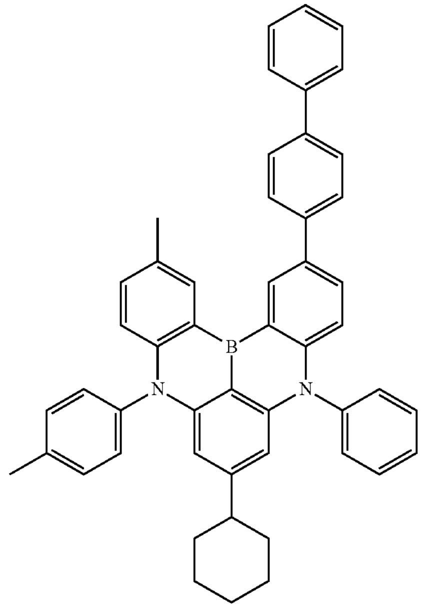
376
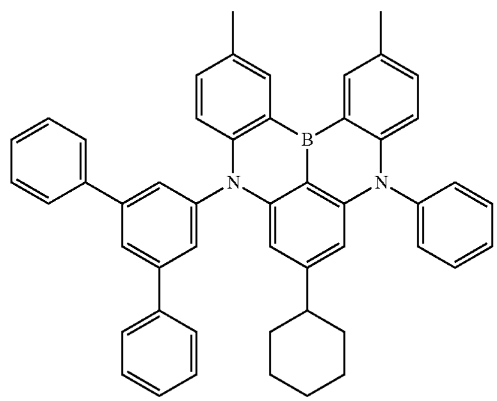
377
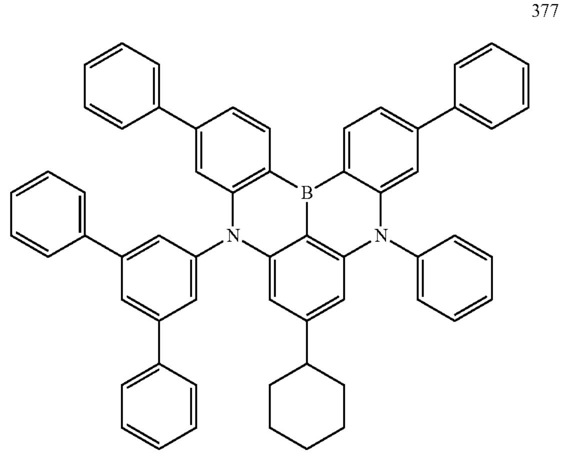

-continued
378
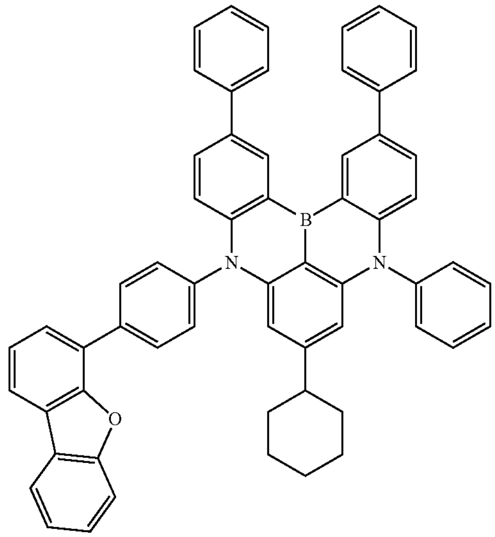
379
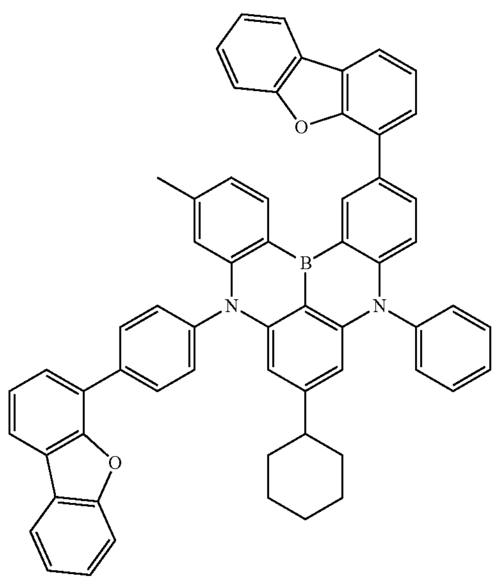
380
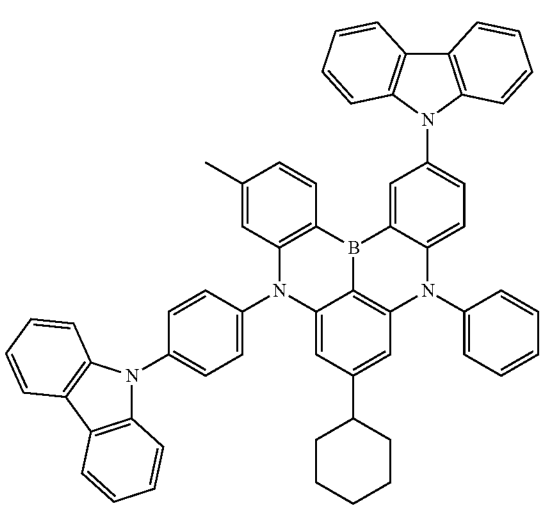
-continued
381
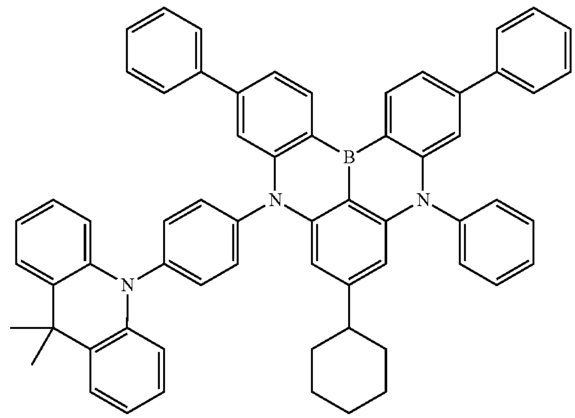
382
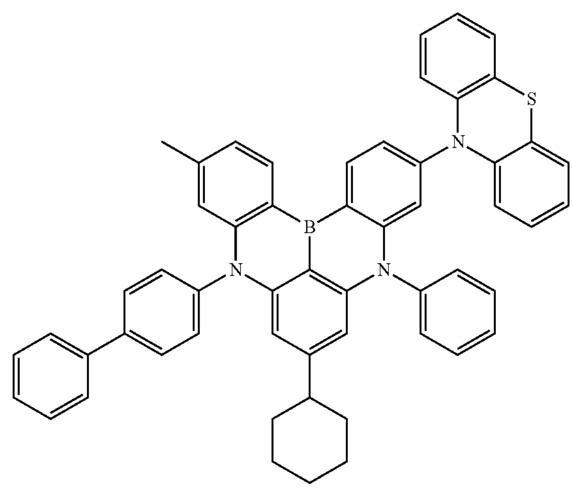
384
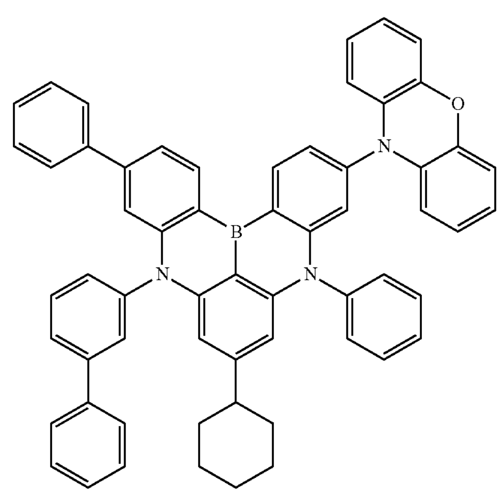

-continued
385
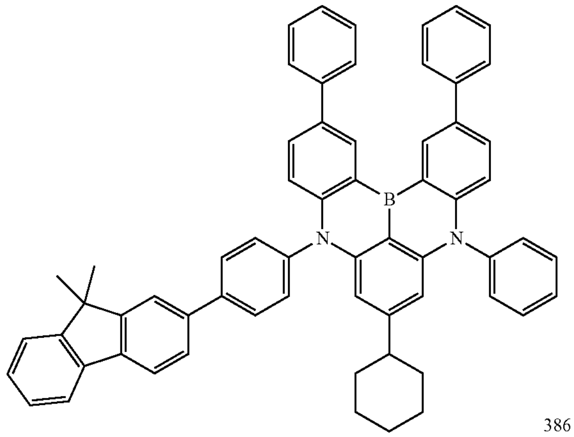
386
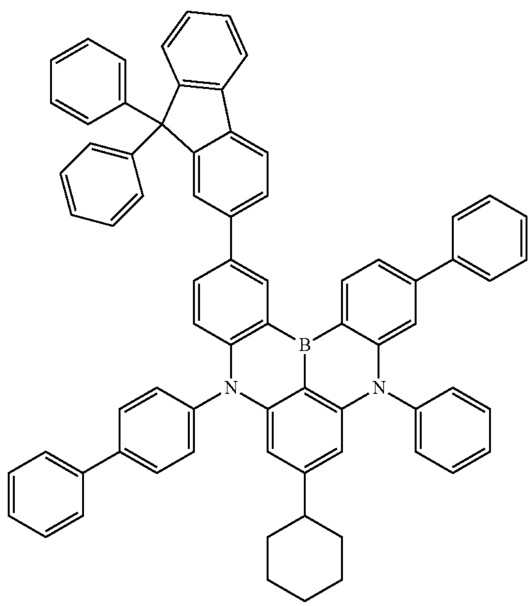
387
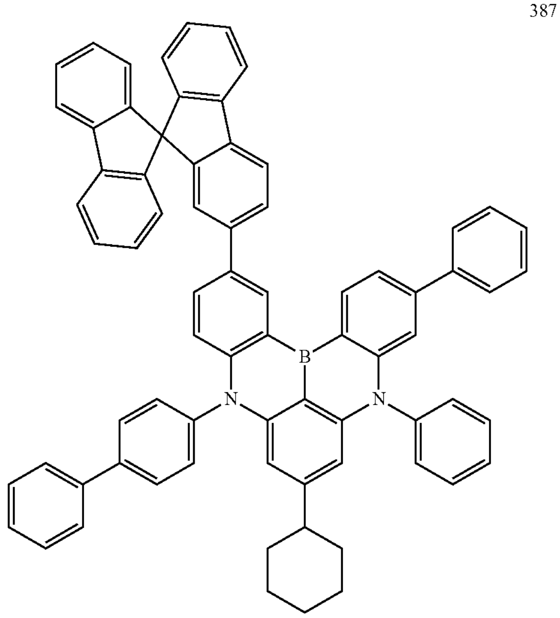
-continued
388
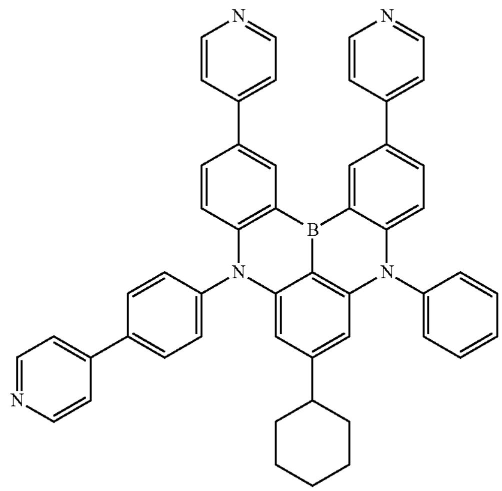
389
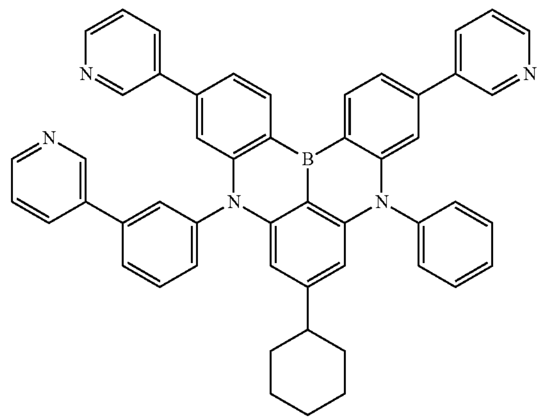
390
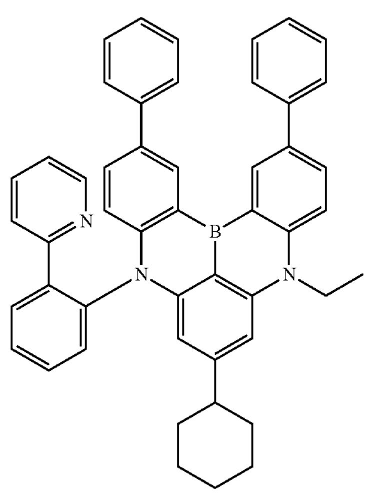

-continued
391
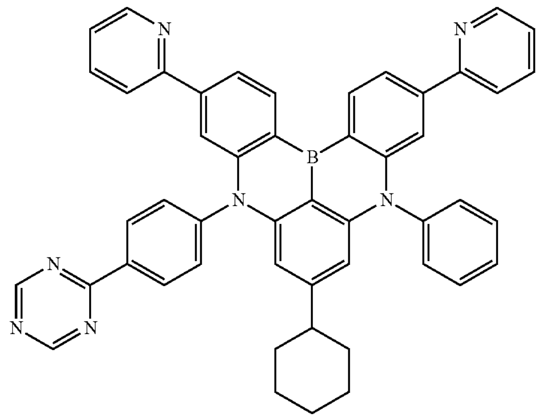
392
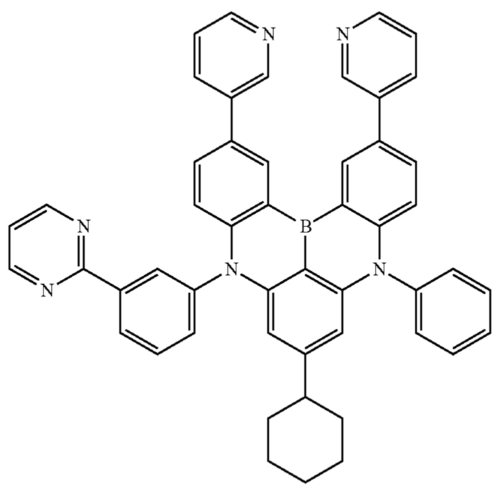
393
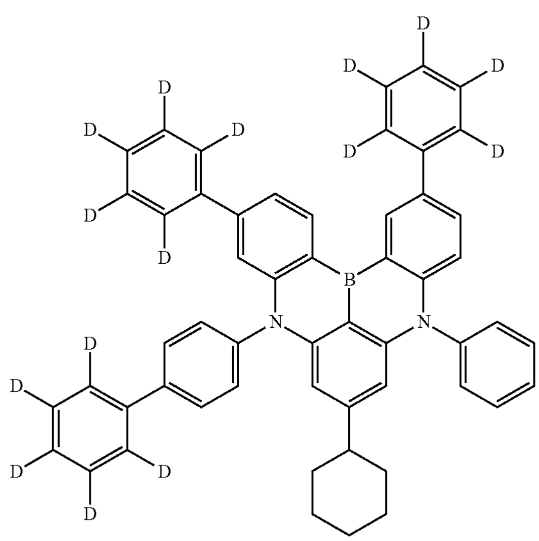
-continued
394
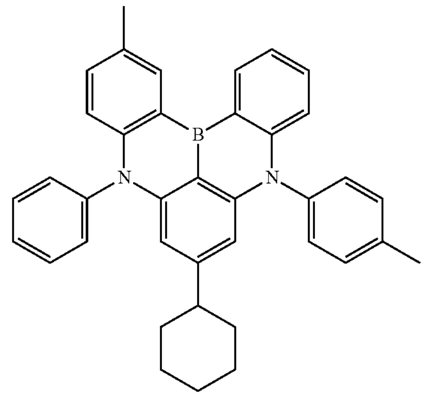
395
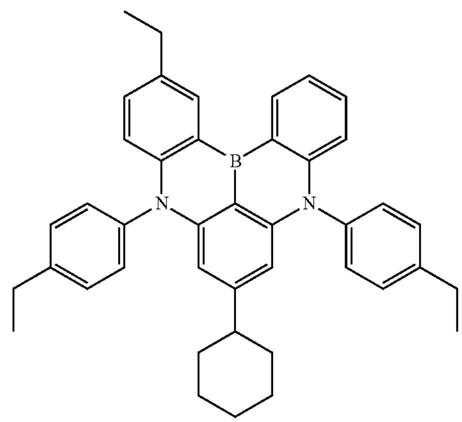
396
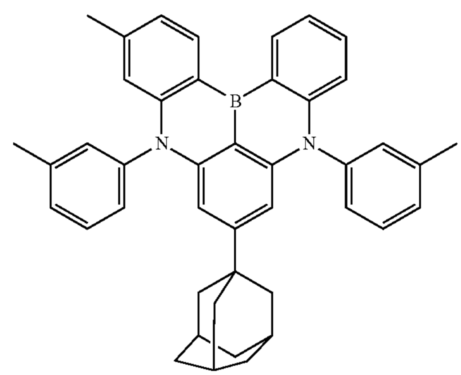
397
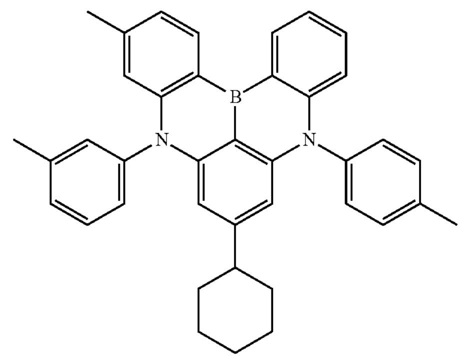

-continued
398
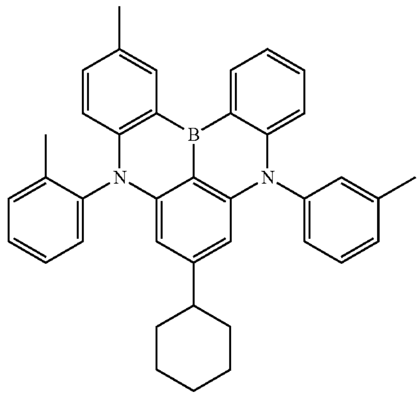
399
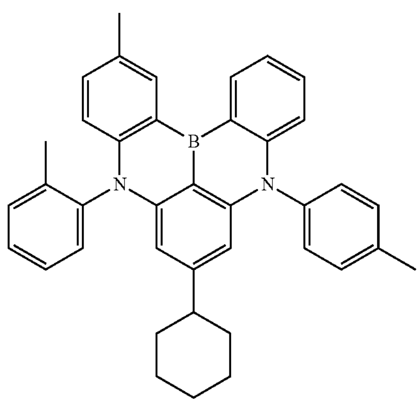
400
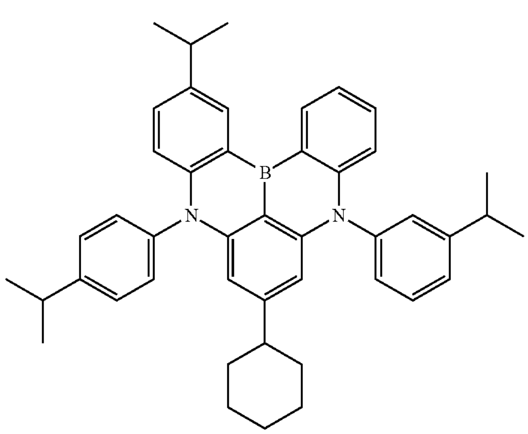
-continued
401
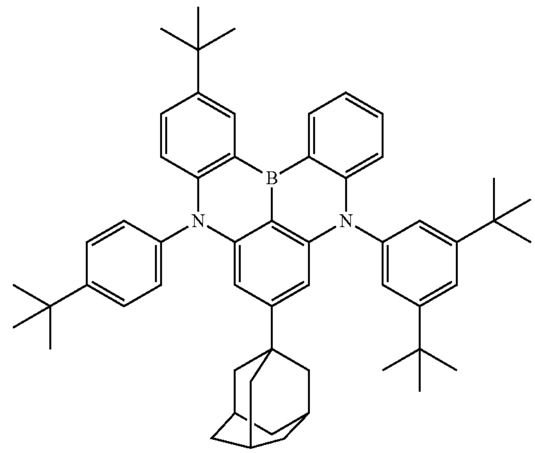
402
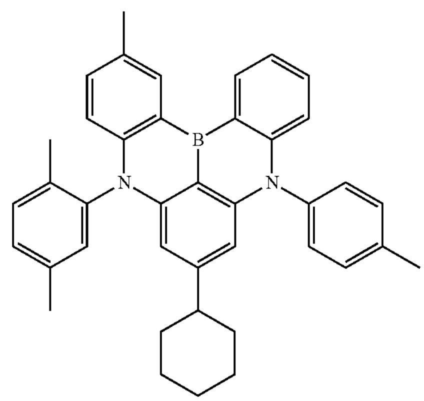
403
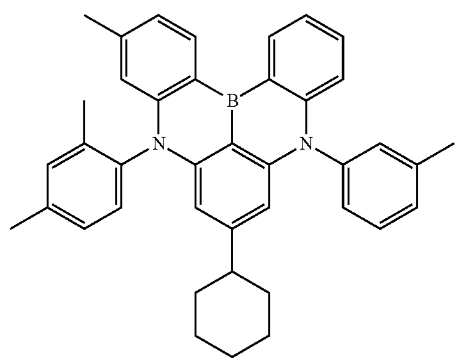
404
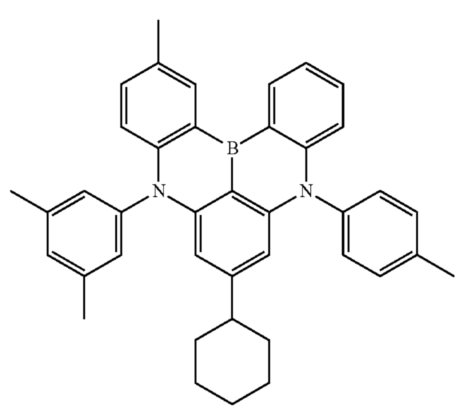

-continued
405
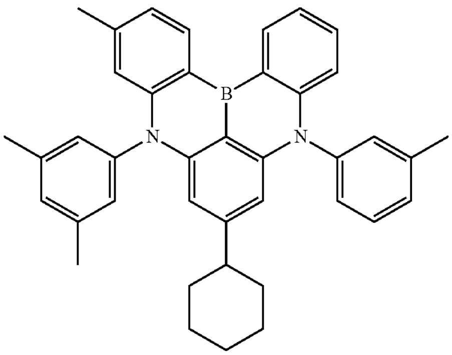
406
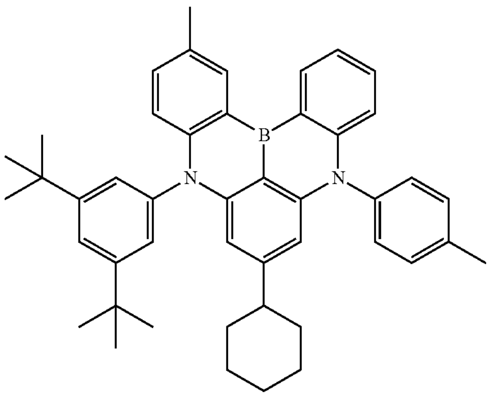
407
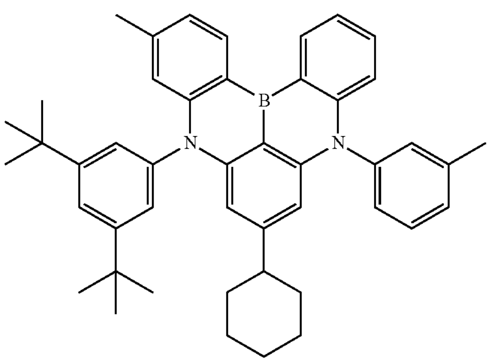
408
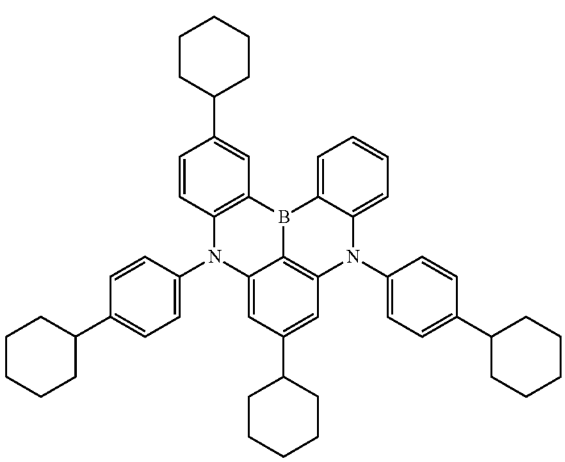
-continued
409
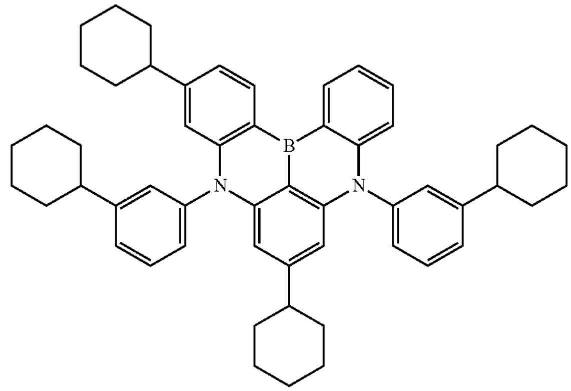
410
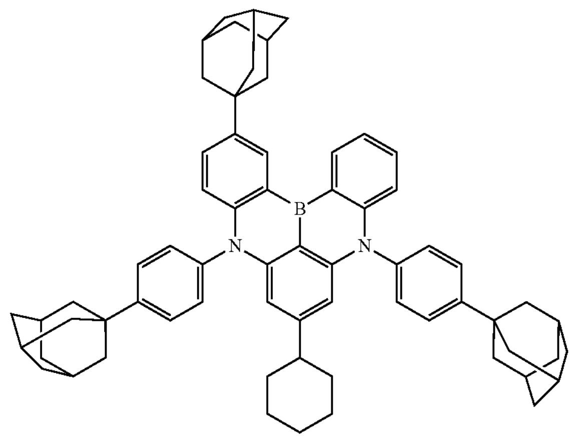
411
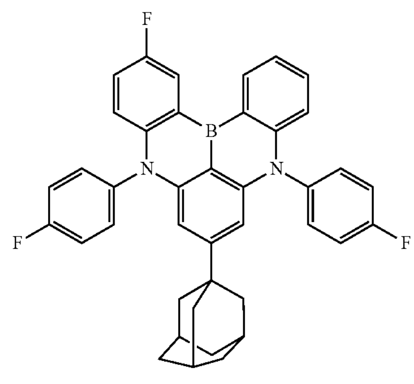
412
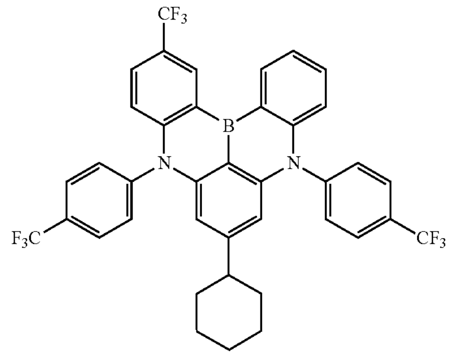

413
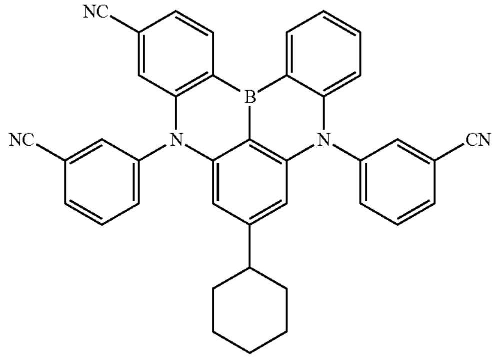
415
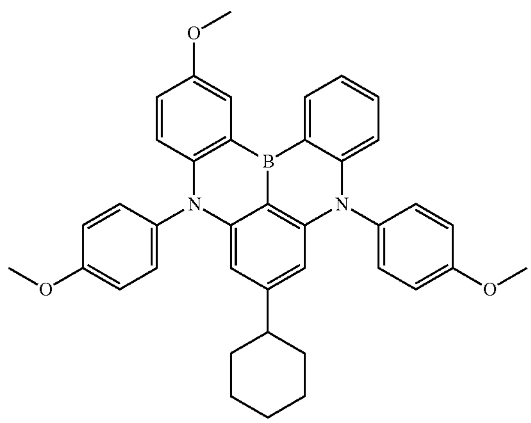
416
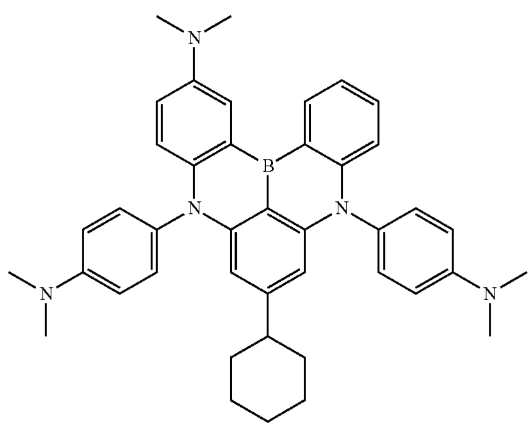
417
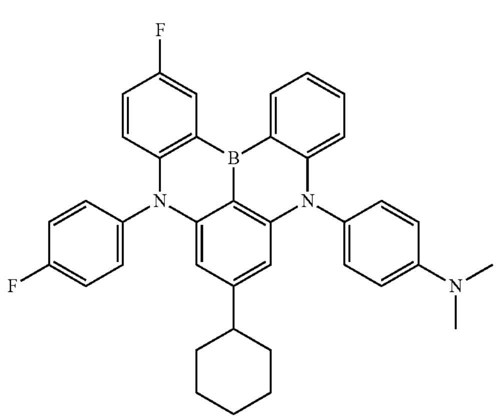
418
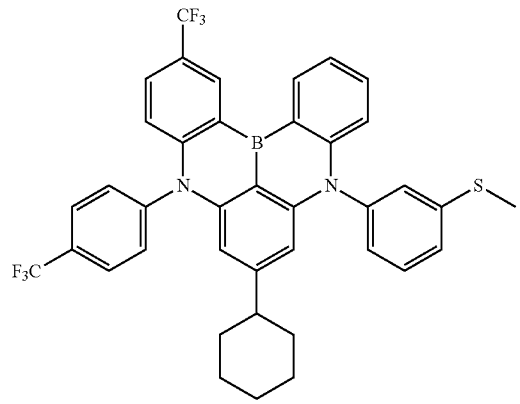
420
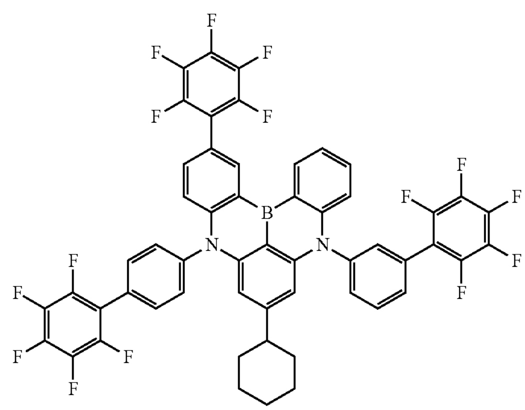
421
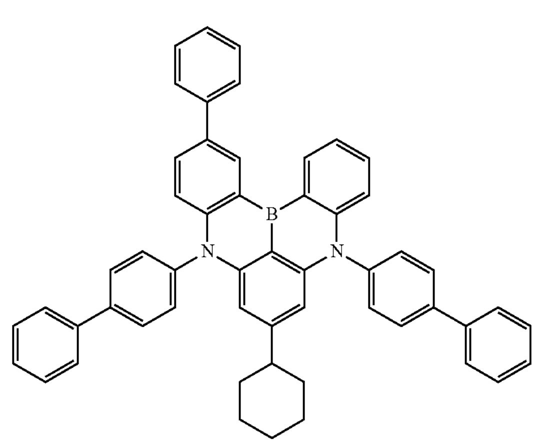

-continued
422
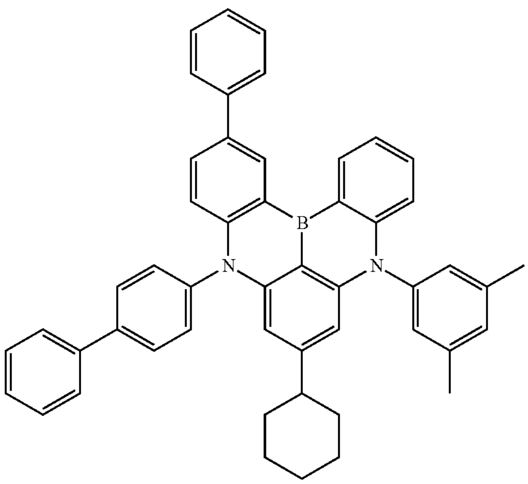
423
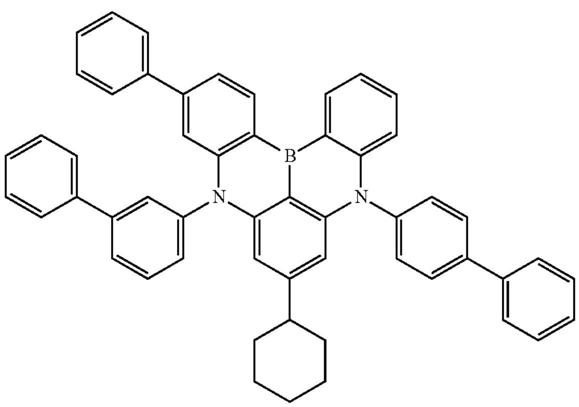
424
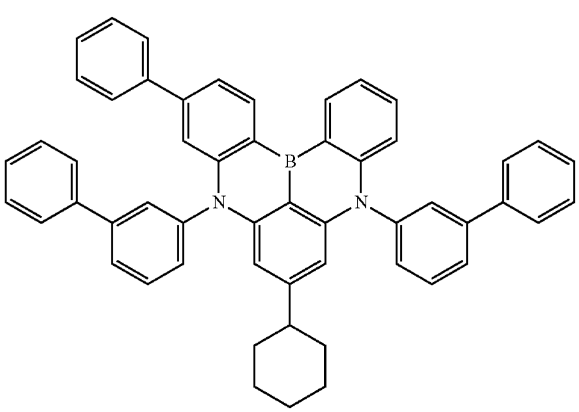
-continued
425
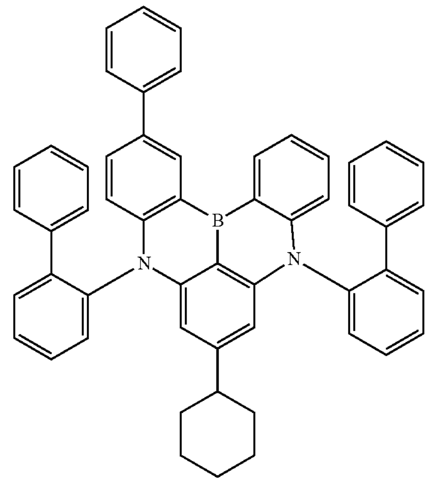
426
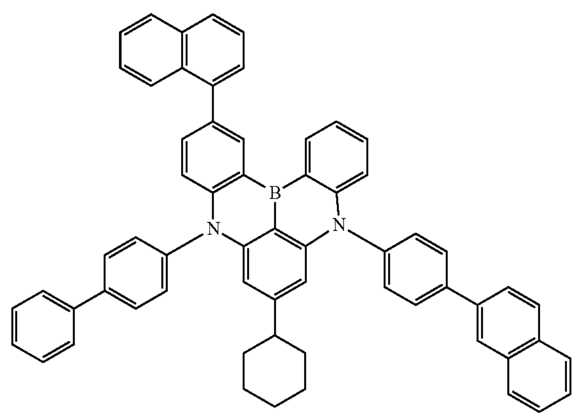
427
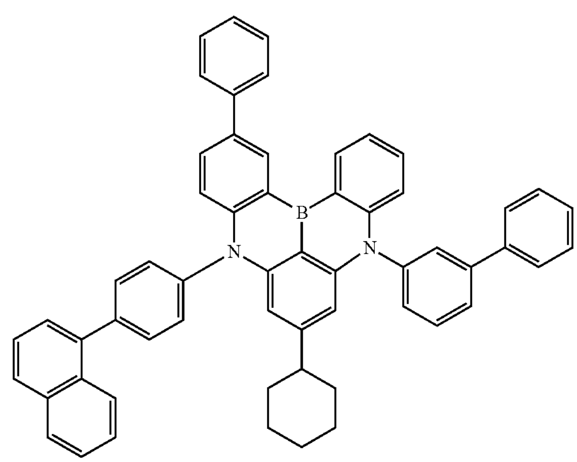

-continued
428
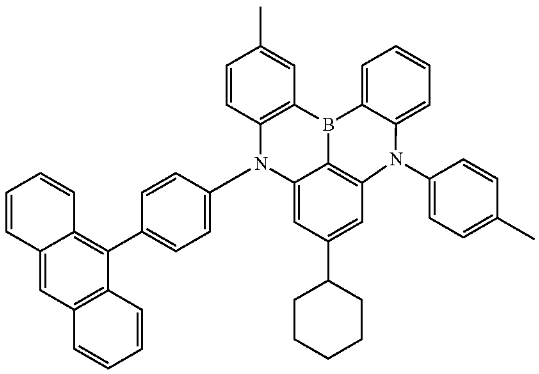
429
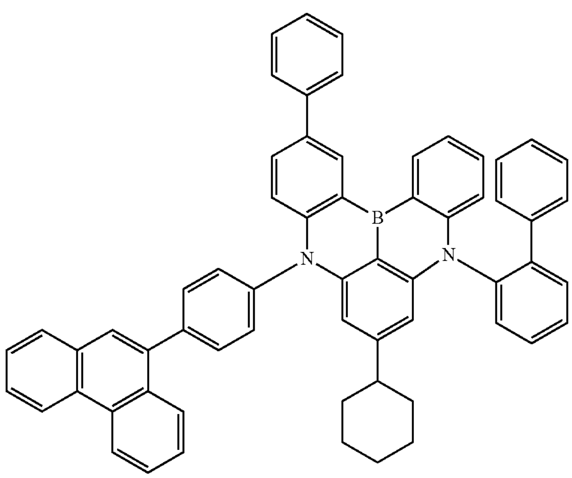
430
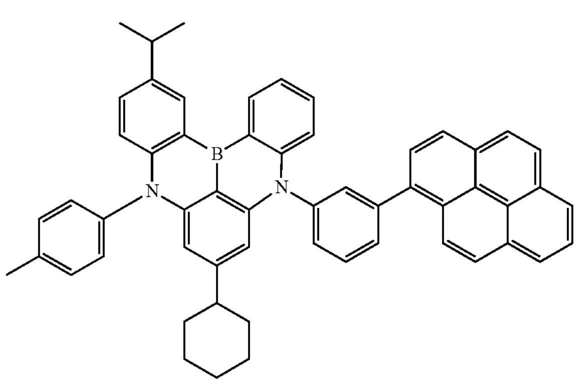
-continued
431
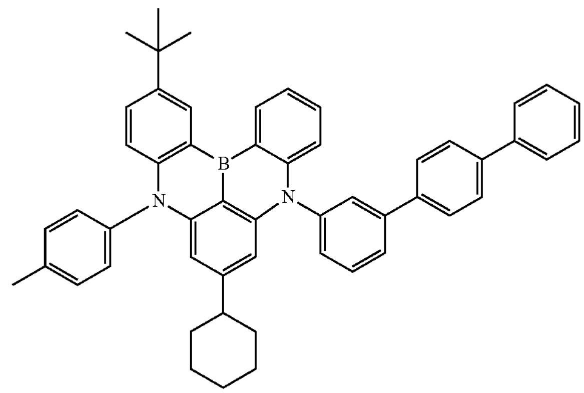
432
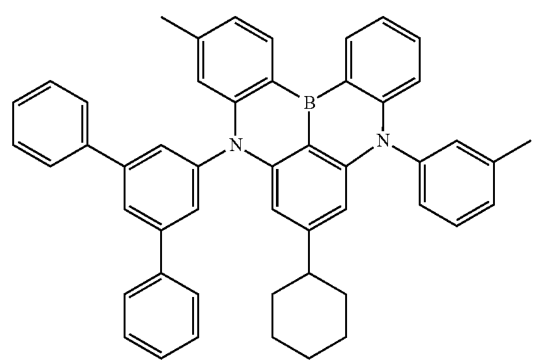
433
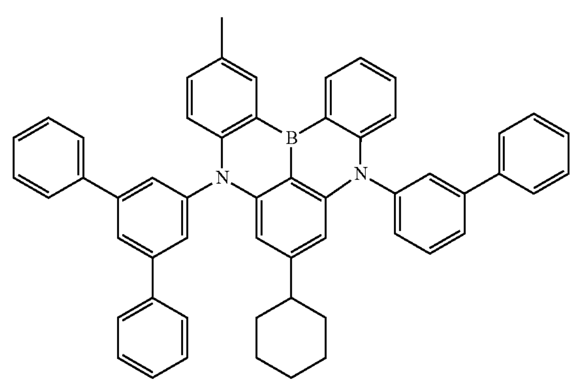

-continued
434
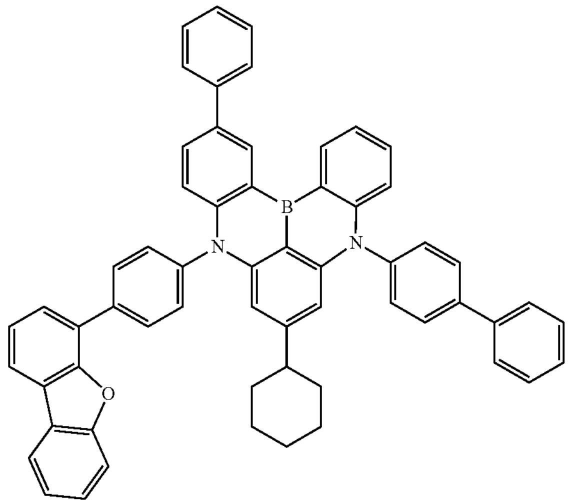
435
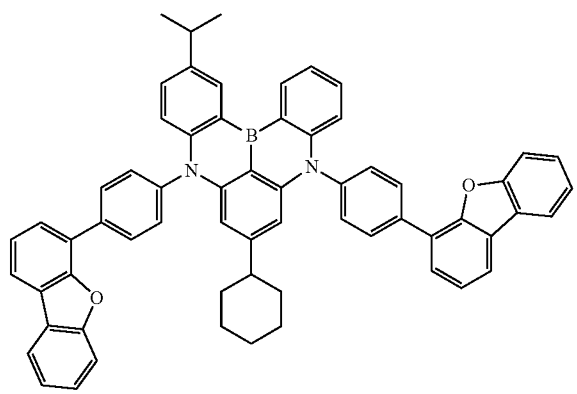
436
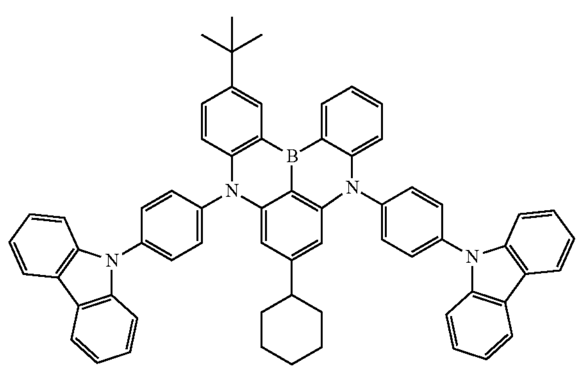
-continued
437
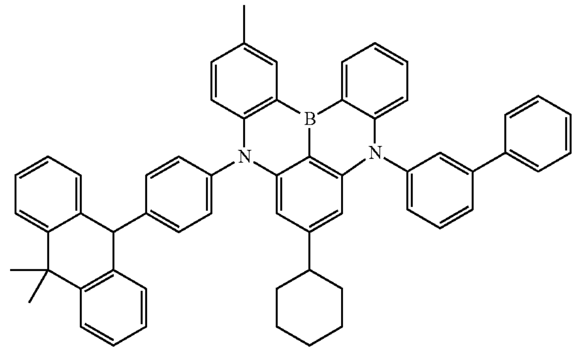
438
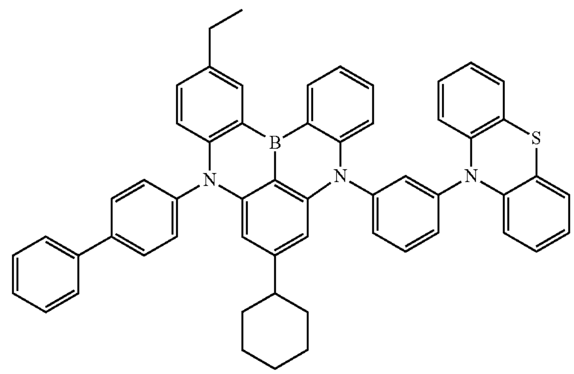
440
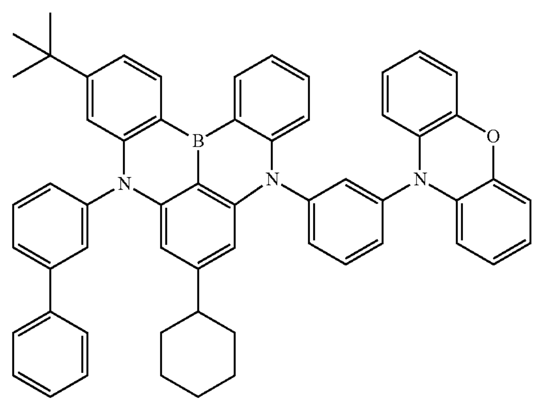
441
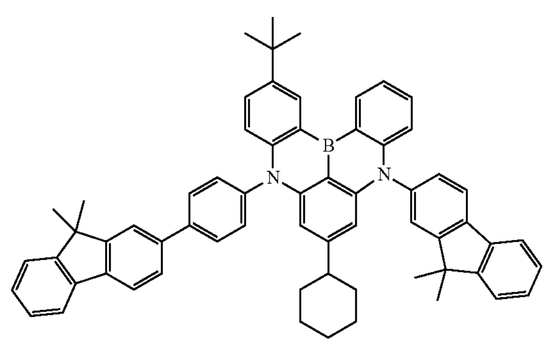

-continued
442
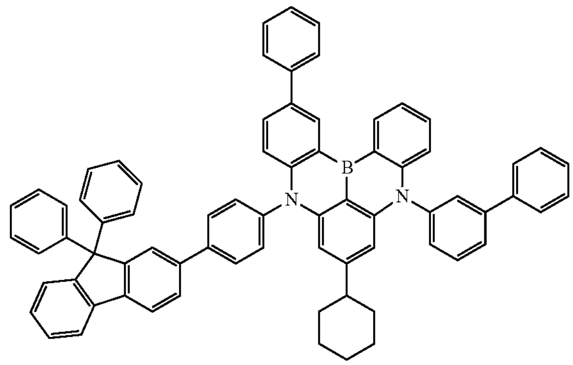
443
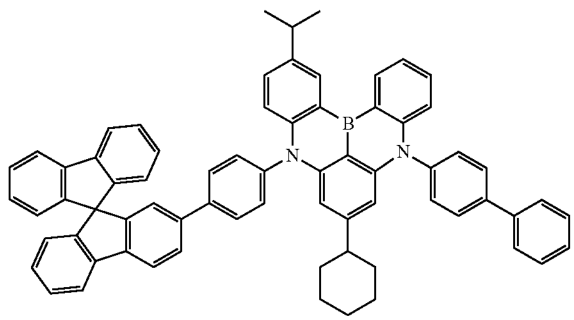
444
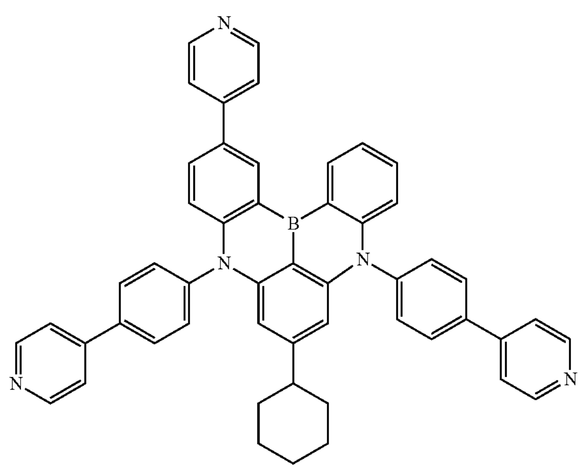
445
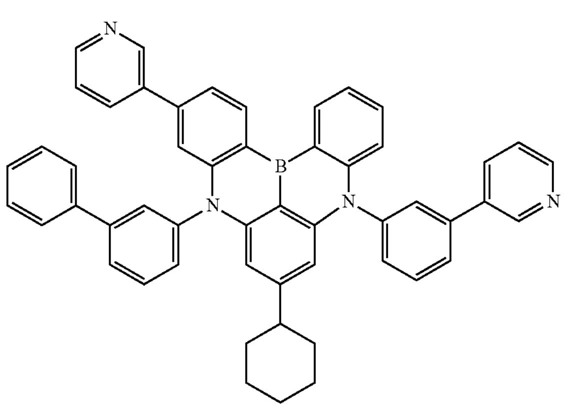
-continued
446
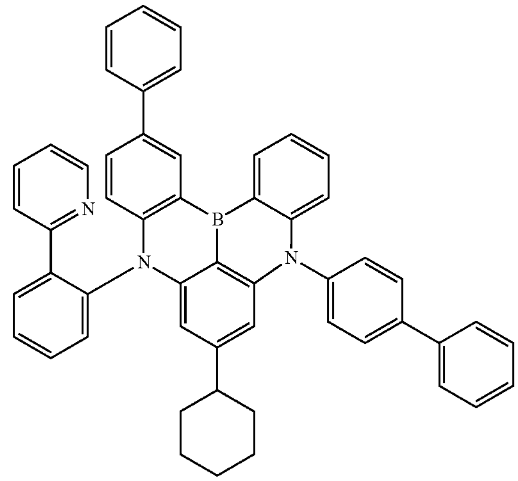
447
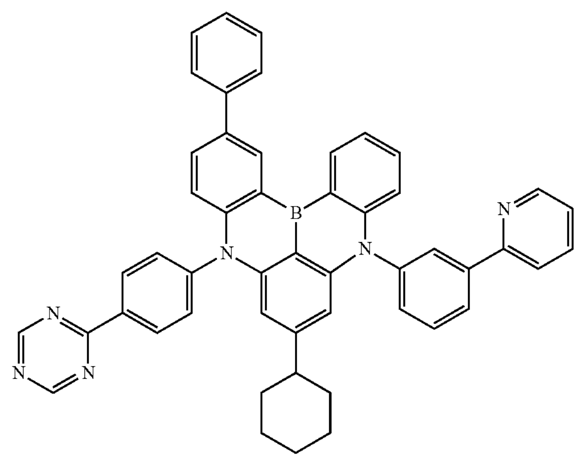
448
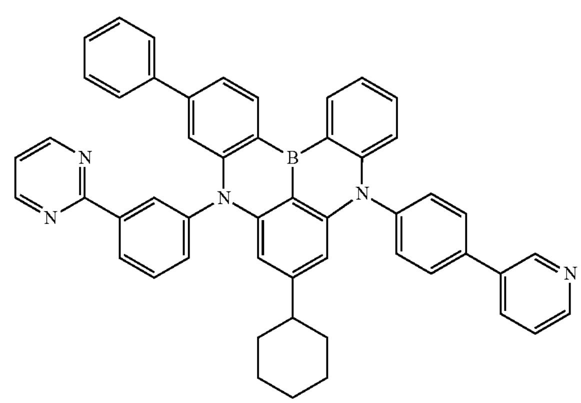

-continued
449
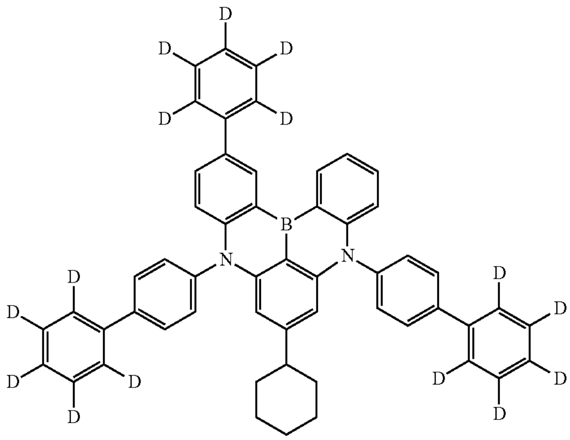
450
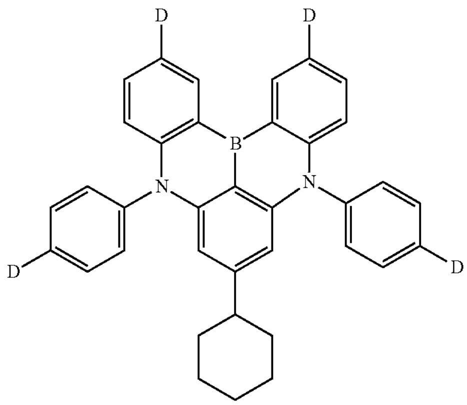
451
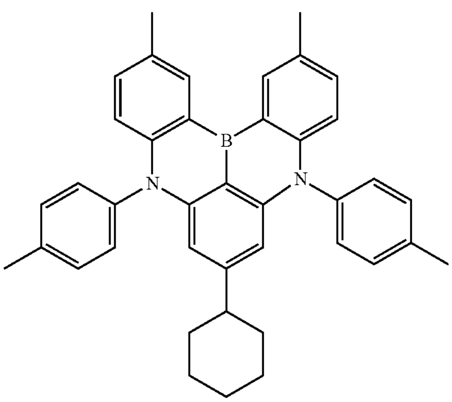
452
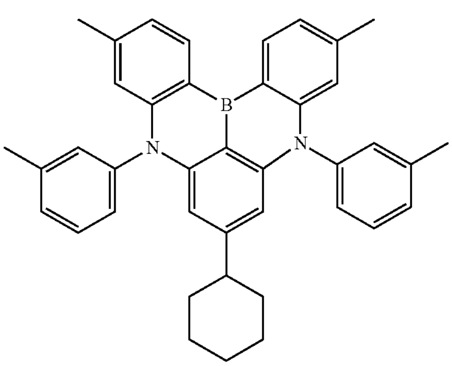
-continued
453
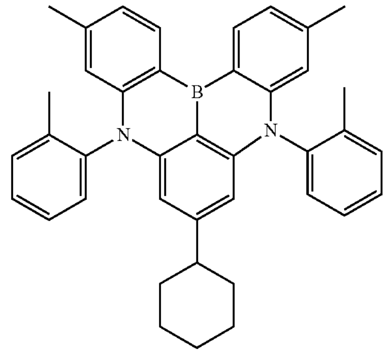
454
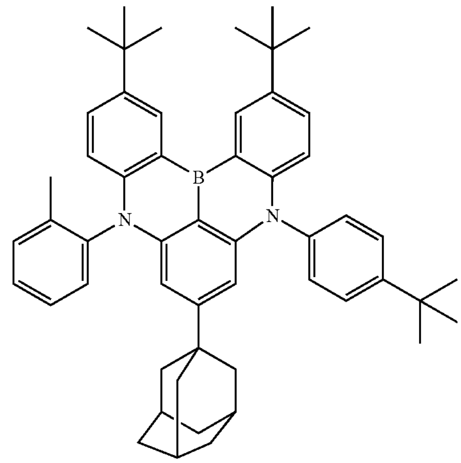
455
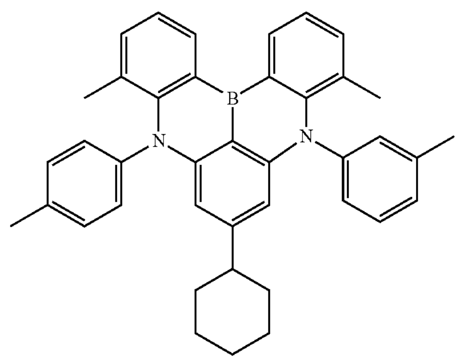
456
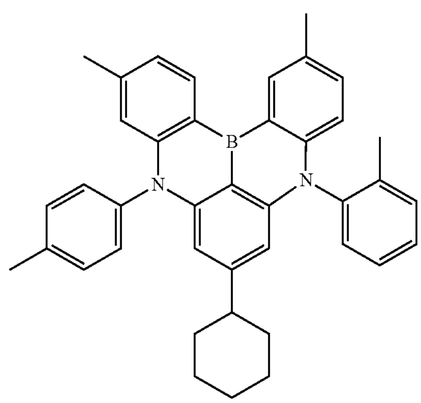

-continued
457
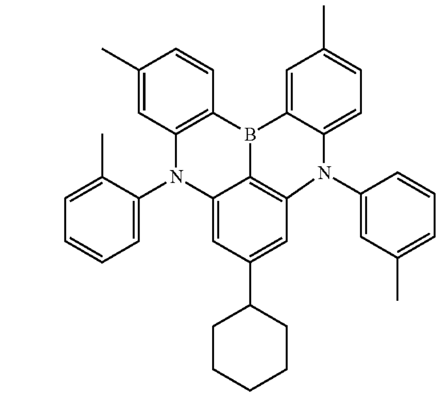
458
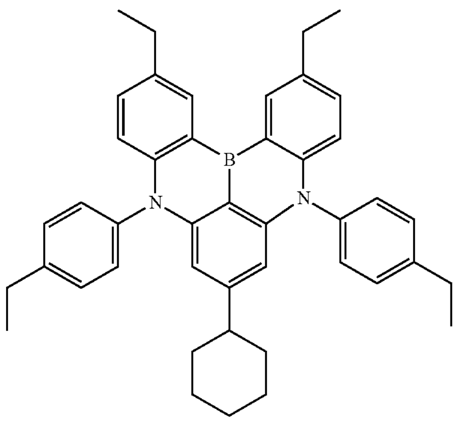
459
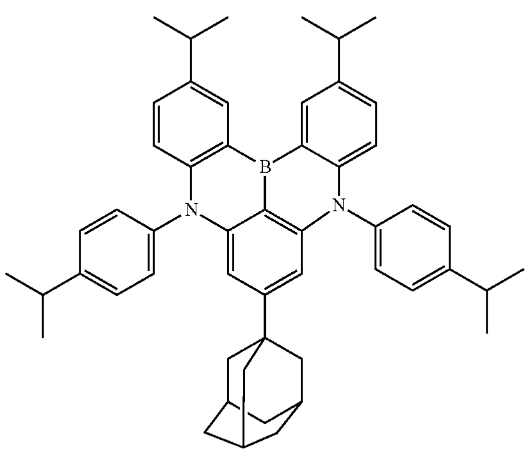
-continued
460
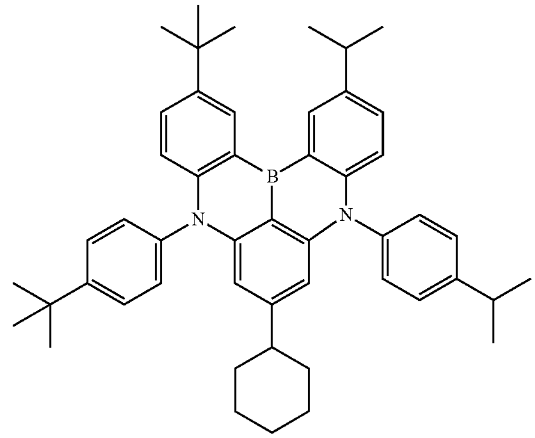
461
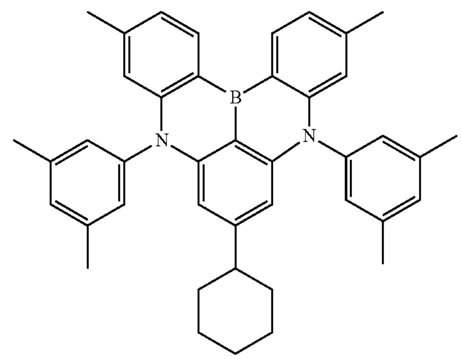
462
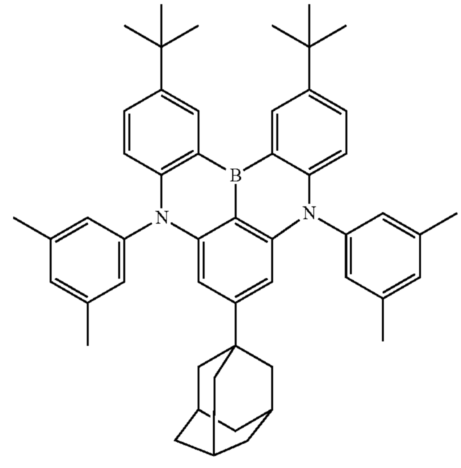

-continued
463
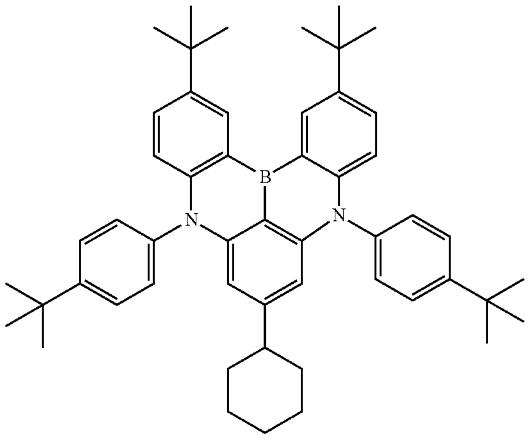
464
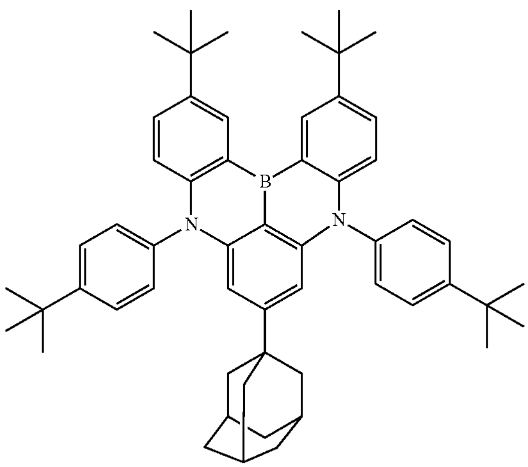
465
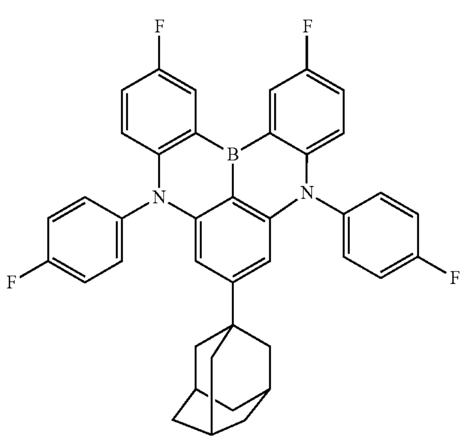
-continued
466
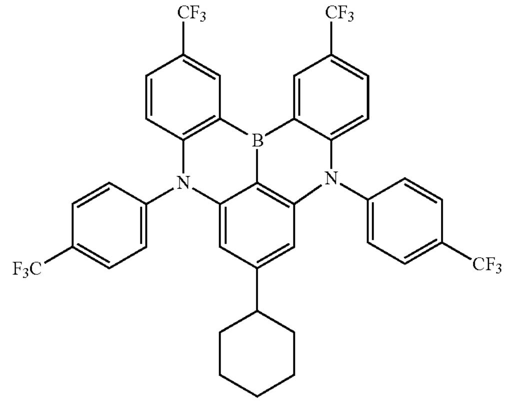
467
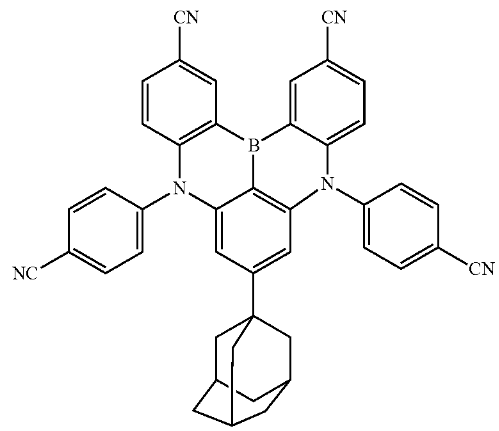
469
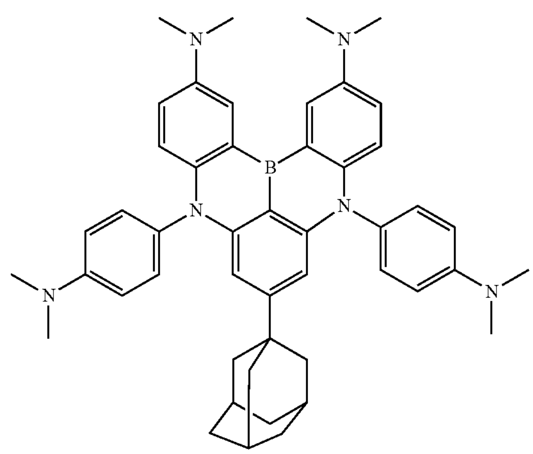

-continued
470
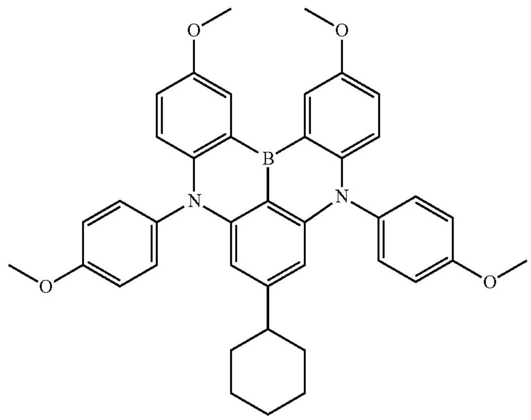
471
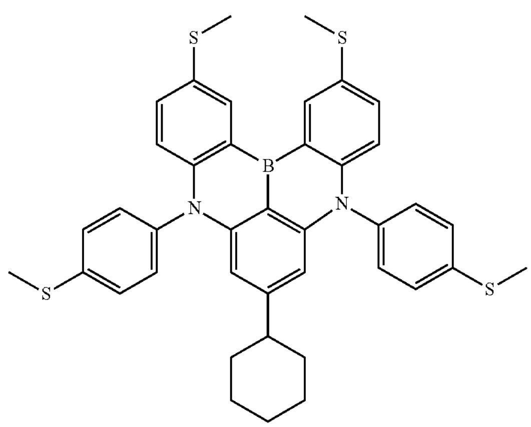
473
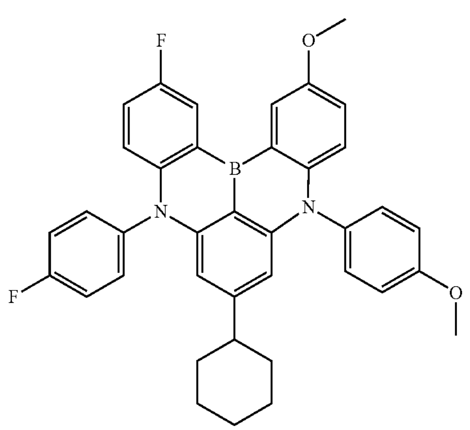
-continued
474
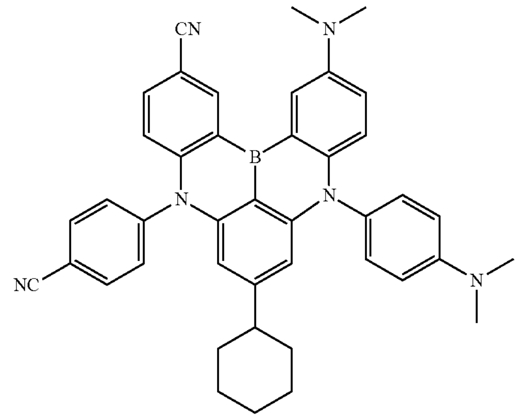
475
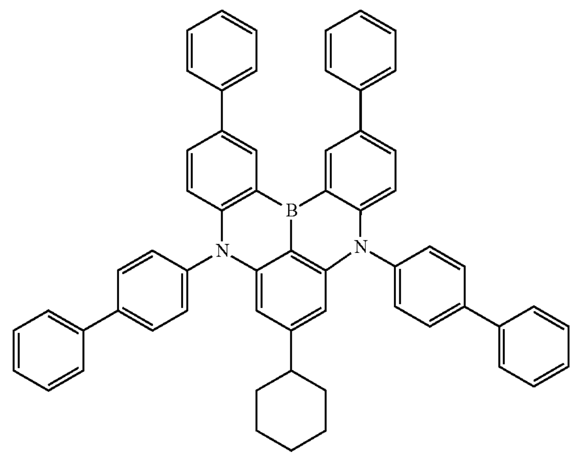
476
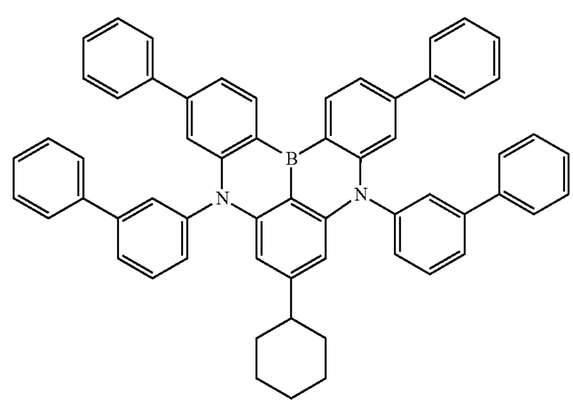

477
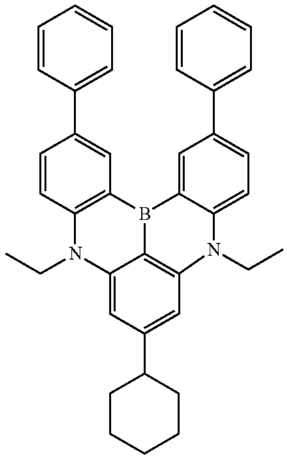
478
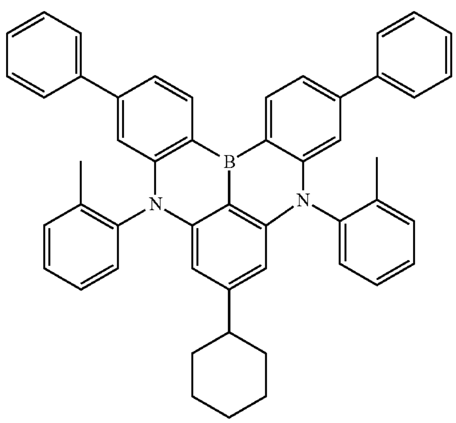
479
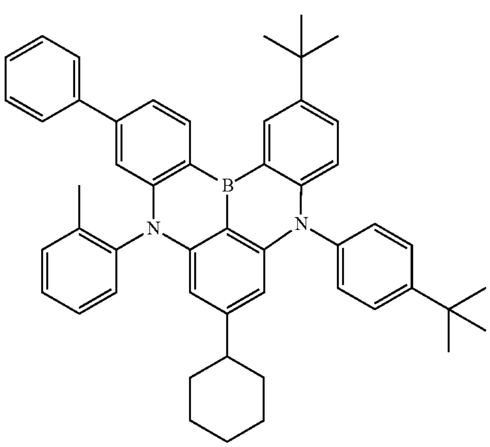
480
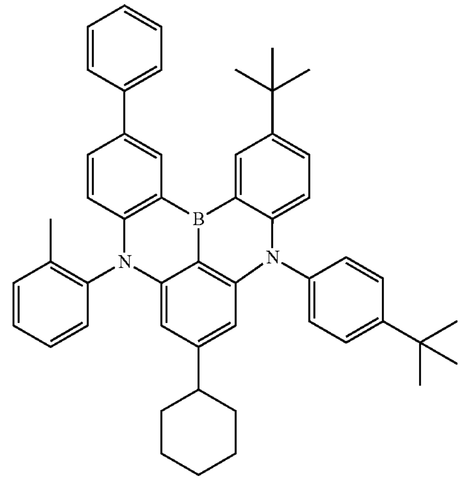
481
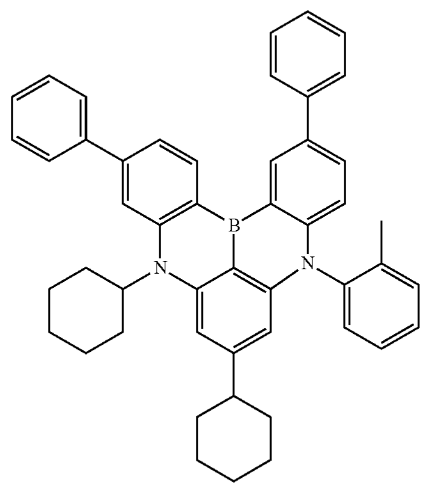
482
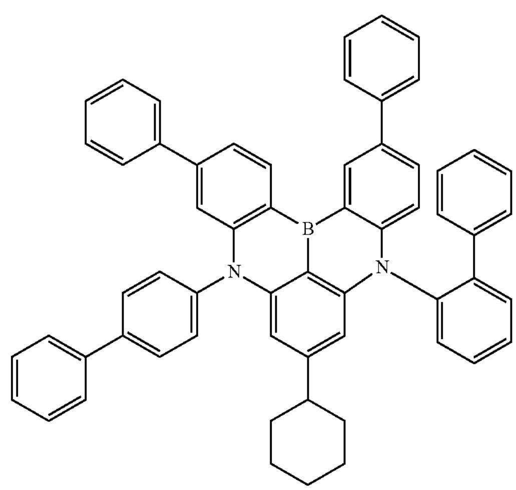

483
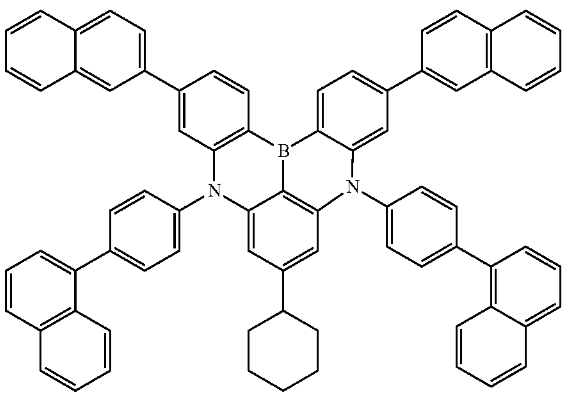
484
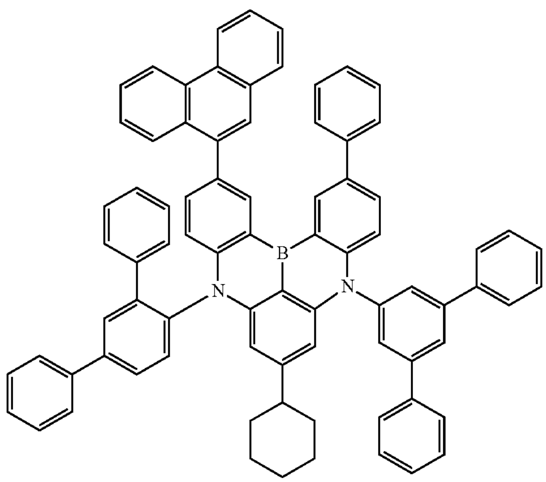
485
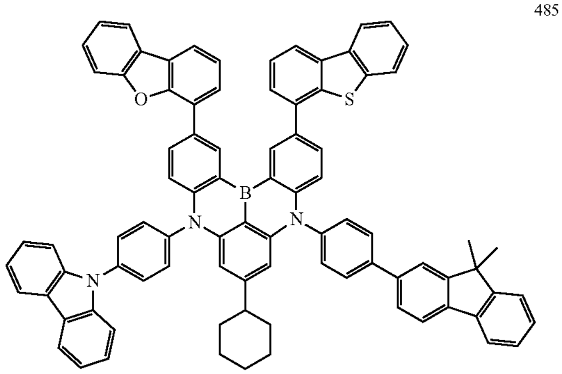
486
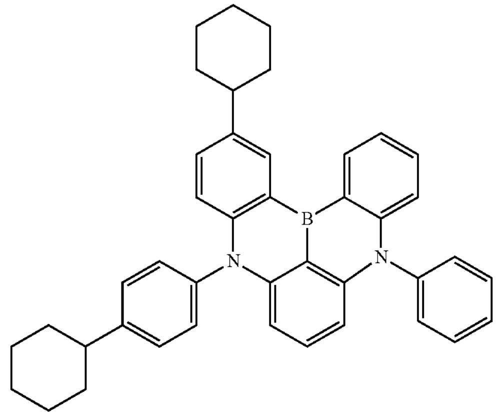
497
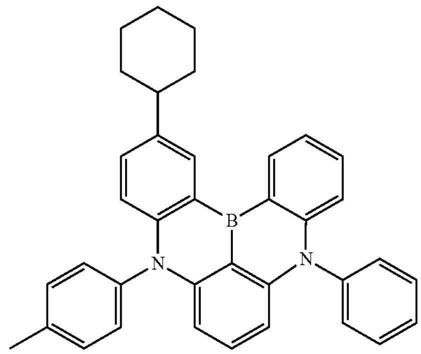
498
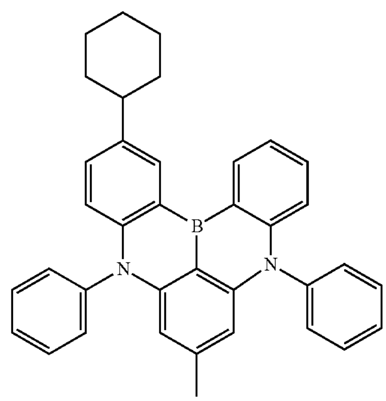
499
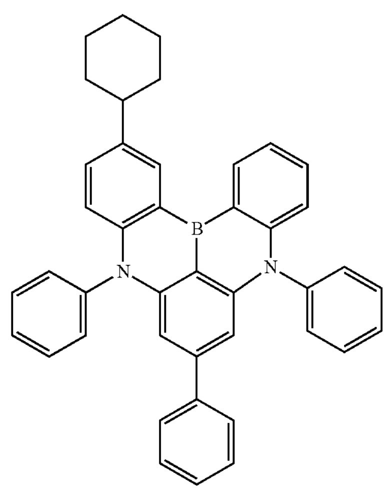

-continued
500
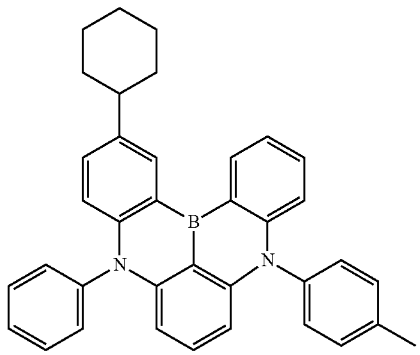
501
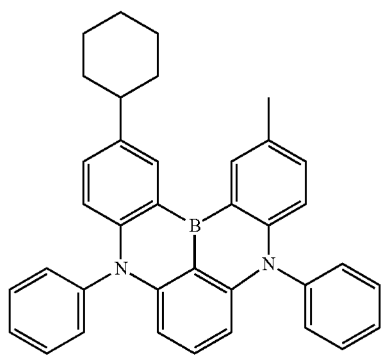
502
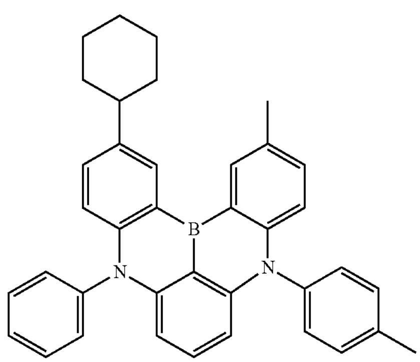
503
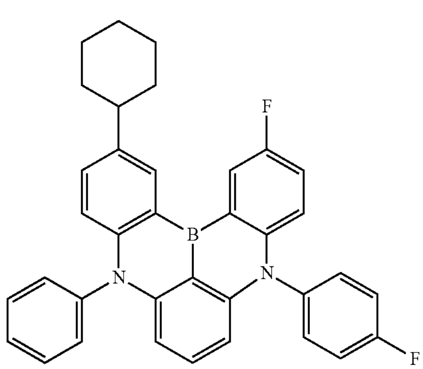
-continued
504
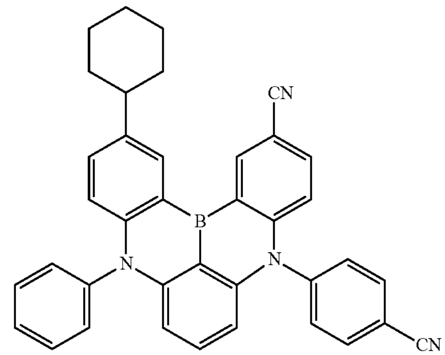
505
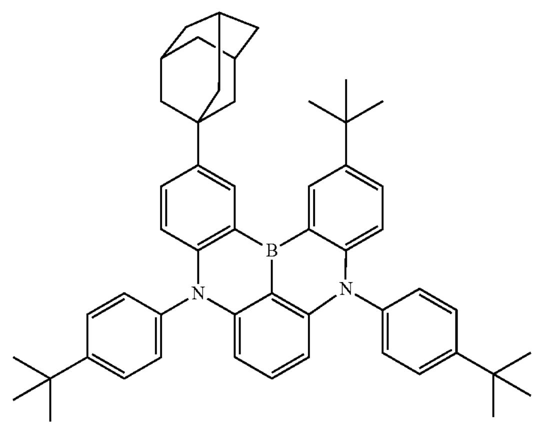
506
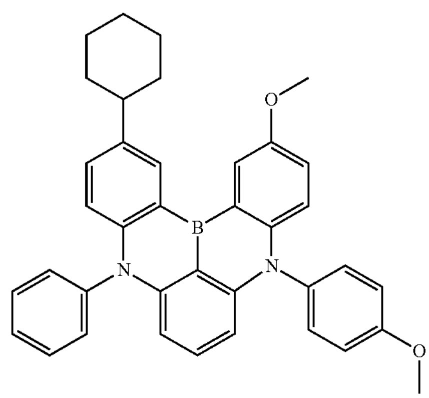
508
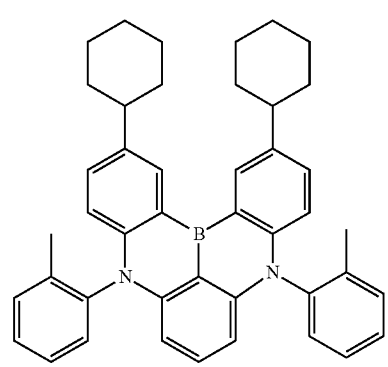

-continued
509
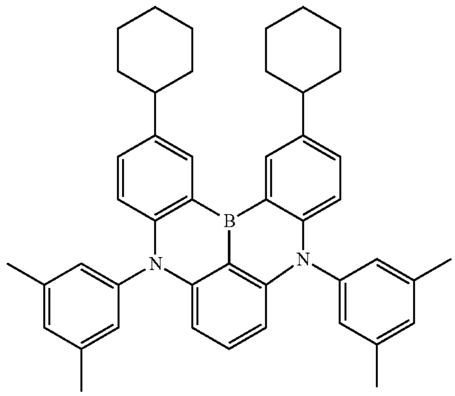
510
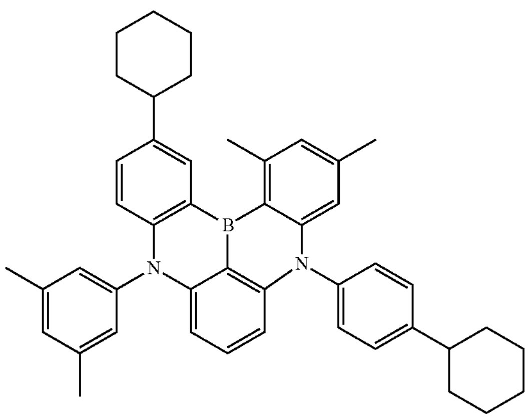
511
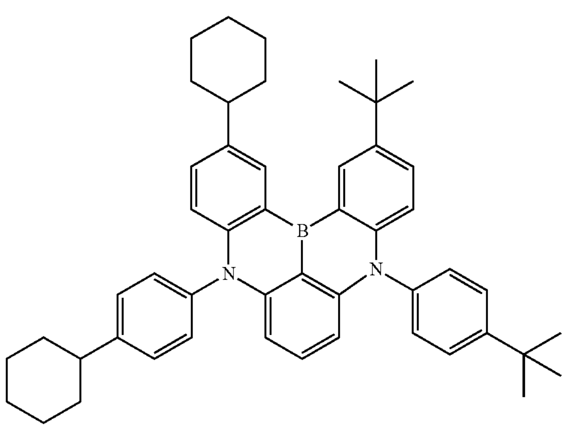
-continued
512
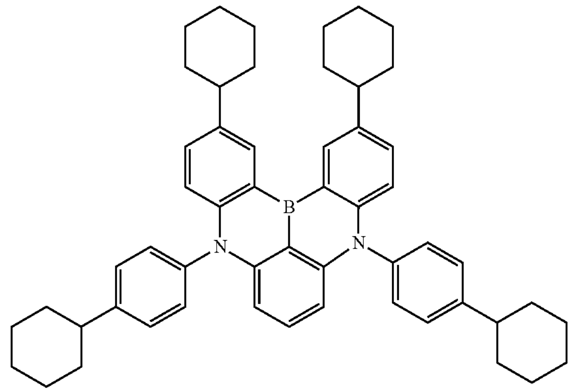
513
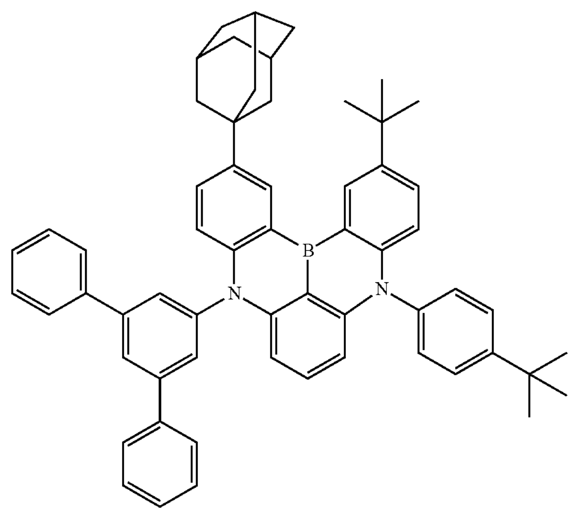
514
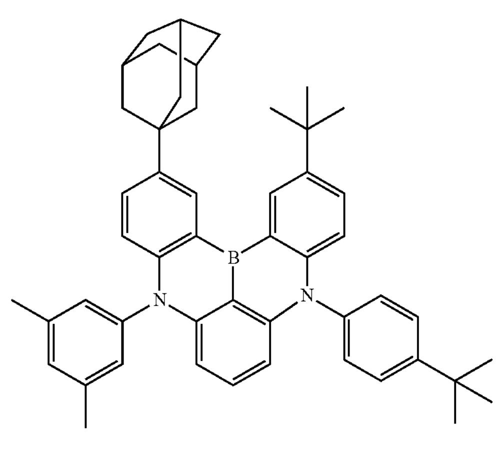

-continued
515
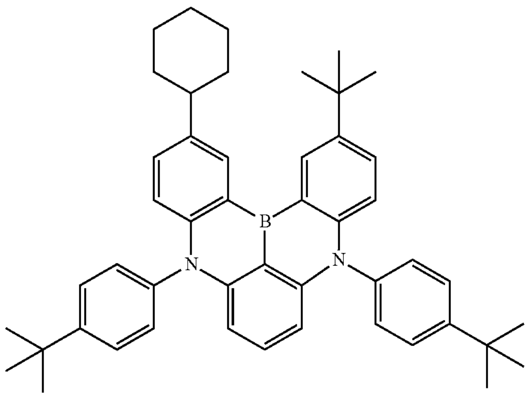
516
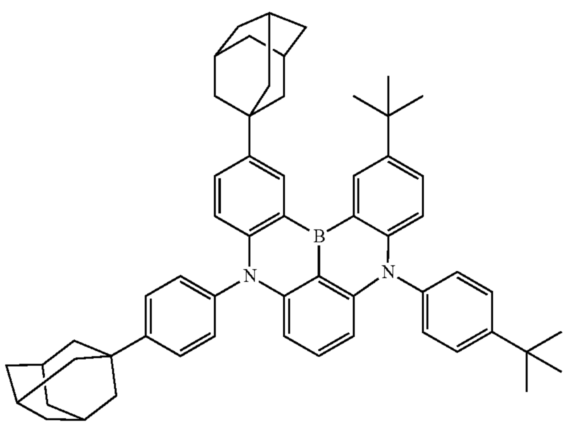
517
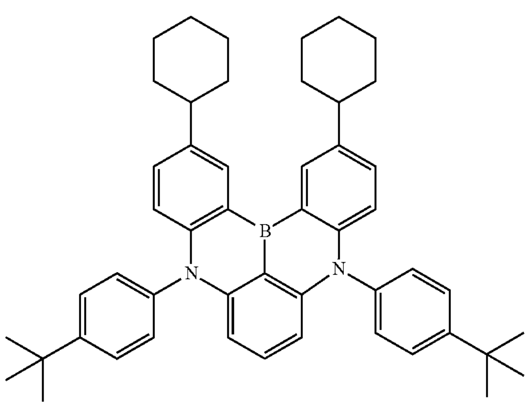
-continued
518
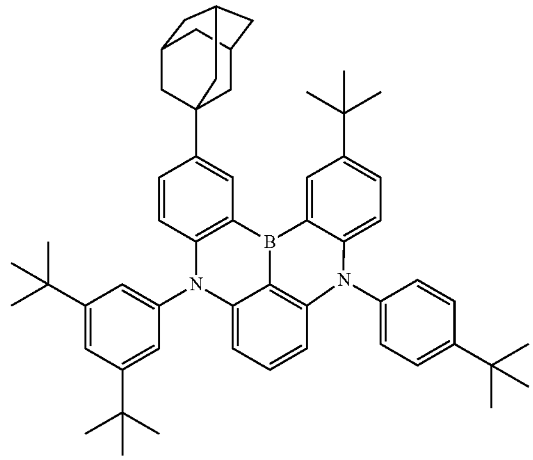
521
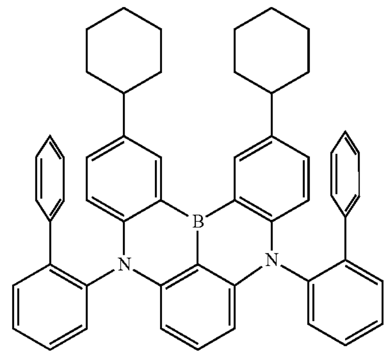
522
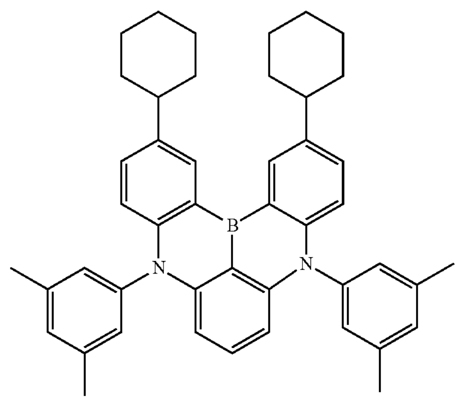
523
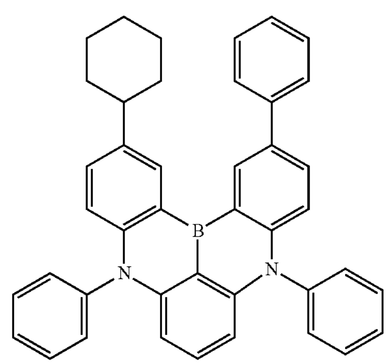

-continued
524
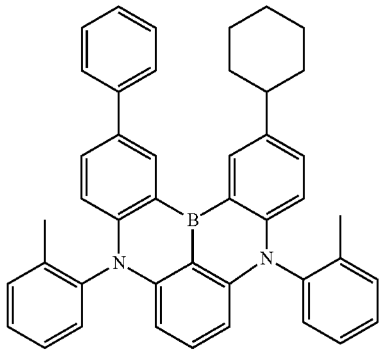
525
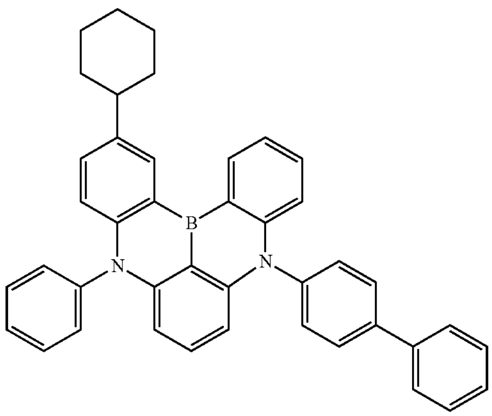
526
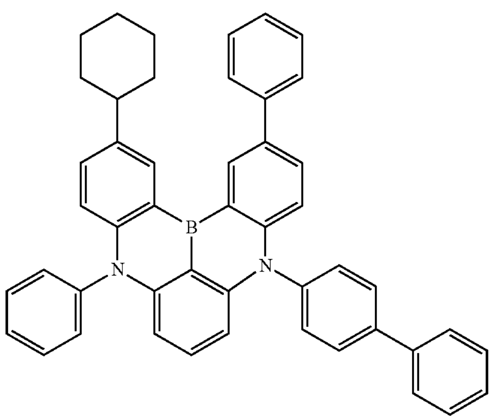
527
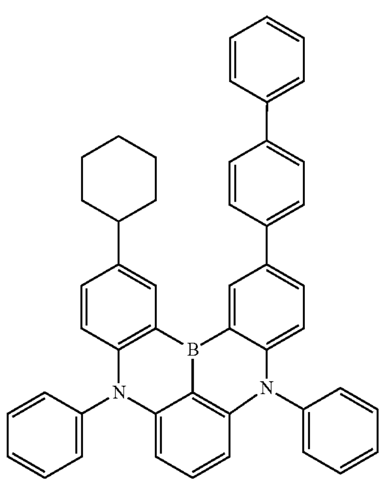
-continued
528
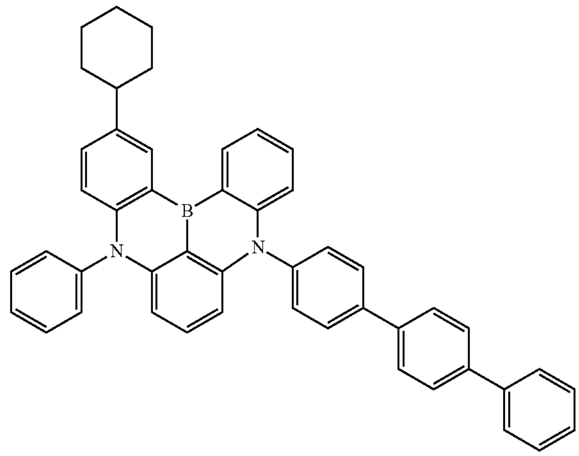
587
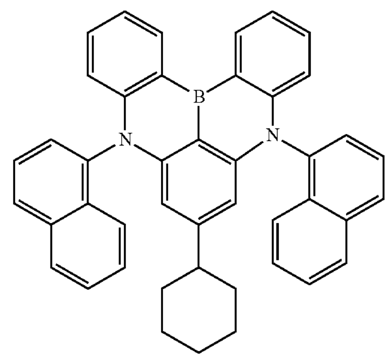
589
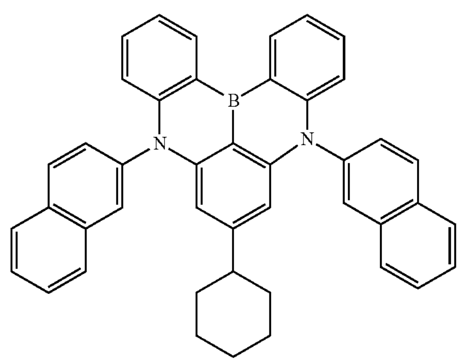
591
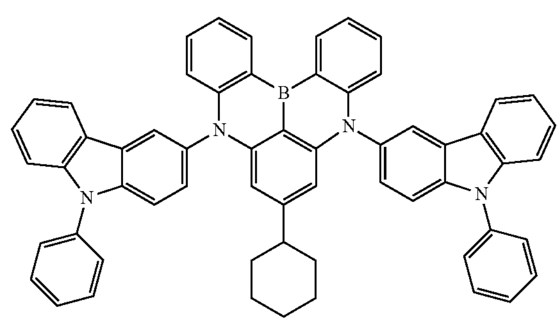

-continued
593
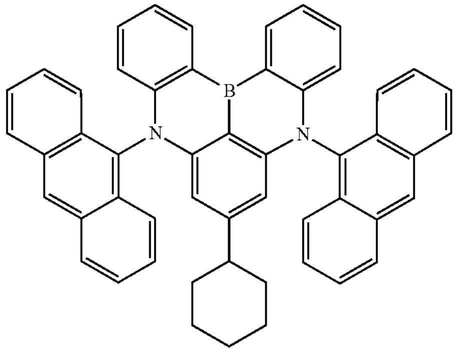
594
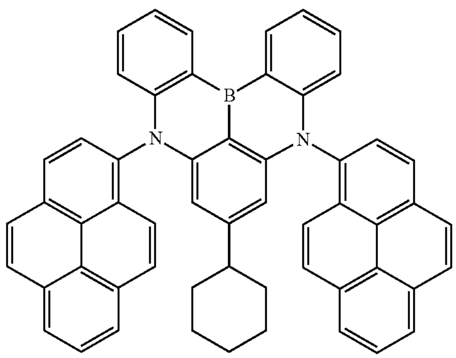
596
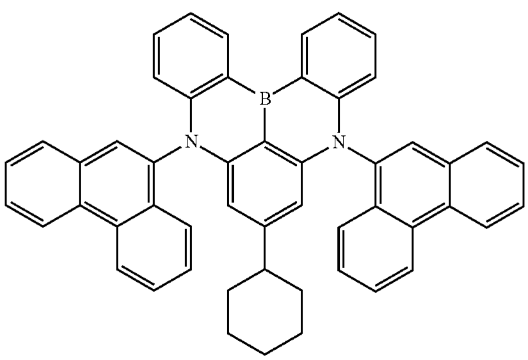
599
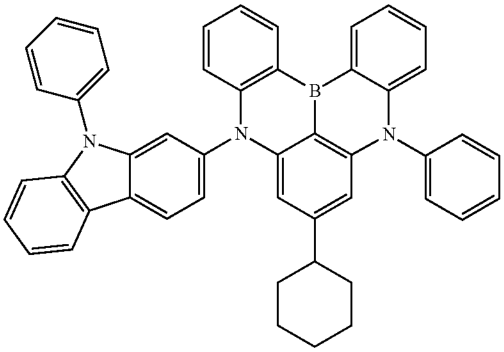
-continued
600
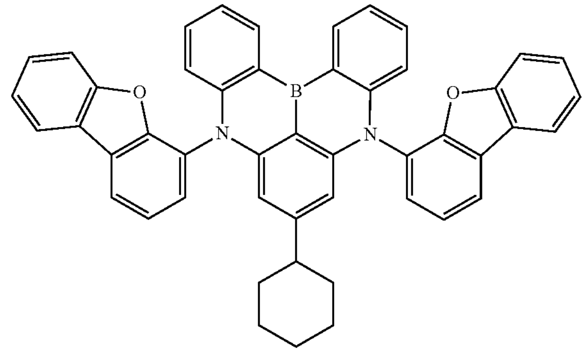
607
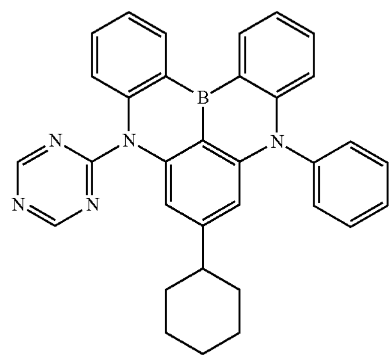
608
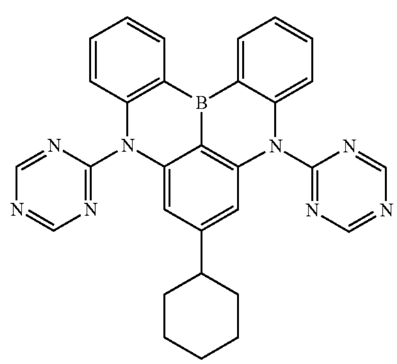

-continued
609
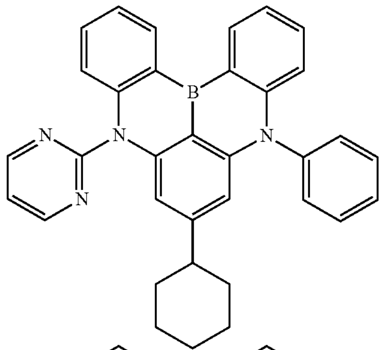
610
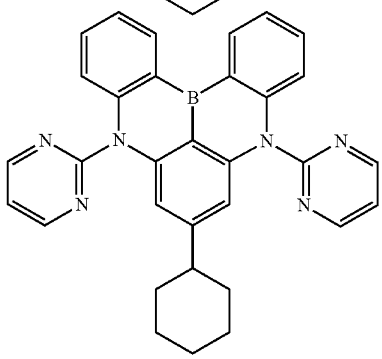
-continued
659
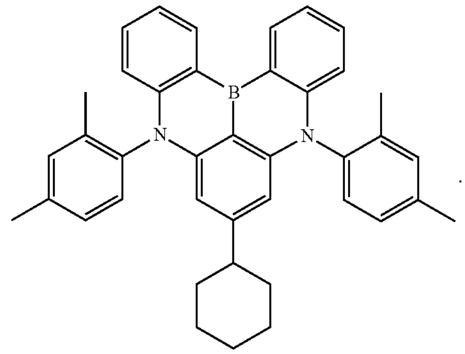
7. The organic electroluminescent element of claim 1, wherein the one or more organic layers further comprise an organic layer(s) one or more selected from the group consisting of a hole injection layer, a hole transport layer, a hole blocking layer, an electron transport layer, and an electron injection layer.
* * * * *